US008477085B2

(12) United States Patent
Shishido

(10) Patent No.: US 8,477,085 B2
(45) Date of Patent: Jul. 2, 2013

(54) SEMICONDUCTOR DEVICE AND DRIVING METHOD THEREOF

(75) Inventor: Hideaki Shishido, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 863 days.

(21) Appl. No.: 11/951,817

(22) Filed: Dec. 6, 2007

(65) Prior Publication Data

US 2008/0143653 A1   Jun. 19, 2008

(30) Foreign Application Priority Data

Dec. 15, 2006   (JP) .................................. 2006-338989

(51) Int. Cl.
*G09G 3/20*   (2006.01)

(52) U.S. Cl.
USPC .............................. 345/76; 345/78; 315/169.3

(58) Field of Classification Search
USPC ................. 345/36, 39, 42–46, 76–83, 87–92; 315/169.3; 313/463
See application file for complete search history.

(56) References Cited

U.S. PATENT DOCUMENTS

| | | | |
|---|---|---|---|
| 6,501,466 B1 | 12/2002 | Yamagishi et al. | |
| 6,924,602 B2 | 8/2005 | Komiya | |
| 6,958,651 B2 | 10/2005 | Kimura | |
| 7,009,591 B2 * | 3/2006 | Shibusawa | 345/76 |
| 7,429,985 B2 | 9/2008 | Kimura et al. | |
| 7,508,365 B2 | 3/2009 | Kim | |
| 7,564,452 B2 | 7/2009 | Komiya | |
| 7,586,473 B2 * | 9/2009 | Edwards et al. | 345/92 |
| 7,773,058 B2 | 8/2010 | Kimura | |
| 8,305,138 B2 | 11/2012 | Kimura | |
| 2002/0060756 A1 * | 5/2002 | Kurashina | 349/39 |
| 2003/0174152 A1 | 9/2003 | Noguchi | |
| 2004/0080474 A1 | 4/2004 | Kimura | |
| 2004/0095338 A1 * | 5/2004 | Miyazawa | 345/204 |
| 2004/0196239 A1 * | 10/2004 | Kwon | 345/92 |
| 2004/0246209 A1 | 12/2004 | Sung | |

(Continued)

FOREIGN PATENT DOCUMENTS

CN   1521712 A   8/2004
EP   1 102 234 A2   5/2001

(Continued)

OTHER PUBLICATIONS

Office Action, Chinese Application No. 200710300958.2, dated Sep. 22, 2011, 24 pages with English translation.

(Continued)

*Primary Examiner* — Hong Zhou
(74) *Attorney, Agent, or Firm* — Fish & Richardson P.C.

(57) ABSTRACT

A display device which can compensate for variations of the threshold voltage of transistors and suppress variations in luminance, and a driving method thereof are provided. Current is supplied to a light emitting element and light is emitted from the light emitting element by following steps: in the first period initial voltage is stored in a storage capacitor; in the second period, voltage based on video signal voltage and the threshold voltage of the transistor is stored in the storage capacitor; and in the third period, the voltage stored in the storage capacitor in the second period is applied to a gate electrode of the transistor. By these operation processes, the current which compensates the effect of the variations of the threshold voltage of the transistor can be supplied to the light emitting element. Therefore, variations in luminance are suppressed.

26 Claims, 67 Drawing Sheets

U.S. PATENT DOCUMENTS

| | | | |
|---|---|---|---|
| 2005/0007316 A1* | 1/2005 | Akimoto et al. | 345/76 |
| 2005/0017934 A1 | 1/2005 | Chung et al. | |
| 2005/0212787 A1 | 9/2005 | Noguchi et al. | |
| 2005/0285823 A1* | 12/2005 | Kimura et al. | 345/76 |
| 2006/0038754 A1* | 2/2006 | Kim | 345/76 |
| 2006/0043447 A1* | 3/2006 | Ishii et al. | 257/295 |
| 2006/0055336 A1* | 3/2006 | Jeong | 315/169.3 |
| 2006/0132054 A1* | 6/2006 | Kim et al. | 315/169.3 |
| 2006/0208977 A1* | 9/2006 | Kimura | 345/76 |
| 2007/0063993 A1 | 3/2007 | Shishido | |
| 2007/0085847 A1 | 4/2007 | Shishido | |
| 2007/0103406 A1* | 5/2007 | Kim | 345/76 |
| 2009/0009676 A1 | 1/2009 | Kimura et al. | |
| 2011/0205144 A1 | 8/2011 | Kimura et al. | |

FOREIGN PATENT DOCUMENTS

| | | |
|---|---|---|
| EP | 1233398 A2 | 8/2002 |
| JP | 10239699 A | 9/1998 |
| JP | 2001-147659 | 5/2001 |
| JP | 2002244617 A | 8/2002 |
| JP | 2003202833 A | 7/2003 |
| JP | 2004-201297 A | 7/2004 |
| JP | 2004-341351 A | 12/2004 |
| JP | 2005275276 A | 10/2005 |
| JP | 2006017966 A | 1/2006 |
| JP | 2006039544 A | 2/2006 |
| JP | 2006309119 A | 11/2006 |

OTHER PUBLICATIONS

Park.Y et al., "A New Voltage Driven Pixel Circuit for Large Sized AMOLED Panel,", IDW '04 : Proceedings of the 11th International Display Workshops, Dec. 8, 2004, pp. 539-540. English document.

Jung.S et al., "OLEDP-L1: A New Voltage Modulated AMOLED Pixel Design for Compensation of Threshold Voltage Non-Uniformity of TFTS,", AM-LCD '04 Digest of Technical Papers, Aug. 25, 2004, pp. 143-144. English document.

* cited by examiner

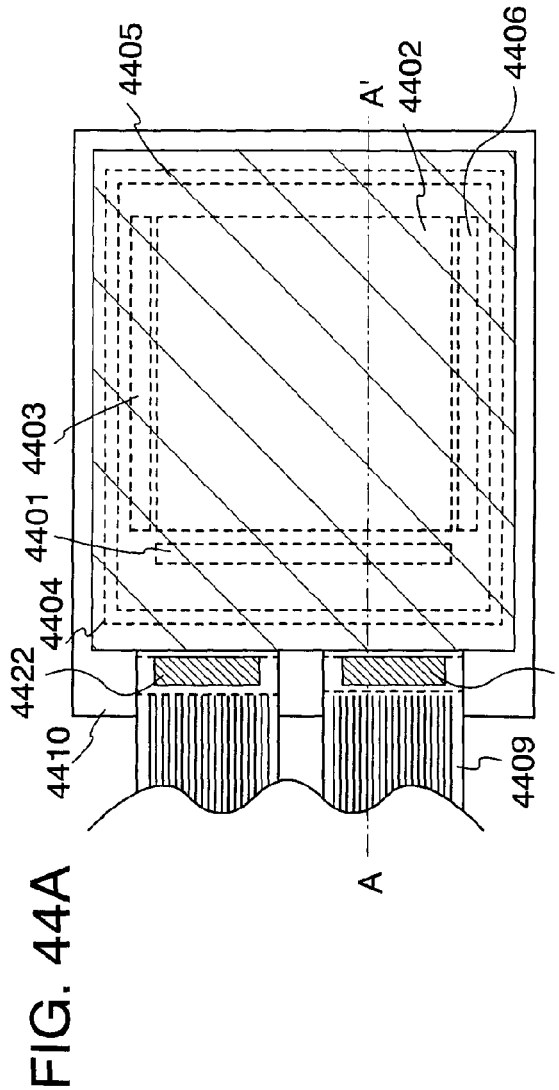
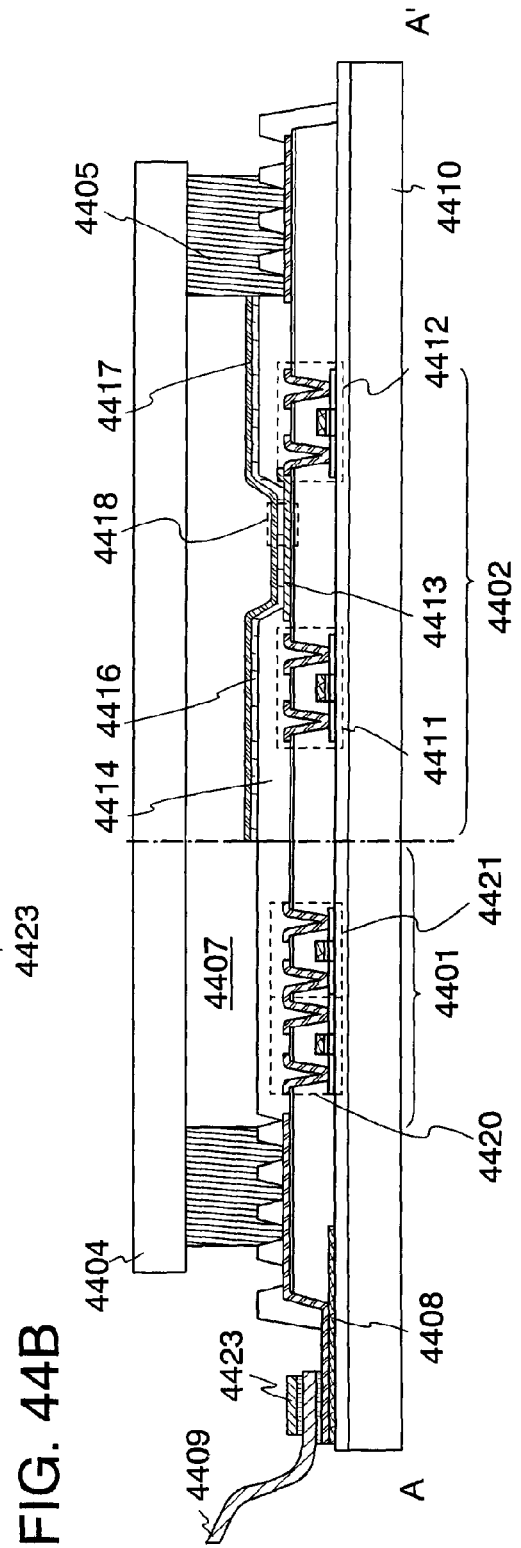
FIG. 44A
FIG. 44B

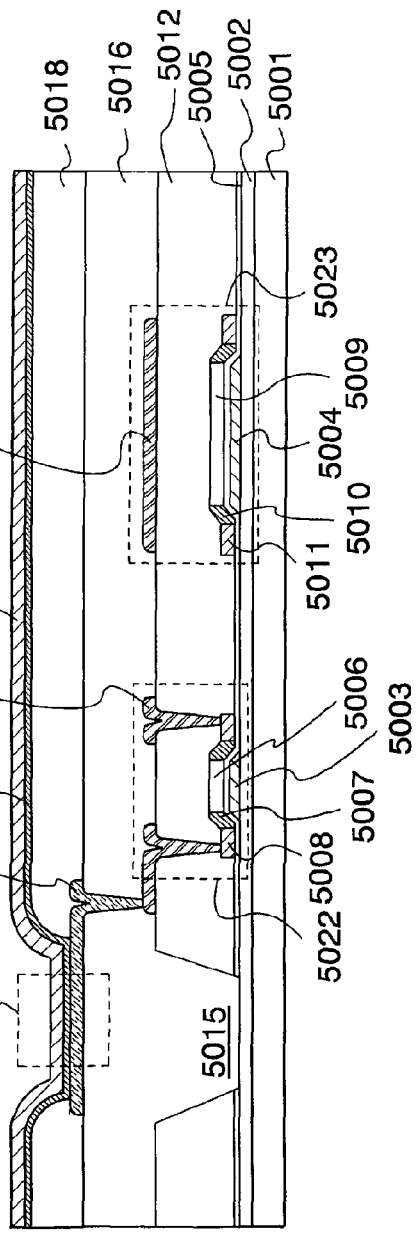
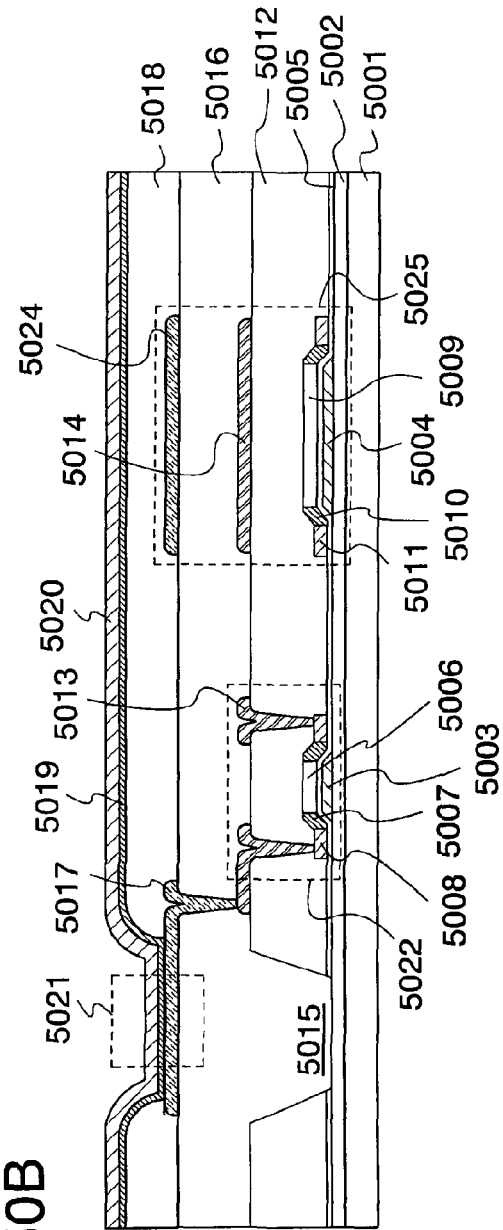
FIG. 50A
FIG. 50B

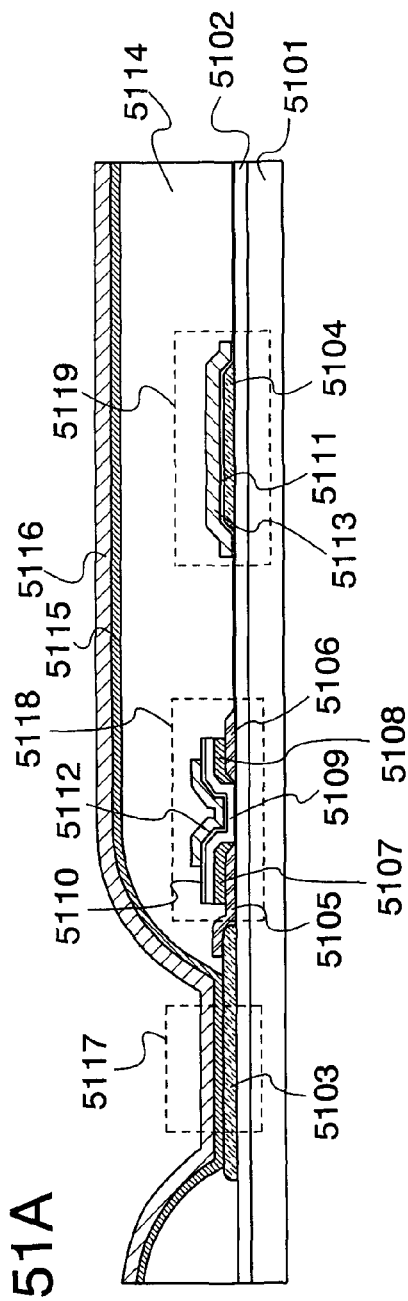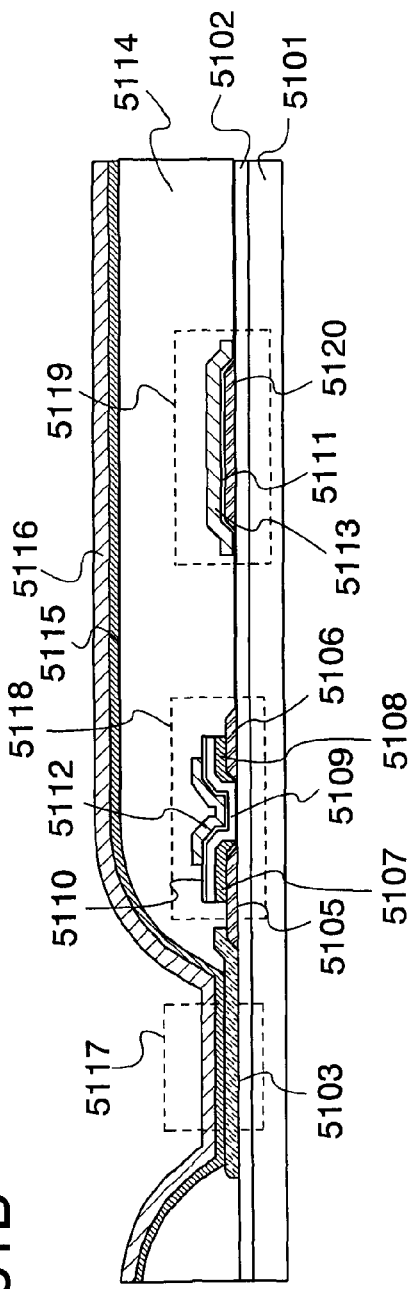

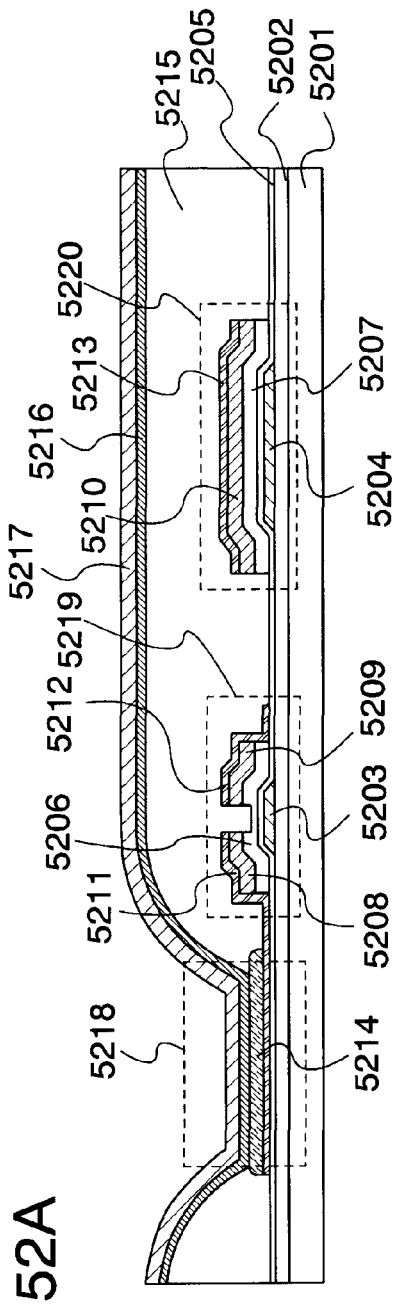
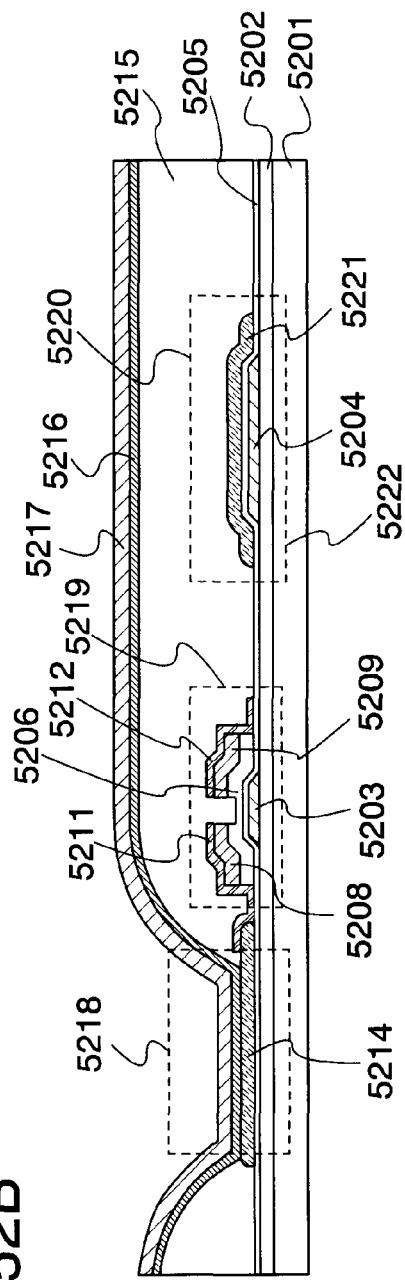
FIG. 52A
FIG. 52B

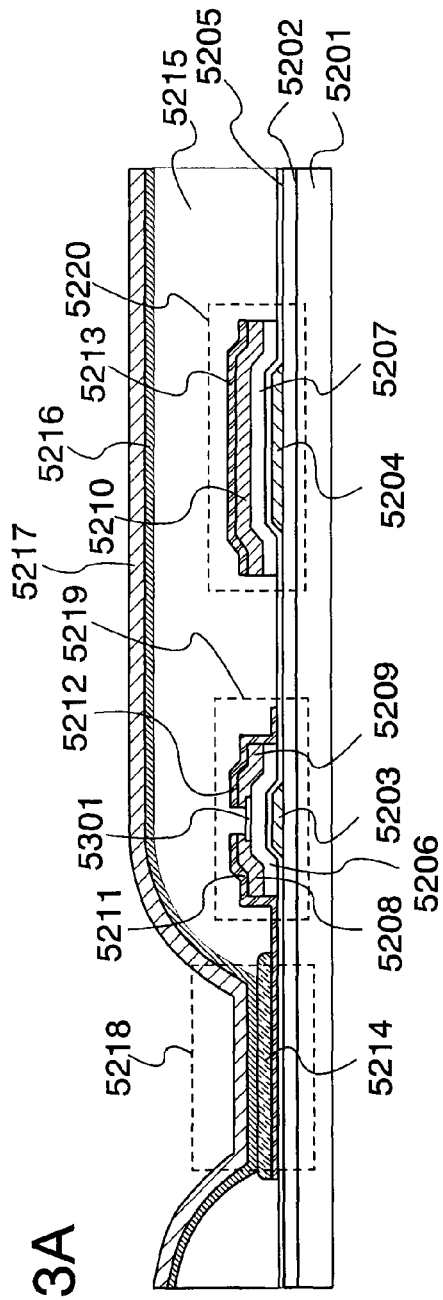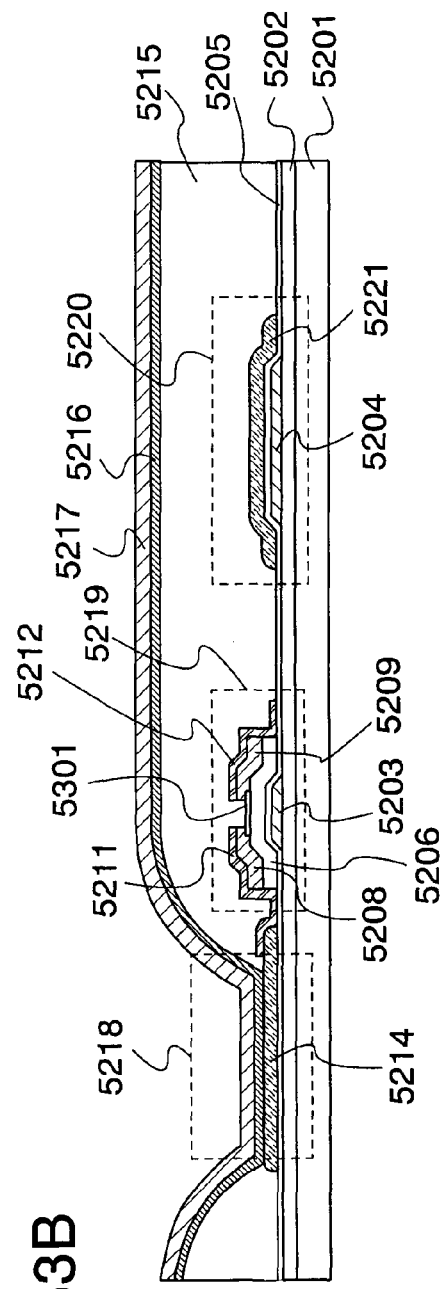
FIG. 53A
FIG. 53B

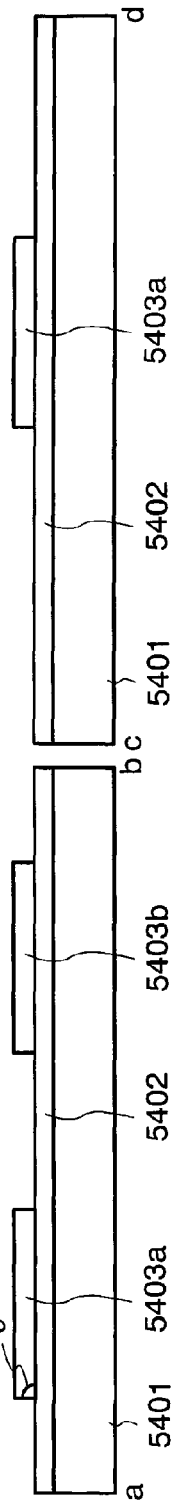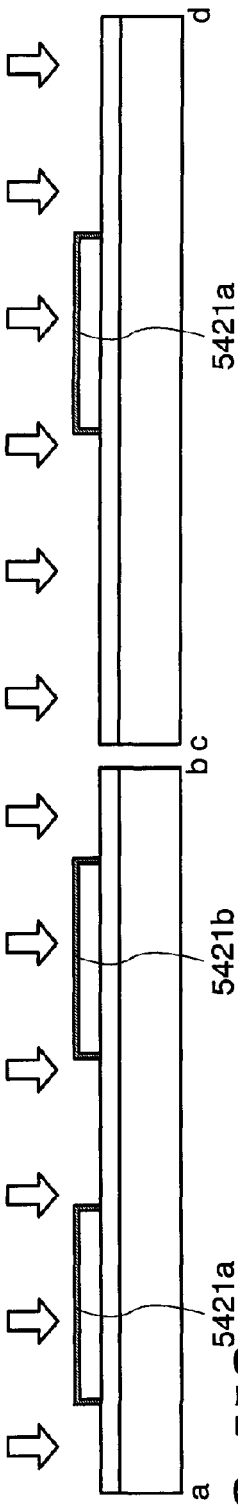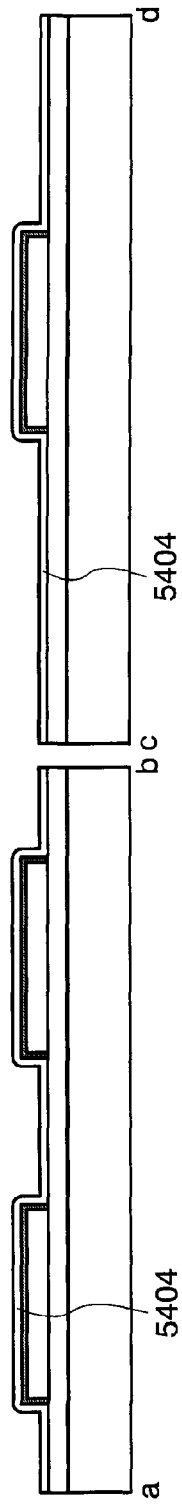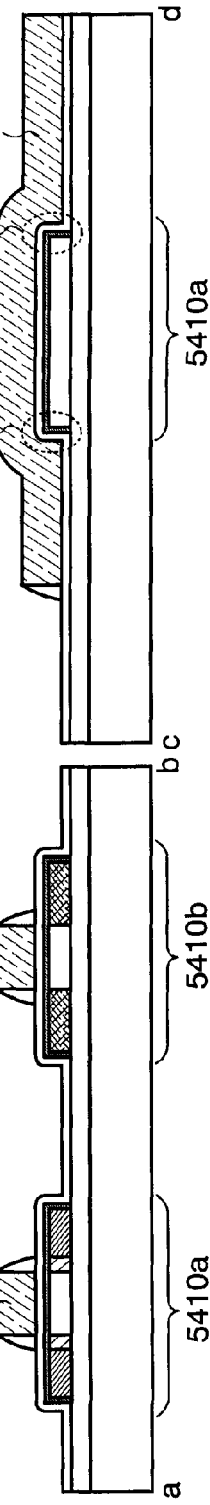

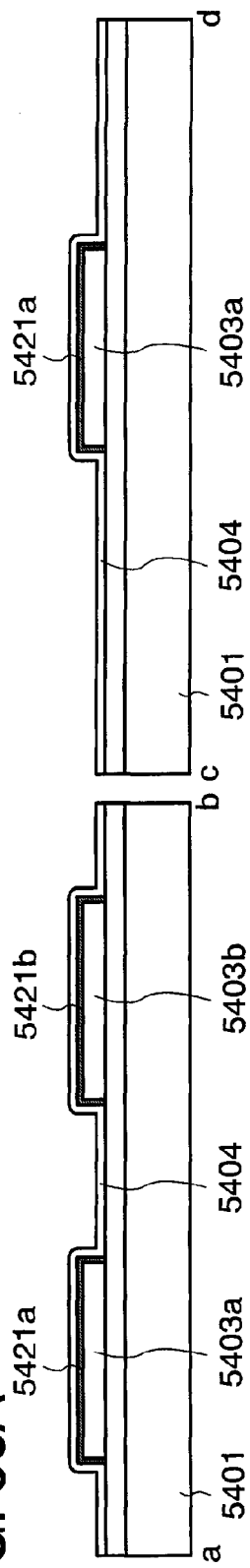
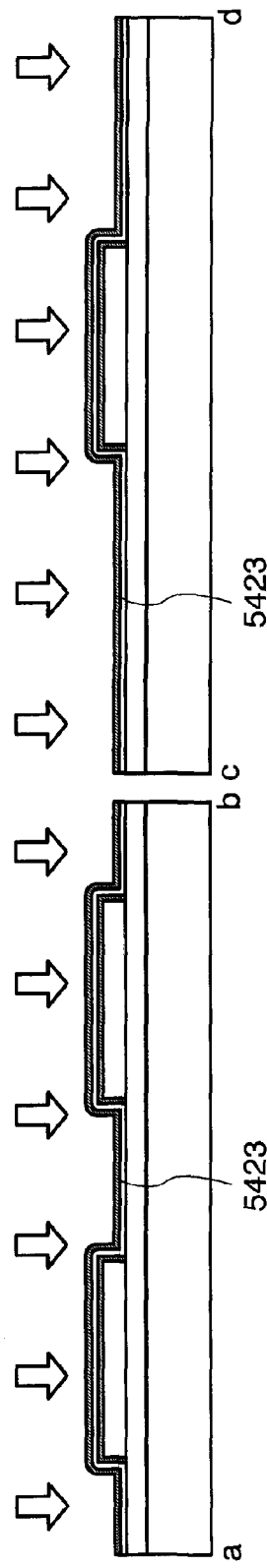
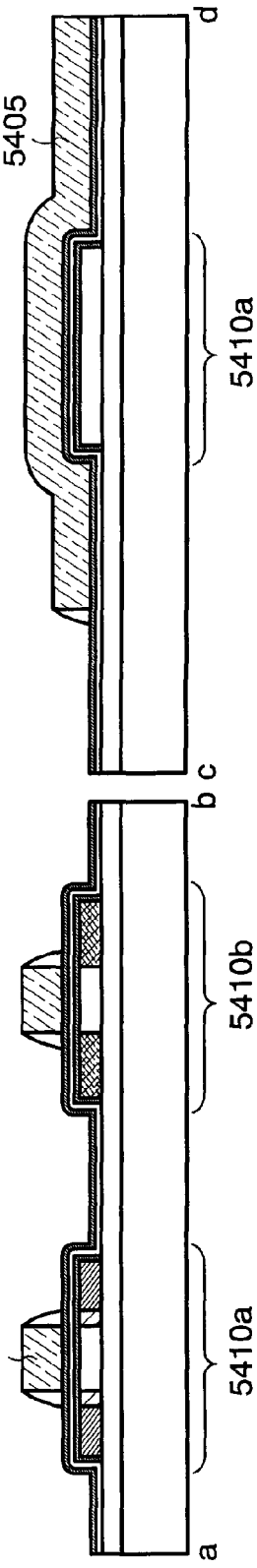
FIG. 56A
FIG. 56B
FIG. 56C

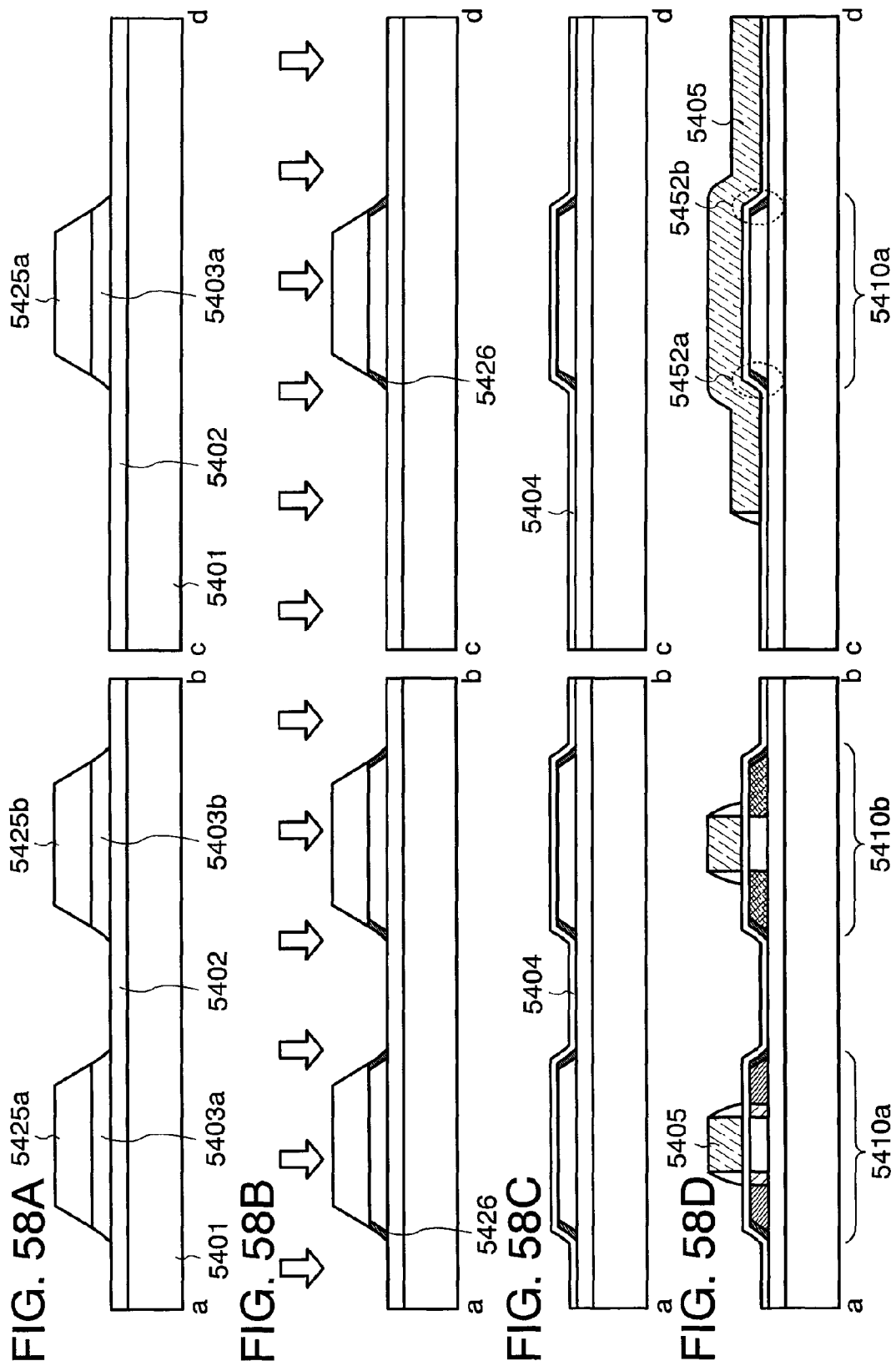

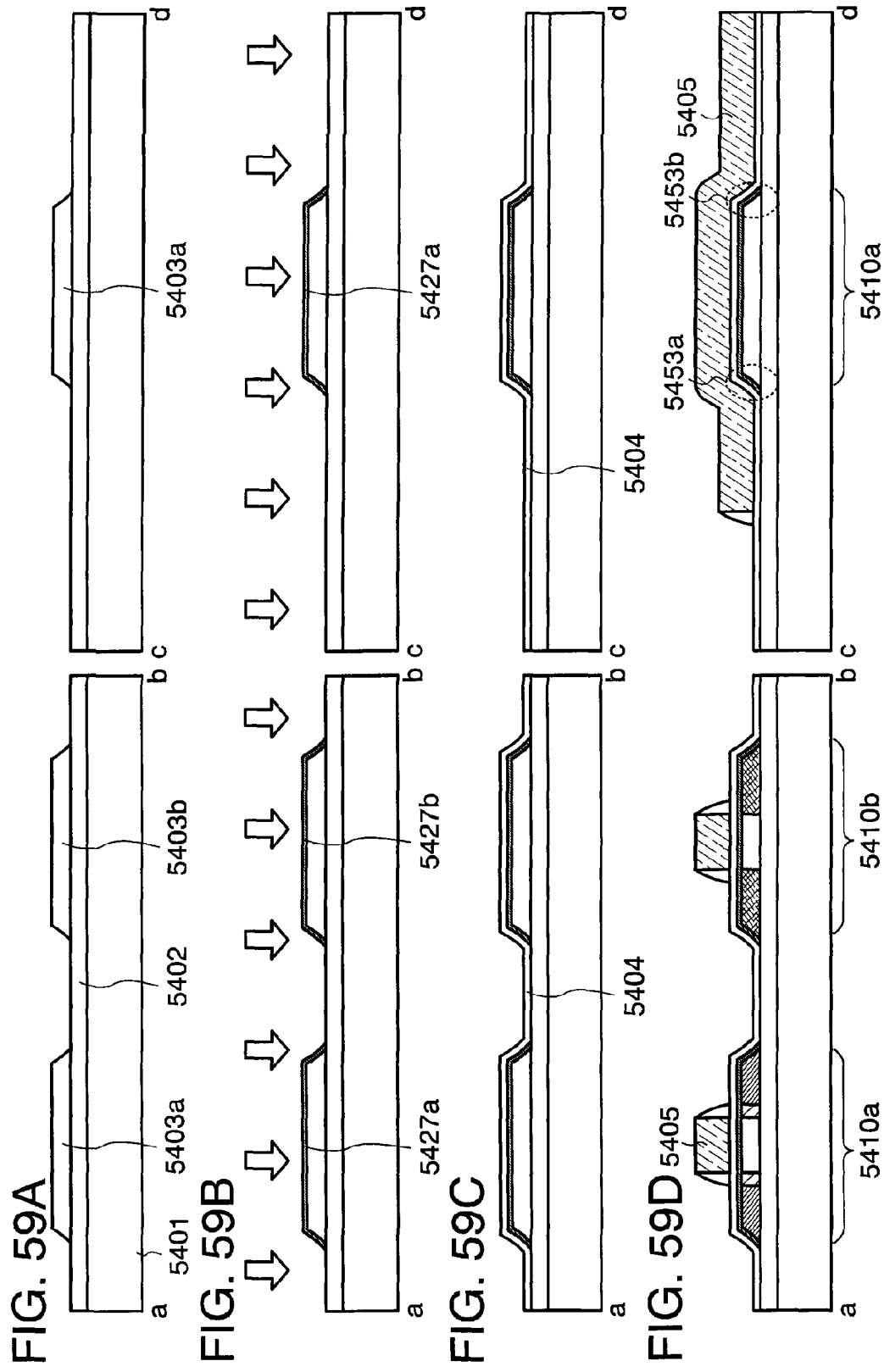

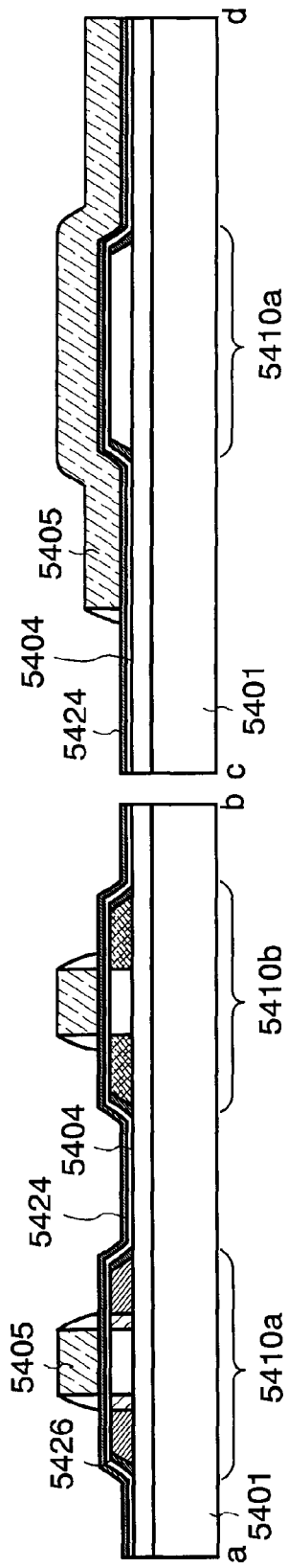
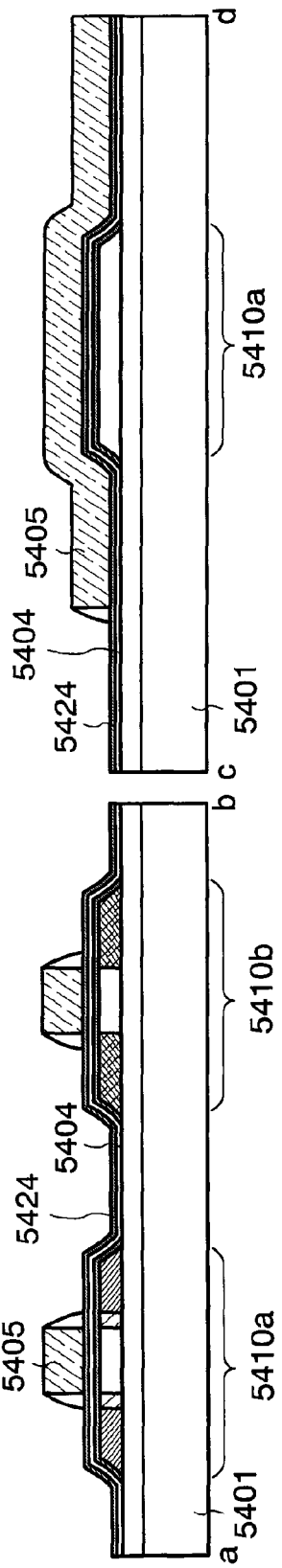
FIG. 60A
FIG. 60B

SEMICONDUCTOR DEVICE AND DRIVING METHOD THEREOF

BACKGROUND OF THE INVENTION

1. Field of the Invention

The present invention relates to a structure and a driving method of a semiconductor device having a transistor. In addition, the present invention relates to a structure and a driving method of an active matrix display device using a semiconductor device having a thin film transistor. Further, the present invention relates to an electronic device using such a semiconductor device in a display portion.

2. Description of the Related Art

In recent years, a so-called self-luminous display device having a pixel formed by using a light-emitting element such as a light-emitting diode has attracted attention. As a light-emitting element used for such a self-luminous display device, an organic light-emitting diode (also referred to as an OLED (organic light-emitting diode), an organic EL element, an electroluminescence (electro luminescence: EL) element, and the like) has attracted attention, and it has been used for an EL display or the like. Since a light-emitting element such as an OLED is a self-luminous type, an EL display or the like has advantages over a liquid crystal display such that it has higher pixel visibility, no backlight is needed, and response speed is higher, and the like. Luminance of a light-emitting element is controlled with the amount of current flowing thereto.

In addition, in recent years, an active matrix display device in which a light-emitting element and a transistor which controls light emission of the light-emitting element are provided in each pixel has been developed. An active matrix display device has been expected to be put into practical use because not only it can realize high-definition display and large-screen display which are difficult to realize in a passive matrix display device, but also it can operate with less power consumption than the passive matrix display device and has higher reliability.

When driving methods of pixels of an active matrix display device are classified according to kinds of input signals, a voltage programming method and a current programming method can be given as examples. The former voltage programming method is a method of controlling luminance of a light-emitting element with a driving element by inputting a video signal (voltage) which is to be input to a pixel to a gate electrode of the driving element. In addition, the latter current programming method is a method of controlling luminance of a light-emitting element by supplying programmed signal current to the light-emitting element.

Here, an example of a pixel structure of a display device to which a voltage programming method is applied, and a driving method thereof are described with reference to FIG. 67. Note that an EL display device is described as an example of a typical display device.

FIG. 67 is a diagram showing an example of a pixel structure of a display device to which a voltage programming method is applied (see Reference 1: Japanese Published Patent Application No. 2001-147659). The pixel shown in FIG. 67 includes a driving transistor 6701, a switching transistor 6702, a storage capacitor 6703, a signal line 6704, a scan line 6705, a first power supply line 6706, a second power supply line 6707, and a light-emitting element 6708.

Note that in this specification, description that a transistor is on corresponds to a state where gate-source voltage of a transistor is higher than the threshold voltage thereof and current flows between a source and a drain. Description that a transistor is off corresponds to a state where gate-source voltage of a transistor is lower than the threshold voltage thereof and no current flows between a source and a drain.

When the switching transistor 6702 is turned on in response to change in a potential of the scan line 6705, a video signal input to the signal line 6704 is input to a gate electrode of the driving transistor 6701. Gate-source voltage of the driving transistor 6701 is determined in accordance with a potential of the video signal which is input, and the amount of current flowing between a source and a drain of the driving transistor 6701 is determined. This current is supplied to the light-emitting element 6708, so that the light-emitting element 6708 emits light.

In this manner, the voltage programming method is a method of setting gate-source voltage of a driving transistor and the amount of current flowing between a source and a drain of the driving transistor in accordance with a potential of a video signal, and a light-emitting element emits light at luminance corresponding to this current.

As a semiconductor element which drives a light-emitting element, a polysilicon (p-Si) transistor is used. However, electrical characteristics such as the threshold voltage, on current, and mobility of a polysilicon transistor easily vary due to a defect in a crystal grain boundary. In the pixel shown in FIG. 67, when characteristics of the driving transistor 6701 vary between each pixel, the amount of drain current of the transistor 6701 varies in accordance with a video signal which is input even when the same video signal is input. Therefore, luminance of the light-emitting element 6708 varies.

In addition, in a conventional pixel circuit (FIG. 67), a storage capacitor is connected between a gate and a source of a driving transistor. In the case of forming this storage capacitor using a MOS transistor, a channel region of the MOS transistor is not induced when gate-source voltage of the MOS transistor is approximately equal to the threshold voltage of the MOS transistor. Therefore, the MOS transistor cannot function as a storage capacitor. Accordingly, video signals cannot be accurately held.

SUMMARY OF THE INVENTION

In this manner, in a conventional voltage programming method, luminance of light-emitting elements varies due to variations in electric characteristics of transistors.

In view of the foregoing problems, it is an object of the present invention to provide a semiconductor device and a display device where variations in the threshold voltage of transistors can be compensated and variations in luminance of light-emitting elements can be reduced, and a driving method thereof.

Note that targets are not limited to only a semiconductor device and a display device which have light-emitting elements. It is an object of the present invention to suppress variations in drain current due to variations in the threshold voltage of transistors. Thus, a supply destination of drain current of a driving transistor is not limited to a light-emitting element. Hereinafter, the supply destination of the drain current is generically referred to as a load.

One aspect of the present invention is a semiconductor device having a signal line, a capacitor line, a load, a first transistor, a second transistor, and a storage capacitor. A first electrode of the first transistor is electrically connected to the signal line. A second electrode of the first transistor is electrically connected to the load. The second transistor has a function as a switch which determines whether to electrically connect the second electrode and a gate electrode of the first transistor. A first electrode of the storage capacitor is electrically connected to a gate electrode of the first transistor. A second electrode of the storage capacitor is electrically connected to the capacitor line. Voltage which is based on signal voltage applied to the signal line and the threshold voltage of the first transistor is held in the storage capacitor. Current is supplied to the load by applying the voltage to the gate electrode of the first transistor.

Another aspect of the present invention is a semiconductor device having a pixel. The pixel includes a signal line, a capacitor line, a load, a first transistor, a second transistor, and a storage capacitor. A first electrode of the first transistor is electrically connected to the signal line. A second electrode of the first transistor is electrically connected to the load. The second transistor has a function as a switch which determines whether to electrically connect the second electrode and a gate electrode of the first transistor. A first electrode of the storage capacitor is electrically connected to a gate electrode of the first transistor. A second electrode of the storage capacitor is electrically connected to the capacitor line. Voltage which is based on signal voltage applied to the signal line and the threshold voltage of the first transistor is held in the storage capacitor. Current is supplied to the load by applying the voltage to the gate electrode of the first transistor.

Another aspect of the present invention is a semiconductor device having a pixel. The pixel includes a signal line, a capacitor line, a first power supply line, a second power supply line, a load, a first transistor, a second transistor, a third transistor, a fourth transistor, a fifth transistor, and a storage capacitor. A second electrode of the load is electrically connected to the second power supply line. The first transistor has a function of supplying current to the load. The second transistor has a function as a switch which electrically connects a first electrode of the first transistor and the signal line. The third transistor has a function as a switch which electrically connects the first electrode of the first transistor and the first power supply line. The fourth transistor has a function as a switch which determines whether to electrically connect a second electrode and a gate electrode of the first transistor. The fifth transistor has a function as a switch which electrically connects the second electrode of the first transistor and the load. A first electrode of the storage capacitor is electrically connected to the gate electrode of the first transistor. A second electrode of the storage capacitor is electrically connected to the capacitor line. Voltage which is based on signal voltage applied to the signal line and the threshold voltage of the first transistor is held in the storage capacitor. Current is supplied to the load by applying the voltage to the gate electrode of the first transistor.

Another aspect of the present invention is a semiconductor device having a pixel. The pixel includes a signal line, a capacitor line, a first power supply line, a second power supply line, a load, a first transistor, a second transistor, a third transistor, a fourth transistor, and a storage capacitor. A potential of the second power supply line is changed. A second electrode of the load is electrically connected to the second power supply line. A second electrode of the first transistor is directly connected to a first electrode of the load. The second transistor has a function as a switch which electrically connects a first electrode of the first transistor and the signal line. The third transistor has a function as a switch which electrically connects the first electrode of the first transistor and the first power supply line. The fourth transistor has a function as a switch which determines whether to electrically connect the second electrode and a gate electrode of the first transistor. A first electrode of the storage capacitor is electrically connected to the gate electrode of the first transistor. A second electrode of the storage capacitor is electrically connected to the capacitor line. Voltage which is based on signal voltage applied to the signal line and the threshold voltage of the first transistor is held in the storage capacitor. Current is supplied to the load by applying the voltage to the gate electrode of the first transistor.

Note that in the semiconductor device of the present invention, the pixel may further include a sixth transistor, and an initial potential may be applied to the second electrode of the first transistor through the sixth transistor.

Note that in the semiconductor device of the present invention, the second electrode of the first transistor may be electrically connected to any one of the wirings included in the pixel through the sixth transistor.

Note that in the semiconductor device of the present invention, the pixel may further include an initializing line which is electrically connected to the second electrode of the first transistor through the sixth transistor Note that in the semiconductor device of the present invention, the first transistor preferably has the largest value of W/L (ratio of the channel width W to the channel length L) among the values of W/L of respective transistors included in the pixel.

Note that in the semiconductor device of the present invention, conductivity types of the second transistor and the third transistor may be different from each other.

Note that in the semiconductor device of the present invention, the pixel may further include a plurality of scan lines, and gate electrodes of at least two transistors included in the pixel may be electrically connected to the same scan line.

Note that in the semiconductor device of the present invention, the pixel may further include a plurality of scan lines, and gate electrodes of a plurality of transistors included in the pixel may be electrically connected to different scan lines.

Note that in the semiconductor device of the present invention, a pixel which is adjacent to the pixel may further include a plurality of scan lines, and any one of the scan lines of the pixel which is adjacent to the pixel may be used as the capacitor line.

Note that in the semiconductor of the present invention, the fourth transistor may be an N-channel transistor.

Another aspect of the present invention is a driving method of a semiconductor device including a pixel which has a signal line, a capacitor line, a power supply line, a load, a first transistor, a first electrode of which is electrically connected to the signal line and a second electrode of which is electrically connected to the load, a second transistor having a function as a switch which determines whether to electrically connect the second electrode and a gate electrode of the first transistor, and a storage capacitor, a first electrode of which is electrically connected to the gate electrode of the first transistor and a second electrode of which is electrically connected to the capacitor line. After initial voltage is held in the storage capacitor by supplying current to the load, the second transistor is turned on and voltage which is based on signal voltage supplied from the signal line and the threshold voltage of the first transistor is held in the storage capacitor. Voltage which is based on the voltage is applied to the gate electrode of the first transistor, and current is supplied to the load from the power supply line through the first transistor.

Another aspect of the present invention is a driving method of a semiconductor device including a pixel which has a signal line, a capacitor line, a power supply line, a load, a first transistor, a first electrode of which is electrically connected to the signal line and a second electrode of which is electrically connected to the load, a second transistor having a function as a switch which determines whether to electrically connect the second electrode and a gate electrode of the first transistor, a third transistor having a function as a switch for applying an initial potential to the second electrode of the first transistor, and a storage capacitor, a first electrode of which is electrically connected to the gate electrode of the first transistor and a second electrode of which is electrically connected to the capacitor line. After the initial potential is applied to the second electrode of the first transistor by turning on the third transistor, the second transistor is turned on and voltage which is based on signal voltage supplied from the signal line and the threshold voltage of the first transistor is held in the storage capacitor. Voltage which is based on the voltage is applied to the gate electrode of the first transistor, and current is supplied to the load from the power supply line through the first transistor.

Note that in the driving method of the present invention, the pixel may further include an initializing line which is electrically connected to the second electrode of the first transistor through the third transistor, and the initial potential may be supplied from the initializing line.

Note that in the driving method of the present invention, voltage applied to the power supply line may be different between a period during which the voltage which is based on the signal voltage supplied from the signal line and the threshold voltage of the first transistor is held in the storage capacitor and periods other than the period.

In the above-described structure, the load may be a light-emitting element.

It is difficult to distinguish a source and a drain of a transistor from each other because of the structure of a transistor. In addition, the level of potentials is switched depending on circuit operations in some cases. Therefore, in this specification, a source and a drain is not particularly specified and are referred to as a first electrode and a second electrode. For example, when a first electrode is a source, a second electrode corresponds to a drain, and on the contrary, when a first electrode is a drain, a second electrode corresponds to a source.

Note that one pixel corresponds to one color element in this document (the specification, the claim, the drawing, and the like). Therefore, in the case of a color display device having color elements of R (red), G (green), and B (blue), a minimum unit of an image is formed of three pixels of an R pixel, a G pixel, and a B pixel. Note that the color elements are not limited to three colors, and color elements of more than three colors may be used or a color other than RGB may be added. For example, RGBW may be used by adding white (W). In addition, RGB plus one or more colors of yellow, cyan, magenta and the like may be used. Further, for example, a color similar to at least one of R, G, and B may be added to RGB. For example, R, G, B1, and B2 may be used. Although both B1 and B2 are blue, they have different frequencies. By using such color elements, display which is closer to the real object can be performed and power consumption can be reduced. Furthermore, brightness of one color element may be controlled by using a plurality of regions. In this case, one color element corresponds to one pixel and each region which controls brightness of the pixel corresponds to a subpixel. Thus, for example, in the case of performing area ratio gray scale display, a plurality of regions which control brightness are provided in each color element and gray scales are expressed with the whole region. In this case, each region which controls brightness may correspond to a subpixel. Thus, in that case, one color element includes a plurality of subpixels. In that case, regions which contribute to display have different area dimensions depending on the subpixels in some cases. In addition, in the plurality of subpixels included in one color element, signals each supplied to the plurality of subpixels may be slightly varied to widen the viewing angle.

Note that in this document (the specification, the claim, the drawing, or the like), pixels are provided (arranged) in matrix in some cases. Here, description that pixels are provided (arranged) in matrix includes the case where the pixels are arranged in a straight line and the case where the pixels are arranged in a jagged line, in a longitudinal direction or a lateral direction. Thus, for example, in the case of performing full color display with three color elements (e.g., RGB), the following cases are included therein: the case where the pixels are arranged in stripes and the case where dots of the three color elements are arranged in a so-called delta pattern. In addition, the case is also included therein in which dots of the three color elements are provided in Bayer arrangement. Further, the size of display regions may be different between respective dots of color elements. Thus, power consumption can be reduced or the life of a display element can be prolonged.

Note that a light-emitting element in this document (the specification, the claim, the drawing, and the like) corresponds to an element, luminance of which can be controlled by the amount of current flowing to the element. Note that an EL element may be either an organic EL element or an inorganic EL element. For example, a light-emitting element such as an element used for a field emission display (an FED) or an element used for an SED (surface-conduction electron-emitter display) which is a kind of an FED can be employed as well as an EL element.

Note that in this document (the specification, the claim, the drawing, and the like), various types of transistors can be employed as a transistor without limiting to a certain type. For example, a thin film transistor (a TFT) including a non-single crystalline semiconductor film typified by amorphous silicon, polycrystalline silicon, microcrystalline (also referred to as semi-amorphous) silicon, or the like can be employed. In the case of using the TFT, there are various advantages. For example, since the TFT can be formed at temperature lower than that of the case of using single crystalline silicon, manufacturing cost can be reduced and a manufacturing device can be made larger. Since the manufacturing device can be made larger, the TFT can be formed using a large substrate. Therefore, since many display devices can be formed at the same time, the TFT can be formed at low cost. In addition, a substrate having low heat resistance can be used because of low manufacturing temperature. Therefore, the transistor can be formed over a light-transmitting substrate. Further, transmission of light in a display element can be controlled by using the transistor formed over the light-transmitting substrate. Alternatively, part of a film which forms the transistor can transmit light because film thickness of the transistor is thin. Accordingly, an aperture ratio can be improved.

Note that by using a catalyst (e.g., nickel) in the case of forming polycrystalline silicon, crystallinity can be further improved and a transistor having excellent electric characteristics can be formed. Accordingly, a gate driver circuit (e.g., a scan line driver circuit), a source driver circuit (e.g., a signal line driver circuit), and/or a signal processing circuit (e.g., a signal generation circuit, a gamma correction circuit, or a DA converter circuit) can be formed over the same substrate as a pixel portion.

Note that by using a catalyst (e.g., nickel) in the case of forming microcrystalline silicon, crystallinity can be further improved and a transistor having excellent electric characteristics can be formed. At this time, crystallinity can be improved by performing heat treatment without using a laser. Accordingly, a gate driver circuit (e.g., a scan line driver circuit) and part of a source driver circuit (e.g., an analog switch) can be formed over the same substrate. In addition, in the case of not using a laser for crystallization, crystallinity unevenness of silicon can be suppressed. Therefore, an image having high quality can be displayed.

Note that polycrystalline silicon and microcrystalline silicon can be formed without using a catalyst (e.g., nickel).

In addition, a transistor can be formed by using a semiconductor substrate, an SOI substrate, or the like. Therefore, a transistor with few variations in characteristics, sizes, shapes, or the like, with high current supply capacity, and with a small size can be formed. By using such a transistor, power consumption of a circuit can be reduced or a circuit can be highly integrated.

In addition, a transistor including a compound semiconductor or a oxide semiconductor such as ZnO, a-InGaZnO, SiGe, GaAs, indium zinc oxide (IZO), indium tin oxide (ITO), or SnO, and a thin film transistor or the like obtained by thinning such a compound semiconductor or a oxide semiconductor can be used. Therefore, manufacturing temperature can be lowered and for example, such a transistor can be formed at room temperature. Accordingly, the transistor can be formed directly on a substrate having low heat resistance such as a plastic substrate or a film substrate. Note that such a compound semiconductor or an oxide semiconductor can be used for not only a channel portion of the transistor but also other applications. For example, such a compound semiconductor or an oxide semiconductor can be used as a resistor, a pixel electrode, or a light-transmitting electrode. Further, since such an element can be formed at the same time as the transistor, cost can be reduced.

A transistor or the like formed by using an inkjet method or a printing method can also be used. Accordingly, a transistor can be formed at room temperature, can be formed at a low vacuum, or can be formed using a large substrate. In addition, since the transistor can be formed without using a mask (a reticle), layout of the transistor can be easily changed. Further, since it is not necessary to use a resist, material cost is reduced and the number of steps can be reduced. Furthermore, since a film is formed only in a necessary portion, a material is not wasted compared with a manufacturing method in which etching is performed after the film is formed over the entire surface, so that cost can be reduced.

Further, a transistor or the like including an organic semiconductor or a carbon nanotube can be used. Accordingly, such a transistor can be formed using a substrate which can be bent. Therefore, a device using a transistor or the like including an organic semiconductor or a carbon nanotube can resist a shock.

Furthermore, transistors with various structures can be used. For example, a MOS transistor, a junction transistor, a bipolar transistor, or the like can be used as a transistor described in this document (the specification, the claim, the drawing, and the like). By using a MOS transistor, the size of the transistor can be reduced. Thus, a plurality of transistors can be mounted. By using a bipolar transistor, large current can flow. Thus, a circuit can be operated at high speed.

Note that a MOS transistor, a bipolar transistor, and the like may be formed over one substrate. Thus, reduction in power consumption, reduction in size, a high speed operation, and the like can be realized.

Furthermore, various transistors can be used.

A transistor can be formed using various types of substrates. The type of a substrate where a transistor is formed is not limited to a certain type. For example, a single crystalline substrate, an SOI substrate, a glass substrate, a quartz substrate, a plastic substrate, a paper substrate, a cellophane substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), or the like), a leather substrate, a rubber substrate, a stainless steel substrate, a substrate including a stainless steel foil, or the like can be used as a substrate where the transistor is formed. Alternatively, a skin (e.g., epidermis or corium) or hypodermal tissue of an animal such as a human being can be used as a substrate where the transistor is formed. In addition, the transistor may be formed using one substrate, and then, the transistor may be transferred to another substrate. A single crystalline substrate, an SOI substrate, a glass substrate, a quartz substrate, a plastic substrate, a paper substrate, a cellophane substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), or the like), a leather substrate, a rubber substrate, a stainless steel substrate, a substrate including a stainless steel foil, or the like can be used as a substrate to which the transistor is transferred. Alternatively, a skin (e.g., epidermis or corium) or hypodermal tissue of an animal such as a human being can be used as a substrate to which the transistor is transferred. Further alternatively, the transistor may be formed using one substrate and the substrate may be thinned by polishing. A single crystalline substrate, an SOI substrate, a glass substrate, a quartz substrate, a plastic substrate, a paper substrate, a cellophane substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), or the like), a leather substrate, a rubber substrate, a stainless steel substrate, a substrate including a stainless steel foil, or the like can be used as a substrate to be polished. Alternatively, a skin (e.g., epidermis or corium) or hypodermal tissue of an animal such as a human being can be used as a substrate to be polished. By using such a substrate, a transistor with excellent properties or a transistor with low power consumption can be formed, a device with high durability or high heat resistance can be formed, or reduction in weight or thickness can be achieved.

Note that in this document (the specification, the claim, the drawing, and the like), description "be connected" is synonymous with description "be electrically connected". Accordingly, in structures disclosed in the present invention, another element which enables an electrical connection (e.g., a switch) may be interposed between elements having a predetermined connection relation.

Note that various types of switches can be used as a switch shown in this document (a specification, a claim, a drawing, or the like). An electrical switch, a mechanical switch, and the like are given as examples. That is, any element can be used as long as it can control a current flow, without limiting to a certain element. Thus, various switches can be used. For example, a transistor, a diode (e.g., a PN diode, a PIN diode, a Schottky diode, or a diode-connected transistor), a thyristor, or the like may be used. Alternatively, a logic circuit in which such elements are combined may be used. Thus, in the case of using a transistor as a switch, polarity (a conductivity type) of the transistor is not particularly limited because it operates just as a switch. However, a transistor of polarity with smaller off-current is preferably used when off-current is preferably small. A transistor provided with an LDD region, a transistor with a multi-gate structure, and the like are given as examples of a transistor with smaller off-current. In addition, it is preferable that an N-channel transistor be used when a potential of a source terminal of the transistor which is operated as a switch is closer to a potential of a low-potential-side power supply (e.g., VSS, GND, or 0 V), while a P-channel transistor be used when the potential of the source terminal is closer to a potential of a high-potential-side power supply (e.g., VDD). This is because the absolute value of gate-source voltage can be increased, so that the transistor can easily operate as a switch. Note that a CMOS switch may be used by using both N-channel and P-channel transistors. By using a CMOS switch, the switch can easily operate as a switch because current can flow when the P-channel transistor or the N-channel transistor is turned on. For example, voltage can be appropriately output regardless of whether voltage of an input signal of the switch is high or low. In addition, since a voltage amplitude value of a signal for turning on or off the switch can be made small, power consumption can be reduced.

In this document (the specification, the claim, the drawing, and the like), description that an object is formed "on" or formed "over" another object does not necessarily mean that the object is formed in direct contact with another object. The description includes the case where two objects are not in direct contact with each other, that is, the case where another object is interposed therebetween. Accordingly, for example, description that a layer B is formed on (or over) a layer A corresponds to both the case where the layer B is formed in direct contact with the layer A, and the case where another layer (e.g., a layer C or a layer D) is formed in direct contact with the layer A and the layer B is formed in direct contact with the layer C or D. Similarly, description that an object is formed above another object does not necessarily mean that the object is in direct contact with another object, and another object may be interposed therebetween. Accordingly, for example, description that a layer B is formed above a layer A corresponds to both the case where the layer B is formed in direct contact with the layer A, and the case where another layer (e.g., a layer C or a layer D) is formed in direct contact with the layer A and the layer B is formed in direct contact with the layer C or D. Similarly, description that an object is formed below or under another object corresponds to both the case where the objects are in direct contact with each other, and the case where the objects are not in contact with each other.

By using the present invention, variations of the current value which are caused by variations in the threshold voltage of a transistor can be suppressed. Therefore, desired current can be supplied to a load such as a light-emitting element. In particular, in the case of using a light-emitting element as a load, current supplied to the light-emitting element is determined without depending on the threshold voltage of a transistor because variations in the threshold voltage of the transistor can be compensated in a display device of the present invention. Thus, variations in luminance of the light-emitting element can be reduced, so that image quality of the display device can be improved.

BRIEF DESCRIPTION OF THE DRAWINGS

In the accompanying drawings:

FIGS. 44A and 44B are views each showing a structural example of a display panel used for a display device of the present invention;

FIGS. 50A and 50B are cross-sectional views each showing a structural example of a display device of the present invention;

FIGS. 51A and 51B are cross-sectional views each showing a structural example of a display device of the present invention;

FIGS. 52A and 52B are cross-sectional views each showing a structural example of a display device of the present invention;

FIGS. 53A and 53B are cross-sectional views each showing a structural example of a display device of the present invention;

FIGS. 55A to 55D are cross-sectional views showing a manufacturing method of a transistor used for a display device of the present invention;

FIGS. 56A to 56C are cross-sectional views showing a manufacturing method of a transistor used for a display device of the present invention;

FIGS. 58A to 58D are cross-sectional views showing a manufacturing method of a transistor used for a display device of the present invention;

FIGS. 59A to 59D are cross-sectional views showing a manufacturing method of a transistor used for a display device of the present invention;

FIGS. 60A and 60B are cross-sectional views showing a manufacturing method of a transistor used for a display device of the present invention;

DETAILED DESCRIPTION OF THE INVENTION

Hereinafter, the present invention will be described by way of embodiment modes with reference to the drawings. However, the present invention can be implemented in various different ways and it will be easily understood by those skilled in the art that various changes and modifications are possible. Unless such changes and modifications depart from the spirit and the scope of the present invention, they should be construed as being included therein. Therefore, the present invention should not be construed as being limited to the description of the embodiment modes.

[Embodiment Mode 1]

First, a basic structure of a pixel circuit in a display device of the present invention is described with reference to FIGS. 1 and 2. Note that an EL element is described as an example of a light-emitting element.

Figure 1:
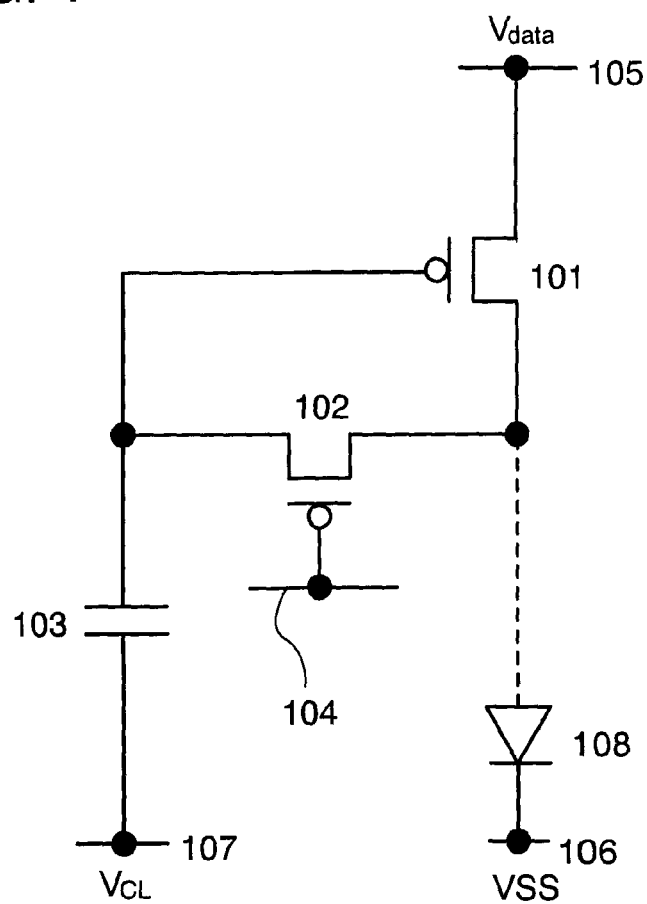
FIG. 1 is a diagram showing an example of a basic structure of a pixel in a display device of the present invention.

FIG. 1 is a diagram showing a circuit structure for acquiring voltage which is based on video signal voltage and the threshold voltage of a transistor in a pixel structure of this embodiment mode. FIG. 1 shows a circuit including a first transistor 101, a second transistor 102, a storage capacitor 103, a scan line 104, a signal line 105, a power supply line 106, a capacitor line 107, and a light-emitting element 108.

Note that in FIG. 1, the first transistor 101 and the second transistor 102 are P-channel transistors.

A gate electrode of the first transistor 101 is connected to a second electrode of the second transistor 102 and a first electrode of the storage capacitor 103; a first electrode of the first transistor 101 is connected to the signal line 105; and a second electrode of the first transistor 101 is connected to a first electrode of the second transistor 102. A gate electrode of the second transistor 102 is connected to the scan line 104. A second electrode of the storage capacitor 103 is connected to the capacitor line 107. A second electrode of the light-emitting element 108 is connected to the power supply line 106.

Video signal voltage $V_{data}$ is applied to the signal line 105 and a potential $V_{CL}$ is applied to the capacitor line 107. Note that a potential relationship is $V_{data} > V_{CL}$. In addition, a power supply potential VSS is applied to the power supply line 106.

Here, the first transistor 101 has a function of supplying current to the light-emitting element 108. The second transistor 102 has a function as a switch which makes the first transistor 101 be diode-connected.

Note that in this specification, a diode-connection corresponds to a state where a gate electrode of a transistor is connected to a first or second electrode of the transistor.

In the pixel circuit shown in FIG. 1, the first transistor 101 is diode-connected by turning on the second transistor 102, and current flows to the storage capacitor 103, so that the storage capacitor 103 is charged. Charging of the storage capacitor 103 continues until voltage held in the storage capacitor 103 reaches a potential obtained by subtracting the threshold voltage $|V_{th}|$ of the first transistor 101 and the potential $V_{CL}$ of the capacitor line 107 from the video signal voltage $V_{data}$, i.e., $V_{data}-|V_{th}|-V_{CL}$. When the voltage held in the storage capacitor 103 reaches $V_{data}-|V_{th}|-V_{CL}$, the first transistor 101 is turned off and current does not flow to the storage capacitor 103.

By the above-described operation, voltage based on the video signal voltage $V_{data}$ and the threshold voltage $|V_{th}|$ of the first transistor 101 can be held in the storage capacitor 103.

Figure 2:
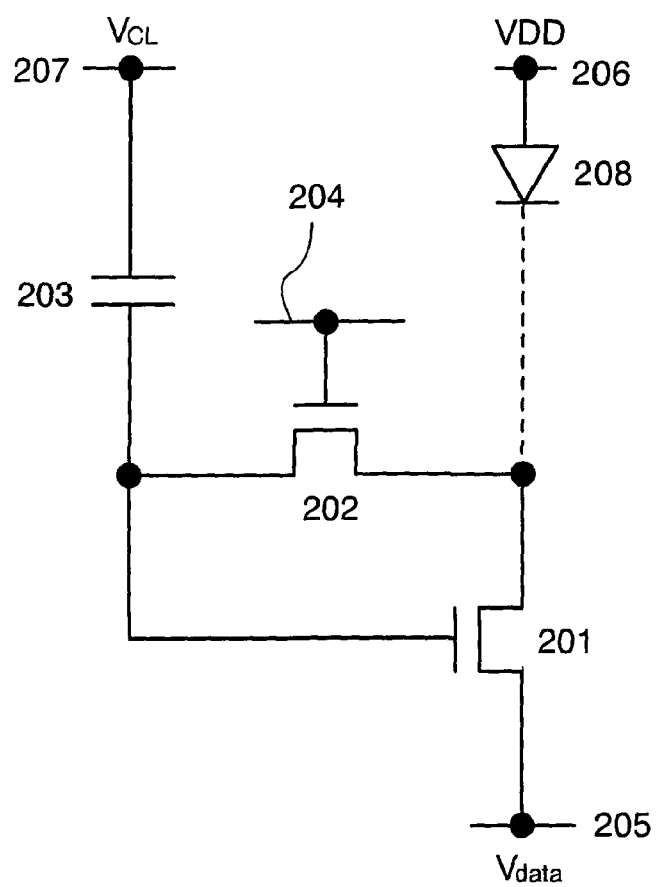
FIG. 2 is a diagram showing an example of a basic structure of a pixel in a display device of the present invention.

FIG. 2 shows a circuit structure for acquiring the threshold voltage of the first transistor in the case where the first transistor is an N-channel transistor.

FIG. 2 shows a circuit including a first transistor 201, a second transistor 202, a storage capacitor 203, a scan line 204, a signal line 205, a power supply line 206, a capacitor line 207, and a light-emitting element 208.

Note that in FIG. 2, the second transistor 202 is an N-channel transistor.

A video signal voltage $V_{data}$ is applied to the signal line 205 and a potential $V_{CL}$ is applied to the capacitor line 207. Note that a potential relationship is $V_{data} > V_{CL}$. In addition, a power supply potential VDD is applied to the power supply line 206.

In the pixel circuit shown in FIG. 2, the first transistor 201 is diode-connected by turning on the second transistor 202, and current flows to the storage capacitor 203, so that the storage capacitor 203 is charged. Charging of the storage capacitor 203 continues until voltage held in the storage capacitor 203 reaches a potential obtained by subtracting the video signal voltage $V_{data}$ and the threshold voltage $|V_{th}|$ of the first transistor 201 from the potential $V_{CL}$ of the capacitor line 207, i.e., $V_{CL}-V_{data}-|V_{th}|$. When the voltage held in the storage capacitor 203 reaches $V_{CL}-V_{data}-|V_{th}|$, the first transistor 201 is turned off and current does not flow to the storage capacitor 203.

By the above-described operation, voltage based on the video signal voltage $V_{data}$ and the threshold voltage $|V_{th}|$ of the first transistor 201 can be held in the storage capacitor 203.

Note that in each of FIGS. 1 and 2, the second transistor has a function as a switch which makes the first transistor be diode-connected. Thus, another element having a function as a switch may be used instead of the second transistor. For example, a diode (e.g., a PN diode, a PIN diode, a Schottky diode, or a diode-connected transistor), a thyristor, or the like may be used. Alternatively, a logic circuit in which such elements are combined may be used.

Next, a pixel structure of this embodiment which includes the basic circuit structure shown in FIG. 1 or FIG. 2 is described. Note that an EL element is described as an example of a light-emitting element.

Figure 3:
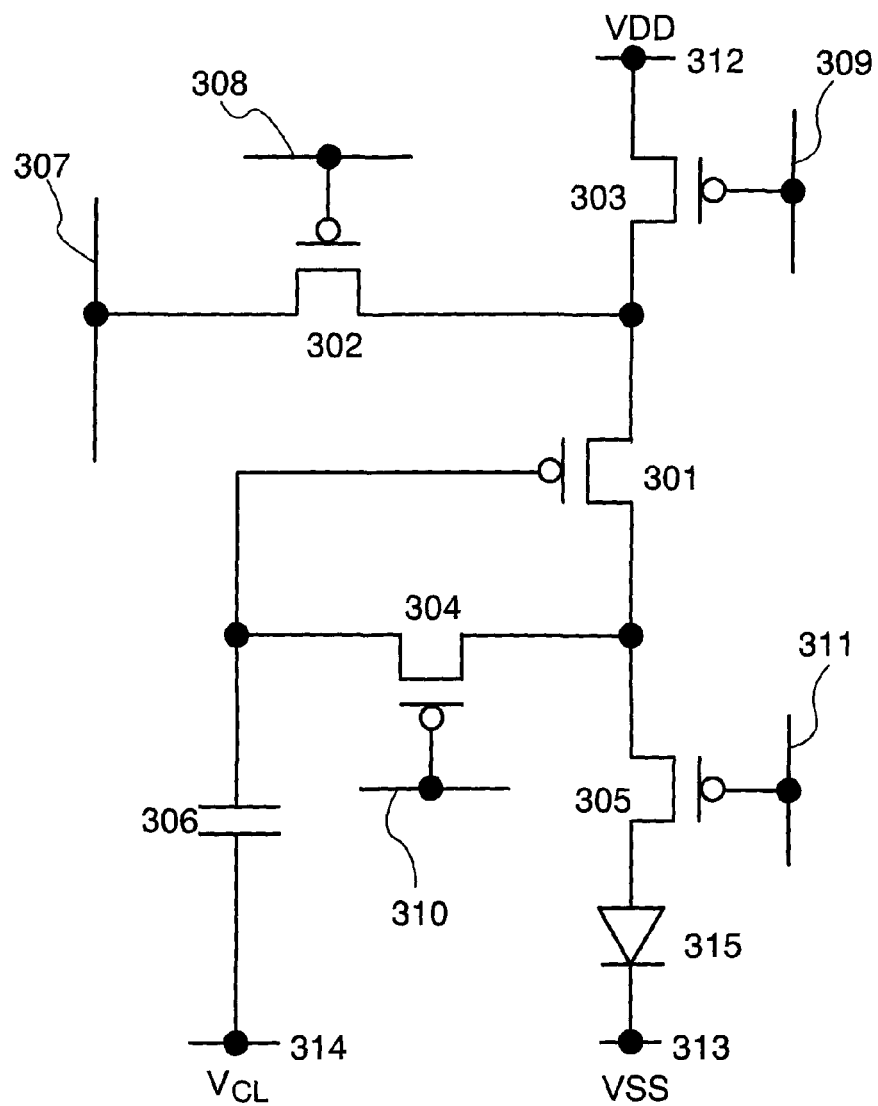
FIG. 3 is a diagram showing an example of a pixel structure in a display device of the present invention.

FIG. 3 is a diagram showing a pixel circuit of this embodiment mode. The pixel circuit of this embodiment mode includes a first transistor 301 to a fifth transistor 305, a storage capacitor 306, a signal line 307, a first scan line 308 to a fourth scan line 311, a first power supply line 312, a second power supply line 313, a capacitor line 314, and a light-emitting element 315.

Here, the first transistor 301 is used as a transistor which supplies current to the light-emitting element 315. Each of the second transistor 302 to the fifth transistor 305 is used as a switch which determines whether to connect a wiring.

A gate electrode of the first transistor 301 is connected to a second electrode of the fourth transistor 304 and a first electrode of the storage capacitor 306; a first electrode of the first transistor 301 is connected to a second electrode of the second transistor 302 and a second electrode of the third transistor 303; and a second electrode of the first transistor 301 is connected to a first electrode of the fourth transistor 304 and a first electrode of the fifth transistor 305. A gate electrode of the second transistor 302 is connected to the first scan line 308, and a first electrode of the second transistor 302 is connected to the signal line 307. A gate electrode of the third transistor 303 is connected to the second scan line 309, and a first electrode of the third transistor 303 is connected to the first power supply line 312. A gate electrode of the fourth transistor 304 is connected to the third scan line 310. A gate electrode of the fifth transistor 305 is connected to the fourth scan line 311, and a second electrode of the fifth transistor 305 is connected to a first electrode of the light-emitting element 315. A second electrode of the storage capacitor 306 is connected to the capacitor line 314. A second electrode of the light-emitting element 315 is connected to the second power supply line 313.

A power supply potential VDD is applied to the first power supply line 312, a power supply potential VSS is applied to the second power supply line 313, and a potential $V_{CL}$ is applied to the capacitor line 314. Note that a potential relationship is VDD>VSS and VDD>$V_{CL}$.

Note that in the pixel circuit shown in FIG. 3, all the first transistor 301 to the fifth transistor 305 are P-channel transistors.

Note that the first transistor 301 in FIG. 3 corresponds to the first transistor 101 in FIG. 1. In addition, the fourth transistor 304 in FIG. 3 corresponds to the second transistor 102 in FIG. 1. Further, the second power supply line 313 in FIG. 3 corresponds to the power supply line 106 in FIG. 1.

Next, operations of the pixel circuit of this embodiment mode are described with reference to FIGS. 4 to 7.

Figure 4:
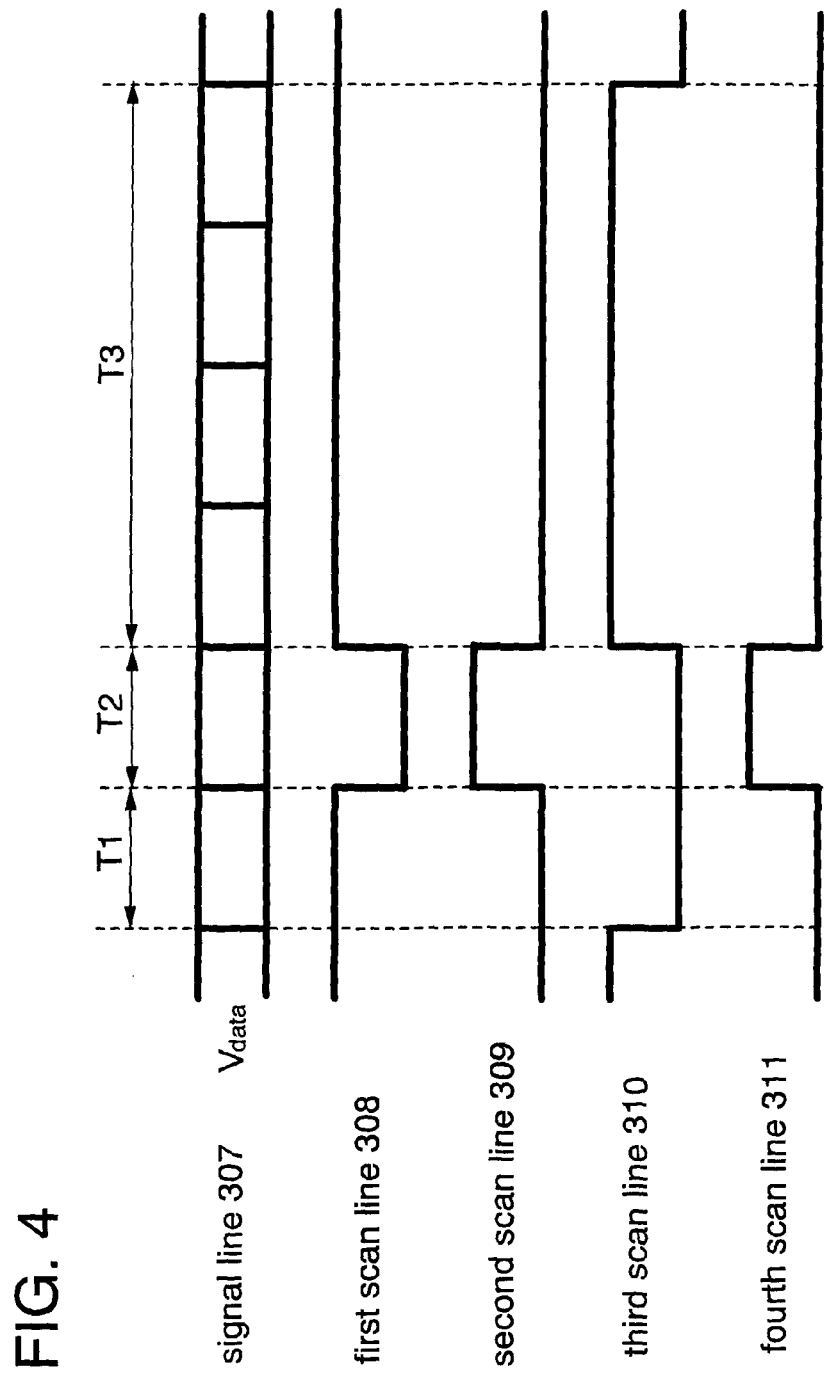
FIG. 4 is a diagram showing a timing chart of a pixel circuit in a display device of the present invention.

FIG. 4 shows a timing chart of video signal voltage and pulses which are input to the signal line 307 and the first scan line 308 to the fourth scan line 311. The whole period is divided into three periods of a first period T1 to a third period T3 in accordance with each operation of the pixel circuits shown in FIGS. 5 to 7.

Figure 5:
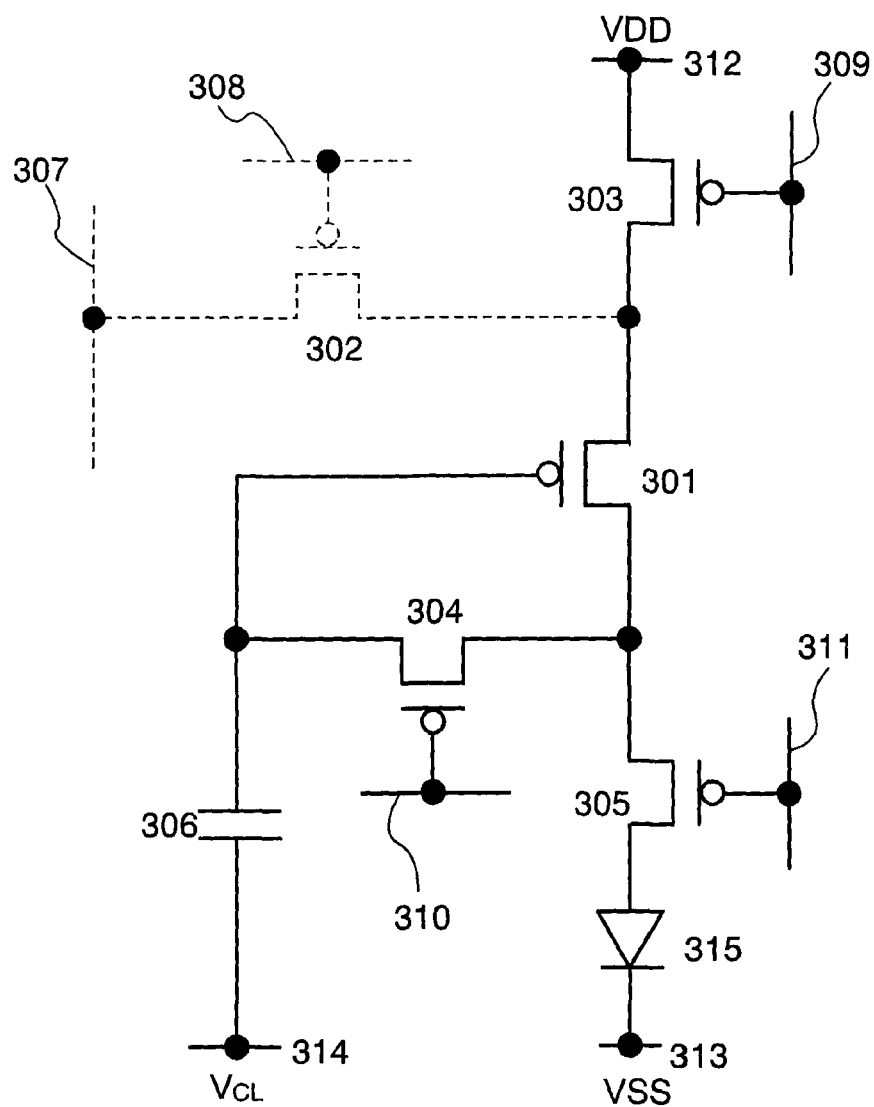
FIG. 5 is a diagram showing an operation of a pixel circuit in a display device of the present invention.
Figure 6:
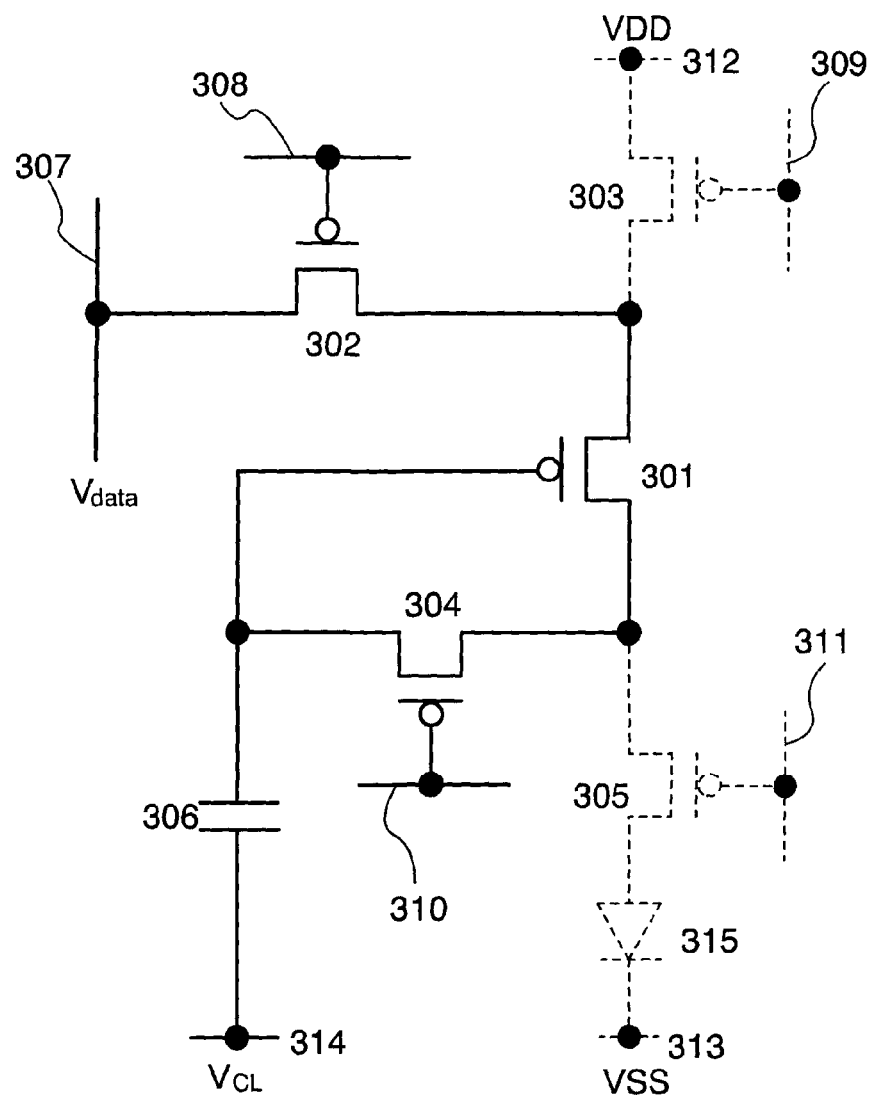
FIG. 6 is a diagram showing an operation of a pixel circuit in a display device of the present invention.
Figure 7:
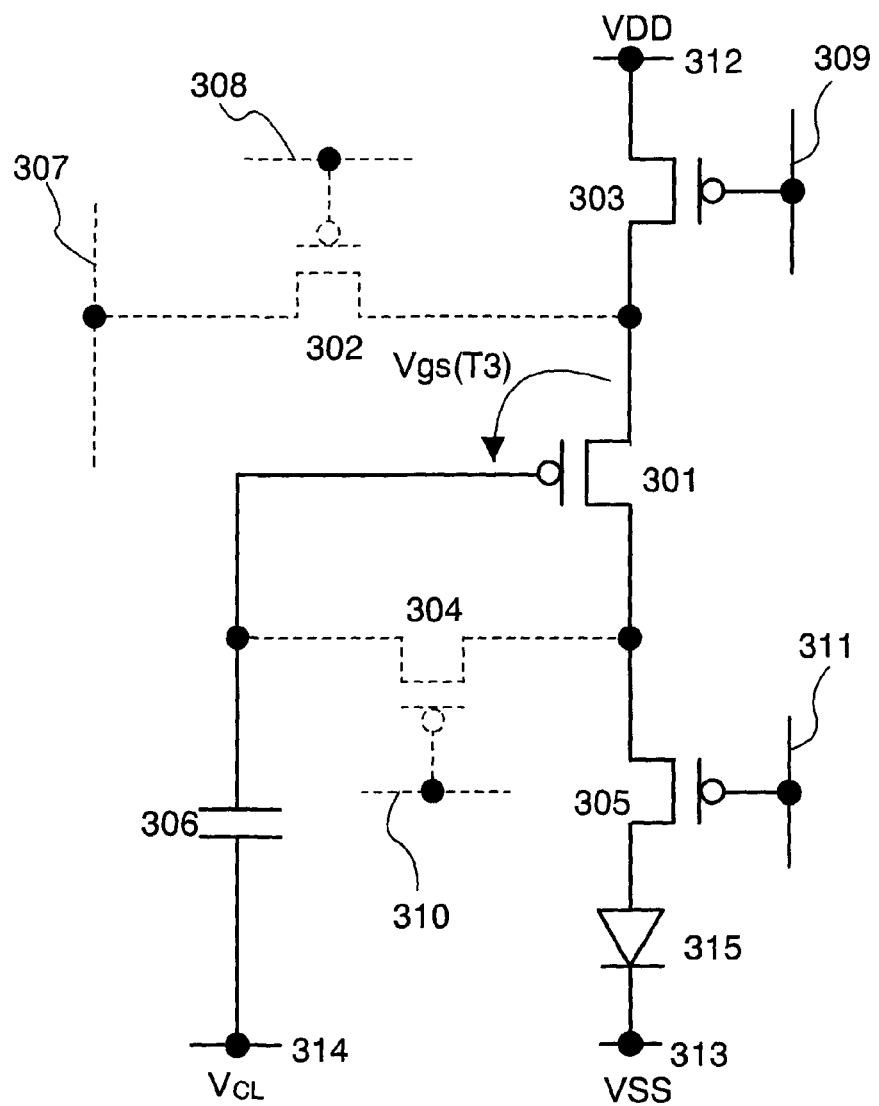
FIG. 7 is a diagram showing an operation of a pixel circuit in a display device of the present invention.

In addition, FIGS. 5 to 7 show connection states of the pixel circuit of this embodiment in each period. In FIGS. 5 to 7, portions shown by solid lines are on and portions shown by dashed lines are off.

First, an operation of the pixel circuit in the first period T1 is described with reference to FIG. 5. FIG. 5 is a diagram showing a connection state of the pixel circuit in the first period T1. In the first period T1, the second scan line 309 to the fourth scan line 311 become an L level, and the third transistor 303 to the fifth transistor 305 are turned on. In addition, the first scan line 308 becomes an H level and the second transistor 302 is turned off. Thus, the first transistor 301 is diode-connected and current flows to the light-emitting element 315. Accordingly, potentials of the second electrode of the first transistor 301 and the first electrode of the storage capacitor 306 decrease, so that certain voltage is held in the storage capacitor 306. Potentials of the second electrode of the first transistor 301 and the first electrode of the storage capacitor 306 in completion of the first period are referred to as initial potentials in this specification, and voltage held in the storage capacitor 306 is referred to as initial voltage.

By the above-described operation, certain initial voltage is held in the storage capacitor 306 in the first period T1. In this specification, this operation is referred to as initialization.

Next, an operation of the pixel circuit in the second period T2 is described with reference to FIG. 6. FIG. 6 is a diagram showing a connection state of the pixel circuit in the second period T2. In the second period T2, the first scan line 308 and the third scan line 310 become an L level, and the second transistor 302 and the fourth transistor 304 are turned on. In addition, the second scan line 309 and the fourth scan line 311 become an H level, and the third transistor 303 and the fifth transistor 305 are turned off. In addition, video signal voltage $V_{data}$ is applied to the signal line 307. Thus, the first electrode of the first transistor 301 is connected to the signal line 307 and the first transistor 301 is diode-connected, and current flows to the storage capacitor 306, so that the storage capacitor 306 is charged. Charging of the storage capacitor 306 continues until voltage held in the storage capacitor 306 reaches a potential obtained by subtracting the threshold voltage $|V_{th}|$ of the first transistor 301 and the potential $V_{CL}$ of the capacitor line 314 from the video signal voltage $V_{data}$, i.e., $V_{data}-|V_{th}|-V_{CL}$. When the voltage held in the storage capacitor 306 reaches $V_{data}-|V_{th}|-V_{CL}$, the first transistor 301 is turned off and current does not flow to the storage capacitor 306.

By the above-described operation, voltage based on the video signal voltage $V_{data}$ and the threshold voltage $|V_{th}|$ of the first transistor 301 is held in the storage capacitor 306 in the second period T2.

Note that in order to hold the voltage based on the video signal voltage $V_{data}$ and the threshold voltage $|V_{th}|$ of the first transistor 301 in the storage capacitor 306 in the second period T2, a potential of the second electrode of the first transistor 301 is necessarily set lower than a potential obtained by subtracting the threshold voltage $|V_{th}|$ of the first transistor 301 from the video signal voltage $V_{data}$, i.e., $V_{data}-|V_{th}|$ in advance. Therefore, by supplying current to the light-emitting element 315 in the first period T1, a potential of the second electrode of the first transistor 301 can be surely set lower than $V_{data}-|V_{th}|$, so that the threshold voltage can be surely held in the storage capacitor 306.

Next, an operation of the pixel circuit in the third period T3 is described with reference to FIG. 7. FIG. 7 is a diagram showing a connection state of the pixel circuit in the third period T3. In the third period T3, the second scan line 309 and the fourth scan line 311 become an L level, and the third transistor 303 and the fifth transistor 305 are turned on. In addition, the first scan line 308 and the third scan line 310 become an H level, and the second transistor 302 and the fourth transistor 304 are turned off. Thus, the first electrode of the first transistor 301 is connected to the first power supply line 312. Further, when gate-source voltage of the first transistor 301 in the third period T3 is denoted by $V_{gs}(T3)$, $V_{gs}(T3)$ is represented by the following Formula (1) because the sum of the voltage $V_{data}-|V_{th}|-V_{CL}$ held in the storage capacitor 306 in the first period T1 and the potential $V_{CL}$ of the capacitor line 314 is applied to the gate electrode of the first transistor 301.

$$|V_{gs}(T3)|=VDD-(V_{data}-|V_{th}|)=VDD-V_{data}+|V_{th}| \quad (1)$$

Therefore, current $I_{OLED}$ flowing between a drain and a source of the first transistor 301 can be represented by the following Formula (2), and this current flows to the light-emitting element 315 through the fifth transistor 305, so that the light-emitting element 315 emits light.

$$I_{OLED} = \frac{\beta}{2}(|V_{gs}(T3)|-|V_{th}|)^2 = \frac{\beta}{2}(VDD-V_{data})^2 \quad (2)$$

Note that $\beta$ is a constant which is determined by mobility or the size of a transistor, capacitance of an oxide film, or the like.

By the above-described operation, the current $I_{OLED}$ which is dependent on the video signal voltage $V_{data}$ is supplied to the light-emitting element 315 in the third period T3, so that the light-emitting element 315 emits light.

Here, functions of the first transistor 301 to the fifth transistor 305 in an operation process of the pixel circuit shown in FIG. 3 are described.

The first transistor 301 has a function of supplying current to the light-emitting element 315 in the third period T3.

The second transistor 302 functions as a switch which connects the first electrode of the first transistor 301 and the signal line 307 so that the video signal voltage $V_{data}$ is input to a pixel in the second period T2.

The third transistor 303 functions as a switch which connects the first electrode of the first transistor 301 and the first power supply line 312 so that the potential of the first power supply line 312 is applied to the first electrode of the first transistor 301 in the first period T1 and the third period T3.

The fourth transistor 304 functions as a switch which sets the first transistor 301 to a diode-connection state so that voltage based on the threshold voltage $|V_{th}|$ of the first transistor 301 is held in the storage capacitor 306 in the second period T2.

The fifth transistor 305 operates such that it supplies current to the light-emitting element 315 in the first period T1 and the third period T3 and does not supply current to the light-emitting element 315 in the second period T2. That is, the fifth transistor 305 functions as a switch which connects the second electrode of the first transistor 301 and the first electrode of the light-emitting element 315 so that supply of current to the light-emitting element 315 is controlled.

By the above-described operation process, the current $I_{OLED}$ is supplied to the light-emitting element 315, so that the light-emitting element 315 can emit light at luminance corresponding to the current $I_{OLED}$. At this time, as shown in Formula (2), the current $I_{OLED}$ flowing to the light-emitting element 315 is independent of the threshold voltage $|V_{th}|$ of the first transistor 301. Therefore, variations in the threshold voltage of the transistor can be compensated.

Note that in order to hold the voltage based on the video signal voltage $V_{data}$ and the threshold voltage $|V_{th}|$ of the first transistor 301 in the storage capacitor 306 in the second period T2 and to turn on the first transistor 301 in the third period T3, a range of the video signal voltage $V_{data}$ is set to $V_{CL}+|V_{th}|<V_{data} \leq VDD$.

Note that it is only necessary that the potential $V_{CL}$ of the capacitor line 314 be lower than a potential obtained by subtracting the threshold voltage $|V_{th}|$ of the first transistor 301 from the video signal voltage $V_{data}$, i.e., $V_{data}-|V_{th}|$. Note that the voltage $V_{CL}$ of the capacitor line 314 is preferably as low as possible so that the voltage based on the video signal voltage $V_{data}$ and the threshold voltage $|V_{th}|$ of the first transistor 301 can be surely held in the storage capacitor 306.

Although the first transistor 301 is a P-channel transistor in the pixel circuit shown in FIG. 3, the first transistor 301 may be an N-channel transistor. Here, FIG. 8 shows a pixel structure in the case where the first transistor is an N-channel transistor.

Figure 8:
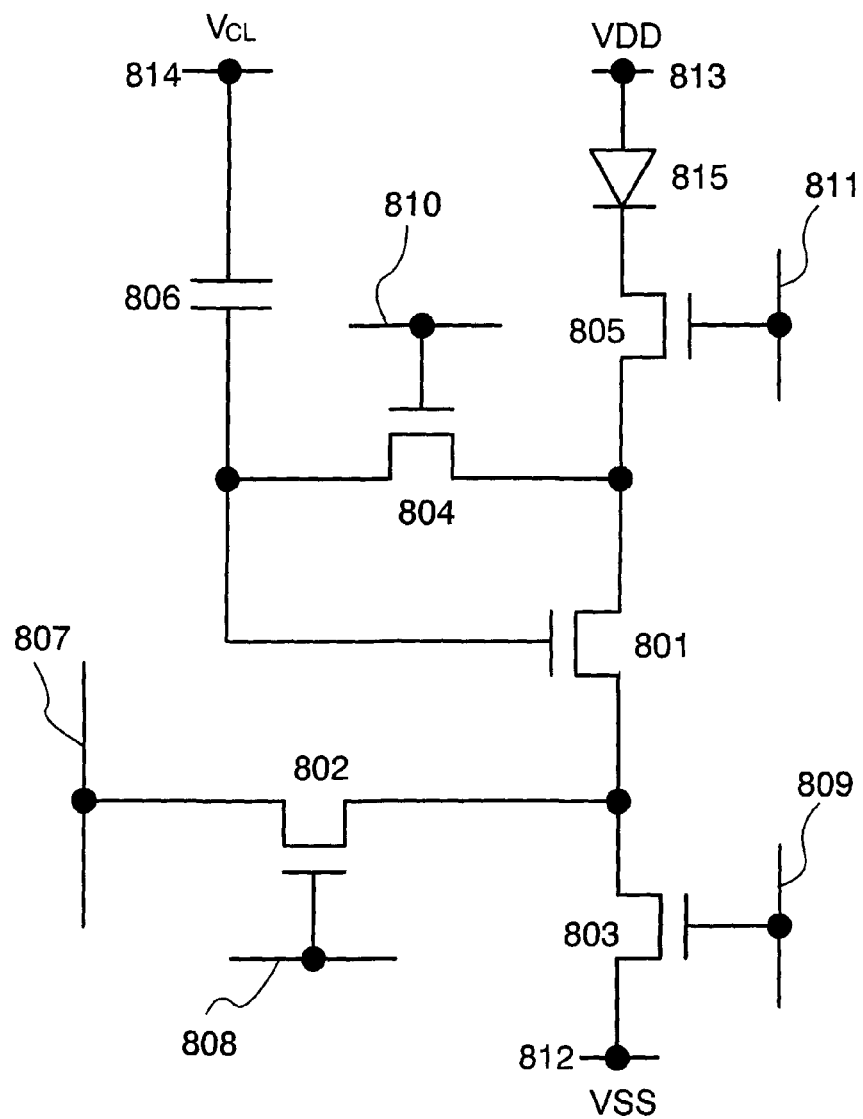
FIG. 8 is a diagram showing an example of a pixel structure in a display device of the present invention.

FIG. 8 is a diagram showing a circuit diagram of the pixel circuit of this embodiment mode. The pixel circuit of this embodiment mode includes a first transistor 801 to a fifth transistor 805, a storage capacitor 806, a signal line 807, a first scan line 808 to a fourth scan line 811, a first power supply line 812, a second power supply line 813, a capacitor line 814, and a light-emitting element 815.

Note that in the pixel circuit in FIG. 8, all the second transistor 802 to the fifth transistor 805 are N-channel transistors.

Here, the first transistor 801 is used as a transistor which supplies current to the light-emitting element 815. Each of the second transistor 802 to the fifth transistor 805 is used as a switch which determines whether to connect a wiring.

A gate electrode of the first transistor 801 is connected to a second electrode of the fourth transistor 804 and a first electrode of the storage capacitor 806; a first electrode of the first transistor 801 is connected to a second electrode of the second transistor 802 and a second electrode of the third transistor 803; and a second electrode of the first transistor 801 is connected to a first electrode of the fourth transistor 804 and a first electrode of the fifth transistor 805. A gate electrode of the second transistor 802 is connected to the first scan line 808, and a first electrode of the second transistor 802 is connected to the signal line 807. A gate electrode of the third transistor 803 is connected to the second scan line 809, and a first electrode of the third transistor 803 is connected to the first power supply line 812. A gate electrode of the fourth transistor 804 is connected to the third scan line 810. A gate electrode of the fifth transistor 805 is connected to the fourth scan line 811, and a second electrode of the fifth transistor 805 is connected to a second electrode of the light-emitting element 815. A second electrode of the storage capacitor 806 is connected to the capacitor line 814. A first electrode of the light-emitting element 815 is connected to the second power supply line 813.

A power supply potential VSS is applied to the first power supply line 812, a power supply potential VDD is applied to the second power supply line 813, and a potential $V_{CL}$ is applied to the capacitor line 814. Note that a potential relationship is VDD>VSS and $V_{CL}$>VSS.

Note that the first transistor 801 in FIG. 8 corresponds to the first transistor 201 in FIG. 2. In addition, the fourth transistor 804 in FIG. 8 corresponds to the second transistor 202 in FIG. 2. Further, the second power supply line 813 in FIG. 8 corresponds to the power supply line 206 in FIG. 2.

Next, operations of the pixel circuit of this embodiment mode are described with reference to FIG. 9.

Figure 9:
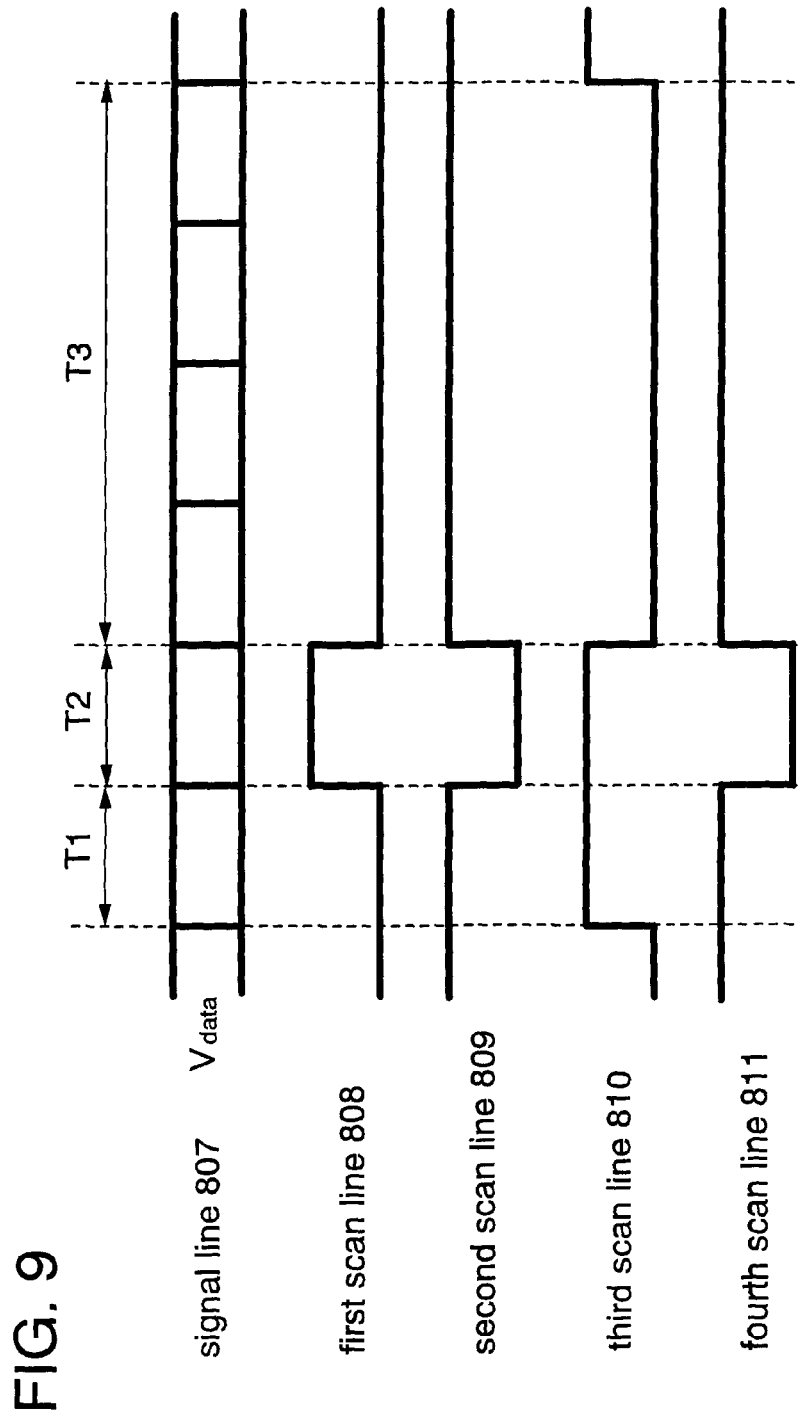
FIG. 9 is a diagram showing a timing chart of a pixel circuit in a display device of the present invention.

FIG. 9 shows a timing chart of video signal voltage and pulses which are input to the signal line 807 and the first scan line 808 to the fourth scan line 811. Since all the first to fifth transistors are N-channel transistors, timing of pulses (an H level/an L level) which are input to the first scan line 808 to the fourth scan line 811 is inverted from timing in the case where all the transistors are P-channel transistors (FIG. 4). In addition, the whole period is divided into three periods of a first period T1 to a third period T3 in accordance with each operation of the pixel circuit.

The operations of the pixel circuit in FIG. 8 in the first period T1 to the third period T3 are the same as the operations of the pixel circuit shown in FIG. 3. That is, certain initial voltage is held in the storage capacitor 806 in the first period T1. That is, initialization is performed. Next, voltage based on the video signal voltage $V_{data}$ and the threshold voltage $|V_{th}|$ of the first transistor 801 is held in the storage capacitor 806 in the second period T2. Then, in the third period T3, the current $I_{OLED}$ which is dependent on the video signal voltage $V_{data}$ is supplied to the light-emitting element 815, so that the light-emitting element 815 emits light. Note that the current $I_{OLED}$ which is supplied to the light-emitting element 815 can be represented by the following Formula (3).

$$I_{OLED} = \frac{\beta}{2}(V_{data} - VSS)^2 \quad (3)$$

Note that in order to hold the voltage based on the video signal voltage $V_{data}$ and the threshold voltage $|V_{th}|$ of the first transistor 801 in the storage capacitor 806 in the second period T2, a potential of the second electrode of the first transistor 801 is necessarily set higher than the sum of the video signal voltage $V_{data}$ and the threshold voltage $|V_{th}|$ of the first transistor 801, i.e., $V_{data}+|V_{th}|$ in advance. Therefore, by supplying current to the light-emitting element 815 in the first period T1, a potential of the second electrode of the first transistor 801 can be surely set higher than $V_{data}+|V_{th}|$, so that the threshold voltage can be surely held in the storage capacitor 806 and variations in the threshold voltage of the transistor can be surely compensated.

Note that in an operation process of the pixel circuit shown in FIG. 8, functions of the first transistor 801 to the fifth transistor 805 are the same as the functions of the first transistor 301 to the fifth transistor 305 in the pixel circuit shown in FIG. 3.

By the above-described operation process, the current $I_{OLED}$ is supplied to the light-emitting element 815, so that the light-emitting element 815 can emit light at luminance corresponding to the current $I_{OLED}$. At this time, as shown in Formula (3), the current $I_{OLED}$ flowing to the light-emitting element 815 is independent of the threshold voltage $|V_{th}|$ of the first transistor 801. Therefore, variations in the threshold voltage of the transistor can be compensated.

Note that in order to hold the voltage based the video signal voltage $V_{data}$ and the threshold voltage $|V_{th}|$ of the first transistor 801 in the storage capacitor 806 in the second period T2 and to turn on the first transistor 801 in the third period T3, a range of the video signal voltage $V_{data}$ is set to VSS≦$V_{data}$≦$V_{CL}$−$|V_{th}|$.

Note that it is only necessary that the potential $V_{CL}$ of the capacitor line 814 be higher than the sum of the video signal voltage $V_{data}$ and the threshold voltage $|V_{th}|$ of the first transistor 801, i.e., $V_{data}+|V_{th}|$. Note that the voltage $V_{CL}$ of the capacitor line 814 is preferably as high as possible so that the voltage based on the video signal voltage $V_{data}$ and the threshold voltage $|V_{th}|$ of the first transistor 801 can be surely held in the storage capacitor 806.

As described above, by using the pixel structure of this embodiment mode, variations in the threshold voltage of transistors can be compensated and variations in luminance can be reduced. Therefore, image quality can be improved.

In addition, in the pixel circuit of this embodiment mode, as shown by Formula (2) and Formula (3), the current $I_{OLED}$ flowing to the light-emitting element has an almost constant value when the level of the video signal voltage $V_{data}$ is determined. Therefore, constant current in accordance with the video signal voltage can be supplied to the light-emitting element, so that the light-emitting element can emit light at constant luminance. Therefore, luminance unevenness in the light-emitting period T3 is reduced.

Since the current $I_{OLED}$ flowing to the light-emitting element is independent of a capacitance value of the storage capacitor, constant current can be supplied to the light-emitting element even when the capacitance value varies between each pixel by a manufacturing error such as misalignment of mask patterns in manufacturing, for example.

Further, in the pixel circuit of this embodiment mode, by performing acquisition of the threshold voltage $|V_{th}|$ of the first transistor and acquisition of the video signal voltage $V_{data}$ in the same period, a preparation period for emission of the light-emitting element can be further decreased, so that the light-emitting period can be increased with respect to one frame period. Therefore, duty ratio (ratio of a light-emitting period in one frame period) can be increased and voltage applied to the light-emitting element can be decreased. Thus, power consumption can be reduced and deterioration of the light-emitting element can be suppressed.

Since the preparation period for emission of the light-emitting element can be further decreased, the length of one frame period can be further decreased and frame frequency can be further increased. Thus, a pseudo contour or a flicker in displaying moving images or the like can be suppressed, so that image quality can be improved.

Note that although the first electrode of the first transistor is connected to the first power supply line through the third transistor when initialization is performed in the first period T1 in this embodiment mode, the connection portion of the first electrode of the first transistor is not limited to this. The first electrode of the first transistor may be connected to the signal line through the second transistor, and initialization may be performed by applying a potential which turns on the first transistor to the signal line.

Note that although the first electrode of the first transistor is connected to the first power supply line through the third transistor when current is supplied to the light-emitting element in the third period T3 in this embodiment mode, the connection portion of the first electrode of the first transistor is not limited to this. The first electrode of the first transistor may be connected to the signal line through the second transistor, and current may be supplied to the light-emitting element by applying a potential which turns on the first transistor to the signal line.

Note that in this embodiment mode, the storage capacitor may be formed using either metal or a MOS transistor. In particular, when the storage capacitor is formed using a MOS transistor, an area occupied by the storage capacitor can be made smaller than that of the case where the storage capacitor is formed of metal, so that the aperture ratio of pixels can be improved.

Figure 10:
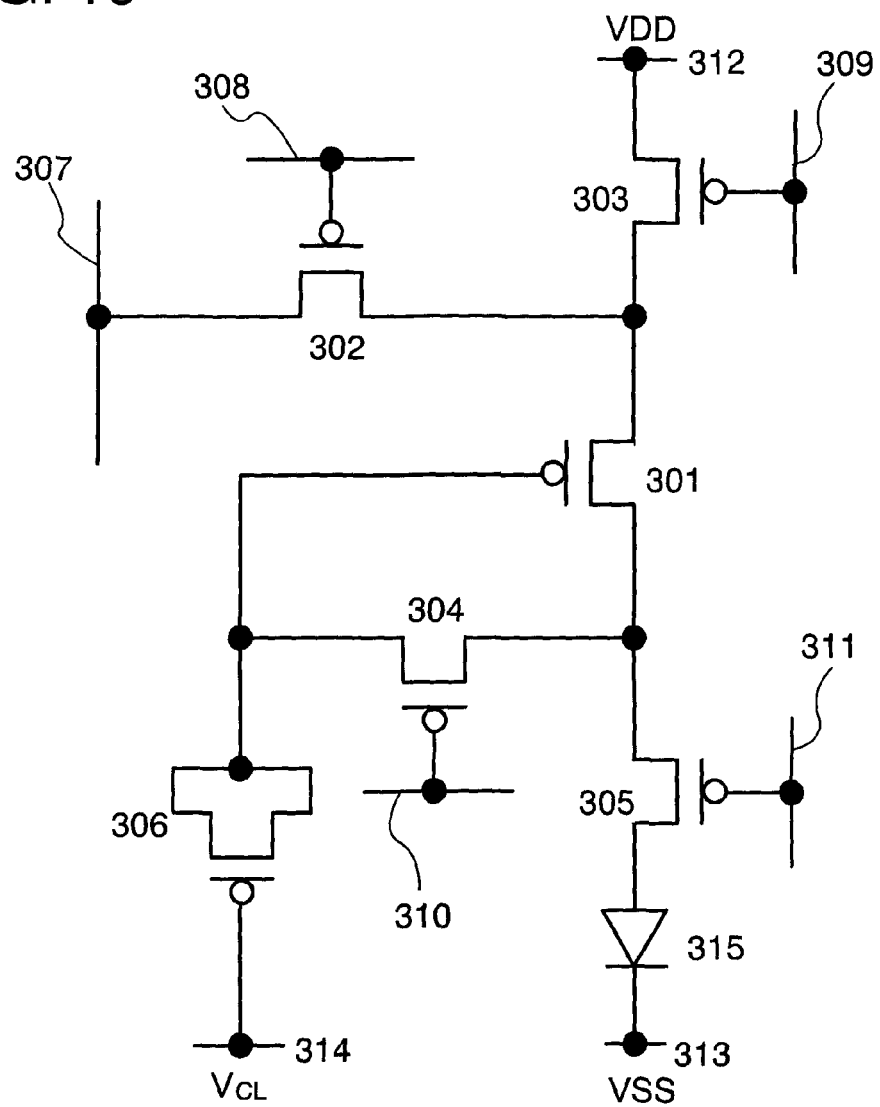
FIG. 10 is a diagram showing an example of a pixel structure in a display device of the present invention.
Figure 11:
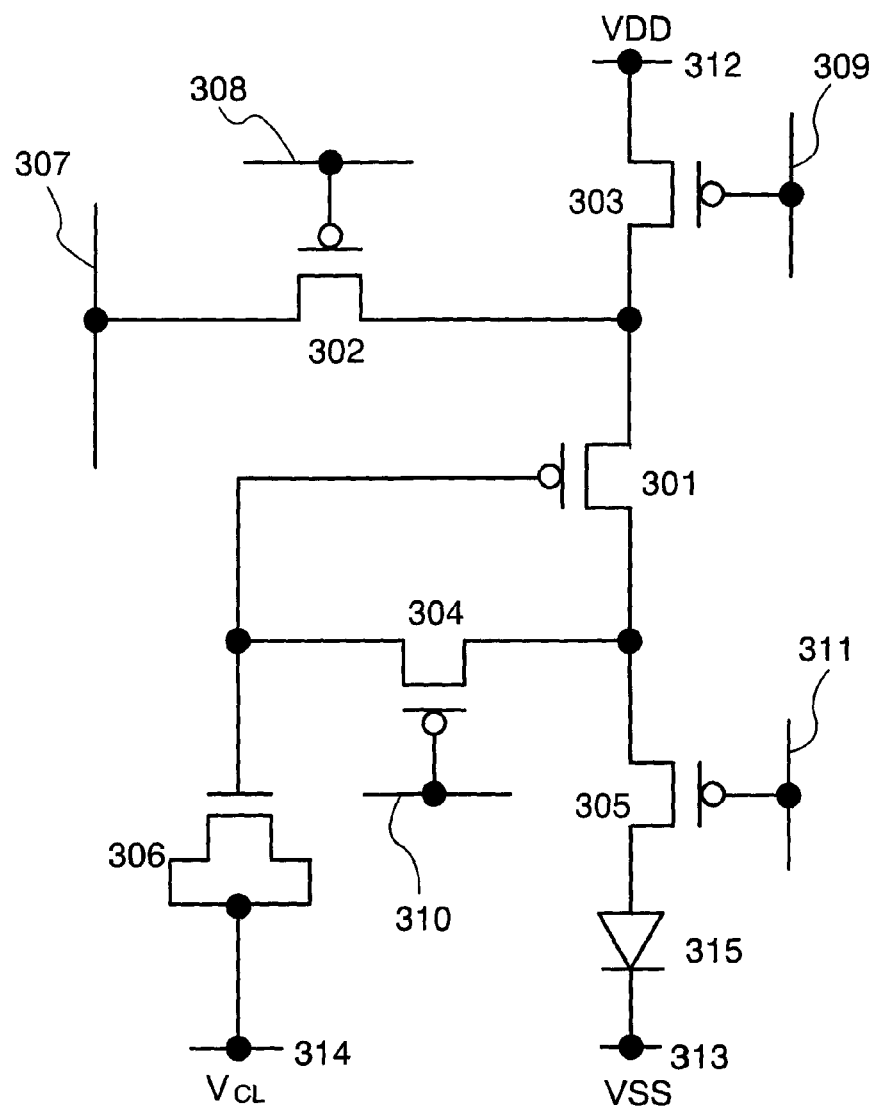
FIG. 11 is a diagram showing an example of a pixel structure in a display device of the present invention.

For example, FIGS. 10 and 11 show the case the storage capacitor is formed using a MOS transistor in the pixel circuit shown in FIG. 3.

FIG. 10 shows the case where the storage capacitor 306 is formed using a P-channel transistor. When a storage capacitor is formed using a P-channel transistor, a potential of a gate electrode of the P-channel transistor is necessarily set lower than potentials of first and second electrodes of the P-channel transistor because it is necessary to induce a channel region in the P-channel transistor for holding charges. In the case of the pixel circuit shown in FIG. 3, the first electrode of the storage capacitor 306 has a higher potential than that of the second electrode of the storage capacitor 306. Therefore, in order to make the P-channel transistor function as a storage capacitor, the first and second electrodes of the P-channel transistor serve as the first electrode of the storage capacitor 306 and are connected to the gate electrode of the first transistor 301 and the second electrode of the fourth transistor 304. In addition, the gate electrode of the P-channel transistor serves as the second electrode of the storage capacitor 306 and is connected to the capacitor line 314.

FIG. 11 shows the case where the storage capacitor 306 is formed using an N-channel transistor. When a storage capacitor is formed using an N-channel transistor, a potential of a gate electrode of the N-channel transistor is necessarily set higher than potentials of first and second electrodes of the N-channel transistor because it is necessary to induce a channel region in the N-channel transistor for holding charges. Therefore, in order to make the N-channel transistor function as a storage capacitor, the gate electrode of the N-channel transistor serves as the first electrode of the storage capacitor 306 and is connected to the gate electrode of the first transistor 301 and the second electrode of the fourth transistor 304. In addition, the first and second electrodes of the N-channel transistor serve as the second electrode of the storage capacitor 306 and are connected to the capacitor line 314.

Figure 12:
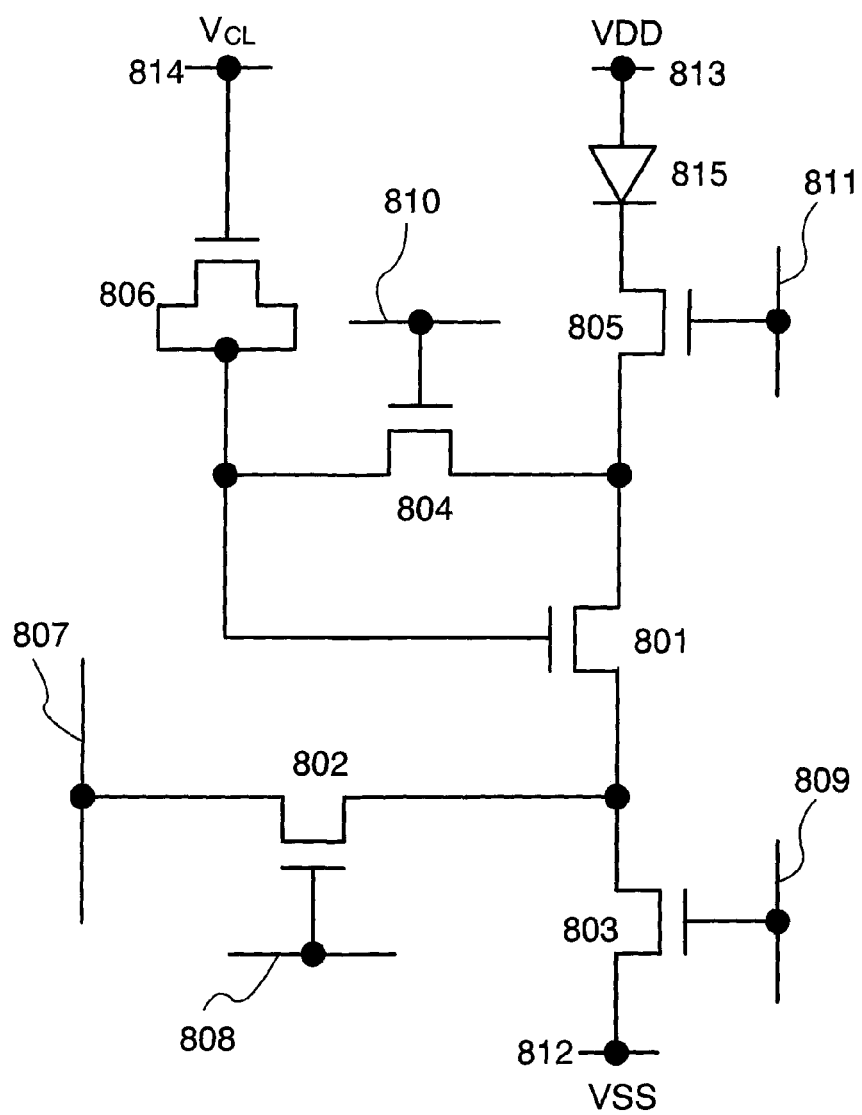
FIG. 12 is a diagram showing an example of a pixel structure in a display device of the present invention.
Figure 13:
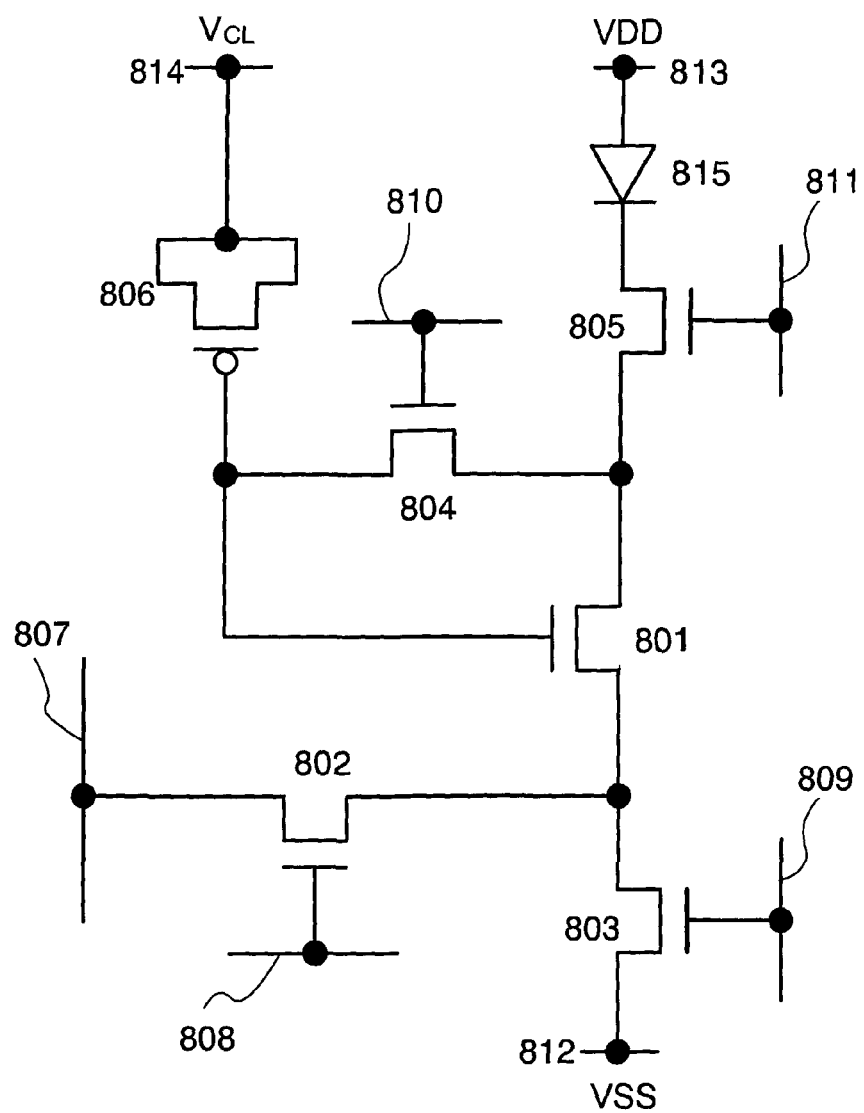
FIG. 13 is a diagram showing an example of a pixel structure in a display device of the present invention.

As another example, FIGS. 12 and 13 show the case where the storage capacitor is formed using a MOS transistor in the pixel circuit in FIG. 8.

FIG. 12 shows the case where the storage capacitor 806 is formed using an N-channel transistor. In the case of the pixel circuit in FIG. 8, the second electrode of the storage capacitor 806 has a higher potential than that of the first electrode of the storage capacitor 806. Therefore, in order to make the N-channel transistor function as a storage capacitor, first and second electrodes of the N-channel transistor serve as the first electrode of the storage capacitor 806 and are connected to the gate electrode of the first transistor 801 and the second electrode of the fourth transistor 804. In addition, a gate electrode of the N-channel transistor serves as the second electrode of the storage capacitor 806 and is connected to the capacitor line 814.

FIG. 13 shows the case where the storage capacitor 806 is formed using a P-channel transistor. In order to make the P-channel transistor function as a storage capacitor, a gate electrode of the P-channel transistor serves as the first electrode of the storage capacitor 806 and is connected to the gate electrode of the first transistor 801 and the second electrode of the fourth transistor 804. In addition, first and second electrodes of the P-channel transistor serve as the second electrode of the storage capacitor 806 and are connected to the capacitor line 814.

By connecting the storage capacitor between the gate electrode of the first transistor and the capacitor line as in this embodiment mode, when the storage capacitor is particularly formed using a MOS transistor, voltage higher than the threshold voltage of the MOS transistor is always applied between a gate and a source of the MOS transistor. Therefore, a channel region can be always induced in the MOS transistor and it can always function as a storage capacitor. Thus, desired voltage can be accurately held in the storage capacitor in the operation process of the pixel circuit.

In addition, in the pixel structure of this embodiment mode, when the first transistor is formed so as to have the largest value of W/L (ratio of the channel width W to the channel length L) among the values of W/L of the first to fifth transistors, current flowing between a drain and a source of the first transistor can be further increased. Thus, an operation of acquiring voltage based on the video signal voltage $V_{data}$ and the threshold voltage $|V_{th}|$ of the first transistor in the second period T2 can be performed with larger current, so that a faster operation can be performed. Further, the current $I_{OLED}$ flowing to the light-emitting element in the third period T3 can be further increased, so that luminance can be further increased.

Note that in this embodiment mode, since timing at which pulses are input to the second scan line and the fourth scan line is the same, the third transistor and the fifth transistor may be controlled with the second scan line or the fourth scan line.

Figure 14:
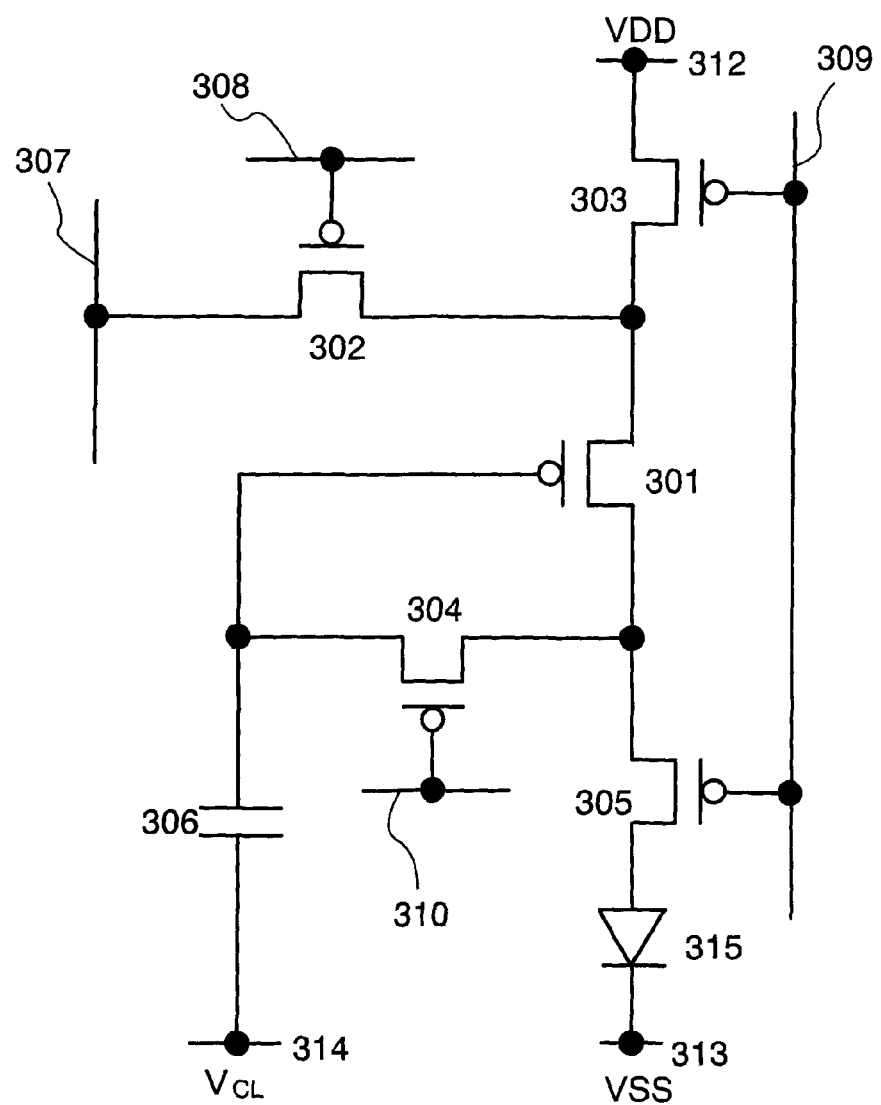
FIG. 14 is a diagram showing an example of a pixel structure in a display device of the present invention.

For example, FIG. 14 shows an example where the third transistor 303 and the fifth transistor 305 are controlled with the second scan line 309 in the pixel circuit shown in FIG. 3. Note that in FIG. 14, the gate electrodes of the third transistor 303 and the fifth transistor 305 are connected to the second scan line 309.

Figure 15:
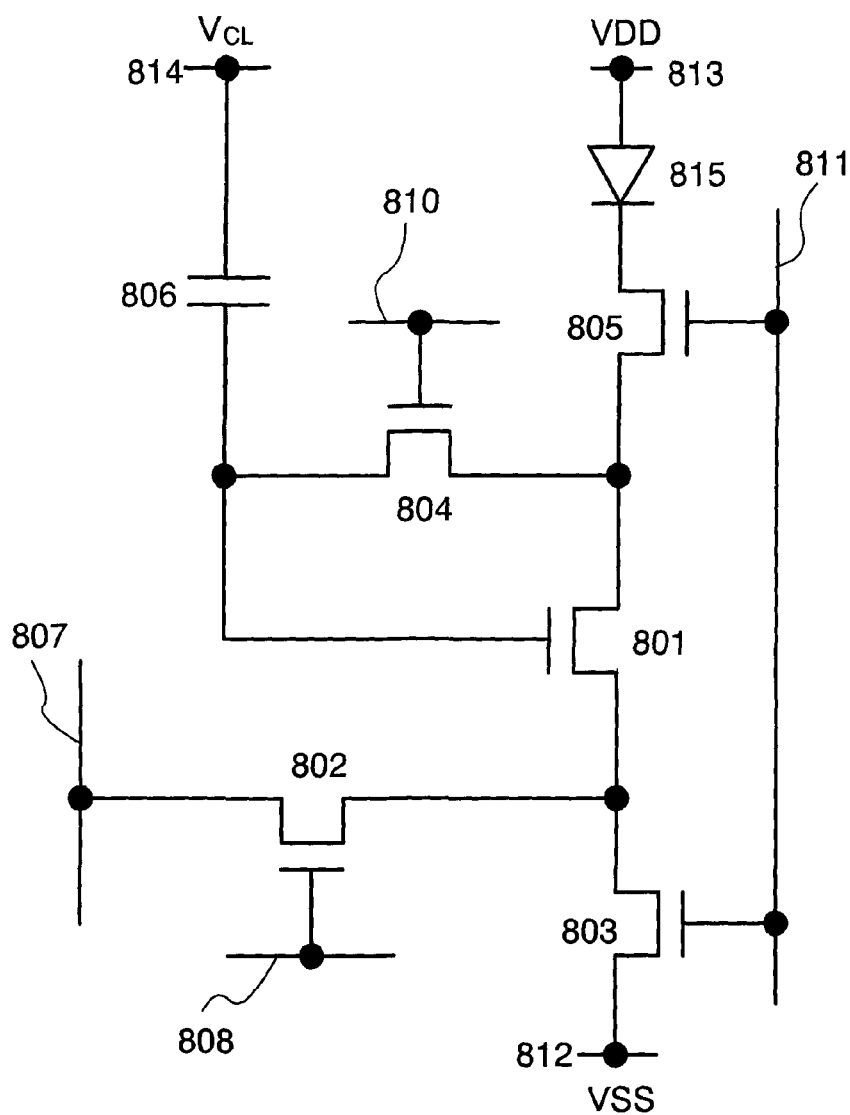
FIG. 15 is a diagram showing an example of a pixel structure in a display device of the present invention.

In addition, FIG. 15 shows another example where the third transistor 803 and the fifth transistor 805 are controlled with the fourth scan line 811 in the pixel circuit shown in FIG. 8.

Note that in FIG. 15, the gate electrodes of the third transistor 803 and the fifth transistor 805 are connected to the fourth scan line 811.

By controlling the third transistor and the fifth transistor with the same scan line in this manner, the number of scan lines can be reduced, so that the aperture ratio of pixels can be improved.

Note that although all the second to fifth transistors are transistors with the same conductivity type such as P-channel transistors or N-channel transistors in this embodiment mode, the present invention is not limited to this. The circuit may be formed by using both P-channel transistors and N-channel transistors.

Figure 16:
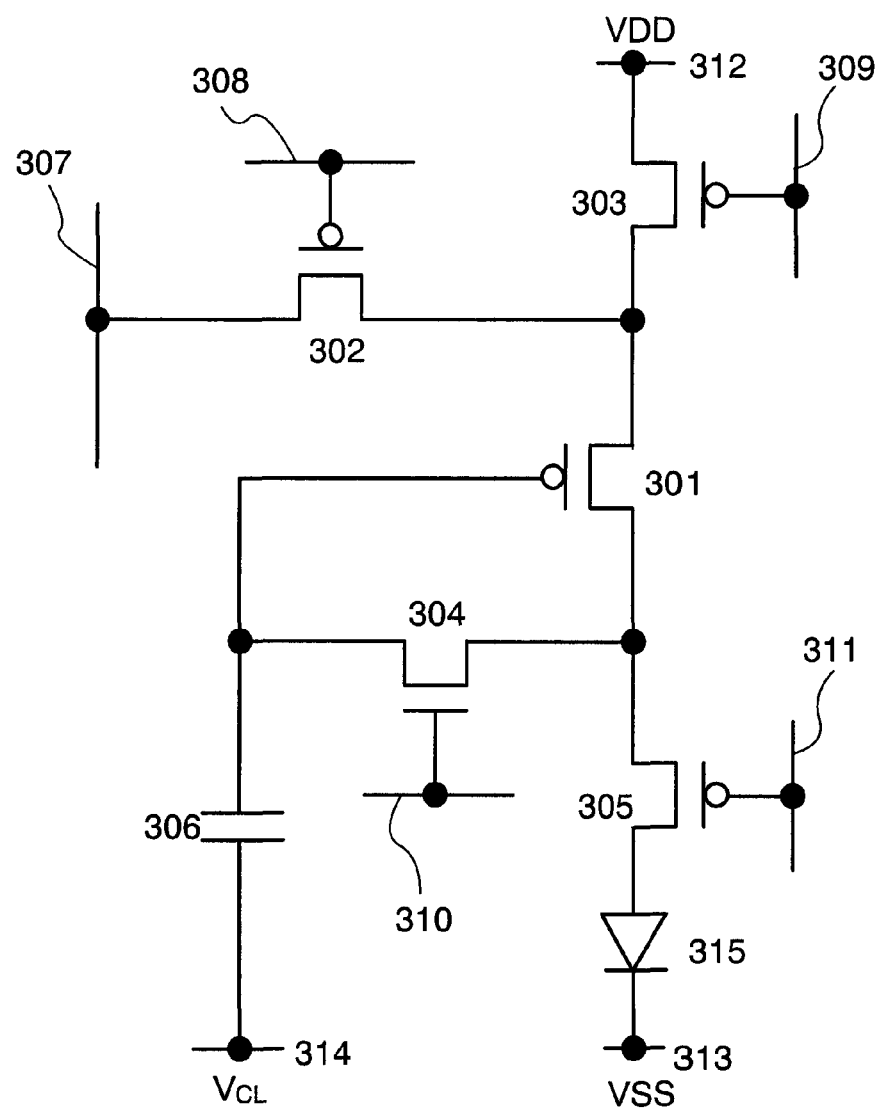
FIG. 16 is a diagram showing an example of a pixel structure in a display device of the present invention.
Figure 17:
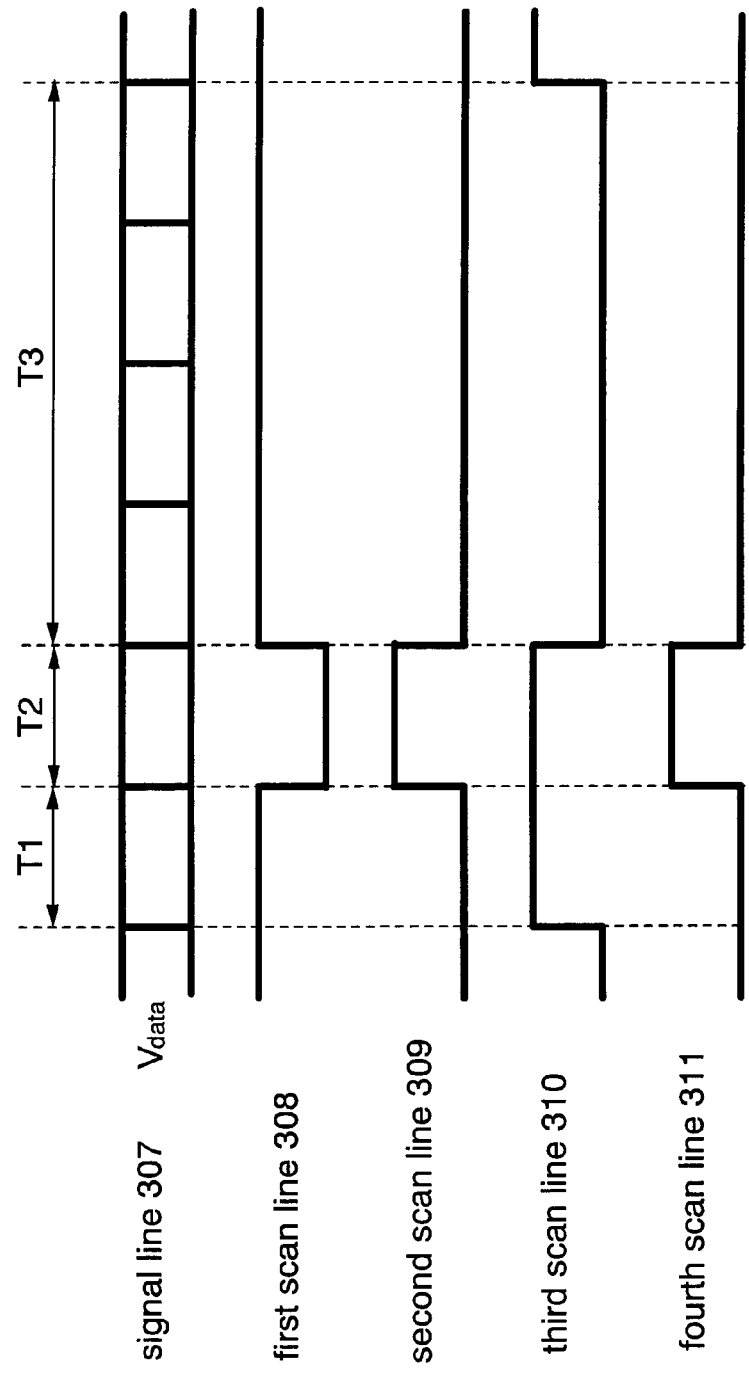
FIG. 17 is a diagram showing a timing chart of a pixel circuit in a display device of the present invention.

For example, in FIG. 3, the fourth transistor 304 may be an N-channel transistor, and the transistors other than the fourth transistor 304 may be P-channel transistors. FIG. 16 shows a pixel circuit of this case. In addition, FIG. 17 shows a timing chart of video signal voltage and pulses which are input to the signal line 307 and the first scan line 308 to the fourth scan line 311.

When the fourth transistor 304 is an N-channel transistor in this manner, leakage current of the fourth transistor 304 can be made less than that of the case of using a P-channel transistor. Therefore, leakage of charges held in the storage capacitor 306 decreased, so that fluctuations of voltage held in the storage capacitor 306 are reduced. Thus, constant voltage is always applied to the gate electrode of the first transistor 301 particularly in the light-emitting period (T3), so that constant current can be supplied to the light-emitting element 315. Accordingly, the light-emitting element 315 can emit light at constant luminance, so that luminance unevenness can be reduced.

Figure 18:
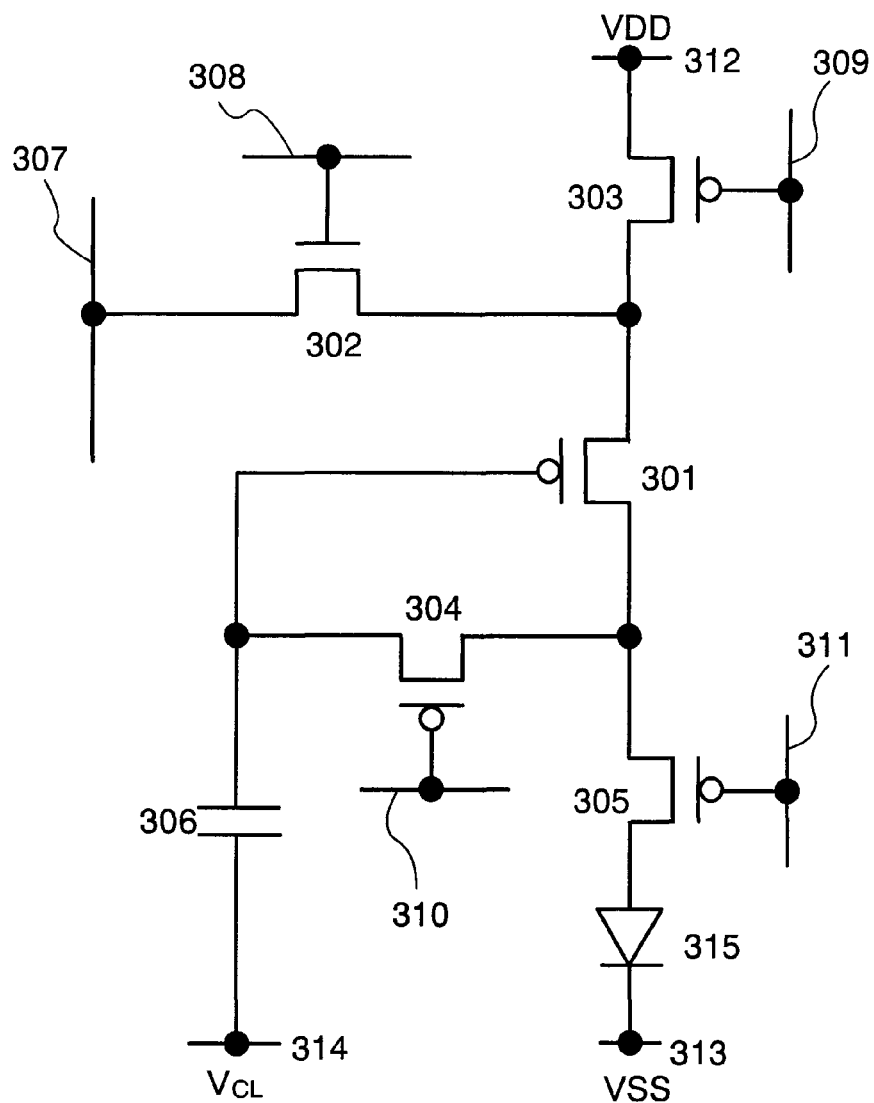
FIG. 18 is a diagram showing an example of a pixel structure in a display device of the present invention.
Figure 19:
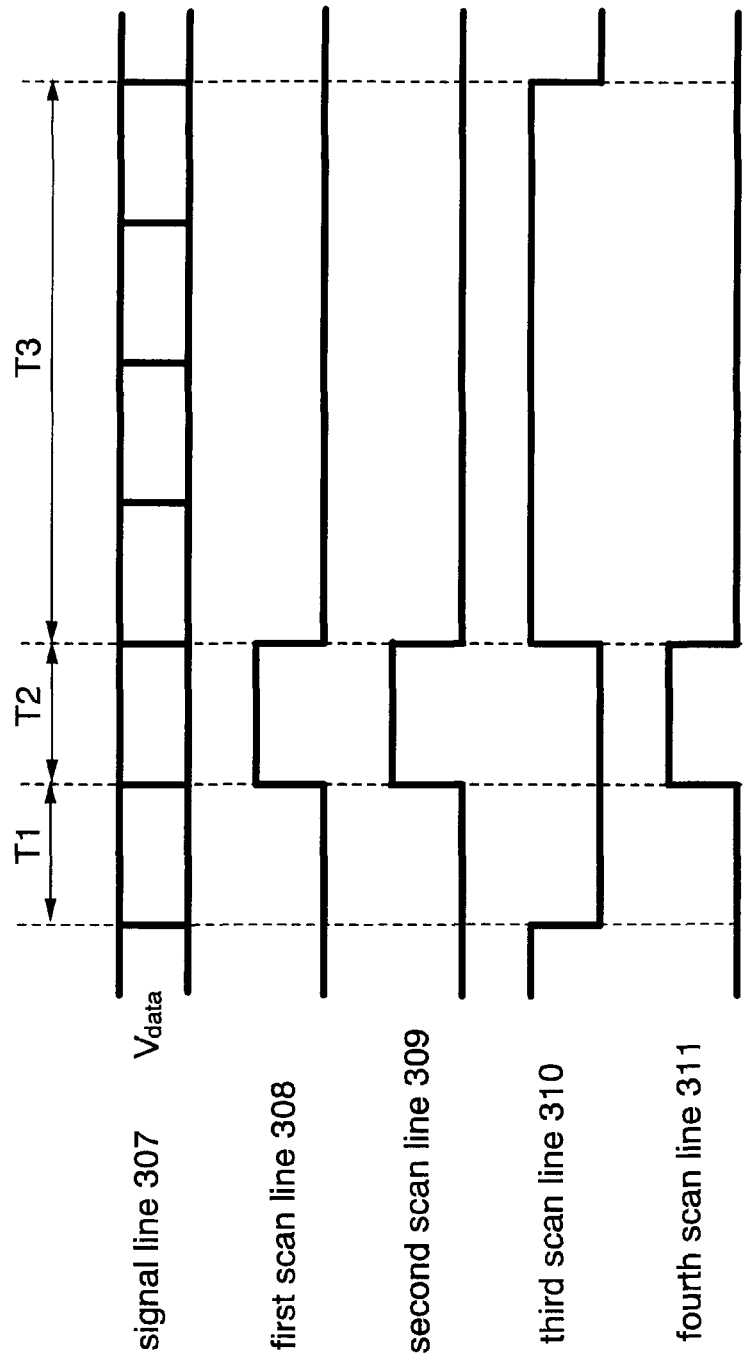
FIG. 19 is a diagram showing a timing chart of a pixel circuit in a display device of the present invention.

As another example, in FIG. 3, the second transistor 302 may be an N-channel transistor, and the transistors other than the second transistor 302 may be P-channel transistors. FIG. 18 shows a pixel circuit of this case. In addition, FIG. 19 shows a timing chart of video signal voltage and pulses which are input to the signal line 307 and the first scan line 308 to the fourth scan line 311.

When the second transistor 302 is an N-channel transistor in this manner, timings at which pulses are input to the first scan line 308, the second scan line 309, and the fourth scan line 311 is the same, so that the second transistor 302, the third transistor 303, and the fifth transistor 305 can be controlled with any one of the first scan line 308, the second scan line 309, and the fourth scan line 311.

Figure 20:
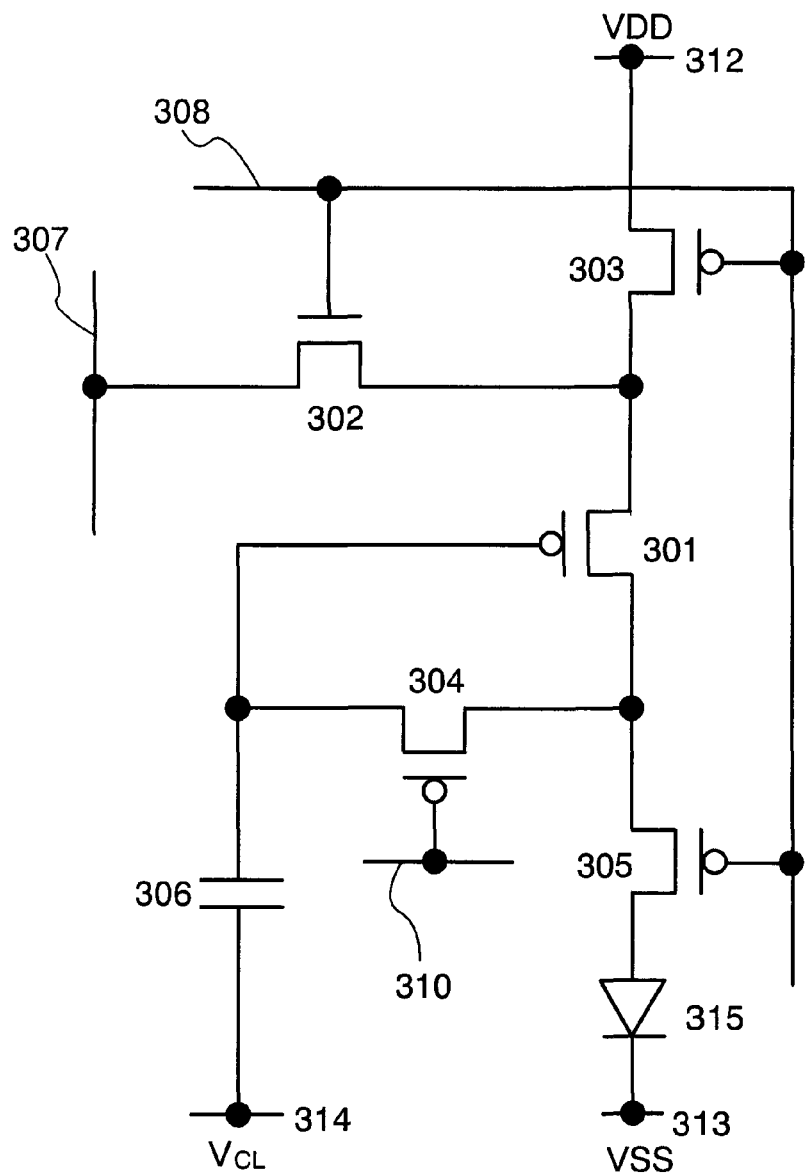
FIG. 20 is diagram showing an example of a pixel structure in a display device of the present invention.

Here, FIG. 20 shows the case where the second transistor 302, the third transistor 303, and the fifth transistor 305 are controlled with the first scan line 308. Note that in FIG. 20, the gate electrode of the second transistor 302, the gate electrode of the third transistor 303, and the gate electrode of the fifth transistor 305 are connected to the first scan line 308.

By forming the second transistor so as to have a conductivity type which is different from those of the transistors other than the second transistor in this manner, the number of scan lines can be reduced, so that the aperture ratio of pixels can be improved.

Note that the conductivity types of the second transistor to the fifth transistor are not limited to the above description.

Note that this embodiment mode shows an example of an embodied case of the contents (or may be part of the contents) described in other embodiment modes, an example of slight transformation thereof, an example of partial modification thereof, an example of improvement thereof, an example of detailed description thereof, an application example thereof, an example of related part thereof, or the like. Therefore, the contents described in other embodiment modes can be freely applied to, combined with, or replaced with this embodiment mode.

Although this embodiment mode is described with reference to various drawings, the contents (or may be part of the contents) described in each drawing can be freely applied to, combined with, or replaced with the contents (or may be part of the contents) described in another drawing. Further, even more drawings can be formed by combining each part with another part in the above-described drawings.

Similarly, the contents (or may be part of the contents) described in each drawing of this embodiment mode can be freely applied to, combined with, or replaced with the contents (or may be part of the contents) described in a drawing in another embodiment mode. Further, even more drawings can be formed by combining each part with part of another embodiment mode in the drawings of this embodiment mode.

[Embodiment Mode 2]

Although a capacitor line is separately provided in Embodiment Mode 1, another wiring which has been already provided may be used instead of the capacitor line. For example, by using any one of first to fourth scan lines included in a pixel of another row instead of the capacitor line, a capacitor line included in the pixel can be omitted. In this embodiment mode, the case is described in which any one of first to fourth scan lines included in a pixel of another row is used instead of the capacitor line included in the pixel. Note that an EL element is described as an example of a light-emitting element.

Figure 21:
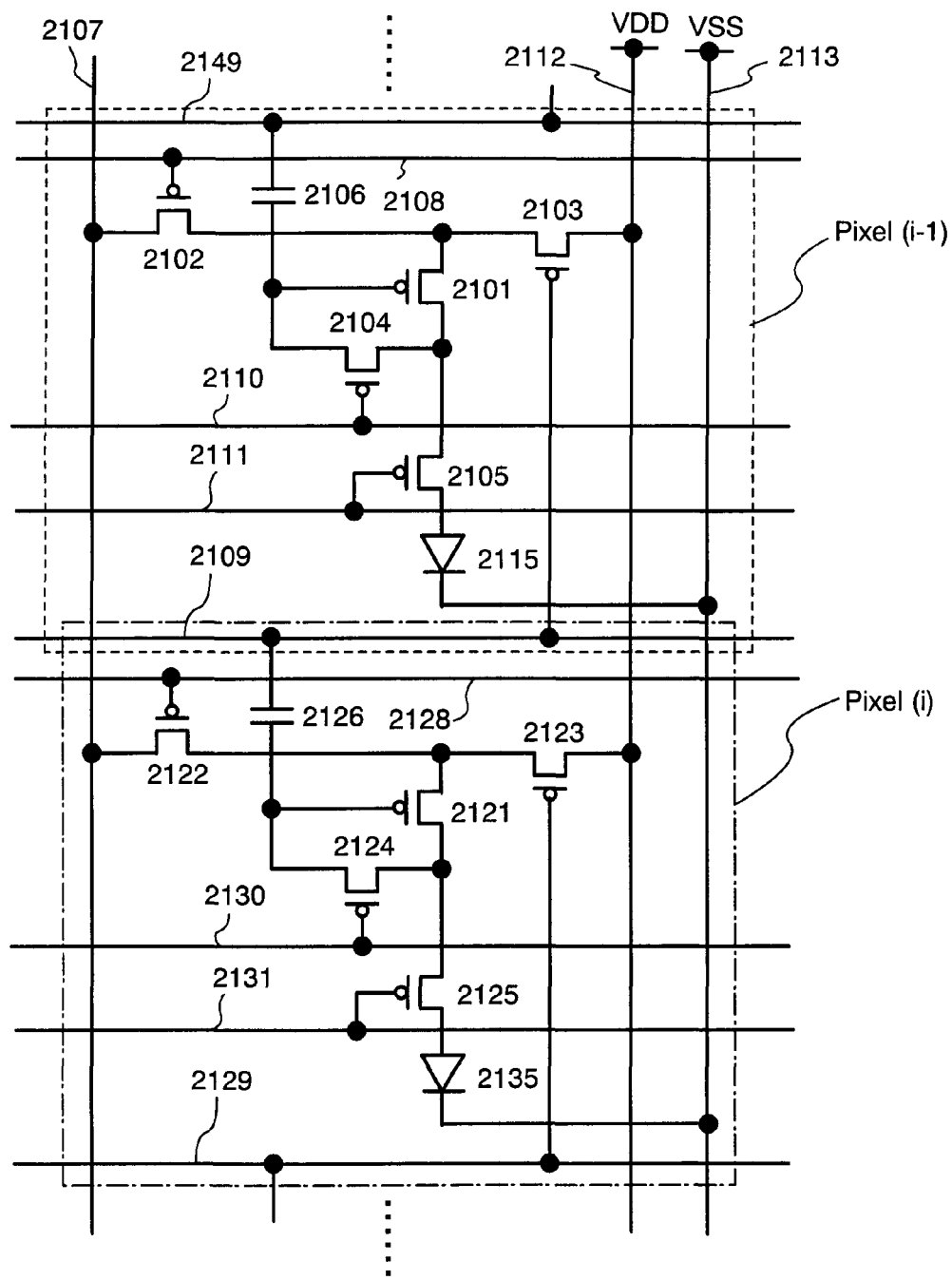
FIG. 21 is a diagram showing an example of a pixel structure in a display device of the present invention.

For example, FIG. 21 shows an example of a pixel circuit in the case where a second scan line included in a pixel of a previous row is used instead of a capacitor line included in the pixel in the pixel circuit shown in FIG. 3.

FIG. 21 shows structures of a Pixel (i) in an i-th row and a Pixel (i−1) in an (i−1)th row, which is a previous row. The Pixel (i−1) in the (i−1)th row includes a first transistor 2101 to a fifth transistor 2105, a storage capacitor 2106, a first scan line 2108 to a fourth scan line 2111, a light-emitting element 2115, and the like. The Pixel (i) in the i-th row includes a first transistor 2121 to a fifth transistor 2125, a storage capacitor 2126, a first scan line 2128 to a fourth scan line 2131, a light-emitting element 2135, and the like. In addition, a signal line 2107, a first power supply line 2112, and a second power supply line 2113 are shared with the Pixel (i) in the i-th row and the Pixel (i−1) in the (i−1)th row.

Since connections of each element in each pixel in FIG. 21 are almost similar to those of the pixel structure shown in FIG. 3, detailed description thereof is omitted. Differences between FIG. 3 and FIG. 21 are as follows. The second scan line 2109 included in the Pixel (i−1) in the (i−1)th row is used instead of the capacitor line included in the Pixel (i) in the i-th row, and a second electrode of the storage capacitor 2126 included in the Pixel (i) in the i-th row is connected to the second scan line 2109 included in the Pixel (i−1) in the (i−1)th row.

Note that in the Pixel (i−1) in the (i−1)th row, a second scan line 2149 included in a Pixel (i−2) in the (i−2)th row is used instead of a capacitor line included in the Pixel (i−1) in the (i−1)th row, and a second electrode of the storage capacitor 2106 included in the Pixel (i−1) in the (i−1)th row is connected to the second scan line 2149 included in the Pixel (i−2) in the (i−2)th row.

Figure 22:
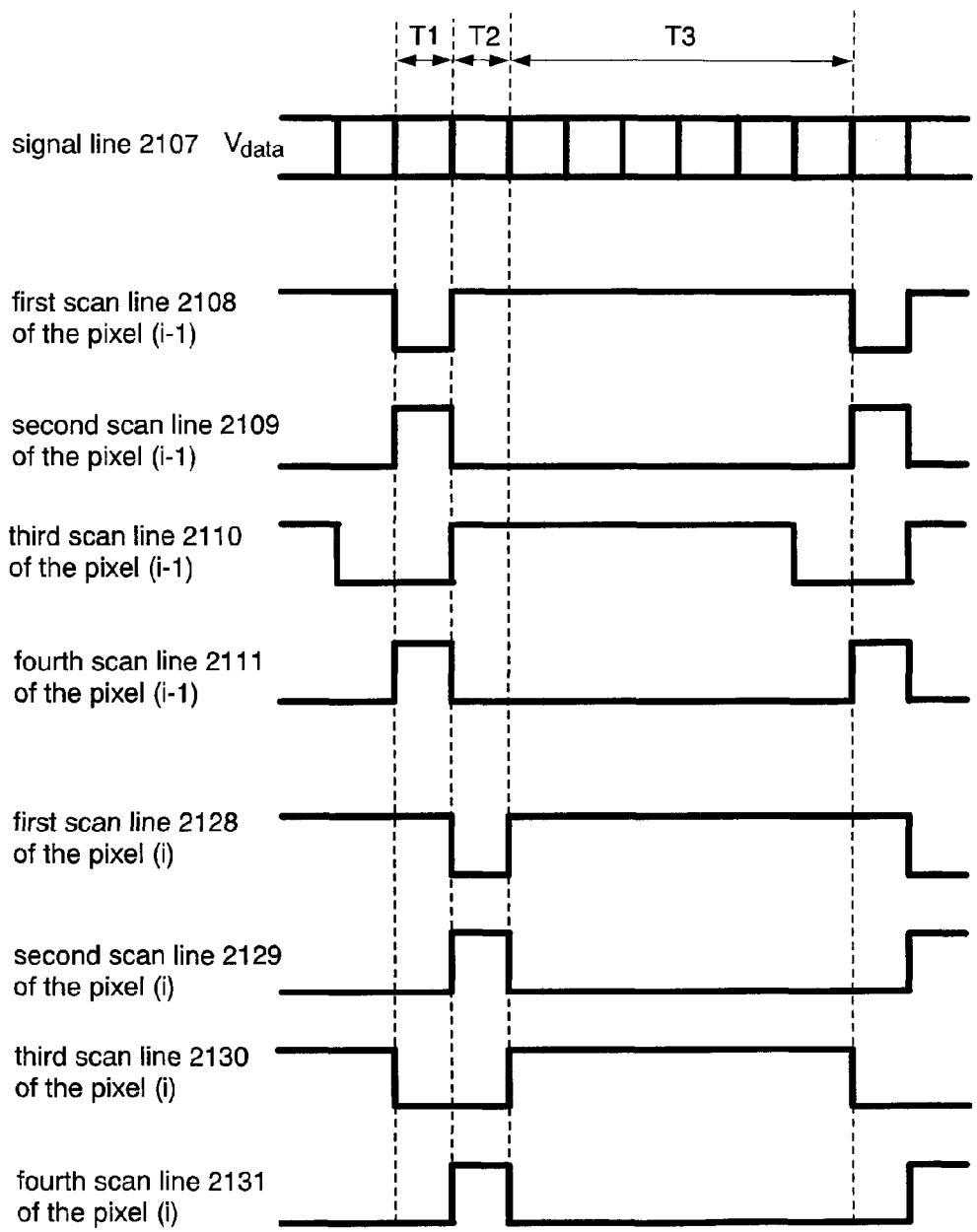
FIG. 22 is a diagram showing a timing chart of a pixel circuit in a display device of the present invention.

Here, FIG. 22 shows a timing chart of video signal voltage and pulses which are input to the signal line 2107, the first scan line 2108 to the fourth scan line 2111 of the Pixel (i−1) in the (i−1)th row, and the first scan line 2128 to the fourth scan line 2131 of the Pixel (i) in the i-th row. Note that periods T1 to T3 in FIG. 22 correspond to operations of the Pixel (i) in the i-th row.

When the pixel structure as shown in FIG. 21 is employed, a potential which is applied to the second scan line 2109 of the Pixel (i−1) in the (i−1)th row is applied to the second electrode of the storage capacitor 2126 in the Pixel (i) in the i-th row. Therefore, in the first period T1, an H-level potential is applied to the second electrode of the storage capacitor 2126 in the Pixel (i) in the i-th row, and an L-level potential is applied the second electrode of the storage capacitor 2126 in the second period T2 and the third period T3. Thus, a constant potential can be applied to the second electrode of the storage capacitor 2126 in the Pixel (i) in the i-th row in each period, so that an operation of the pixel circuit as described in Embodiment Mode 1 can be performed.

Note that when the fourth scan line included in the pixel in the previous row is used instead of the capacitor line included in the pixel in FIG. 21, an operation which is similar to the above-described operation can be performed. This is because timing at which pulses are input to the second scan line and the fourth scan line included in the Pixel (i−1) in the (i−1) the row is the same.

Note that a scan line used instead of the capacitor line included in the pixel is not limited to the second scan line or the fourth scan line included in the pixel in the previous row. The first scan line or the third scan line included in the pixel in the previous row may be used instead of the capacitor line included in the pixel. Alternatively, any one of first to fourth scan lines in the next row may be used.

Note that in the pixel, a constant potential is preferably applied to the capacitor line in the second period T2 and the third period T3. In addition, a low potential is preferably applied to the capacitor line in the second period T2 and the third period T3. Thus, the threshold voltage of the first transistor and the video signal voltage can be acquired more surely and the amount of current flowing to the light-emitting element in the light-emitting period of the pixel can be kept constant, so that the light-emitting element can emit light at constant luminance. In view of the above description, the second scan line or the fourth scan line included in the pixel in the previous row is preferably used instead of the capacitor line included in the pixel.

Figure 23:
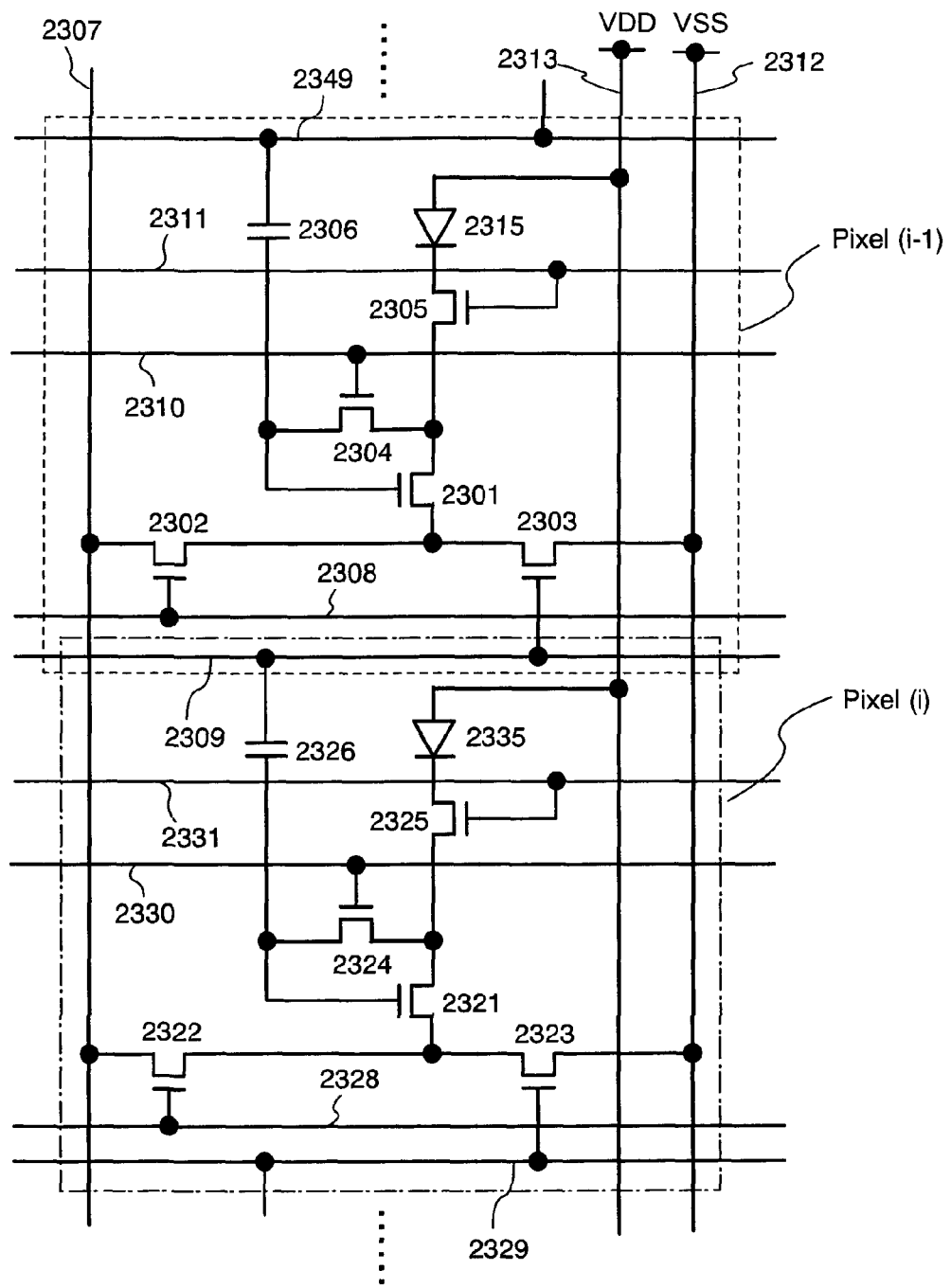
FIG. 23 is a diagram showing an example of a pixel structure in a display device of the present invention.

As another example, FIG. 23 shows the case where the second scan line included in the pixel in the previous row is used instead of the capacitor line included in the pixel in the pixel circuit shown in FIG. 8.

FIG. 23 shows structures of a Pixel (i) in an i-th row and a Pixel (i−1) in an (i−1)th row, which is a previous row. The Pixel (i−1) in the (i−1)th row includes a first transistor 2301 to a fifth transistor 2305, a storage capacitor 2306, a first scan line 2308 to a fourth scan line 2311, a light-emitting element 2315, and the like. The Pixel (i) in the i-th row includes a first transistor 2321 to a fifth transistor 2325, a storage capacitor 2326, a first scan line 2328 to a fourth scan line 2331, a light-emitting element 2335, and the like. In addition, a signal line 2307, a first power supply line 2312, and a second power supply line 2313 are shared with the Pixel (i) in the i-th row and the Pixel (i−1) in the (i−1)th row.

Since connections of each element in each pixel in FIG. 23 are almost similar to those of the pixel structure shown in FIG. 8, detailed description thereof is omitted. Differences between FIG. 8 and FIG. 23 are as follows. The second scan line 2309 included in the Pixel (i−1) in the (i−1)th row is used instead of the capacitor line included in the Pixel (i) in the i-th row, and a second electrode of the storage capacitor 2326 included in the Pixel (i) in the i-th row is connected to the second scan line 2309 included in the Pixel (i−1) in the (i−1)th row.

Note that in the Pixel (i−1) in the (i−1)th row, a second scan line 2349 included in a Pixel (i−2) in the (i−2)th row is used instead of a capacitor line included in the Pixel (i−1) in the (i−1)th row, and a second electrode of the storage capacitor 2306 included in the Pixel (i−1) in the (i−1)th row is connected to the second scan line 2349 included in the Pixel (i−2) in the (i−2)th row.

Figure 24:
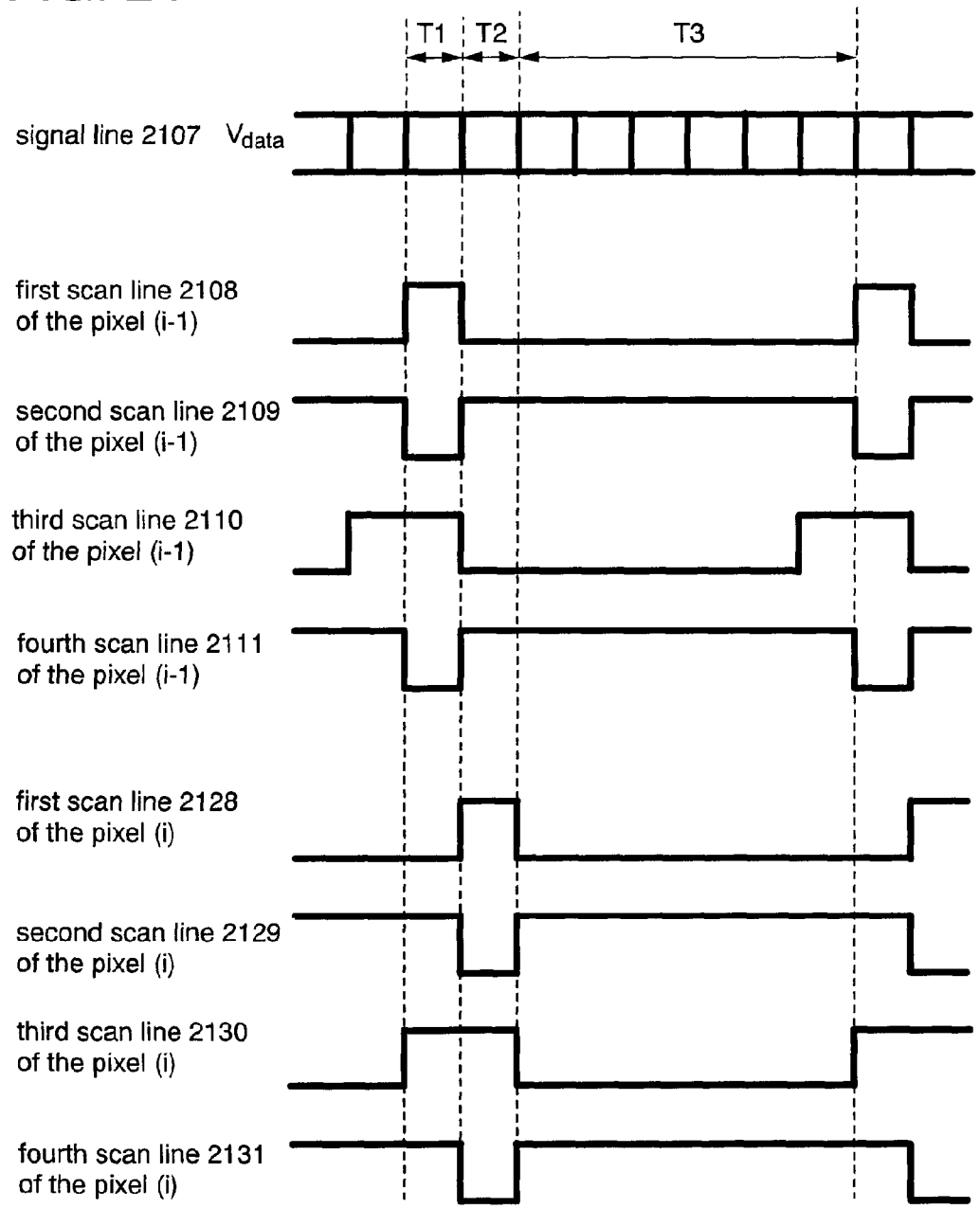
FIG. 24 is a diagram showing a timing chart of a pixel circuit in a display device of the present invention.

FIG. 24 shows a timing chart of video signal voltage and pulses which are input to the signal line 2307, the first scan line 2308 to the fourth scan line 2311 of the Pixel (i−1) in the (i−1)-th row, and the first scan line 2328 to the fourth scan line 2331 of the Pixel (i) in the i-th row. Note that periods T1 to T3 in FIG. 24 correspond to the operations of the Pixel (i) in the i-th row.

When the pixel structure as shown in FIG. 23 is employed, a potential which is applied to the second scan line 2309 of the Pixel (i−1) in the (i−1)th row is applied to the second electrode of the storage capacitor 2326 in the Pixel (i) in the i-th row. Therefore, in the first period T1, an L-level potential is applied to the second electrode of the storage capacitor 2126 in the Pixel (i) in the i-th row, and an H-level potential is applied the second electrode of the storage capacitor 2126 in the second period T2 and the third period T3. Thus, a constant potential can be applied to the second electrode of the storage capacitor 2126 in the Pixel (i) in the i-th row in each period, so that an operation of the pixel circuit as described in Embodiment Mode 1 can be performed.

Note that when the fourth scan line included in the pixel in the previous row is used instead of the capacitor line included in the pixel in FIG. 23, an operation which is similar to the above-described operation can be performed. This is because timing at which pulses are input to the second scan line and the fourth scan line included in the Pixel (i−1) in the (i−1) the row is the same.

Note that a scan line used instead of the capacitor line included in the pixel is not limited to the second scan line or the fourth scan line included in the pixel in the previous row. The first scan line or the third scan line included in the pixel in the previous row may be used instead of the capacitor line included in the pixel. Alternatively, any one of first to fourth scan lines in the next row may be used.

Note that in the pixel, a constant potential is preferably applied to the capacitor line in the second period T2 and the third period T3. In addition, a high potential is preferably applied to the capacitor line in the second period T2 and the third period T3. Thus, the threshold voltage of the first transistor and the video signal voltage can be acquired more surely and the amount of current flowing to the light-emitting element in the light-emitting period of the pixel can be kept constant, so that the light-emitting element can emit light at constant luminance. In view of the above description, the second scan line or the fourth scan line included in the pixel in the previous row is preferably used instead of the capacitor line included in the pixel.

By using the second scan line included in the pixel in the previous row instead of the capacitor line included in the pixel in this manner, it is not necessary to additionally provide a capacitor line to the pixel. Therefore, the number of wirings can be reduced, so that an aperture ratio of pixels can be improved. Further, since it is not necessary to additionally generate voltage to be applied to a capacitor line, a circuit for generating the voltage can be omitted and power consumption can be reduced.

Note that this embodiment mode shows an example of an embodied case of the contents (or may be part of the contents) described in other embodiment modes, an example of slight transformation thereof, an example of partial modification thereof, an example of improvement thereof, an example of detailed description thereof, an application example thereof, an example of related part thereof, or the like. Therefore, the contents described in other embodiment modes can be freely applied to, combined with, or replaced with this embodiment mode.

Although this embodiment mode is described with reference to various drawings, the contents (or may be part of the contents) described in each drawing can be freely applied to, combined with, or replaced with the contents (or may be part of the contents) described in another drawing. Further, even more drawings can be formed by combining each part with another part in the above-described drawings.

Similarly, the contents (or may be part of the contents) described in each drawing of this embodiment mode can be freely applied to, combined with, or replaced with the contents (or may be part of the contents) described in a drawing in another embodiment mode. Further, even more drawings can be formed by combining each part with part of another embodiment mode in the drawings of this embodiment mode.

[Embodiment Mode 3]

Although current is supplied to a light-emitting element when initialization is performed in Embodiment Mode 1 and Embodiment Mode 2, initialization can also be performed by adding an initialization transistor which turns on in a first period T1 to the pixel circuit which is shown heretofore. In this embodiment mode, a method of performing initialization using an initialization transistor is described. Note that an EL element is described as an example of a light-emitting element.

In order to perform initialization, a second electrode of a first transistor is necessary to be set at an initial potential. At this time, by connecting the second electrode of the first transistor to an electrode of another element or to another wiring through an initialization transistor and turning on the initialization transistor, the second electrode of the first transistor can be set at a potential of the electrode of another element or of another wiring, to which the second electrode of the first transistor is connected.

That is, in order to set the second electrode of the first transistor at an initial potential, the initialization transistor functions as a switch which connects the second electrode of the first transistor to an electrode of another element or another wiring.

For example, in the case of the pixel circuit shown in FIG. 3, in order to hold the voltage based on the video signal voltage $V_{data}$ and the threshold voltage $|V_{th}|$ of the first transistor 301 in the storage capacitor 306, a potential of the second electrode of the first transistor 301 is necessary to be set lower than a potential obtained by subtracting the threshold voltage $|V_{th}|$ of the first transistor 301 from the video signal voltage $V_{data}$, i.e., $V_{data}-|V_{th}|$. Thus, the second electrode of the first transistor 301 can be set at an initial potential which is lower than $V_{data}-|V_{th}|$ by connecting the second electrode of the first transistor 301 to an electrode of another element or to another wiring through an initialization transistor in the first period T1.

Figure 25:
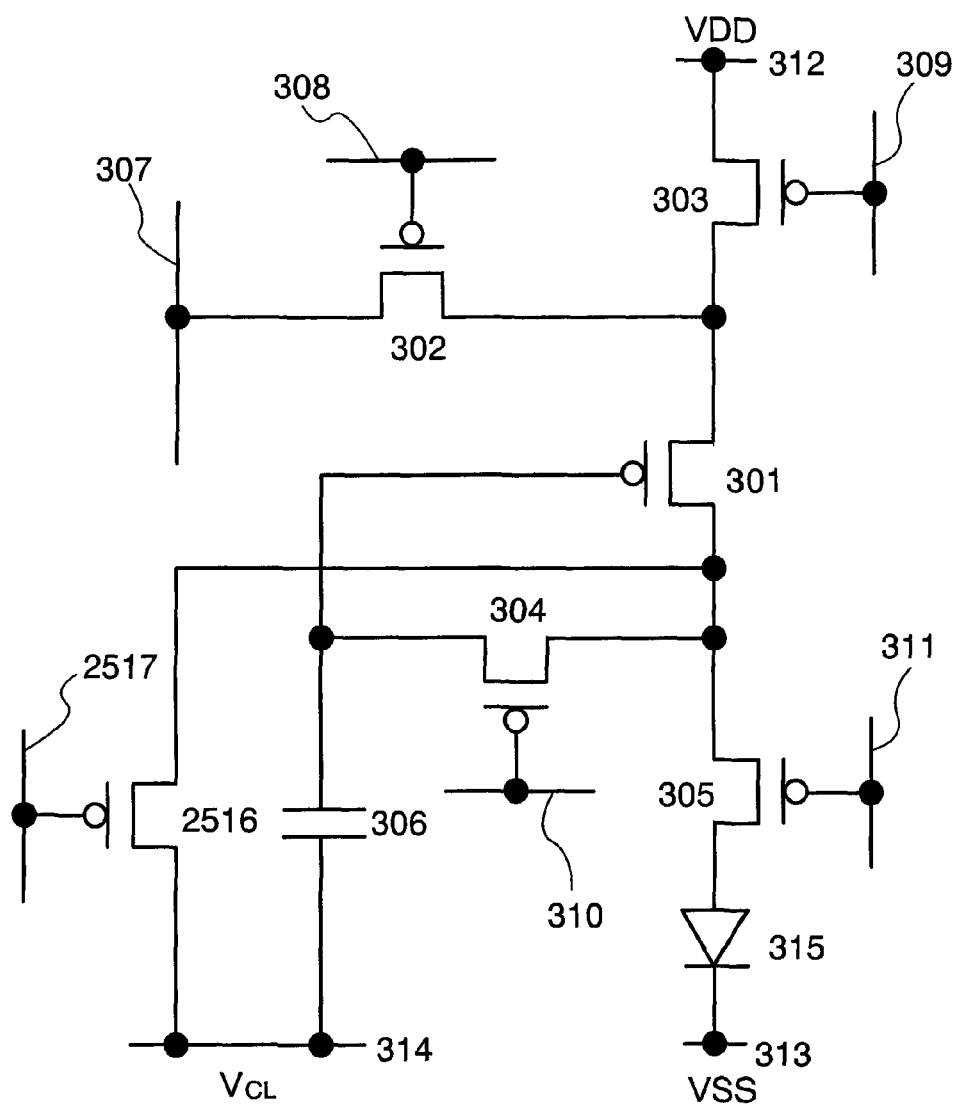
FIG. 25 is a diagram showing an example of a pixel structure in a display device of the present invention.

Here, FIG. 25 shows an example of the case where an initialization transistor is provided in the pixel circuit shown in FIG. 3. FIG. 25 is an example where the second electrode of the first transistor 301 and the capacitor line 314 are connected through an initialization transistor.

In FIG. 25, a sixth transistor 2516 which is an initialization transistor and a fifth scan line 2517 are added to the pixel circuit shown in FIG. 3. Note that a gate electrode of the sixth transistor 2516 is connected to the fifth scan line 2517; a first electrode of the sixth transistor 2516 is connected to the second electrode of the first transistor 301, the first electrode of the fourth transistor 304, and the first electrode of the fifth transistor 305; and a second electrode of the sixth transistor 2516 is connected to the capacitor line 314.

Next, operations of the pixel circuit shown in FIG. 25 are described with reference to FIGS. 26 and 27.

Figure 26:
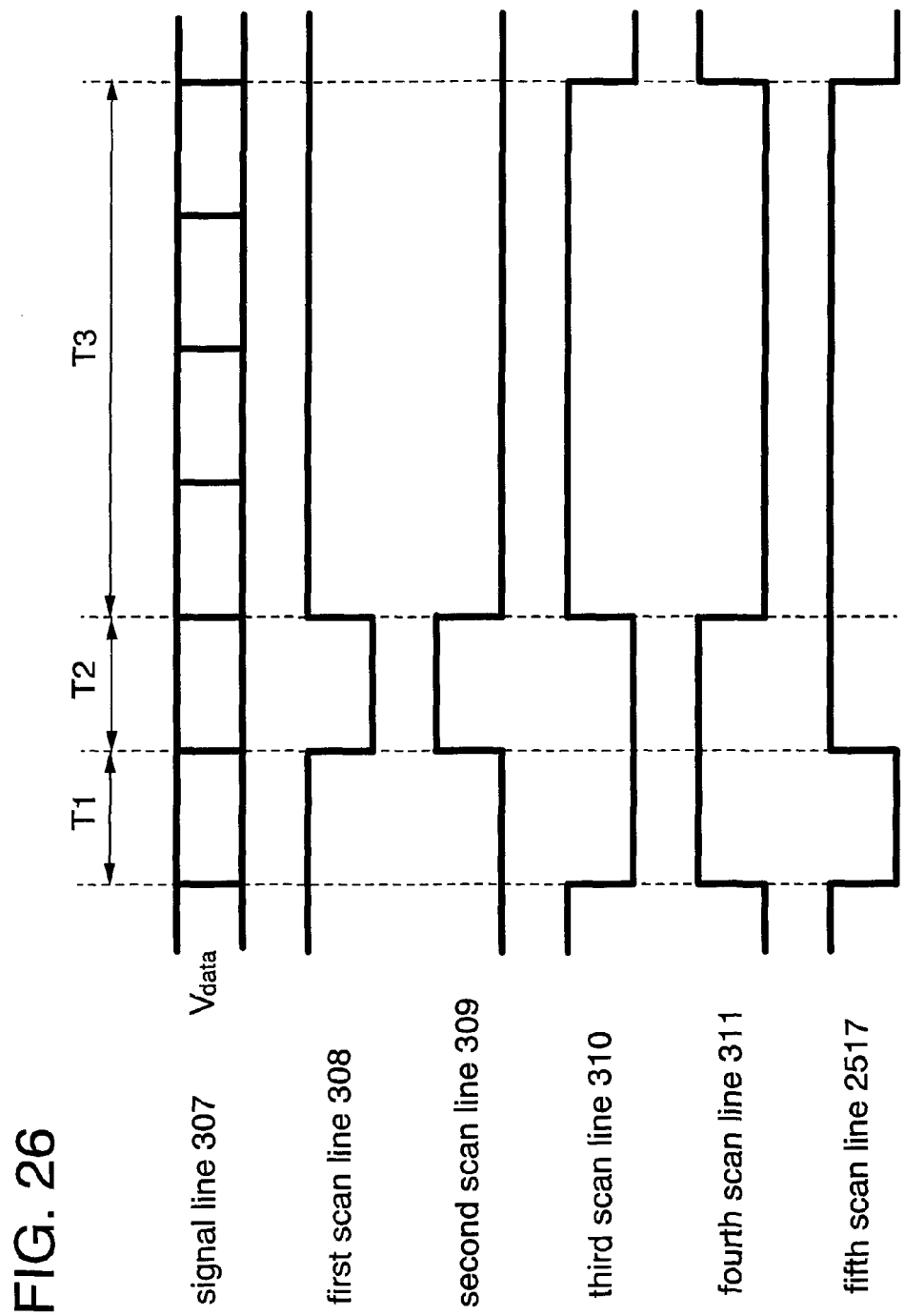
FIG. 26 is a diagram showing a timing chart of a pixel circuit in a display device of the present invention.
Figure 27:
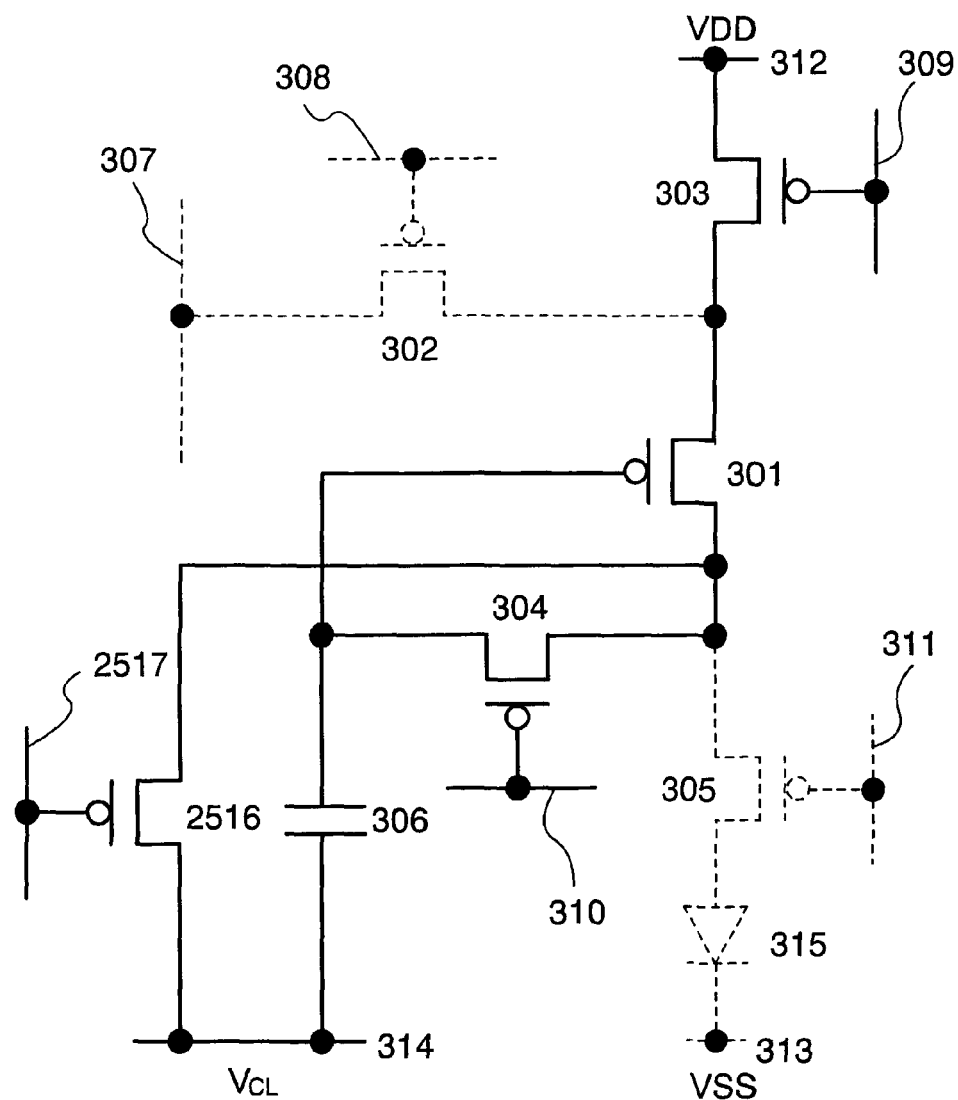
FIG. 27 is a diagram showing an operation of a pixel circuit in a display device of the present invention.

FIG. 26 shows a timing chart of video signal voltage and pulses which are input to the signal line 307, the first scan line 308 to the fourth scan line 311, and the fifth scan line 2517. In addition, the whole period is divided into three periods of a first period T1 to a third period T3 in accordance with each operation of the pixel circuit.

An operation of the pixel circuit in the first period T1 is described with reference to FIG. 27. In the first period T1, the second scan line 309, the third scan line 310, and the fifth scan line 2517 become an L level, and the third transistor 303, the fourth transistor 304, and the sixth transistor 2516 are turned on. In addition, the first scan line 308 and the fourth scan line 311 become an H level, and the second transistor 302 and the fifth transistor 305 are turned off. Thus, the second electrode of the first transistor 301 and the capacitor line 314 are connected, so that the second electrode of the first transistor 301 and the first electrode of the storage capacitor 306 have the same potential as the potential $V_{CL}$ of the capacitor line 314.

By the above-described operation, the second electrode of the first transistor 301 and the first electrode of the storage capacitor 306 are set at the potential $V_{CL}$ of the capacitor line 314 as an initial potential in the first period T1.

By setting the second electrode of the first transistor 301 at the potential $V_{CL}$ of the capacitor line 314 which is lower than $V_{data}-|V_{th}|$ in the first period T1 in this manner, a potential of the second electrode of the first transistor 301 can be surely set lower than $V_{data}-|V_{th}|$, so that the threshold voltage can be surely compensated.

Note that in the second period T2 and the third period T3, the fifth scan line 2517 is at an H level and the sixth transistor 2516 is turned off. In addition, the same operation as the pixel circuit shown in FIG. 3 is performed. That is, in the second period T2, the voltage based on the video signal voltage $V_{data}$ and the threshold voltage $|V_{th}|$ of the first transistor 301 is held in the storage capacitor 306. Further, in the third period T3, the current $I_{OLED}$ which is dependent on the video signal voltage $V_{data}$ is supplied to the light-emitting element 315, and the light-emitting element 315 emits light.

Figure 28:
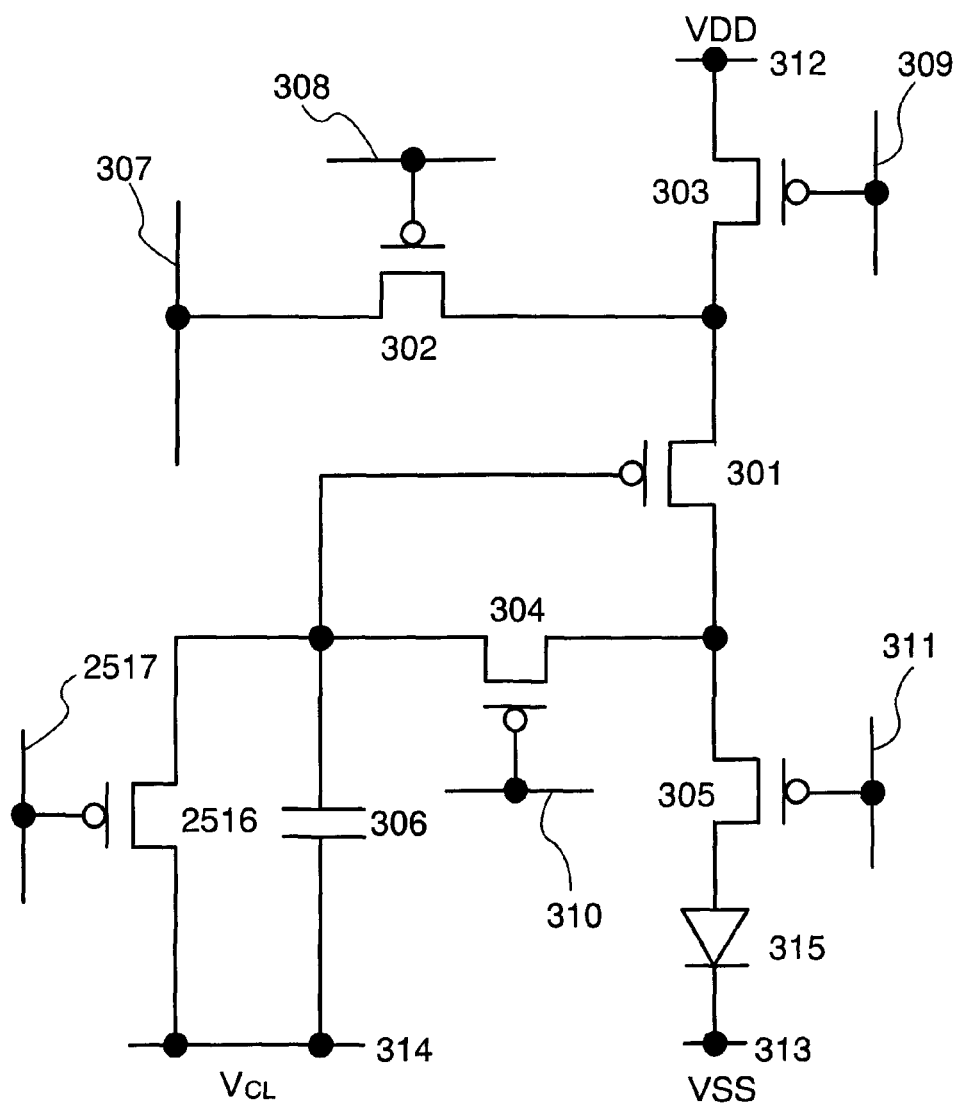
FIG. 28 is a diagram showing an example of a pixel structure in a display device of the present invention.

Note that it is only necessary that the sixth transistor 2516 is connected so that the second electrode of the first transistor 301 is set lower than $V_{data}-|V_{th}|$. For example, as shown in FIG. 28, the first electrode of the sixth transistor 2516 may be connected to the gate electrode of the first transistor 301, the second electrode of the fourth transistor 304, and the first electrode of the storage capacitor 306.

Although the second electrode of the sixth transistor 2516 is connected to the capacitor line 314 in FIG. 25, the second electrode of the sixth transistor 2516 may be connected to a wiring which has been already provided other than the capacitor line. In particular, the second electrode of the sixth transistor 2516 may be connected to any wiring as long as it is a wiring to which a potential lower than $V_{data}-|V_{th}|$ is applied.

Figure 29:
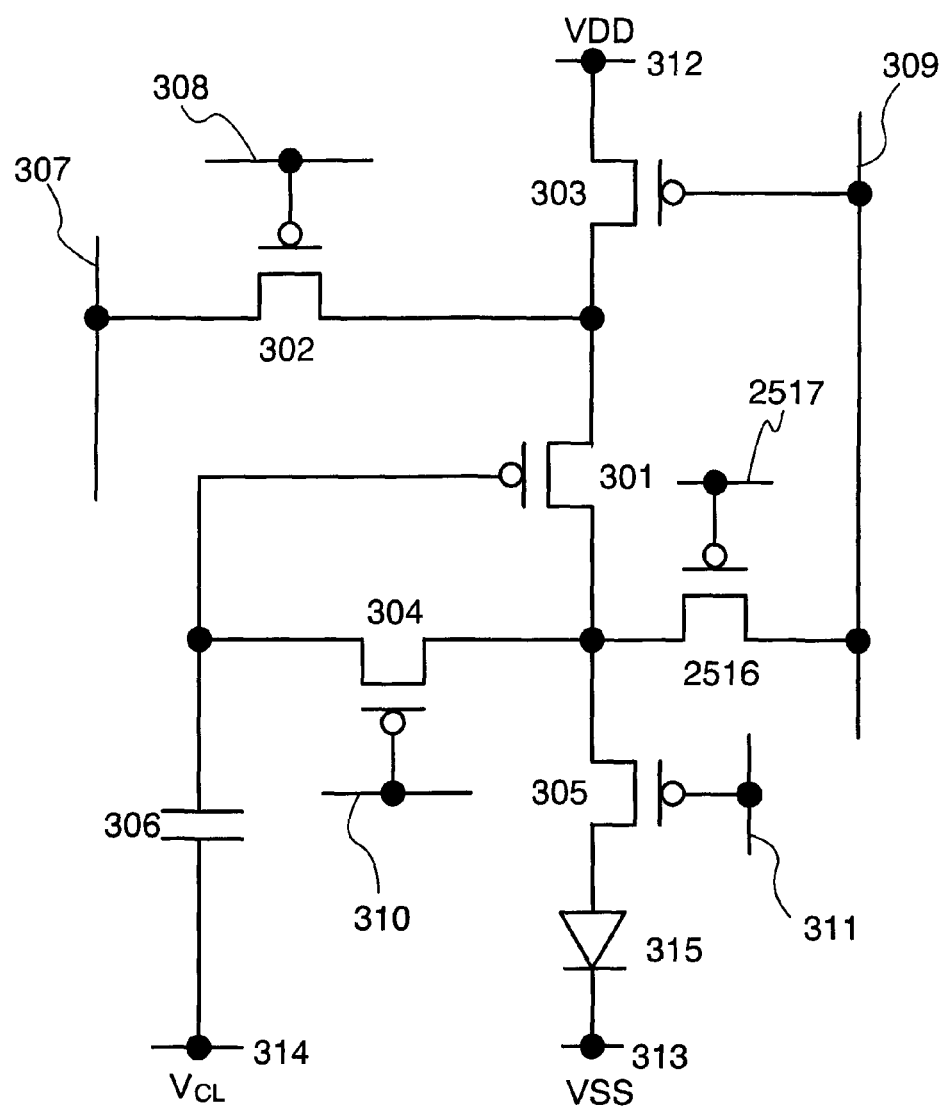
FIG. 29 is a diagram showing an example of a pixel structure in a display device of the present invention.

For example, as shown in FIG. 29, the second electrode of the sixth transistor 2516 may be connected to the second scan line 309. Since an L-level potential is applied to the second scan line 309 in the first period T1, the potential of the second electrode of the first transistor 301 can be set lower than $V_{data}-|V_{th}|$.

Since an L-level potential is also applied to the third scan line 310 in the first period T1, the second electrode of the sixth transistor 2516 may be connected to the third scan line 310.

In addition, in order to set the second electrode of the first transistor 301 at a certain initial potential, an initialization power supply line may be additionally provided. This initialization power supply line is refereed to as an initializing line in this specification.

Figure 30:
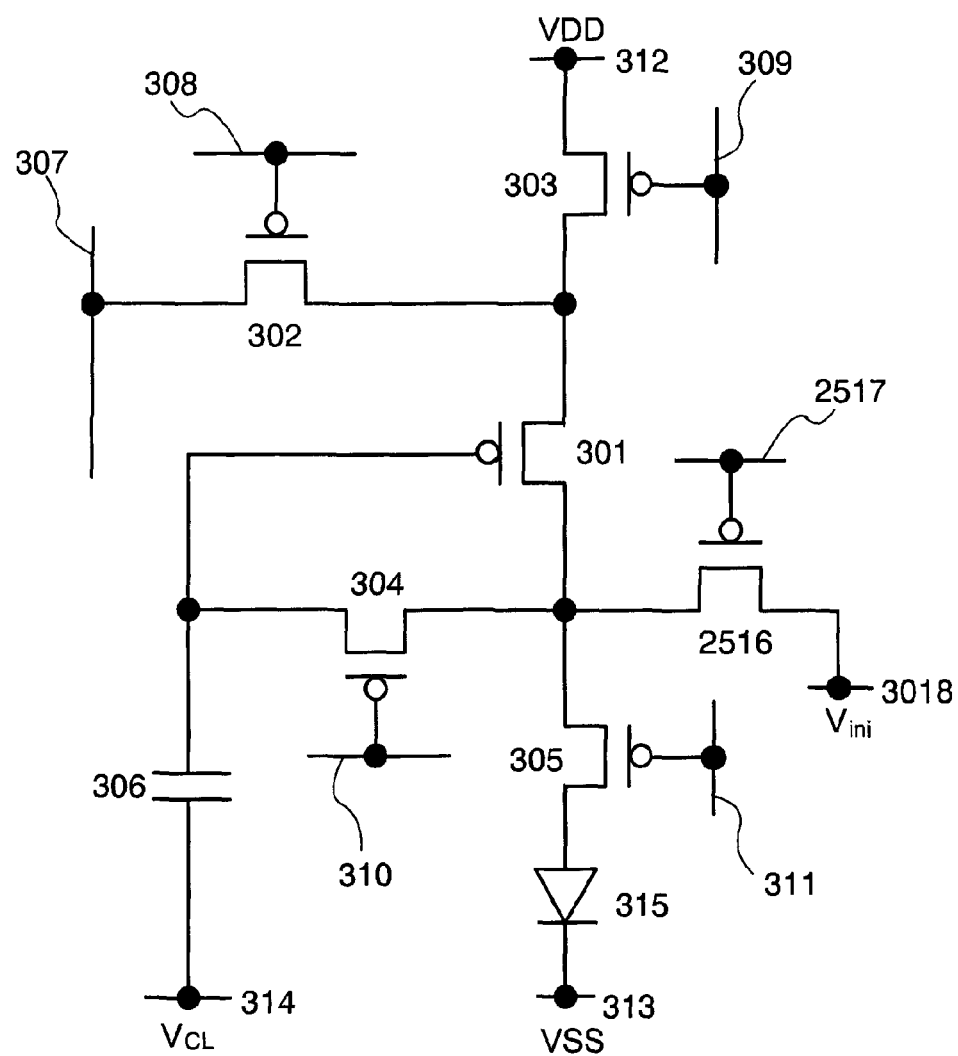
FIG. 30 is a diagram showing an example of a pixel structure in a display device of the present invention.

For example, FIG. 30 shows an example where an initialization transistor and an initializing line are provided in the pixel circuit shown in FIG. 3. In FIG. 30, the sixth transistor 2516 which is an initialization transistor, the fifth scan line 2517, and an initializing line 3018 are added to the pixel circuit shown in FIG. 3. Note that the gate electrode of the sixth transistor 2516 is connected to the fifth scan line 2517; the first electrode of the sixth transistor 2516 is connected to the second electrode of the first transistor 301, the first electrode of the fourth transistor 304, and the first electrode of the fifth transistor 305; and the second electrode of the sixth transistor 2516 is connected to the initializing line 3018.

In addition, an initial potential $V_{ini}$ is applied to the initializing line 3018. Note that a potential relationship is $V_{ini}<V_{data}-|V_{th}|$.

Figure 31:
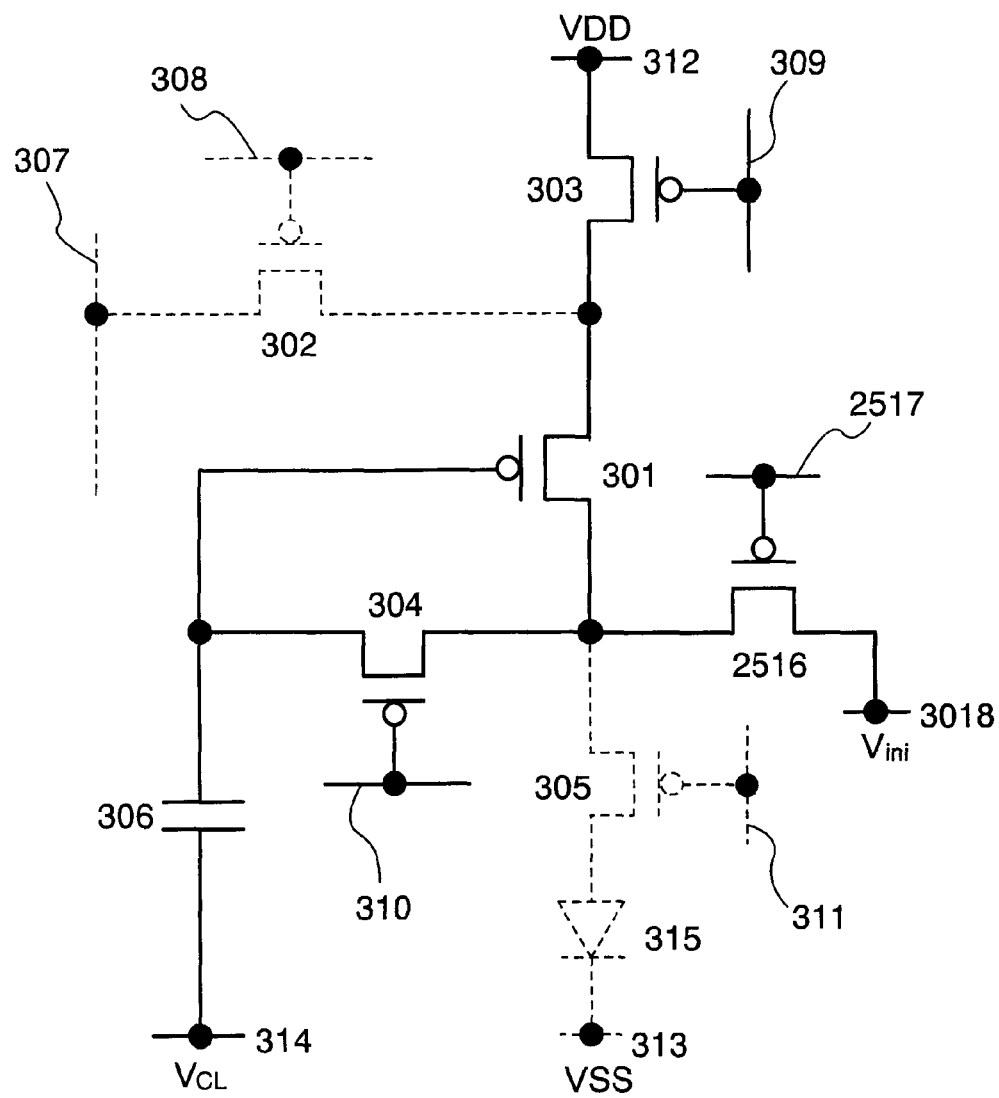
FIG. 31 is a diagram showing an operation of a pixel circuit in a display device of the present invention.

FIG. 31 shows an operation of the pixel circuit shown in FIG. 30 in the first period T1. In the first period T1, the first transistor 301 has a diode-connection state, and current flows through the initializing line 3018. Accordingly, the second electrode of the first transistor 301 and the first electrode of the storage capacitor 306 have the same potential as the initializing line 3018, so that a potential obtained by subtracting the potential $V_{CL}$ of the capacitor line 314 from the initial potential $V_{ini}$, i.e., $V_{ini}-V_{CL}$ is held in the storage capacitor 306.

By the above-described operation, in the first period T1, the potential obtained by subtracting the potential $V_{CL}$ of the capacitor line 314 from the initial potential $V_{ini}$, i.e., $V_{ini}-V_{CL}$ is held in the storage capacitor 306 as initialization voltage.

By providing the initializing line 3018 in this manner and setting the second electrode of the first transistor 301 at $V_{ini}$ which is lower than $V_{data}-|V_{th}|$, the second electrode of the first transistor 301 can be surely set at a potential lower than $V_{data}-|V_{th}|$, so that the threshold voltage can be surely compensated.

In particular, since the initial potential $V_{ini}$ can be set at a given potential which is lower than $V_{data}-|V_{th}|$ by additionally providing an initializing line, the second electrode of the first transistor 301 can be surely set at a potential lower than $V_{data}-|V_{th}|$, so that the threshold voltage can be surely compensated.

Figure 32:
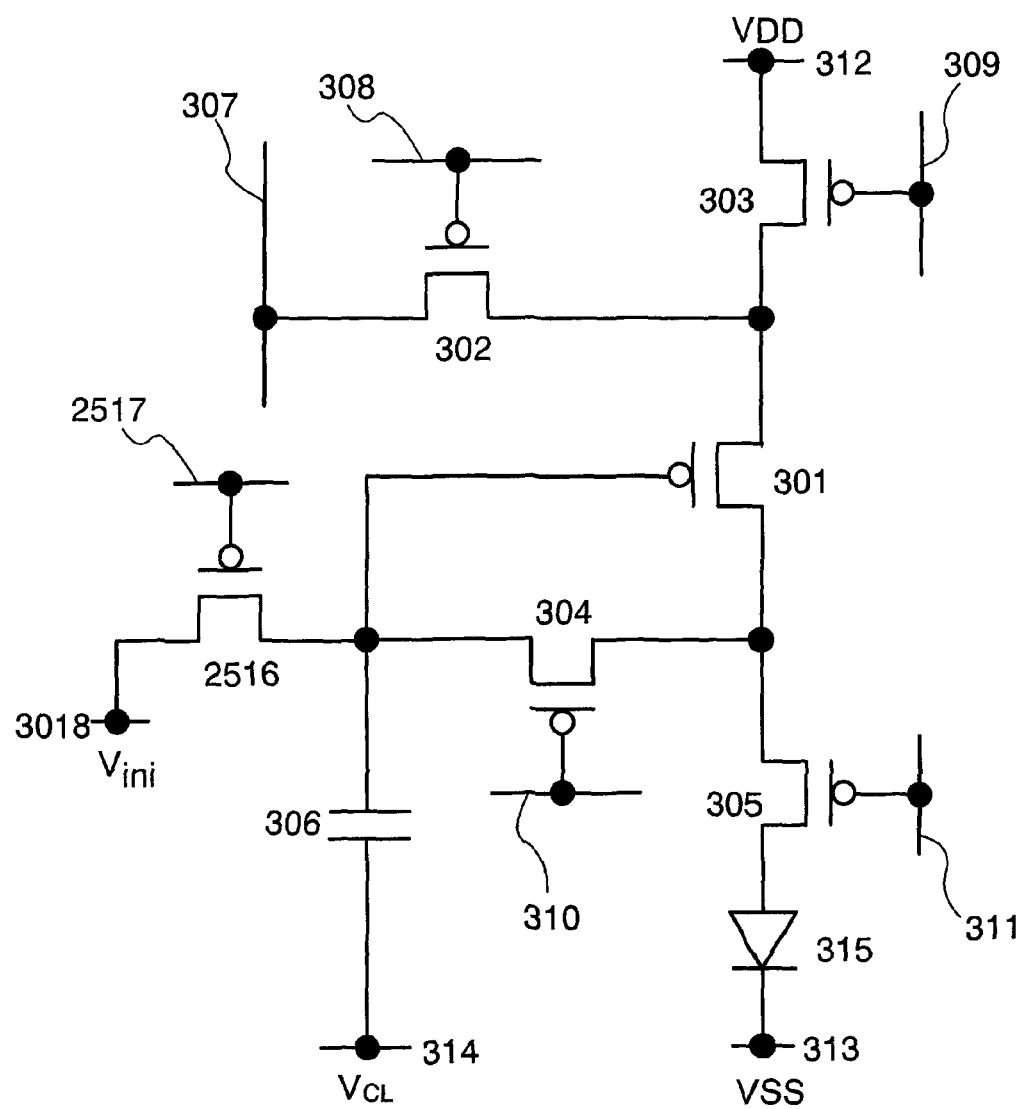
FIG. 32 is a diagram showing an example of a pixel structure in a display device of the present invention.

Note that it is only necessary that the sixth transistor 2516 be connected so that the second electrode of the first transistor 301 is set at the initial potential $V_{ini}$. For example, as shown in FIG. 32, the first electrode of the sixth transistor 2516 may be connected to the gate electrode of the first transistor 301, the second electrode of the fourth transistor 304, the first electrode of the storage capacitor 306.

By performing initialization by adding an initialization transistor and an initializing line in this manner, the threshold voltage of the first transistor can be held more surely and variations in the threshold voltage of the first transistor can be compensated more surely.

In addition, unlike the method of initialization described in Embodiment Mode 1 where a light-emitting element emits light in the first period T1 because current flows to the light-emitting element while performing initialization, the method described in this embodiment mode can suppress light emission of a light-emitting element in periods other than the light-emitting period because no current flows to the light-emitting element while performing initialization, so that the light-emitting element does not emit light in the first period T1.

Note that although the sixth transistor which is an initialization transistor is a P-channel transistor in this embodiment mode, the present invention is not limited to this. The sixth transistor may be an N-channel transistor.

Note that although the sixth transistor is controlled by using the fifth scan line in this embodiment mode, another wiring which has been already provided in a pixel in another row may be used instead of the fifth scan line. In particular, it is preferable to use a wiring to which voltage turning on the sixth transistor is applied in the first period T1 during which initialization is performed. For example, when the sixth transistor is a P-channel transistor, a first scan line of a pixel in a previous row may be used instead of the fifth scan line of the pixel. Alternatively, when the sixth transistor is an N-channel transistor, a second scan line of the pixel in the previous row may be used instead of the fifth scan line of the pixel. By using another wiring which has been already provided instead of the fifth scan line, the number of wirings can be reduced because it is not necessary to additionally provide the fifth scan line in the pixel. Therefore, an aperture ratio of pixels can be improved.

Note that although the case where the first transistor is a P-channel transistor (FIG. 3) is only described in this embodiment mode, this embodiment mode can also be similarly applied to the case where the first transistor is an N-channel transistor as in the pixel circuit shown in FIG. 8.

When an initialization transistor is added to the pixel circuit shown in FIG. 8, the initialization transistor is connected so that the second electrode of the first transistor 801 is set higher than the sum of the video signal voltage $V_{data}$ and the threshold voltage $|V_{th}|$ of the first transistor 801, i.e., $V_{data}+|V_{th}|$. In addition, when an initializing line is added, the potential $V_{ini}$ applied to the initializing line is set higher than $V_{data}+|V_{th}|$.

Note that this embodiment mode shows an example of an embodied case of the contents (or may be part of the contents) described in other embodiment modes, an example of slight transformation thereof, an example of partial modification thereof, an example of improvement thereof, an example of detailed description thereof, an application example thereof, an example of related part thereof, or the like. Therefore, the contents described in other embodiment modes can be freely applied to, combined with, or replaced with this embodiment mode.

Although this embodiment mode is described with reference to various drawings, the contents (or may be part of the contents) described in each drawing can be freely applied to, combined with, or replaced with the contents (or may be part of the contents) described in another drawing. Further, even more drawings can be formed by combining each part with another part in the above-described drawings.

Similarly, the contents (or may be part of the contents) described in each drawing of this embodiment mode can be freely applied to, combined with, or replaced with the contents (or may be part of the contents) described in a drawing in another embodiment mode. Further, even more drawings can be formed by combining each part with part of another embodiment mode in the drawings of this embodiment mode.

[Embodiment Mode 4]

Although the potential of the second power supply line is a fixed potential in Embodiment Mode 1 to Embodiment Mode 3, the potential of the second power supply line may be changed in accordance with the first period to the third period. In this embodiment mode, the case is described in which the potential of the second power supply line is changed in accordance with the first period to the third period. Note that an EL element is described as an example of a light-emitting element.

The fifth transistor 305 is turned off not to flow current to the light-emitting element 315 in the second period T2 in the pixel circuit shown in FIG. 3. However, current supply to the light-emitting element 315 can be stopped by, for example, omitting the fifth transistor 305 and directly connecting the second electrode of the first transistor 301 and the first electrode of the light-emitting element 315, so that the potential of the second power supply line 313 in the second period T2 can be set higher than a potential of the first electrode of the light-emitting element 315. This is because a reverse bias can be applied to the light-emitting element 315 by setting the potential of the second power supply line 313 to be higher than the potential of the first electrode of the light-emitting element 315.

Figure 33:
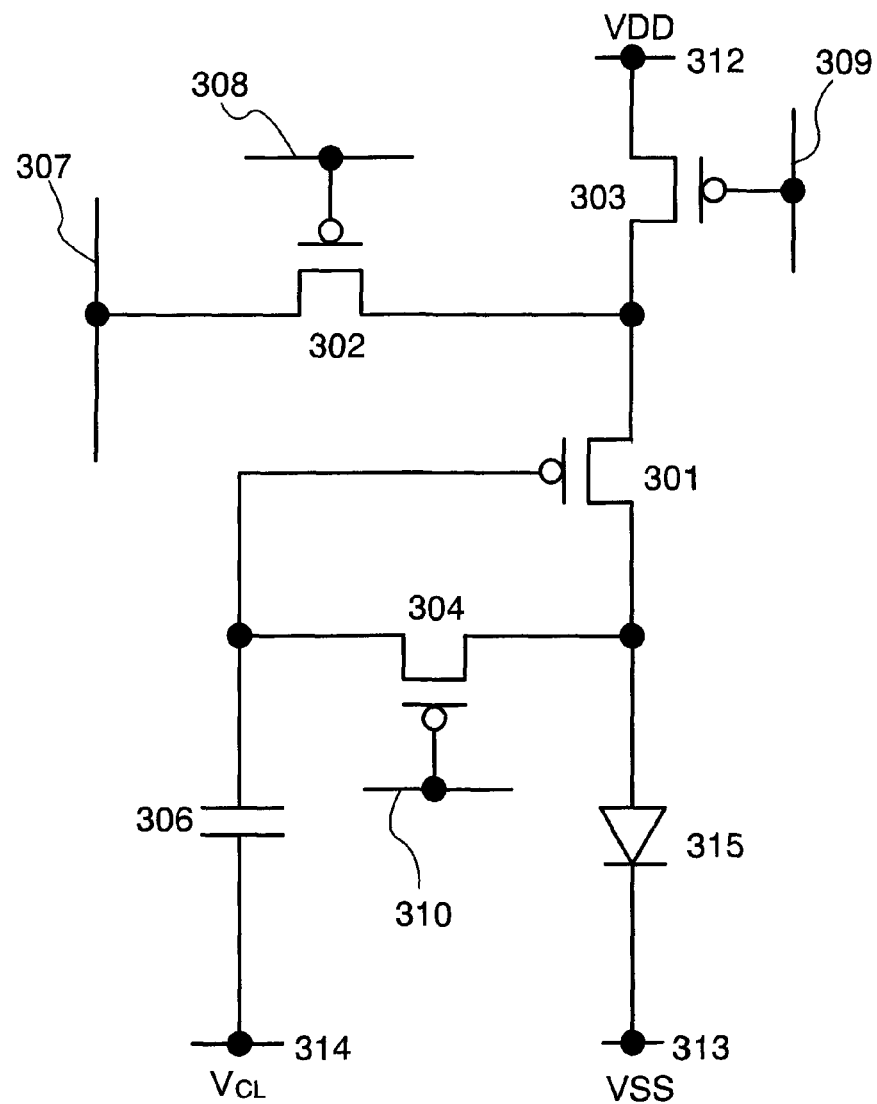
FIG. 33 is a diagram showing an example of a pixel structure in a display device of the present invention.
Figure 34:
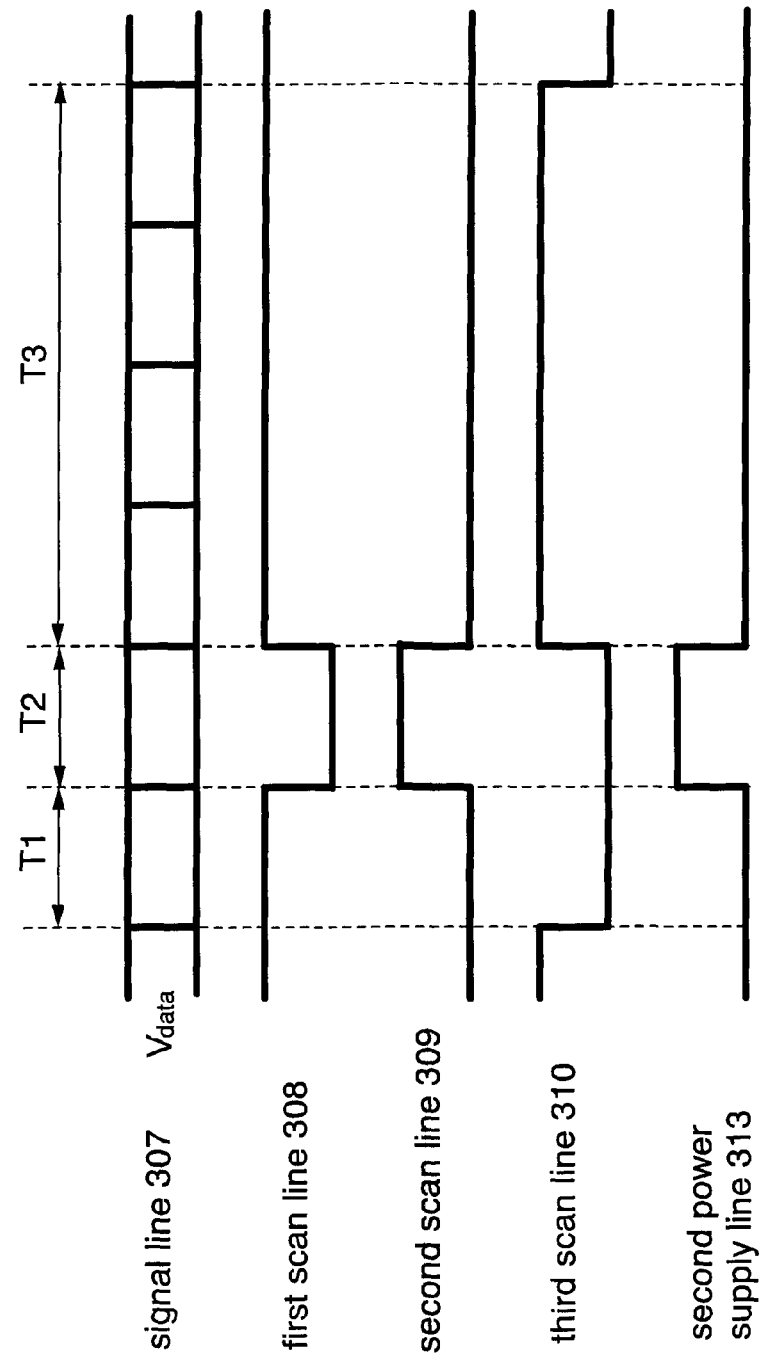
FIG. 34 is a diagram showing a timing chart of a pixel circuit in a display device of the present invention.

In FIG. 33, the second electrode of the first transistor 301 and the first electrode of the light-emitting element 315 are directly connected unlike the pixel circuit shown in FIG. 3. In addition, FIG. 34 shows a timing chart of video signal voltage and pulses which are input to the signal line 307, the first scan line 308 to the third scan line 310, and the second power supply line 313. Note that timing at which pulses are input to the first scan line 308 to the third scan line 310 is the same as that of the pixel circuit shown in FIG. 3.

Note that in the second period T2, a reverse bias can be applied to the light-emitting element 315 by setting the potential of the second power supply line 313 to be higher than or equal to a potential obtained by subtracting the threshold voltage $|V_{th}|$ of the first transistor 301 from the video signal line $V_{data}$, i.e., $V_{data}-|V_{th}|$. Thus, current supply to the light-emitting element 315 can be stopped in the second period T2.

Note that in the first period T1 and the third period T3, a forward bias can be applied to the light-emitting element 315 by setting the potential of the second power supply line 313 to be lower than a potential obtained by subtracting the threshold voltage $|V_{th}|$ of the first transistor 301 from the video signal line $V_{data}$, i.e., $V_{data}-|V_{th}|$. Thus, current supply to the light-emitting element 315 can be stopped in the first period T1 and the third period T3.

Figure 35:
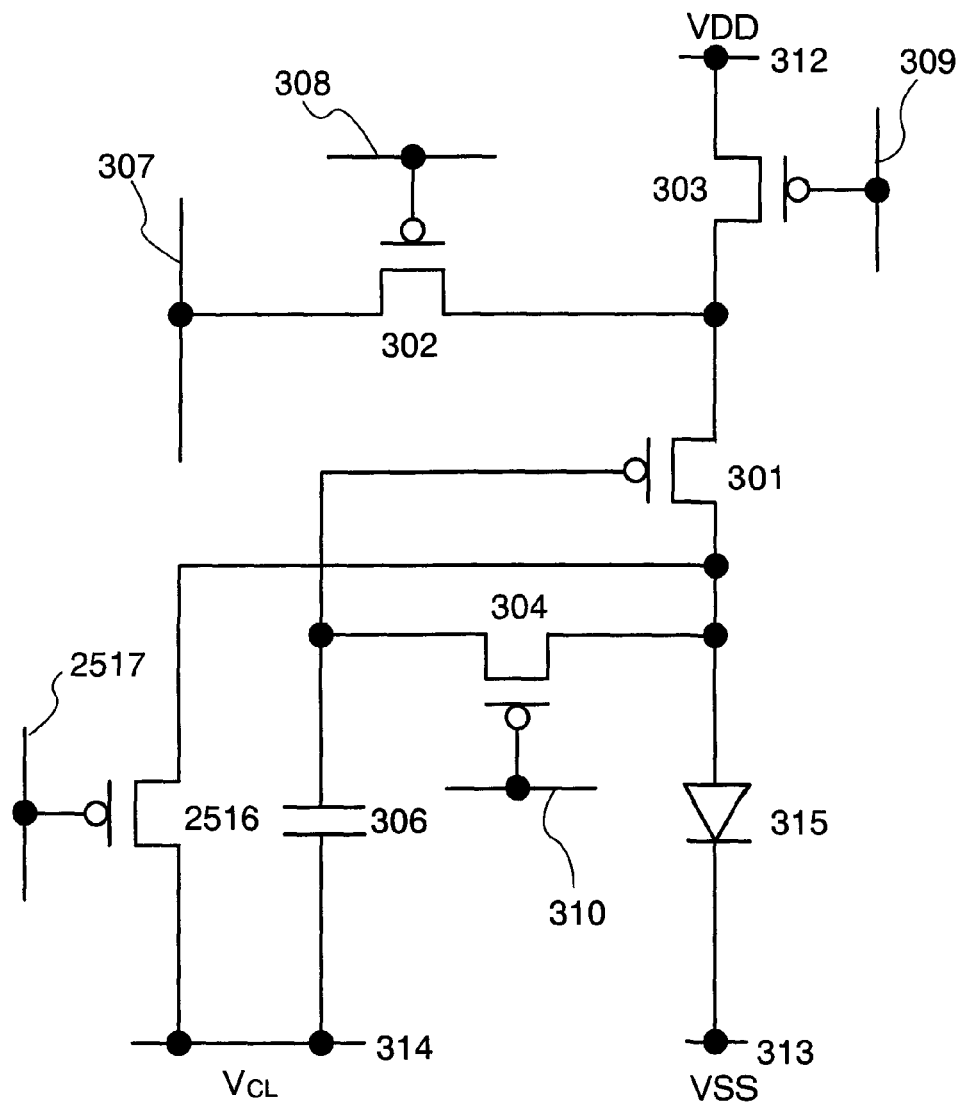
FIG. 35 is a diagram showing an example of a pixel structure in a display device of the present invention.

Note that as a method of initialization, the method of initialization using an initialization transistor, which is described in Embodiment Mode 3, may be used. FIG. 35 shows an example of this case.

In a pixel circuit shown in FIG. 35, the fifth transistor 305 and the fourth scan line 311 are omitted in the diagram showing the example where initialization is performed using the initialization transistor (FIG. 25), and the second electrode of the first transistor 301 and the first electrode of the light-emitting element 315 are connected. In this case, by setting the potential of the second power supply line 313 to be higher than the potential of the second electrode of the first transistor 301 in the first period T1, initialization can be performed without supplying current to the light-emitting element 315.

Figure 36:
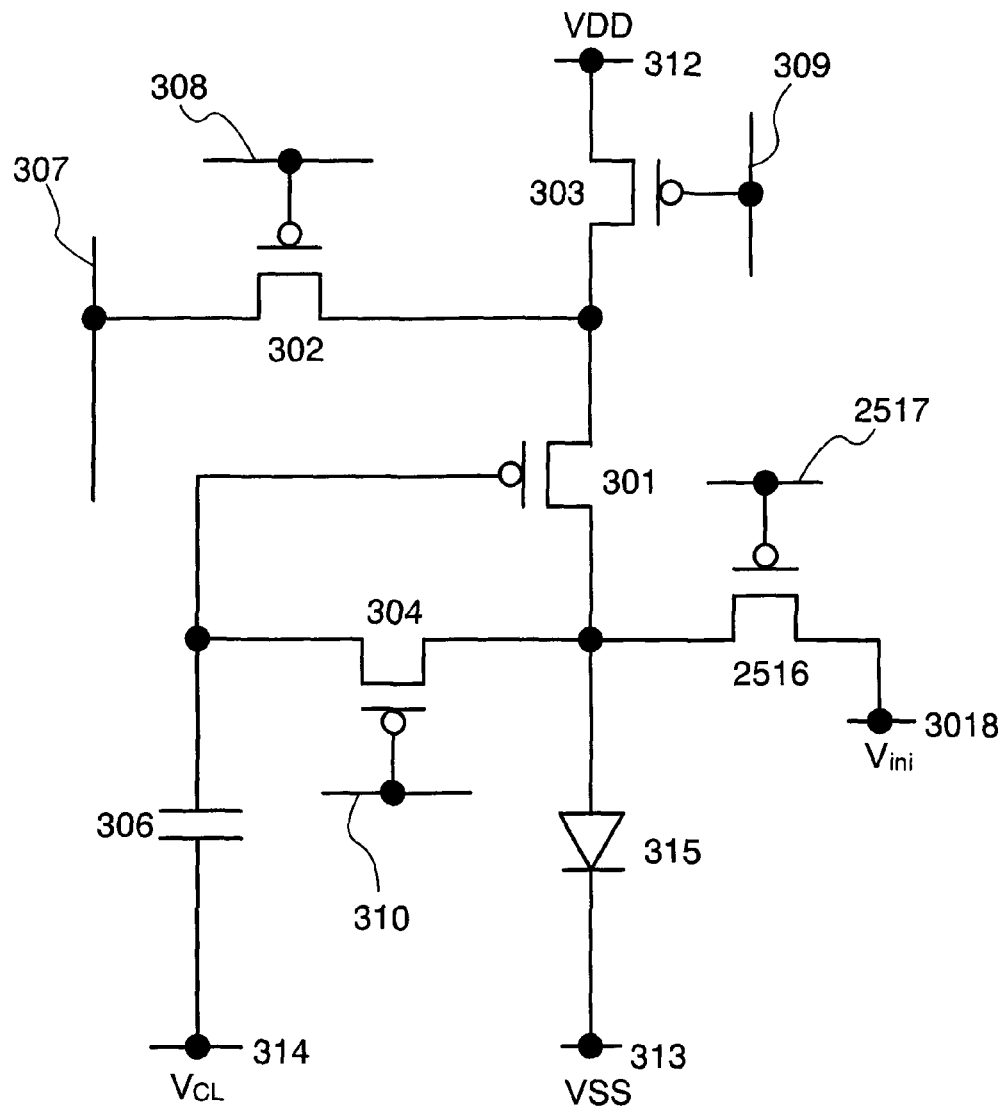
FIG. 36 is a diagram showing an example of a pixel structure in a display device of the present invention.

In addition, as another method of initialization, the method of initialization using an initialization transistor and an initializing line, which is described in Embodiment Mode 3, may be used. FIG. 36 shows an example of this case.

In a pixel circuit shown in FIG. 36, the fifth transistor 305 and the fourth scan line 311 are omitted in the diagram showing the example where initialization is performed using the initialization transistor and initializing line (FIG. 30), and the second electrode of the first transistor 301 and the first electrode of the light-emitting element 315 are connected. In this case, by setting the potential of the second power supply line 313 to be higher than the initial potential $V_{ini}$ in the first period T1, initialization can be performed without supplying current to the light-emitting element 315.

Note that although the case where the first transistor is a P-channel transistor (FIG. 3) is only described in this embodiment mode, this embodiment mode can be similarly applied to the case where the first transistor is an N-channel transistor as in the pixel circuit shown in FIG. 8.

In the pixel circuit shown in FIG. 8, in the case where the potential of the second power supply line 813 is changed in accordance with periods, a reverse bias can be applied to the light-emitting element 815 by setting the potential of the second power supply line 813 to be lower than the potential of the second electrode of the light-emitting element 815 in the second period T2. Thus, current supply to the light-emitting element 815 can be stopped in the second period T2.

Note that the above-described operation can be performed in the period T2 by setting the potential of the second power supply line 813 to be lower than or equal to the sum of the video signal voltage $V_{data}$ and the threshold voltage $|V_{th}|$ of the first transistor 801, i.e., $V_{data}+|V_{th}|$.

Further, a forward bias can be applied to the light-emitting element 815 by setting the potential of the second power supply line 813 to be higher than the sum of the video signal voltage $V_{data}$ and the threshold voltage $|V_{th}|$ of the first transistor 801, i.e., $V_{data}+|V_{th}|$ in the first period T1 and the third period T3. Thus, current can be supplied to the light-emitting element 815 in the first period T1 and the third period T3.

In addition, as another method of initialization, the method of initialization using an initialization transistor, which is described in Embodiment Mode 3, may be used. In this case, initialization can be performed without supplying current to the light-emitting element 815 by setting the potential of the second power supply line 813 to be lower than or equal to the potential of the second electrode of the first transistor 801 in the first period T1.

In addition, as another method of initialization, the method of initialization using an initialization transistor and an initializing line, which is described in Embodiment Mode 3, may be used. In this case, initialization can be performed without supplying current to the light-emitting element 815 by setting the potential of the second power supply line 813 to be lower than or equal to the initial potential $V_{ini}$ in the first period T1.

By changing the potential of the second power supply line in accordance with periods in this manner, current supply to the light-emitting element can be stopped in periods other than the light-emitting period T3. Therefore, light emission of the light-emitting element in the periods other than the light-emitting period can be suppressed. Further, since it is not necessary to provide a fifth transistor and a fourth scan line, an aperture ratio of pixels can be improved. In addition, since the number of scan line driver circuits can be reduced, power consumption can be reduced.

In addition, by changing the potential of the second power supply line in accordance with periods, a reverse bias can be applied to the light-emitting element. In particular, in the case where the light-emitting element is an EL element, by applying a reverse bias, deterioration of the EL element can be suppressed to improve reliability and the life of the EL element can be prolonged.

The pixel structure of the present invention may be applied to a pixel structure in the case of performing an area ratio gray scale method. That is, in a pixel structure where one pixel is divided into a plurality of subpixels, the pixel structure of the present invention may be applied to each subpixel. Thus, fluctuation in luminance can be reduced every subpixel, and high-quality and multi-gray scale display can be performed.

Note that this embodiment mode shows an example of an embodied case of the contents (or may be part of the contents) described in other embodiment modes, an example of slight transformation thereof, an example of partial modification thereof, an example of improvement thereof, an example of detailed description thereof, an application example thereof, an example of related part thereof, or the like. Therefore, the contents described in other embodiment modes can be freely applied to, combined with, or replaced with this embodiment mode.

Although this embodiment mode is described with reference to various drawings, the contents (or may be part of the contents), described in each drawing can be freely applied to, combined with, or replaced with the contents (or may be part of the contents) described in another drawing. Further, even more drawings can be formed by combining each part with another part in the above-described drawings.

Similarly, the contents (or may be part of the contents) described in each drawing of this embodiment mode can be freely applied to, combined with, or replaced with the contents (or may be part of the contents) described in a drawing in another embodiment mode. Further, even more drawings can be formed by combining each part with part of another embodiment mode in the drawings of this embodiment mode.

[Embodiment Mode 5]

Figure 37:
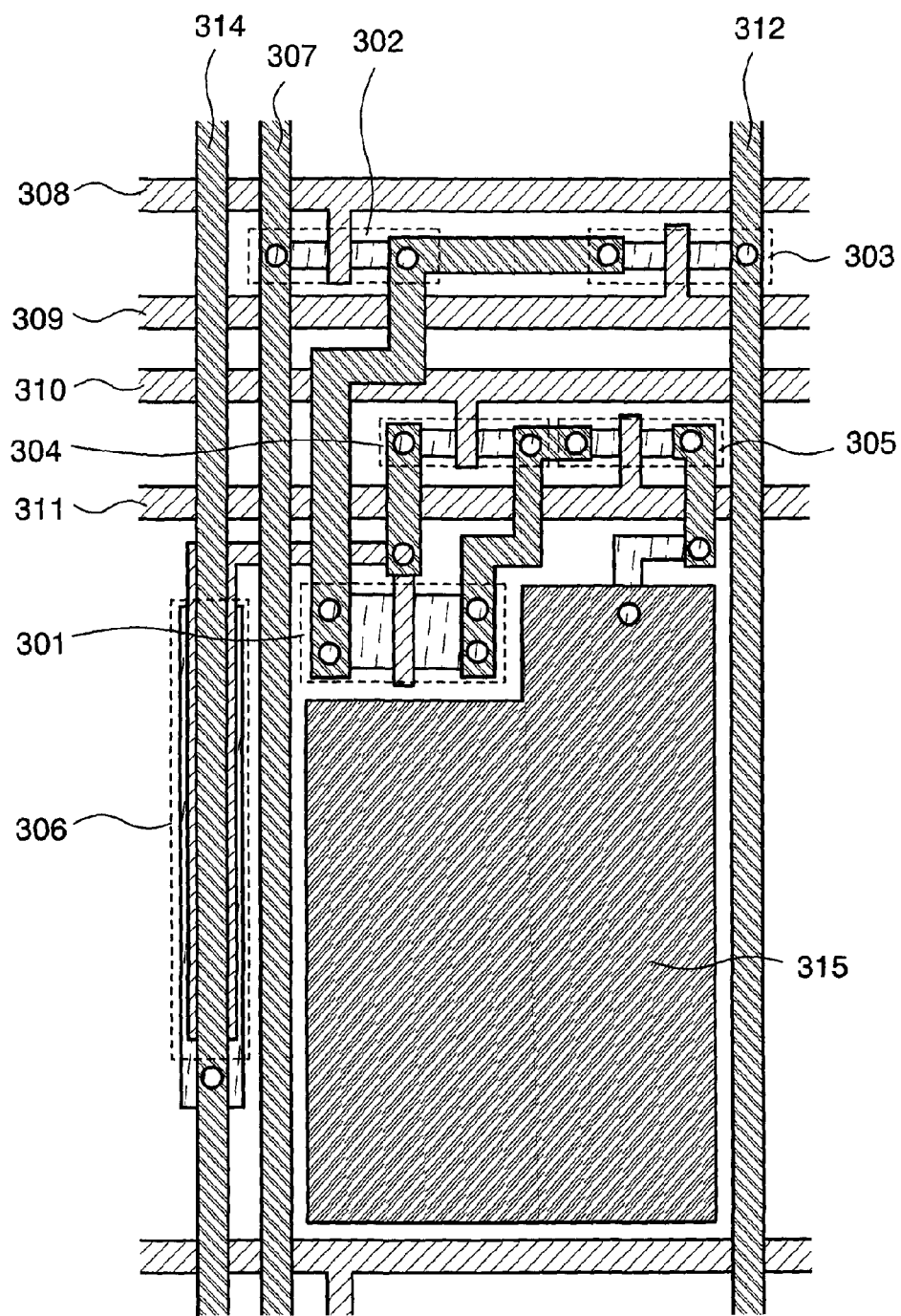
FIG. 37 is a diagram showing a layout of a pixel structure in a display device of the present invention.

In this embodiment mode, a pixel layout of a display device of the present invention is described. For example, FIG. 37 shows a layout of the pixel circuit shown in FIG. 3. Note that portions which are common to FIG. 37 and FIG. 3 are denoted by the common reference numerals. Note that the layout is not limited to FIG. 37.

The pixel circuit shown in FIG. 3 includes the first transistor 301 to the fifth transistor 305, the storage capacitor 306, the signal line 307, the first scan line 308 to the fourth scan line 311, the first power supply line 312, the capacitor line 314, and the light-emitting element 315.

The first scan line 308 to the forth scan line 311 are formed of a first wiring. The signal line 307, the first power supply line 312, the second power supply line 313, and the capacitor line 314 are formed of a second wiring. Note that since the second power supply line 313 cannot be expressed in the layout, the second power supply line 313 is not shown in FIG. 37.

In the case of a top-gate structure, films are stacked in order of a substrate, a semiconductor layer, a gate insulating film, a first wiring, an interlayer insulating film, and a second wiring. Alternatively, in the case of a bottom-gate structure, films are stacked in order of a substrate, a first wiring, a gate insulating film, a semiconductor layer, an interlayer insulating film, and a second wiring.

Note that in the pixel structure of this embodiment mode, when the first transistor is formed so as to have the largest value of W/L (ratio of the channel width W to the channel length L) among the values of W/L of the first transistor to the fifth transistor, current flowing between a drain and a source of the first transistor can be further increased. Thus, in acquiring voltage based on the video signal voltage $V_{data}$ and the threshold voltage $|V_{th}|$ of the first transistor in the second period T2, the operation can be performed with larger current, so that a faster operation can be performed. Further, the current $I_{OLED}$ flowing to the light-emitting element in the third period T3 can be further increased, so that luminance can be further increased. Thus, in order to form the first transistor 301 so as to have the largest value of W/L among the values of W/L of all the transistors, the first transistor 301 is formed so as to have the largest channel width W among the first transistor 301 to the fifth transistor 305 in FIG. 37.

Note that although each of the first transistor 301 to the fifth transistor 305 has a single-gate structure, the present invention is not limited to this. The structure of each of the first transistor 301 to the fifth transistor 305 may be various modes. For example, a multi-gate structure having two or more gate electrodes may be employed. When a multi-gate structure is employed, a structure where channel regions are connected in series is provided, so that a structure where a plurality of transistors are connected in series is provided. By employing a multi-gate structure, off-current can be reduced and the withstand voltage can be increased to improve the reliability of the transistor, and flat characteristics can be provided without causing fluctuations in drain-source current very much even if a drain-source voltage fluctuates when the transistor operates in a saturation region. In addition, a structure where gate electrodes are formed above and below a channel may be employed. By employing a structure where gate electrodes are formed above and below a channel, a channel region is enlarged to increase the amount of current flowing therethrough, and a depletion layer can be easily formed to improve a subthreshold swing. When gate electrodes are formed above and below a channel, a structure where a plurality of transistors are connected in parallel is provided. In addition, a structure where a gate electrode is formed above a channel, a structure where a gate electrode is formed below a channel, a staggered structure, an inversely staggered structure, a structure where a channel region is divided into a plurality of regions, or a structure where channel regions are connected in parallel or in series may be used. In addition, a channel (or part of it) may overlap with a source electrode or a drain electrode. By forming a structure where a channel (or part of it) overlaps with a source electrode or a drain electrode, the case can be prevented in which electric charges are accumulated in part of the channel region, which would result in an unstable operation. In addition, an LDD (lightly doped drain) region may be provided. By providing an LDD region, off-current can be reduced and the withstand voltage can be increased to improve the reliability of the transistor, and even if drain-source voltage fluctuates when the transistor operates in a saturation region, flat characteristics can be provided without causing fluctuations in drain-source current very much.

Note that a wiring, an electrode, a conductive layer, a conductive film, a terminal, a via, a plug, or the like is preferably formed of one element or a plurality of elements of a group consisting of aluminum (Al), tantalum (Ta), titanium (Ti), molybdenum (Mo), tungsten (W), neodymium (Nd), chromium (Cr), nickel (Ni), platinum (Pt), gold (Au), silver (Ag), copper (Cu), magnesium (Mg), scandium (Sc), cobalt (Co), zinc (Zn), niobium (Nb), silicon (Si), phosphorus (P), boron (B), arsenic (As), gallium (Ga), indium (In), tin (Sn), and oxygen (O), or a compound or an alloy material including one element or a plurality of such elements (e.g., indium tin oxide (ITO), indium zinc oxide (IZO), indium tin oxide to which silicon oxide is added (ITSO), zinc oxide (ZnO), cadmium tin oxide (CTO), aluminum neodymium (Al—Nd), magnesium silver (Mg—Ag), or molybdenum neodymium (Mo—Nb)). Alternatively, a wiring, an electrode, a conductive layer, a conductive film, a terminal, or the like is preferably formed of a substance or the like obtained by combining such compounds. Further alternatively, a wiring, an electrode, a conductive layer, a conductive film, a terminal, or the like is preferably formed of a compound of one element or a plurality of elements of the above-described group and silicon (silicide) (e.g., aluminum silicon, molybdenum silicon, or nickel silicide) or a compound of one element or a plurality of elements selected from the above-described group and nitride (e.g., titanium nitride, tantalum nitride, or molybdenum nitride).

Note that silicon (Si) may include n-type impurities (e.g., phosphorus) or p-type impurities (e.g., boron). When silicon includes such impurities, conductivity is improved, so that silicon can behave in a similar manner to a normal conductor. Therefore, silicon can be easily utilized as a wiring or an electrode.

Silicon with various crystallinity such as single crystalline silicon, polycrystalline silicon (polysilicon), or microcrystalline silicon can be used as silicon. Alternatively, silicon with no crystallinity such as amorphous silicon can be used as silicon. By using single crystalline silicon or polycrystalline silicon, resistance of a wiring, an electrode, a conductive layer, a conductive film, a terminal, or the like can be decreased. By using amorphous silicon or microcrystalline silicon, a wiring or the like can be formed through a simple process.

Note that since aluminum or silver has high conductivity, signal delay can be reduced. In addition, aluminum or silver can be easily etched and patterned, so that microfabrication can be performed.

Since copper has high conductivity, signal delay can be reduced. In the case of using copper, it is preferable to use a stacked-layer structure in order to improve adhesiveness.

Molybdenum or titanium is preferable because it has advantages such that a defect does not occur even when molybdenum or titanium is in contact with a oxide semiconductor (e.g., ITO or IZO) or silicon, etching can be easily performed, and heat resistance is high.

Tungsten is preferable because it has advantages such that heat resistance is high.

Neodymium is preferable because it has advantages such that heat resistance is high. In particular, it is preferable to use an alloy of neodymium and aluminum because heat resistance is improved and a hillock is hardly generated in aluminum.

Silicon is preferable because it has advantages such that silicon can be formed at the same time as a semiconductor film included in a transistor and heat resistance is high.

Note that ITO, IZO, ITSO, zinc oxide (ZnO), silicon (Si), tin oxide (SnO), or cadmium tin oxide (CTO) can be used for a portion which transmits light because it has light-transmitting properties. For example, the material can be used for a pixel electrode or a common electrode.

IZO is preferable because it can be easily etched and patterned. IZO hardly generates a residue when it is etched. Therefore, when IZO is used for a pixel electrode, a malfunction (e.g., a short circuit or alignment disorder) of a liquid crystal element or a light-emitting element can be reduced.

Note that a wiring, an electrode, a conductive layer, a conductive film, a terminal, a via, a plug, or the like may have either a single-layer structure or a stacked-layer structure. When a single-layer structure is employed, a manufacturing process of a wiring, an electrode, a conductive layer, a conductive film, a terminal, or the like can be simplified to reduce manufacturing time, so that cost can be reduced. Alternatively, when a multi-layer structure is employed, advantages of each material can be effectively utilized while disadvantages of each material can be reduced, so that a wiring, an electrode, or the like with high performance can be formed. For example, when a multi-layer structure includes a low resistance material (e.g., aluminum), resistance of a wiring can be decreased. In addition, when a stacked-layer structure where a low heat-resistance material is sandwiched between high heat-resistance materials is employed, advantages of the low heat-resistance material can be effectively utilized and heat resistance of a wiring, an electrode, or the like can be increased. For example, a stacked-layer structure where a layer including aluminum is sandwiched between layers including molybdenum, titanium, neodymium, or the like is preferably employed.

In addition, when a wiring, an electrode, and the like are directly in contact with each other, they adversely affect each other in some cases. For example, a material of one of the wiring, the electrode, and the like is mixed into a material of the other of the wiring, the electrode, and the like and properties of the materials are changed, so that the original object cannot be achieved. As another example, when a high resistance portion is formed or manufactured, the high resistance portion cannot be manufactured because of generation of a problem in some cases. In such a case, a material which easily reacts by a stacked-layer structure may be sandwiched between or covered with materials which hardly react. For example, when ITO and aluminum are connected, it is preferable to sandwich titanium, molybdenum, or an alloy of neodymium between ITO and aluminum. In addition, when silicon and aluminum are connected, it is preferable to sandwich titanium, molybdenum, or an alloy of neodymium between silicon and aluminum.

Note that a wiring corresponds to an object provided with a conductor. The conductor may be extended linearly or may be short without extension. Therefore, an electrode corresponds to a wiring.

Note that a carbon nanotube may be used for a wiring, an electrode, a conductive layer, a terminal, a via, a plug, or the like. In addition, a carbon nanotube can be used for a portion which transmits light because it has light-transmitting properties. For example, a carbon nanotube can be used for a pixel electrode or a common electrode.

Note that this embodiment mode shows an example of an embodied case of the contents (or may be part of the contents) described in other embodiment modes, an example of slight transformation thereof, an example of partial modification thereof, an example of improvement thereof, an example of detailed description thereof, an application example thereof, an example of related part thereof, or the like. Therefore, the contents described in other embodiment modes can be freely applied to, combined with, or replaced with this embodiment mode.

Although this embodiment mode is described with reference to various drawings, the contents (or may be part of the contents) described in each drawing can be freely applied to, combined with, or replaced with the contents (or may be part of the contents) described in another drawing. Further, even more drawings can be formed by combining each part with another part in the above-described drawings.

Similarly, the contents (or may be part of the contents) described in each drawing of this embodiment mode can be freely applied to, combined with, or replaced with the contents (or may be part of the contents) described in a drawing in another embodiment mode. Further, even more drawings can be formed by combining each part with part of another embodiment mode in the drawings of this embodiment mode.

[Embodiment Mode 6]

This embodiment mode will describe a structure and an operation of a signal line driver circuit, a scan line driver circuit, and the like of a display device.

Figure 38:
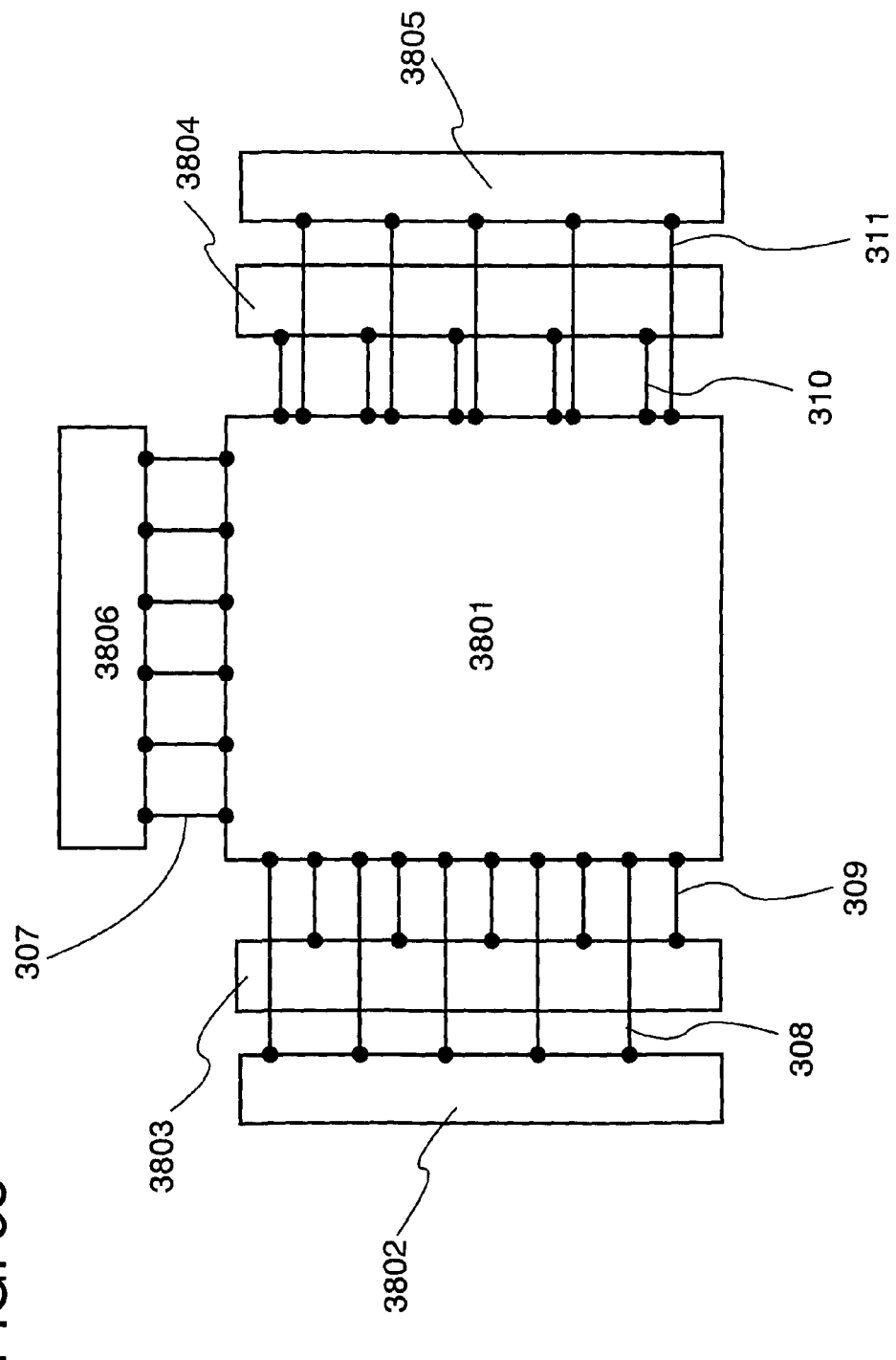
FIG. 38 is a diagram showing a structural example of a display device of the present invention.

First, as a pixel structure, the case of using a pixel structure that controls operation with a signal line and first to fourth scan lines, as shown in FIGS. 3 and 8, is described. Here as a pixel structure, the case of employing a pixel structure shown in FIG. 3 will be described as an example. FIG. 38 illustrates structural example of a display device of this case.

The display device shown in FIG. 38 has a pixel portion 3801, first to fourth scan line driver circuits 3802 to 3805, and a signal line driver circuit 3806. The first scan line driver circuit 3802 and a first scan line 308, the second scan line driver circuit 3803 and a second scan line 309, the third scan line driver circuit 3804 and a third scan line 310, the fourth scan line driver circuit 3805 and a fourth scan line 311, and a signal line driver circuit 3806 and a signal line 307 are connected. Note that the reference numerals of the first to fourth scan lines, and the signal lines correspond to those of FIG. 3.

First, the first to fourth scan line driver circuits 3802 to 3805 are described. The first scan line driver circuit 3802 is a circuit for outputting a selection signal to the first scan line 308 sequentially. The second to fourth scan driver circuits 3803 to 3805 are also circuits with a similar function. Accordingly, a selection signal is written to the pixel portion 3801.

Figure 39:
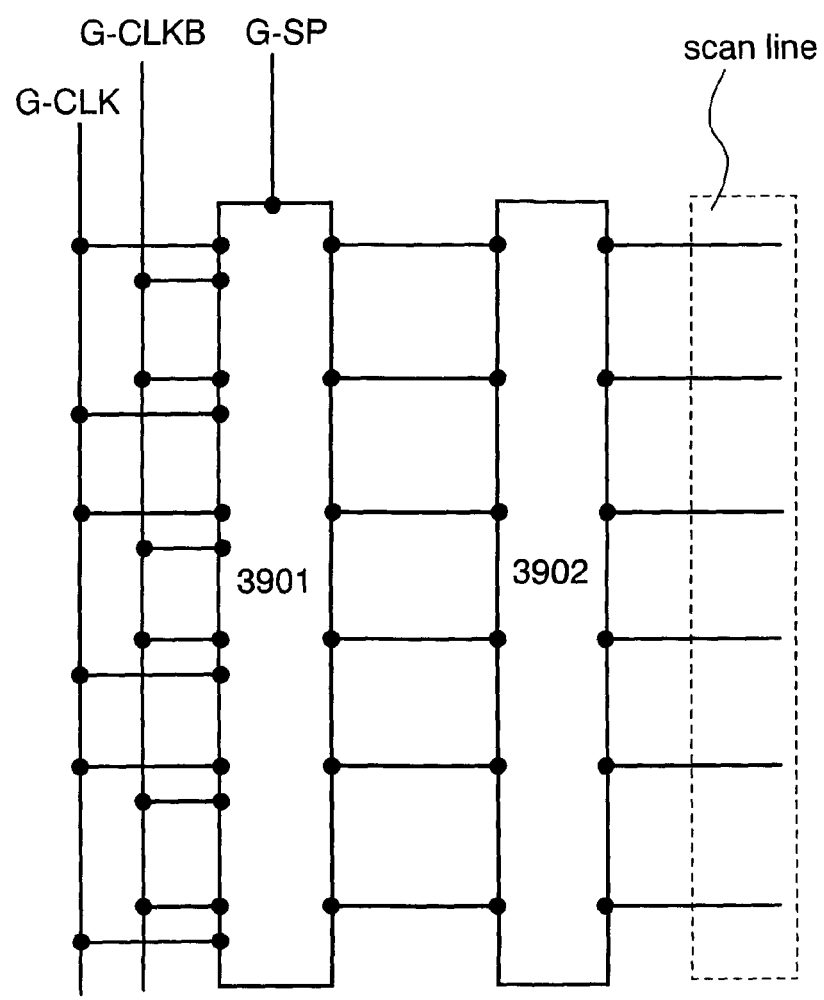
FIG. 39 is a diagram showing a structural example of a scan line driver circuit in a display device of the present invention.

FIG. 39 shows a structure example of the first to fourth scan line driver circuits 3802 to 3805. Each of the scan line driver circuits 3802 and 3805 mainly include a shift register 3901, an amplifier circuit 3902, and the like.

Next, operations of the first to fourth scan line driver circuits 3802 to 3805 shown in FIG. 39 are briefly described. A clock signal (G-CLK), a start pulse (G-SP), and a clock inverted signal (G-CLKB) are input to the shift register 3901, and sampling pulses are sequentially output in accordance with the timing of these signals. The sampling pulses that are output are amplified by the amplifier circuit 3902 and input from each scan line to the pixel portion 3801.

Note that a buffer circuit or a level shifter circuit may be included in the amplifier circuit 3902. Further, a pulse width control circuit and the like may be placed in the scan line driver circuit in addition to the shift register 3901 and the amplifier circuit 3902.

Next, the signal line driver circuit is described. The signal line driver circuit 3806 sequentially outputs video signals to the signal line 307 connected to the pixel portion. The video signals output from the signal line driver circuit 3806 are input to the pixel portion 3801. An image is displayed in the pixel portion 3801 by control of a light emitting state of a pixel in accordance with the video signals.

Figure 40A:
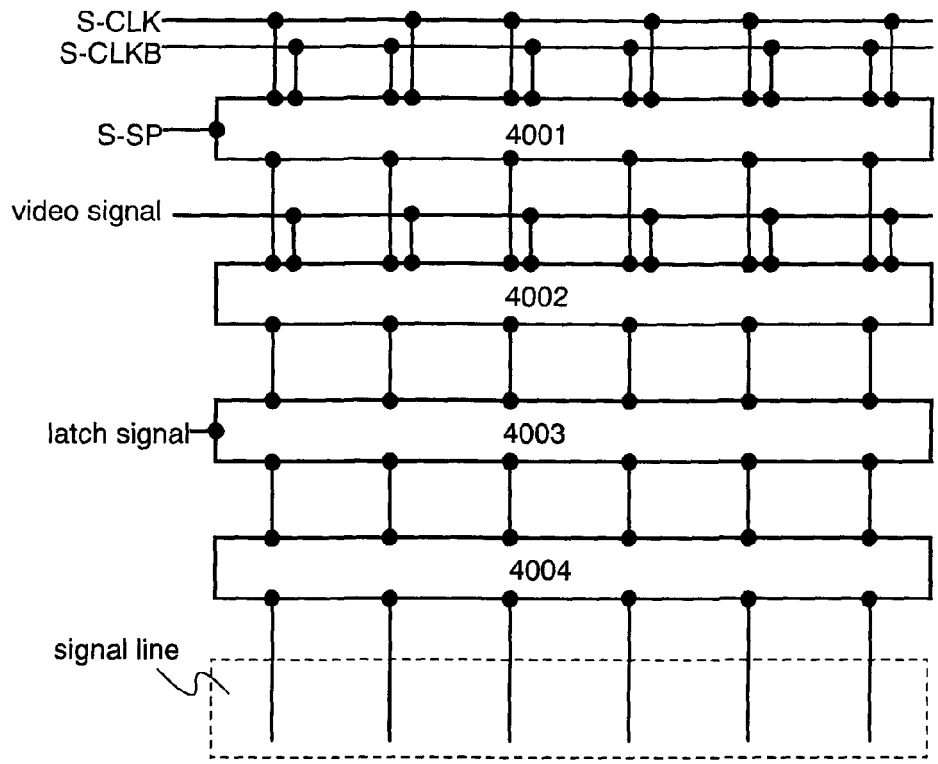
FIGS. 40A and 40B are diagrams each showing a structural example of a signal line driver circuit in a display device of the present invention.
Figure 40B:
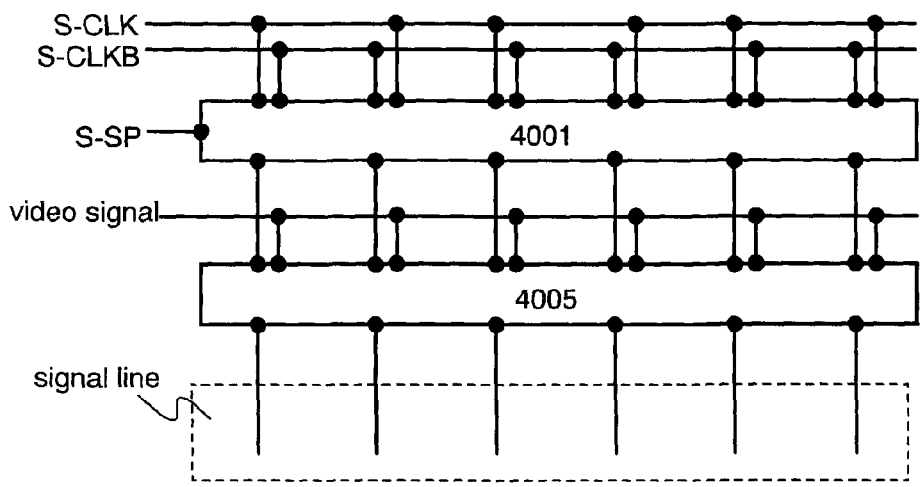

FIGS. 40A and 40B each show a structure example of the signal line driver circuit 3806. FIG. 40A shows an example of the signal line driver circuit 3806 in a case where a signal is supplied to a pixel by line sequential driving. The signal line driver circuit 3806 in this case mainly includes a shift register 4001, a first latch circuit 4002, a second latch circuit 4003, an amplifier circuit 4004, and the like. Note that, the amplifier circuit 4004 may include a buffer circuit, a level shifter circuit, a circuit having a function of converting a digital signal into an analog signal, or a circuit having a function of performing gamma correction.

Next, operations of the signal line driver circuit 3806 shown in FIG. 40A are briefly described. A clock signal (S-CLK), a start pulse (S—SP), and a clock inverted signal (S-CLKB) are input to the shift register 4001, and sampling pulses are sequentially output in accordance with the timing of these signals.

The sampling pulses output from the shift register 4001 are input to the first latch circuit 4002. A video signal as voltage $V_{data}$ is input to the first latch circuit 4002 from a video signal line, and the video signal is stored in each column in accordance with the timing of when the sampling pulses are input.

After storage of the video signal is completed to the last column in the first latch circuit 4002, a latch signal is input from a latch control line in a horizontal retrace period, and the video signal stored in the first latch circuit 4002 is transferred to the second latch circuit 4003 all at once. Thereafter, the video signals of one row, which are stored in the second latch circuit 4003, are input to the amplifier circuit 4004 all at once. Then, the amplitude of the video signal voltage $V_{data}$ is amplified by the amplifier circuit 4004, and the video signals are input from each signal line to the pixel portion 3801.

The video signal held in the second latch circuit 4003 is input to the amplifier circuit 4004, and while the video signal is input to the pixel portion 3801, the shift register 4001 outputs a sampling pulse again. In other words, two operations are performed at the same time. Thus, line sequential driving can be realized. Thereafter, the above operations are repeated.

Note that a signal is supplied to a pixel by dot sequential driving in some cases. FIG. 40B shows an example of the signal line driver circuit 3806 in this case. The signal line driver circuit 3806 in this case has the shift register 4001, a sampling circuit 4005, and the like. Sampling pulses are output from the shift register 4001 to the sampling circuit 4005. A video signal as voltage $V_{data}$ is input to the sampling circuit 4005 from a video signal line, and the video signals are sequentially output to the pixel portion 3801 in accordance with the sampling pulses. Thus, dot sequential driving can be realized.

Note that the signal line driver circuit or a part thereof (such as the current source circuit or the amplifier circuit) does not existed over the same substrate as the pixel portion 3801 in some cases, and may be formed using, for example, an external IC chip.

By using the scan line driver circuit and the signal line driver circuit as described above, the pixel circuit of the invention can be driven.

Note that, in the pixel circuit shown in FIGS. 3 and 8, for example, selection signals that are mutually inverted are input to the first and second scan lines. Thus, the selection signal input into one of the first and second scan lines may be controlled by using one of the first and second scan line driver circuits, and the inverted signal may be input into the other scan line. A structural example of the display device of this case is shown in FIG. 41.

Figure 41:
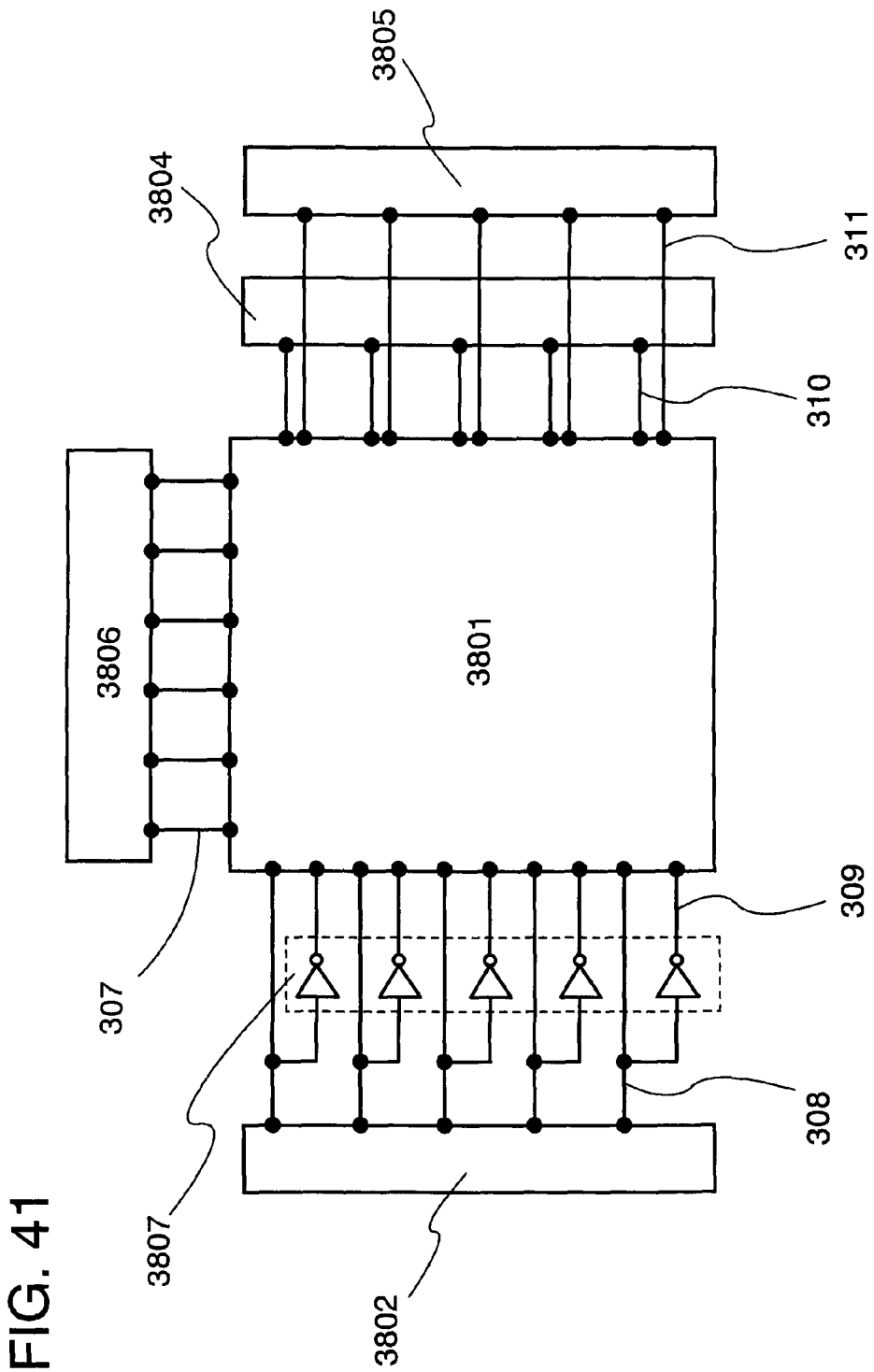
FIG. 41 is a diagram showing a structural example of a display device of the present invention.

The display device shown in FIG. 41 has the pixel portion 3801, the first, third, and fourth scan line driver circuits 3802, 3804 and 3805, the signal line driver circuit 3806, and an inverter 3807. The first scan line driver circuit 3802 is connected to the scan line 308. The second scan line 309 and the first scan line driver circuit 3802 are connected via the inverter 3807. Since the connection of other scan line driver circuit and signal line driver circuit is similar to the display device shown in FIG. 38, description thereof is omitted. Note that reference numerals used for the first to fourth scan lines and the signal line correspond to the reference numerals used in FIG. 3.

In the display device shows in FIG. 41, selection signals input to the first scan line 308 are controlled with the first scan line driver circuit 3802. Inverted signals of the selection signals input to the first scan line 308 are generated by using the inverter 3807, and input to the second scan line 309.

Figure 42:
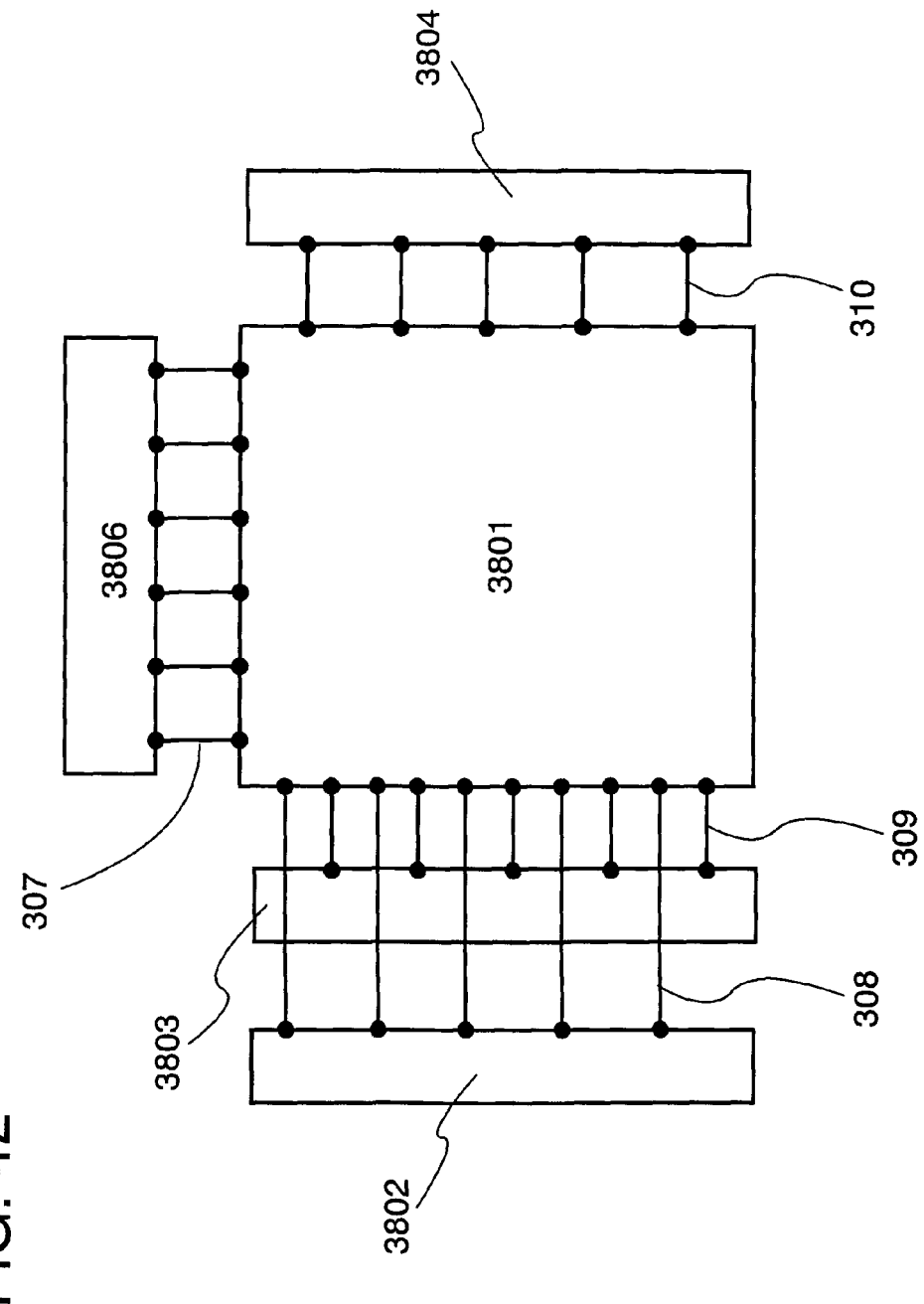
FIG. 42 is a diagram showing a structural example of a display device of the present invention.

In addition, with the pixel structure shown in FIGS. 3 and 8, for example, the same selection signals are input to the second and fourth scan lines. Accordingly, the third and fifth transistors may be controlled with the same scan line as in the pixel structure shown in FIGS. 14 and 15. FIG. 42 shows an exemplary structure of the display device in that case. Note that for the pixel structure, the case of using the pixel structure shown in FIG. 14 is described as an example.

FIG. 42 illustrates an exemplary structure of the display device in the case of controlling the third and fifth transistors 303 and 305 by using the second scan line 309. The display device shown in FIG. 42 has the pixel portion 3801, the first to third scan line driver circuit 3802 to 3804, and the signal line driver circuit 3806. Since the connection of each driver circuit is the same as that in the display device shown in FIG. 38, description thereof is omitted. Note that reference numerals used for the first to third scan lines, the signal line, and the third and fifth transistors correspond to the reference numerals used in FIG. 14

Figure 43:
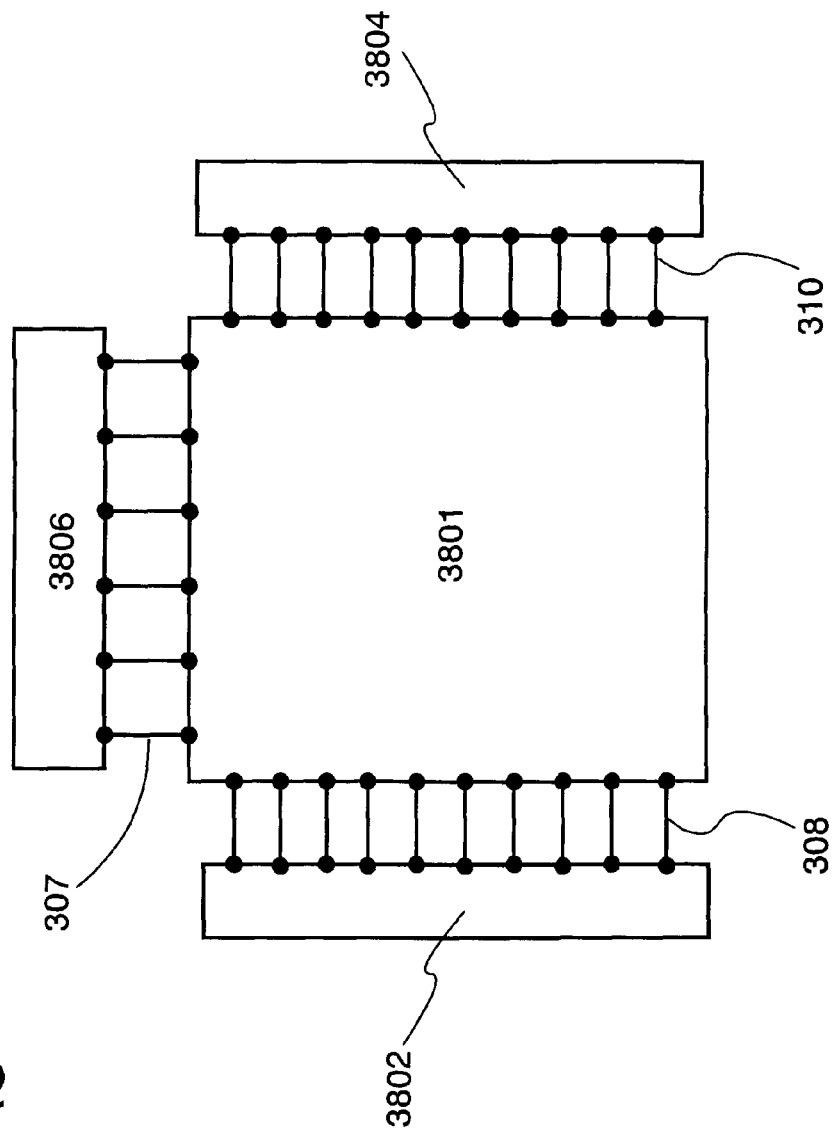
FIG. 43 is a diagram showing a structural example of a display device of the present invention.

Additionally, as in the exemplary pixel structure shown in FIG. 20, the conductivity type of the second transistor may be made to be different from that of the other transistors so that the second transistor, the third transistor, and the fifth transistor can be controlled by the same scan line. FIG. 43 illustrates the exemplary structure of the display device in this case.

FIG. 43 is the exemplary structure of a display device in the case of controlling the second, third, and fifth transistors 302, 303, and 305 by using the first scan line 308. The display device shown in FIG. 43 has the pixel portion 3801, the first and third scan line driver circuit 3802, and 3804, and the signal line driver circuits 3806. Since the connections of each driver circuit are the same as the display device shown in FIG. 38, description thereof is omitted. Note that reference numerals used for the first and third scan lines, the signal line, the second, third, fifth transistors correspond to the reference numerals used in FIG. 20.

In this manner, the pixel circuit of the present invention can be driven with structures of the display device shown in FIGS. 41 to 43.

Note that since the number of the scan line and the scan line driver circuit can be reduced by having structures like those of the display devices shown in FIGS. 41 to 43, aperture ratio of the pixel portion can be increased. Additionally, power consumption can be reduced. Further, by reducing the number of the scan line driver circuit, a frame can be small, or an area occupied by the pixel portion can be large.

Note that structures of the signal driver circuit and scan line driver circuit are not limited to the structures in FIGS. 38 to 43.

Note that a transistor in the invention can be any type of transistors and formed over any substrate. Therefore, all the circuits shown in FIGS. 38 to 43 may be formed over a glass substrate, a plastic substrate, a single crystalline substrate, an SOI substrate, or any other type of substrate. Alternatively, a portion of the circuits in FIGS. 38 to 43 may be formed over one substrate, and the other portion of the circuits in FIGS. 38 to 43 may be formed over another substrate. In other words, it is not necessary that all the circuits in FIGS. 38 to 43 are formed over the same substrate. For example, in FIGS. 38 to 43, the pixel portion and the scan line driver circuit may be formed over a glass substrate by using transistors, and the signal line driver circuit (or a part thereof) may be formed over a single crystalline substrate, and then an IC chip may be connected by COG (Chip On Glass) to be provided over a glass substrate. Alternatively, the IC chip may be connected to the glass substrate by TAB (Tape Automated Bonding) or using a printed wiring board. In this manner, when a part of the circuits is formed over the same substrate, the number of components can be reduced to reduce cost, and the number of connections to circuit components can be reduced to improve reliability. In addition, since power consumption is large in a portion with high driving voltage or a portion with high driving frequency, if such a portion is formed over another substrate, increase in power consumption can be prevented.

Note that this embodiment mode shows an example of an embodied case of the contents (or a part thereof) described in other embodiment modes, an example of slight transformation thereof, an example of partial modification thereof, an example of improvement thereof, an example of detailed description thereof, an application example thereof, an example of related part thereof, or the like. Therefore, the contents described in other embodiment modes can be freely applied to, combined with, or replaced with this embodiment mode.

Although this embodiment mode is described with reference to various drawings, the contents (or a part thereof) described in each drawing can be freely applied to, combined with, or replaced with the contents (or a part thereof) described in another drawing. Further, even more drawings can be formed by combining each part with another part in the above-described drawings.

Similarly, the contents (or a part thereof) described in each drawing of this embodiment mode can be freely applied to, combined with, or replaced with the contents (or a part thereof) described in a drawing in another embodiment mode. Further, even more drawings can be formed by combining each part with part of another embodiment mode in the drawings of this embodiment mode.

[Embodiment Mode 7]

In this embodiment mode, a display panel used for a display device of the invention is described with reference to FIGS. 44A and 44B and the like. FIG. 44A is a top view showing a display panel. FIG. 44B is a cross-sectional view along a line A-A' of FIG. 44A. A signal line driver circuit 4401, a pixel portion 4402, a first scan line driver circuit 4403, and a second scan line driver circuit 4406, which are indicated by dotted lines, are included. A sealing substrate 4404 and a sealing material 4405 are also included, and a space surrounded by the sealing material 4405 is a space 4407.

A wiring 4408 is a wiring to transmit signals input to the first scan line driver circuit 4403, the second scan line driver circuit 4406, and the signal line driver circuit 4401, and receives video signals, clock signals, start signals, and the like from an FPC 4409 that become an external input terminal. An IC chip (a semiconductor chip in which a memory circuit, a buffer circuit, and the like are formed) 4422 and 4423 are mounted over a junction portion of the FPC 4409 and the display panel by COG (Chip On Glass) or the like. Note that only the FPC is shown in the figure; however, a printed wiring board (PWB) may be attached to the FPC.

Next, a cross-sectional structure is described with reference to FIG. 44B. The pixel portion 4402 and peripheral driver circuits (the first scan line driver circuit 4403, the second scan line driver circuit 4406, and the signal line driver circuit 4401) are formed over a substrate 4410. Here, the signal line driver circuit 4401 and the pixel portion 4402 are shown.

Note that the signal line driver circuit 4401 is formed using a plurality of transistors such as a transistor 4420 and a transistor 4421. In this embodiment mode, a display panel in which the peripheral driver circuits are formed over the same substrate is described; however, it is not always necessary, and all or a part of the peripheral driver circuits may be formed in an IC chip or the like and mounted by COG or the like.

In addition, the pixel portion 4402 includes a plurality of circuits forming a pixel including a switching transistor 4411 and a driving transistor 4412. Note that a source electrode of the driving transistor 4412 is connected to a first electrode 4413. An insulator 4414 is formed to cover an end portion of the first electrode 4413. Here, a positive photosensitive acrylic resin film is used.

In addition, for good coverage, a curved surface having curvature is formed at an upper end portion or a lower end portion of the insulator 4414. For example, when positive photosensitive acrylic is used as a material for the insulator 4414, a curved surface having a curvature radius (0.2 to 3 µm) is preferably provided only at the upper end portion of the insulator 4414. Further, as the insulator 4414, either negative photosensitive acrylic that become insoluble in an etchant by light irradiation or positive photosensitive acrylic that become soluble in an etchant by light irradiation can be used.

A layer 4416 containing an organic compound and a second electrode 4417 are formed over the first electrode 4413. Here, as a material used for the first electrode 4413 functioning as an anode, a material with a high work function is preferably used. For example, a single layer film such as an ITO (indium tin oxide) film, an indium zinc oxide (IZO) film, a titanium nitride film, a chromium film, a tungsten film, a Zn film, or a Pt film; a stacked-layer structure of a titanium nitride film and a film containing aluminum as its main component; a three-layer structure of a titanium nitride film, a film containing aluminum as its main component, and a titanium nitride film, and the like can be used. Note that in a case of a stacked-layer structure, resistance as a wiring is low, good ohmic contact is obtained, and a function as an anode can be obtained.

The layer 4416 containing the organic compound is formed by a vapor deposition method using a vapor deposition mask or by an ink-jet method. A metal complex using a metal from group 4 of the periodic table is used for a part of the layer 4416 containing the organic compound, and a low molecular weight material or a high molecular weight material may be used in combination. Further, for a material used for the layer containing the organic compound, a single layer or a stacked layer of an organic compound is often used; however, in this embodiment, an inorganic compound may be used in a part of a film formed of an organic compound. Moreover, a known triplet material can also be used.

Further, as a material used for the second electrode 4417, which is a cathode, formed over the layer 4416 containing the organic compound, a material with a low work function (Al, Ag, Li, Ca, or an alloy thereof such as MgAg, MgIn, AlLi, $CaF_2$, or calcium nitride) may be used. Note that when light generated in the layer 4416 containing the organic compound is transmitted through the second electrode 4417, a stacked-layer structure of a metal thin film and a transparent conductive film (ITO (indium tin oxide), an indium oxide-zinc oxide alloy ($In_2O_3$—ZnO), zinc oxide (ZnO), or the like) is preferably used as the second electrode 4417.

In addition, the sealing substrate 4404 is attached to the substrate 4410 with the sealing material 4405 to have a structure provided with a light emitting element 4418 in the space 4407 surrounded by the substrate 4410, the sealing substrate 4404, and the sealing material 4405. Note that the space 4407 may be filled with the sealing material 4405 or with a rare gas (such as nitrogen or argon).

Note that an epoxy-based resin is preferably used for the sealing material 4405. Further, it is preferable that these materials transmit as little moisture or oxygen as possible. In addition, as a material used for the sealing substrate 4404, a plastic substrate formed using FRP (Fiberglass-Reinforced Plastics), PVF (polyvinyl fluoride), polyester, acrylic, or the like as well as a glass substrate or a quartz substrate can be used.

As described above, a display panel having a pixel configuration of the invention can be obtained.

As shown in FIGS. 44A and 44B, the signal line driver circuit 4401, the pixel portion 4402, the first scan line driver circuit 4403, and the second scan line driver circuit 4406 are formed over the same substrate, and thereby, reduction in cost of the display device can be realized. Further, when unipolar transistors are used for the signal line driver circuit 4401, the pixel portion 4402, the first scan line driver circuit 4403, and the second scan line driver circuit 4406, simplification of a manufacturing process can be realized, and thereby, further cost reduction can be realized. When amorphous silicon is employed for semiconductor layers of transistors used for the signal line driver circuit 4401, the pixel portion 4402, the first scan line driver circuit 4403, and the second scan line driver circuit 4406, further cost reduction can be realized.

Note that the structure of the display panel is not limited to the structure shown in FIG. 44A, in which the signal line driver circuit 4401, the pixel portion 4402, the first scan line driver circuit 4403, and the second scan line driver circuit 4406 are formed over the same substrate, and a signal line driver circuit corresponding to the signal line driver circuit 4401 may be formed over an IC chip and mounted on the display panel by COG or the like.

That is, only the signal line driver circuit of which high speed operation is required is formed into an IC chip using a CMOS or the like, and thereby, lower power consumption is realized. Further, when a semiconductor chip formed of a silicon wafer or the like is used as the IC chip, higher speed operation and lower power consumption can be achieved.

Cost reduction can be realized by forming the scan line driver circuits and the pixel portion over the same substrate. Note that when unipolar transistors are used for the scan line driver circuits and the pixel portion, further cost reduction can be realized. As a structure of a pixel included in the pixel portion, the structures shown in Embodiment Mode 1 to Embodiment Mode 4 can be employed. When amorphous silicon is used for semiconductor layers of transistors, the manufacturing process can be simplified, and further cost reduction can be realized.

As described above, cost reduction of a high-definition display device can be realized. Further, by mounting an IC chip including a functional circuit (memory or buffer) over the junction of the FPC 4409 and the substrate 4410, a substrate area can be effectively utilized.

Further, a signal line driver circuit 4401; signal line driver circuits which correspond to the first scan line driver circuit 4403; and the second scan line driver circuit 4406; and the first and second scan line driver circuits in FIG. 44A may be formed over an IC chip and mounted on a display panel by COG or the like. In this case, reduction in power consumption of a high-definition display device can be realized. Accordingly, in order to obtain a display device with less power consumption, polysilicon is preferably used for semiconductor layers of transistors used in the pixel portion.

In addition, when amorphous silicon is used for semiconductor layers of transistors in the pixel portion 4402, further cost reduction can be realized. Moreover, a large display panel can be manufactured as well.

Note that the signal line driver circuit and the scan line driver circuit are not limited to being provided in a row direction and a column direction of the pixels.

Figure 45:
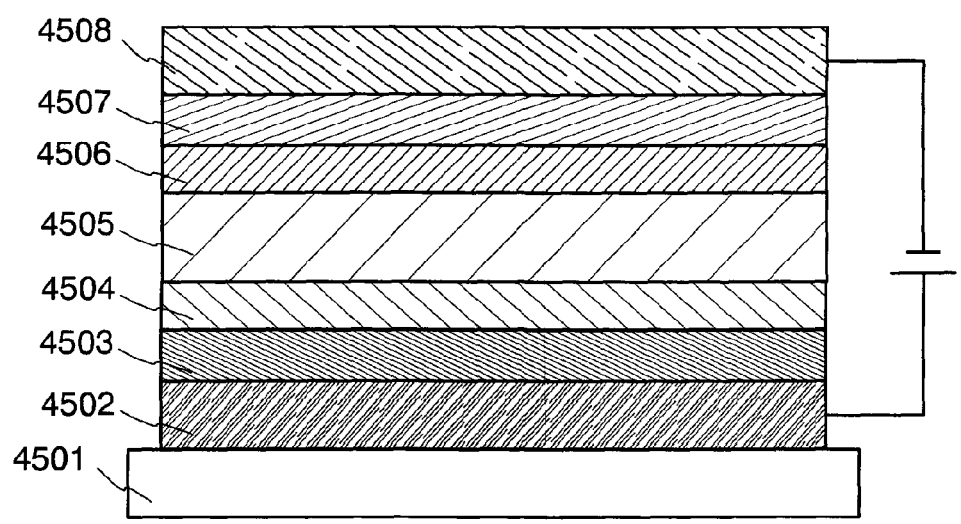
FIG. 45 is a cross-sectional view showing a structural example of a light-emitting element for a display device of the present invention.

Next, FIG. 45 shows an example of a light emitting element which can be applied to the light emitting element 4418.

An element structure is such that an anode 4502, a hole injecting layer 4503 formed of a hole injecting material, a hole transporting layer 4504 formed of a hole transporting material, a light emitting layer 4505, an electron transporting layer 4506 formed of an electron transporting material, an electron injecting layer 4507 formed of an electron injecting material, and a cathode 4508 are stacked over a substrate 4501. Here, the light emitting layer 4505 is formed of only one kind of a light emitting material in some cases and formed of two or more kinds of materials in other cases. A structure of the element of the invention is not limited thereto.

In addition to the stacked-layer structure shown in FIG. 45, in which functional layers are stacked, there are wide variations such as an element formed using a high molecular compound and a high efficiency element utilizing a triplet light emitting material which emits light from a triplet excitation state in a light emitting layer. These variations can also be applied to a white light emitting element or the like which can be obtained by controlling a recombination region of carriers using a hole blocking layer and dividing a light emitting region into two regions.

Next, a manufacturing method of the element of the invention shown in FIG. 45 is described. First, a hole injecting material, a hole transporting material, and a light emitting material are sequentially deposited over the substrate 4501 including the anode 4502 (ITO (indium tin oxide)). Next, an electron transporting material and an electron injecting material are deposited, and finally, the cathode 4508 is formed by evaporation.

Next, materials suitable for the hole injecting material, the hole transporting material, the electron transporting material, the electron injecting material, and the light emitting material are described as follows.

As the hole injecting material, an organic compound such as a porphyrin-based compound, phthalocyanine (hereinafter referred to as $H_2Pc$), copper phthalocyanine (hereinafter referred to as CuPc), or the like is effective. A material which has a lower ionization potential than that of the hole transporting material to be used and has a hole transporting function can also be used as the hole injecting material. Further, a material, such as polyaniline and polyethylene dioxythiophene (hereinafter referred to as PEDOT) doped with polystyrene sulfonate (hereinafter referred to as PSS), obtained by chemically doping a conductive high molecular compound may also employed. Further, an insulating high molecular compound is effective in planarization of the anode, and polyimide (hereinafter referred to as PI) is often used. Further, an inorganic compound which includes an ultrathin film of aluminum oxide (hereinafter referred to as "alumina") as well as a thin film of a metal such as gold or platinum is also used.

As the hole transporting material, an aromatic amine-based compound (that is, a compound having a benzene ring-nitrogen bond) is most widely used. A material which is widely used as the hole transporting material includes 4,4'-bis(diphenylamino)-biphenyl (hereinafter referred to as TAD), derivatives thereof such as 4,4'-bis[N-(3-methylphenyl)-N-phenyl-amino]-biphenyl (hereinafter referred to as TPD), and 4,4'-bis[N-(1-naphthyl)-N-phenyl-amino]-biphenyl (hereinafter referred to as α-NPD), and starburst aromatic amine compounds such as 4,4',4"-tris(N,N-diphenyl-amino)-triphenylamine (hereinafter referred to as TDATA) and 4,4',4"-tris[N-(3-methylphenyl)-N-phenyl-amino]-triphenylamine (hereinafter referred to as MTDATA).

As the electron transporting material, a metal complex is often used, which includes a metal complex having a quinoline skeleton or a benzoquinoline skeleton, such as tris(8-quinolinolato)aluminum (hereinafter referred to as $Alq_3$), BAlq, tris(4-methyl-8-quinolinolato)aluminum (hereinafter referred to as Almq), or bis(10-hydroxybenzo[h]-quinolinato)beryllium (hereinafter referred to as Bebq). In addition, a metal complex having an oxazole-based or a thiazole-based ligand such as bis[2-(2-hydroxyphenyl)-benzoxazolato]zinc (hereinafter referred to as $Zn(BOX)_2$) or bis[2-(2-hydroxyphenyl)-benzothiazolato]zinc (hereinafter referred to as $Zn(BTZ)_2$) may be employed. Further, in addition to the metal complexes, oxadiazole derivatives such as 2-(4-biphenylyl)-5-(4-tert-butylphenyl)-1,3,4-oxadiazole (hereinafter referred to as PBD) and OXD-7, triazole derivatives such as TAZ and 3-(4-tert-butylphenyl)-4-(4-ethylphenyl)-5-(4-biphenylyl)-1,2,4-triazole (hereinafter referred to as p-EtTAZ), and phenanthroline derivatives such as bathophenanthroline (hereinafter referred to as BPhen) and BCP have electron transporting properties.

As the electron injecting material, the above-mentioned electron transporting materials can be used. In addition, an ultrathin film of an insulator, for example, metal halide such as calcium fluoride, lithium fluoride, or cesium fluoride or alkali metal oxide such as lithium oxide is often used. Further, an alkali metal complex such as lithium acetyl acetonate (hereinafter referred to as Li(acac)) or 8-quinolinolato-lithium (hereinafter referred to as Liq) is also effective.

As the light emitting material, in addition to the above-mentioned metal complexes such as $Alq_3$, Almq, BeBq, BAlq, $Zn(BOX)_2$, and $Zn(BTZ)_2$, various fluorescent pigments are effective. The fluorescent pigments include 4,4'-bis(2,2-diphenyl-vinyl)-biphenyl, which is blue, and 4-(dicyanomethylene)-2-methyl-6-(p-dimethylaminostyryl)-4H-pyran, which is reddish orange, and the like. In addition, a triplet light emitting material which mainly includes a complex with platinum or iridium as a central metal is available. As the triplet light emitting material, tris(2-phenylpyridine)iridium, bis(2-(4'-tolyl)pyridinato-N,$C^{2'}$)acetylacetonato iridium (hereinafter referred to as acacIr$(tpy)_2$), 2,3,7,8,12,13,17,18-octaethyl-21H,23Hporphyrin-platinum, and the like are known.

By using the materials having each function as described above in combination, a highly reliable light emitting element can be formed.

A light emitting element of which layers are formed in reverse order of that in FIG. 45 can also be used. That is, the cathode 4508, the electron injecting layer 4507 formed of the electron injecting material, the electron transporting layer 4506 formed of the electron transporting material, the light emitting layer 4505, the hole transporting layer 4504 formed of the hole transporting material, the hole injecting layer 4503 formed of the hole injecting material, and the anode 4502 are sequentially stacked over the substrate 4501.

In addition, it is acceptable as long as at least one of the anode and the cathode of the light emitting element is transparent in order to extract light emission. A transistor and a light emitting element are formed over a substrate; and there are light emitting elements having a top emission structure where light emission is extracted from a surface on the side opposite to the substrate, having a bottom emission structure where light emission is extracted from a surface on the substrate side, and having a dual emission structure where light emission is extracted from both the surface on the side opposite to the substrate and the surface on the substrate side. A pixel configuration of the invention can be applied to a light emitting element having any emission structure.

A light emitting element having a top emission structure is described with reference to FIG. 46A.

A driving transistor 4601 is formed over a substrate 4600. A first electrode 4602 is formed in contact with a source electrode of the driving TFT 4601, and a layer 4603 containing an organic compound and a second electrode 4604 are formed thereover.

The first electrode 4602 is an anode of the light emitting element. The second electrode 4604 is a cathode of the light emitting element. That is, a region where the layer 4603 containing the organic compound is interposed between the first electrode 4602 and the second electrode 4604 functions as the light emitting element.

As a material used for the first electrode 4602 which functions as the anode, a material having a high work function is preferably used. For example, a single layer film such as a titanium nitride film, a chromium film, a tungsten film, a Zn film, or a Pt film, a stacked-layer structure of a titanium nitride film and a film containing aluminum as its main component, a three-layer structure of a titanium nitride film, a film containing aluminum as its main component, and a titanium nitride film, or the like can be used. Note that in a case of a stacked-layer structure, the resistance as a wiring is low, a good ohmic contact can be obtained, and further, a function as an anode can be achieved. By using a metal film which reflects light, an anode which does not transmit light can be formed.

As a material used for the second electrode 4604 which functions as the cathode, a stacked layer of a thin metal film formed of a material having a low work function (Al, Ag, Li, Ca, or an alloy thereof such as MgAg, MgIn, AlLi, $CaF_2$, or calcium nitride) and a transparent conductive film (ITO (indium tin oxide), indium zinc oxide (IZO), zinc oxide (ZnO), or the like) is preferably used. By using a thin metal film and a transparent conductive film having a light transmitting property, a cathode which can transmit light can be formed.

Figure 46A:
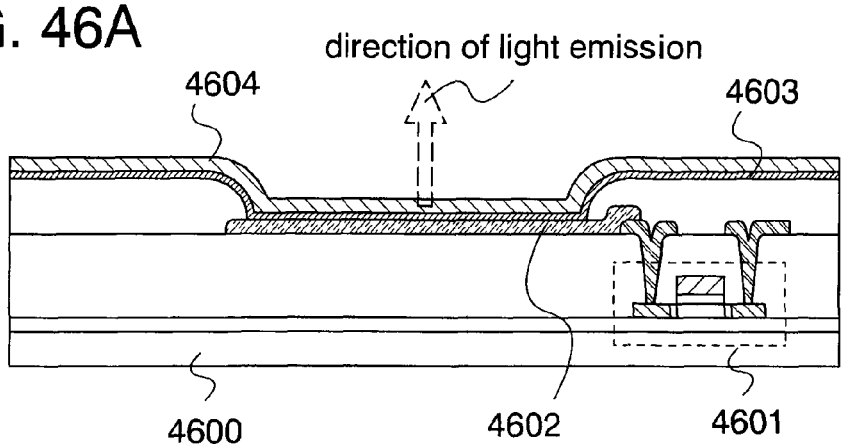
FIGS. 46A to 46C are cross-sectional views each showing a structural example of a display device of the present invention.

As described above, light from the light emitting element can be extracted from a top surface as shown by an arrow in FIG. 46A. That is, when the display panel shown in FIGS. 44A and 44B is employed, light is emitted toward the sealing substrate 4404 side. Therefore, when a light emitting element having a top emission structure is employed in a display device, a substrate having a light transmitting property is used as the sealing substrate 4404.

When an optical film is provided, the sealing substrate 4404 is provided with an optical film.

Note that a metal film formed of a material such as MgAg, MgIn, or AlLi, which functions as a cathode and has a low work function can be used for the first electrode 4602. In this case, a transparent conductive film, such as an ITO (indium tin oxide) film or an indium zinc oxide (IZO) film, can be used for the second electrode 4604. Therefore, the transmittance of the top light emission can be improved with this structure.

Next, a light emitting element having a bottom emission structure is described with reference to FIG. 46B. The same reference numerals as those in FIG. 46A are used since the structure of the light emitting element is the same except for the light emission structure.

Here, as a material used for the first electrode 4602 which functions as the anode, a material having a high work function is preferably used. For example, a transparent conductive film such as an ITO (indium tin oxide) film or an indium zinc oxide (IZO) film can be used. By using a transparent conductive film having a light transmitting property, an anode which can transmit light can be formed.

As a material used for the second electrode 4604 which functions as the cathode, a metal film formed of a material having a low work function (Al, Ag, Li, Ca, or an alloy thereof such as MgAg, MgIn, AlLi, $CaF_2$, or calcium nitride) can be used. By using a metal film which reflects light, a cathode which does not transmit light can be formed.

Figure 46B:
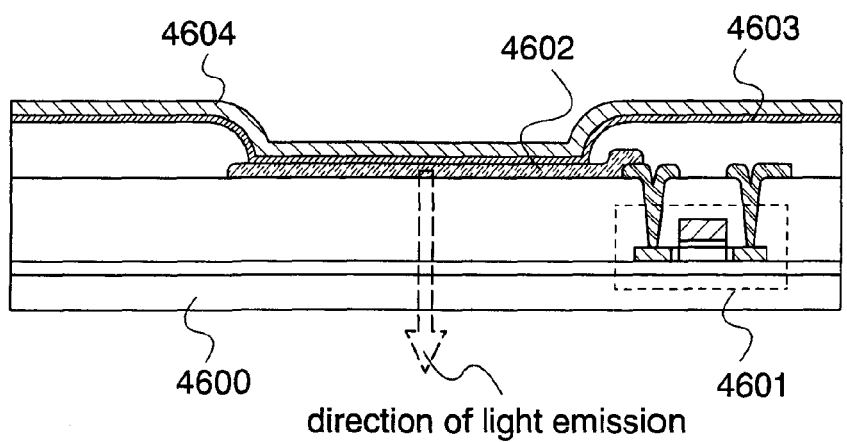

As described above, light from the light emitting element can be extracted from a bottom surface as shown by an arrow in FIG. 46B. That is, when the display panel shown in FIGS. 44A and 44B is employed, light is emitted toward the substrate 4410 side. Therefore, when a light emitting element having a bottom emission structure is employed in a display device, a substrate having a light transmitting property is used as the substrate 4410.

When an optical film is provided, the substrate 4410 is provided with an optical film.

Next, a light emitting element having a dual emission structure is described with reference to FIG. 46C. The same reference numerals as those in FIG. 46A are used since the structure of the light emitting element is the same except for the light emission structure.

Here, as a material used for the first electrode 4602 which functions as the anode, a material having a high work function is preferably used. For example, a transparent conductive film such as an ITO (indium tin oxide) film or an indium zinc oxide (IZO) film can be used. By using a transparent conductive film having a light transmitting property, an anode which can transmit light can be formed.

As a material used for the second electrode 4604 which functions as the cathode, a stacked layer of a thin metal film formed of a material having a low work function (Al, Ag, Li, Ca, or an alloy thereof such as MgAg, MgIn, AlLi, $CaF_2$, or calcium nitride) and a transparent conductive film (ITO (indium tin oxide), indium oxide zinc-oxide alloy ($In_2O_3$—ZnO), zinc oxide (ZnO), or the like) can be used. By using a thin metal film and a transparent conductive film having a light transmitting property, a cathode which can transmit light can be formed.

Figure 46C:
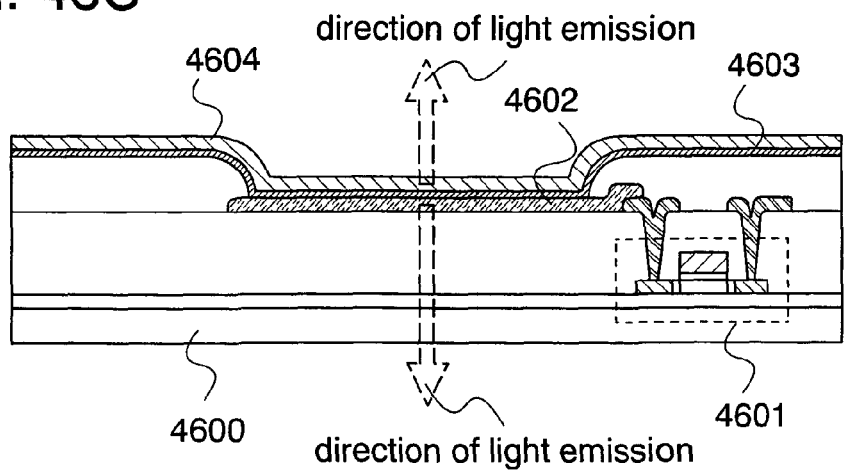

As described above, light from the light emitting element can be extracted from both sides as shown by arrows in FIG. 46C. That is, when the display panel shown in FIGS. 44A and 44B is employed, light is emitted toward the substrate 4410 side and the sealing substrate 4404 side. Therefore, when a light emitting element having a dual emission structure is employed in a display device, a substrate having a light transmitting property is used for both the substrate 4410 and the sealing substrate 4404.

When an optical film is provided, both the substrate 4410 and the sealing substrate 4404 are individually provided with an optical film.

In addition, the invention can be applied to a display device in which full color display is realized by using a white light emitting element and a color filter.

Figure 47:
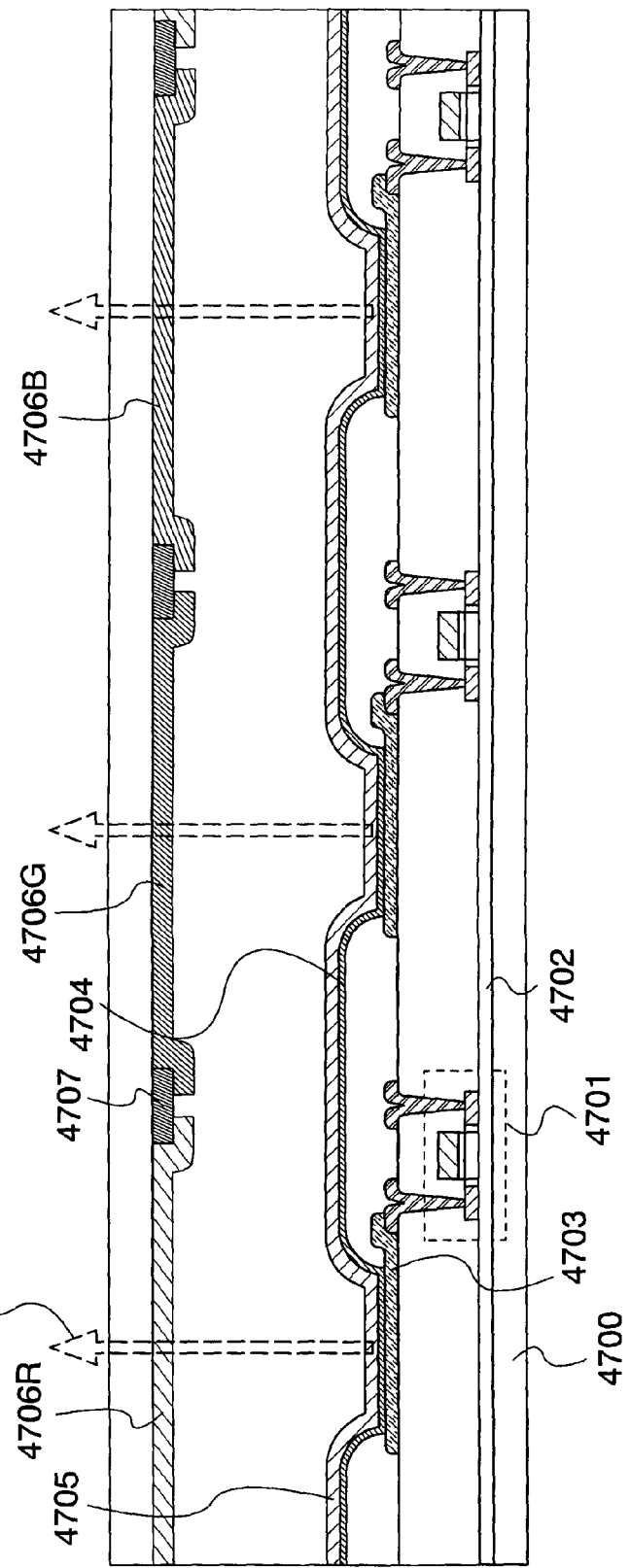
FIG. 47 is a cross-sectional view showing a structural example of a display device of the present invention.

As shown in FIG. 47, a base film 4702 is formed over a substrate 4700, and a driving transistor 4701 is formed over the base film 4702. A first electrode 4703 is formed in contact with a source electrode of the driving transistor 4701, and a layer 4704 containing an organic compound and a second electrode 4705 are formed thereover.

The first electrode 4703 is an anode of a light emitting element. The second electrode 4705 is a cathode of the light emitting element. That is, a region where the layer 4704 containing the organic compound is interposed between the first electrode 4703 and the second electrode 4705 functions as the light emitting element. In the structure shown in FIG. 47, white light is emitted. A red color filter 4706R, a green color filter 4706G, and a blue color filter 4706B are provided over the light emitting elements; thus, full color display can be performed. Further, a black matrix (also referred to as a BM) 4707 which separates these color filters is provided.

The aforementioned structures of the light emitting element can be used in combination and can be applied to the display device of the invention as appropriate. The structures of the display panel and the light emitting elements which are described above are only examples, and the invention can be applied to a display device having another structure.

Next, a partial cross-sectional view of a pixel portion of a display panel is shown.

First, a case where a polysilicon (p-Si:H) film is used as a semiconductor layer of a transistor is described with reference to FIGS. 48A to 50B.

Here, the semiconductor layer is obtained by forming an amorphous silicon (a-Si) film over a substrate by a known film formation method, for example. Note that it is not limited to the amorphous silicon film, and any semiconductor film having an amorphous structure (including a microcrystalline semiconductor film) may be used. Further, a compound semiconductor film having an amorphous structure, such as an amorphous silicon germanium film, may be used.

Then, the amorphous silicon film is crystallized by a laser crystallization method, a thermal crystallization method using RTA or an annealing furnace, a thermal crystallization method using a metal element which promotes crystallization, or the like. It is needless to say that such crystallization methods may be performed in combination.

As a result of the aforementioned crystallization, a crystallized region is formed in a part of the amorphous semiconductor film Further, the crystalline semiconductor film in which a part is made more crystallized is patterned into a desired shape, and an island-shaped semiconductor film is formed using the crystallized region. This semiconductor film is used as the semiconductor layer of the transistor.

Figure 48A:
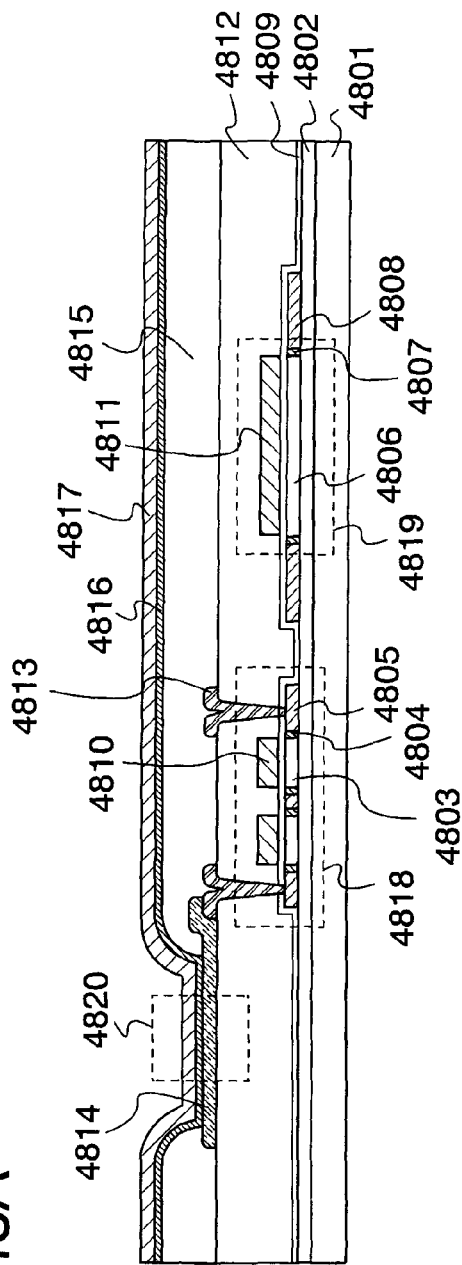
FIGS. 48A and 48B are cross-sectional views each showing a structural example of a display device of the present invention.

As shown in FIG. 48A, a base film 4802 is formed over a substrate 4801, and a semiconductor layer is formed thereover. The semiconductor layer includes a channel forming region 4803, an LDD region 4804, and an impurity region 4805 to be a source region or drain region of a driving transistor 4818; and a channel forming region 4806, an LDD region 4807, and an impurity region 4808 to be a lower electrode of a capacitor 4819. Note that channel doping may be performed on the channel forming region 4803 and the channel forming region 4806.

As the substrate, a glass substrate, a quartz substrate, a ceramic substrate, or the like can be used. As the base film 4802, a single layer of aluminum nitride (AlN), silicon oxide ($SiO_2$), silicon oxynitride ($SiO_xN_y$), or the like, or stacked layers thereof can be used.

A gate electrode 4810 and an upper electrode 4811 of the capacitor 4819 are formed over the semiconductor layer with a gate insulating film 4809 interposed therebetween.

An interlayer insulating film 4812 is formed to cover the capacitor 4819 and the driving transistor 4818. A wiring 4813 is in contact with the impurity region 4805 over the interlayer insulating film 4812 through a contact hole. A pixel electrode 4814 is formed in contact with the wiring 4813. An insulator 4815 is formed to cover end portions of the pixel electrode 4814 and the wiring 4813. Here, the insulator 4815 is formed using a positive photosensitive acrylic resin film. Then, a layer 4816 containing an organic compound and an opposite electrode 4817 are formed over the pixel electrode 4814. A light emitting element 4820 is formed in a region where the layer 4816 containing the organic compound is interposed between the pixel electrode 4814 and the opposite electrode 4817.

Figure 48B:
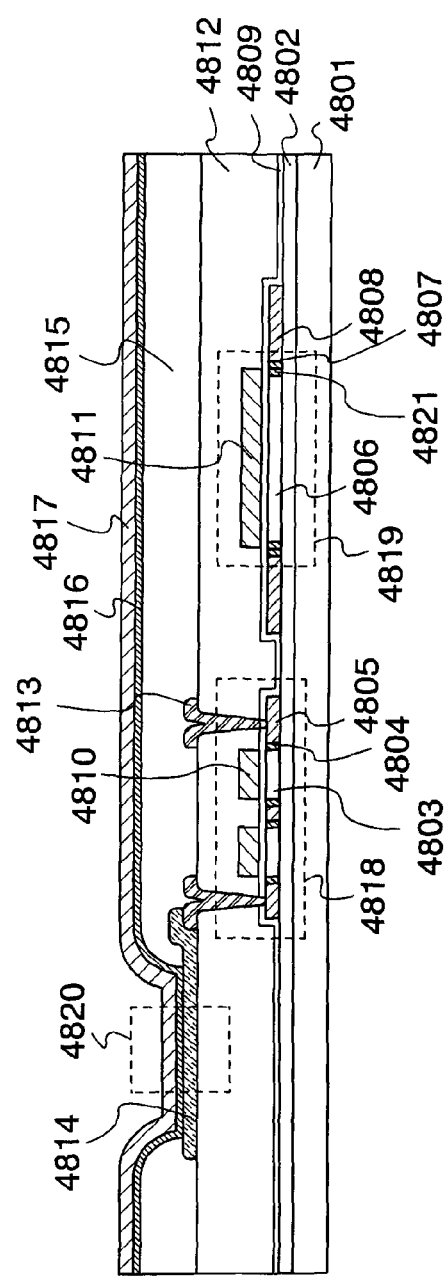

Alternatively, as shown in FIG. 48B, a region 4821 may be provided so that the LDD region which forms a part of the lower electrode of the capacitor 4819 overlaps with the upper electrode 4811 of the capacitor 4819. Note that portions in common with those in FIG. 48A are denoted by the same reference numerals, and description thereof is omitted.

Figure 49A:
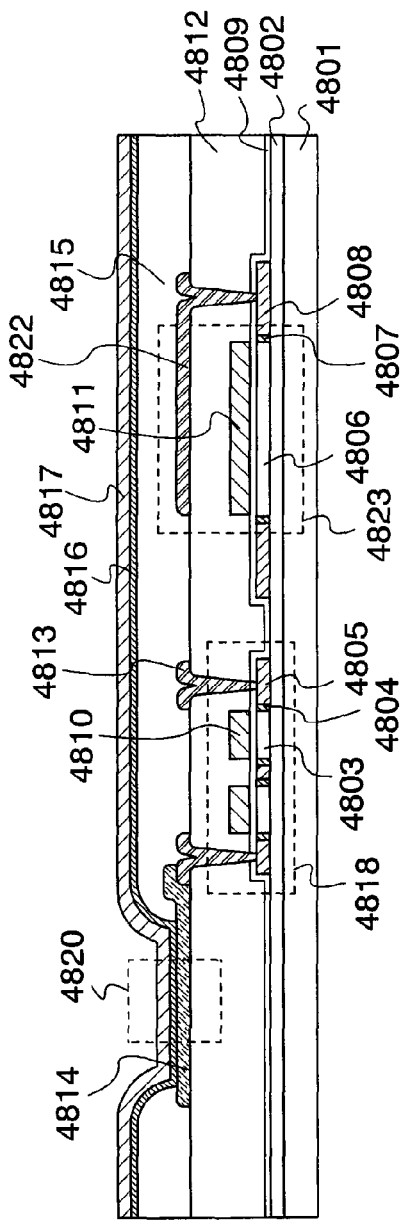
FIGS. 49A and 49B are cross-sectional views each showing a structural example of a display device of the present invention.

Alternatively, as shown in FIG. 49A, a capacitor 4823 may include a second upper electrode 4822 which is formed in the same layer as the wiring 4813 in contact with the impurity region 4805 of the driving transistor 4818. Note that portions in common with those in FIG. 48A are denoted by the same reference numerals, and description thereof is omitted. Since the second upper electrode 4822 is in contact with the impurity region 4808, a first capacitor having a structure where the gate insulating film 4809 is interposed between the upper electrode 4811 and the channel forming region 4806, and a second capacitor having a structure where the interlayer insulating film 4812 is interposed between the upper electrode 4811 and the second upper electrode 4822 are connected in parallel, so that the capacitor 4823 including the first capacitor and the second capacitor is formed. Since the capacitor 4823 has the total capacitance of the first capacitor and the second capacitor, a capacitor having a large capacitance can be formed in a small area. That is, an aperture ratio can be improved by using the capacitor having the pixel configuration of the invention.

Figure 49B:
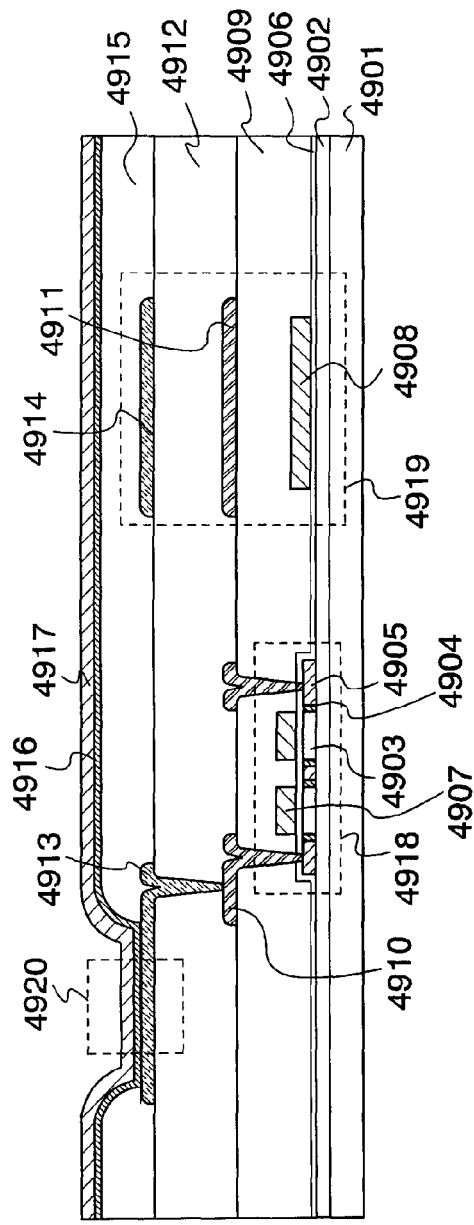

Alternatively, a capacitor may have a structure shown in FIG. 49B. A base film 4902 is formed over a substrate 4901, and a semiconductor layer is formed thereover. The semiconductor layer includes a channel forming region 4903, an LDD region 4904, and an impurity region 4905 to be a source region or drain region of a driving transistor 4918. Note that channel doping may be performed on the channel forming region 4903.

As the substrate, a glass substrate, a quartz substrate, a ceramic substrate, or the like can be used. As the base film 4902, a single layer of aluminum nitride (AlN), silicon oxide ($SiO_2$), silicon oxynitride ($SiO_xN_y$), or the like, or stacked layers thereof can be used.

A gate electrode 4907 and a first electrode 4908 are formed over the semiconductor layer with a gate insulating film 4906 interposed therebetween.

A first interlayer insulating film 4909 is formed to cover the driving transistor 4918 and the first electrode 4908. A wiring 4910 is in contact with the impurity region 4905 over the first interlayer insulating film 4909 through a contact hole. A second electrode 4911 is formed in the same layer and of the same material as the wiring 4910.

Further, a second interlayer insulating film 4912 is formed to cover the wiring 4910 and the second electrode 4911. A pixel electrode 4913 is formed in contact with the wiring 4910 over the second interlayer insulating film 4912 through a contact hole. A third electrode 4914 is formed in the same layer and of the same material as the pixel electrode 4913. Here, a capacitor 4919 is formed of the first electrode 4908, the second electrode 4911, and the third electrode 4914.

A layer 4916 containing an organic compound and an opposite electrode 4917 are formed over the pixel electrode 4913. A light emitting element 4920 is formed in a region where the layer 4916 containing the organic compound is interposed between the pixel electrode 4913 and the opposite electrode 4917.

As described above, the structures shown in FIGS. 48A to 49B can be given as examples of a structure of a transistor in which a crystalline semiconductor film is used for its semiconductor layer. Note that the structures of the transistor shown in FIGS. 48A to 49B are examples of a top gate transistor. That is, the LDD region may have a structure of overlapping with the gate electrode or a structure of not overlapping with the gate electrode. Alternatively, a part of the LDD region may overlap with the gate electrode. Further, the gate electrode may have a tapered shape, and the LDD region may be provided below the tapered portion of the gate electrode in a self-aligned manner. In addition, the number of gate electrodes is not limited to two, and a multi-gate structure with three or more gate electrodes may be employed, or a single gate structure may also be employed.

When a crystalline semiconductor film is used for a semiconductor layer (a channel forming region, a source region, a drain region, and the like) of a transistor included in the pixel of the invention, the scan line driver circuit and the signal line driver circuit are easily formed over the same substrate as the pixel portion. Further, a part of the scan line driver circuit may be formed over the same substrate as the pixel portion, and the other part of the scan line driver circuit may be formed over an IC chip and mounted by COG or the like as shown in FIGS. 44A and 44B. By such a structure, reduction in manufacturing cost can be realized.

As a structure of a transistor which uses polysilicon (p-Si: H) for its semiconductor layer, a structure where a gate electrode is interposed between a substrate and a semiconductor layer, in other words, a transistor having a bottom gate structure where a gate electrode is located below a semiconductor layer may be applied. FIGS. 50A and 50B each show a partial cross-sectional view of a pixel portion of a display panel in which a bottom gate transistor is employed.

As shown in FIG. 50A, a base film 5002 is formed over a substrate 5001. A gate electrode 5003 is formed over the base film 5002. A first electrode 5004 is formed in the same layer and of the same material as the gate electrode 5003. As a material for the gate electrode 5003, polycrystalline silicon to which phosphorus is added can be used. In addition to polycrystalline silicon, silicide, which is a compound of a metal and silicon, may be employed.

A gate insulating film 5005 is formed to cover the gate electrode 5003 and the first electrode 5004. As the gate insulating film 5005, a silicon oxide film, a silicon nitride film, or the like is used.

A semiconductor layer is formed over the gate insulating film 5005. The semiconductor layer includes a channel forming region 5006, an LDD region 5007, and an impurity region 5008 to be a source region or drain region of a driving transistor 5022, and a channel forming region 5009, an LDD region 5010, and an impurity region 5011 to be a second electrode of a capacitor 5023. Note that channel doping may be performed on the channel forming region 5006 and the channel forming region 5009.

As the substrate, a glass substrate, a quartz substrate, a ceramic substrate, or the like can be used. As the base film 5002, a single layer of aluminum nitride (AlN), silicon oxide (SiO$_2$), silicon oxynitride (SiO$_x$N$_y$), or the like, or stacked layers thereof can be used.

A first interlayer insulating film 5012 is formed to cover the semiconductor layer. A wiring 5013 is in contact with the impurity region 5008 over the first interlayer insulating film 5012 through a contact hole. A third electrode 5014 is formed in the same layer and of the same material as the wiring 5013. The capacitor 5023 is formed of the first electrode 5004, the second electrode, and the third electrode 5014.

In addition, an opening 5015 is formed in the first interlayer insulating film 5012. A second interlayer insulating film 5016 is formed to cover the driving transistor 5022, the capacitor 5023, and the opening 5015. A pixel electrode 5017 is formed over the second interlayer insulating film 5016 through a contact hole. Then, an insulator 5018 is formed to cover end portions of the pixel electrode 5017. As the insulator, a positive photosensitive acrylic resin film can be used, for example. A layer 5019 containing an organic compound and an opposite electrode 5020 are formed over the pixel electrode 5017. A light emitting element 5021 is formed in a region where the layer 5019 containing the organic compound is interposed between the pixel electrode 5017 and the opposite electrode 5020. The opening 5015 is located below the light emitting element 5021. That is, when light emitted from the light emitting element 5021 is extracted from the substrate side, the transmittance can be improved since the opening 5015 is provided.

Alternatively, a structure shown in FIG. 50B, in which a fourth electrode 5024 is formed in the same layer and of the same material as the pixel electrode 5017 in FIG. 50A, may be employed. Thus, a capacitor 5025 can be formed of the first electrode 5004, the second electrode, the third electrode 5014, and the fourth electrode 5024.

Next, the case where an amorphous silicon (a-Si:H) film is used for a semiconductor layer of a transistor is described with reference to FIGS. 51A to 53B.

FIGS. 51A and 51B each show a partial cross-sectional view of a pixel portion of a display panel to which a transistor is applied where the transistor has the top gate structure in which amorphous silicon is used for a semiconductor layer. As shown in FIG. 51A, a base film 5102 is formed over a substrate 5101. A pixel electrode 5103 is formed over the base film 5102. A first electrode 5104 is formed in the same layer and of the same material as the pixel electrode 5103.

As the substrate, a glass substrate, a quartz substrate, a ceramic substrate, or the like can be used. As the base film 5102, a single layer of aluminum nitride (AlN), silicon oxide (SiO$_2$), silicon oxynitride (SiO$_x$N$_y$), or the like, or stacked layers thereof can be used.

A wiring 5105 and a wiring 5106 are formed over the base film 5102, and an end portion of the pixel electrode 5103 is covered with the wiring 5105. An n-type semiconductor layer 5107 and an n-type semiconductor layer 5108 each having n-type conductivity are formed over the wiring 5105 and the wiring 5106, respectively. In addition, a semiconductor layer 5109 is formed between the wiring 5105 and the wiring 5106 and over the base film 5102. A part of the semiconductor layer 5109 extends over the n-type semiconductor layers 5107 and 5108. Note that this semiconductor layer 5109 is formed of a semiconductor film having non-crystallinity, such as of amorphous silicon (a-Si:H) or a microcrystalline semiconductor (μT-Si:H).

A gate insulating film 5110 is formed over the semiconductor layer 5109. An insulating film 5111 formed in the same layer and of the same material as the gate insulating film 5110 is also formed over the first electrode 5104. Note that as the gate insulating film 5110, a silicon oxide film, a silicon nitride film, or the like is used.

A gate electrode 5112 is formed over the gate insulating film 5110. A second electrode 5113 which is formed in the same layer and of the same material as the gate electrode 5112 is formed over the first electrode 5104 with the insulating film 5111 interposed therebetween. Thus, a capacitor 5119 in which the insulating film 5111 is interposed between the first electrode 5104 and the second electrode 5113 is formed. An interlayer insulating film 5114 is formed to cover an end portion of the pixel electrode 5103, a driving transistor 5118, and the capacitor 5119.

A layer 5115 containing an organic compound and an opposite electrode 5116 are formed over the interlayer insulating film 5114 and the pixel electrode 5103 located in an opening of the interlayer insulator 5114. A light emitting element 5117 is formed in a region where the layer 5115 containing the organic compound is interposed between the pixel electrode 5103 and the opposite electrode 5116.

As shown in FIG. 51B, a first electrode 5120 may be formed instead of the first electrode 5104 shown in FIG. 51A. Note that the first electrode 5120 shown in FIG. 51B is formed in the same layer and of the same material as the wirings 5105 and 5106.

Next, FIGS. 52A to 53B each show a partial cross-sectional view of a pixel portion of a display panel to which a transistor is applied where the transistor has the bottom gate structure in which amorphous silicon is used for a semiconductor layer.

As shown in FIG. 52A, a base film 5202 is formed over a substrate 5201. A gate electrode 5203 is formed over the base film 5202. A first electrode 5204 is formed in the same layer and of the same material as the gate electrode 5203. As a material for the gate electrode 5203, polycrystalline silicon to which phosphorus is added can be used. In addition to polycrystalline silicon, silicide, which is a compound of a metal and silicon, may be used.

A gate insulating film 5205 is formed to cover the gate electrode 5203 and the first electrode 5204. As the gate insulating film 5205, a silicon oxide film, a silicon nitride film, or the like is used.

A semiconductor layer 5206 is formed over the gate insulating film 5205. Further, a semiconductor layer 5207 is formed in the same layer and of the same material as the semiconductor layer 5206.

As the substrate, a glass substrate, a quartz substrate, a ceramic substrate, or the like can be used. As the base film 5202, a single layer of aluminum nitride (AlN), silicon oxide ($SiO_2$), silicon oxynitride ($SiO_xN_y$), or the like, or stacked layers thereof can be used.

N-type semiconductor layers 5208 and 5209 each having n-type conductivity are formed over the semiconductor layer 5206. An n-type semiconductor layer 5210 is formed over the semiconductor layer 5207.

Wirings 5211 and 5212 are formed over the n-type semiconductor layers 5208 and 5209, respectively. A conductive layer 5213, which is formed in the same layer and of the same material as the wirings 5211 and 5212, is formed over the n-type semiconductor layer 5210.

Thus, a second electrode is formed of the semiconductor layer 5207, the n-type semiconductor layer 5210, and the conductive layer 5213. Note that a capacitor 5220 in which the gate insulating film 5205 is interposed between the second electrode and the first electrode 5204 is formed.

One end portion of the wiring 5211 is extended, and a pixel electrode 5214 is formed to be in contact with an upper portion of the extended wiring 5211.

An insulator 5215 is formed to cover an end portion of the pixel electrode 5214, a driving transistor 5219, and the capacitor 5220.

A layer 5216 containing an organic compound and an opposite electrode 5217 are formed over the pixel electrode 5214 and the insulator 5215. A light emitting element 5218 is formed in a region where the layer 5216 containing the organic compound is interposed between the pixel electrode 5214 and the opposite electrode 5217.

Note that the semiconductor layer 5207 and the n-type semiconductor layer 5210 to be a part of the second electrode of the capacitor 5220 are not necessary to be formed. That is, the second electrode of the capacitor 5220 may be the conductive layer 5213 so that the capacitor 5220 has a structure where the gate insulating film is interposed between the first electrode 5204 and the conductive layer 5213.

Note that in FIG. 52A, the pixel electrode 5214 may be formed before the wiring 5211 is formed, whereby a second electrode 5221 can be formed in the same layer and of the same material as the pixel electrode 5214, as shown in FIG. 52B. Thus, a capacitor 5222 in which the gate insulating film 5205 is interposed between the second electrode 5221 and the first electrode 5204 can be formed.

Note that although FIGS. 52A and 52B each show an example where an inverted staggered channel-etched transistor is applied, a channel protective transistor may also be used. A case where a channel protective transistor is applied is described with reference to FIGS. 53A and 53B.

A channel protective transistor shown in FIG. 53A is different from the driving transistor 5219 having a channel-etched structure shown in FIG. 52A in that an insulator 5301 to be an etching mask is provided over a region where a channel of the semiconductor layer 5206 is to be formed. Common portions are denoted by the same reference numerals.

Similarly, a channel protective transistor shown in FIG. 53B is different from the driving transistor 5219 having a channel-etched structure shown in FIG. 52B in that an insulator 5301 to be an etching mask is provided over the region where a channel of the semiconductor layer 5206 is to be formed. Common portions except that point are denoted by the same reference numerals.

When an amorphous semiconductor film is used for a semiconductor layer (a channel forming region, a source region, a drain region, and the like) of a transistor included in the pixel of the invention, manufacturing cost can be reduced.

Note that structures of the transistor and the capacitor which can be used in the pixel portion in the display device of the invention are not limited to those described above, and transistors and capacitors with various structures can be used.

Note that this embodiment mode shows an example of an embodied case of the contents (or a part thereof) described in other embodiment modes, an example of slight transformation thereof, an example of partial modification thereof, an example of improvement thereof, an example of detailed description thereof, an application example thereof, an example of related part thereof, or the like. Therefore, the contents described in other embodiment modes can be freely applied to, combined with, or replaced with this embodiment mode.

Although this embodiment mode is described with reference to various drawings, the contents (or a part thereof) described in each drawing can be freely applied to, combined with, or replaced with the contents (or a part thereof) described in another drawing. Further, even more drawings can be formed by combining each part with another part in the above-described drawings.

Similarly, the contents (or a part thereof) shown in each drawing of this embodiment mode can be freely applied to, combined with, or replaced with the contents (or a part thereof) described in a drawing in another embodiment mode. Further, even more drawings can be formed by combining each part with part of another embodiment mode in the drawings of this embodiment mode.

[Embodiment Mode 8]

In this embodiment mode, a method for manufacturing a semiconductor device by using plasma treatment is described as a method for manufacturing a semiconductor device including a transistor.

Figure 54A:
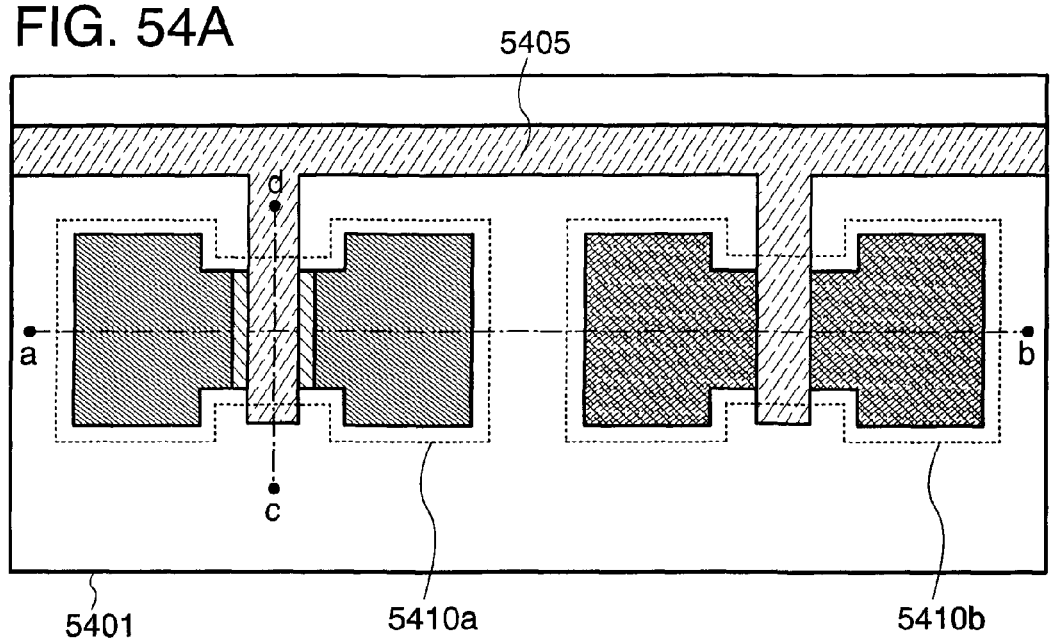
FIGS. 54A to 54C are views each showing a structure of a transistor used for a display device of the present invention.
Figure 54B:
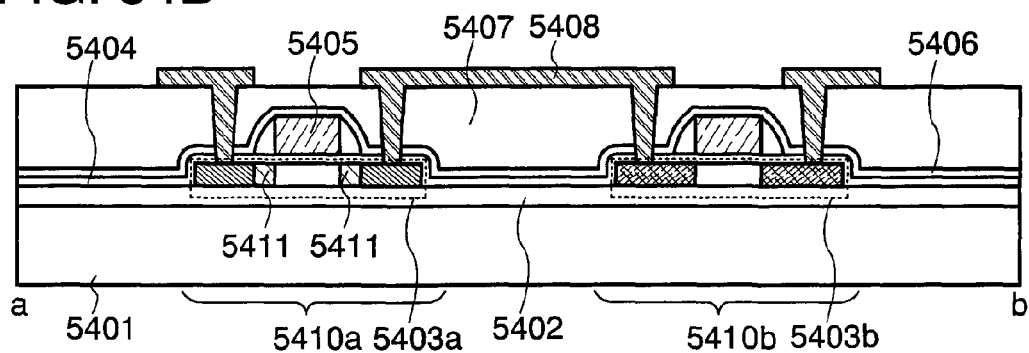
Figure 54C:
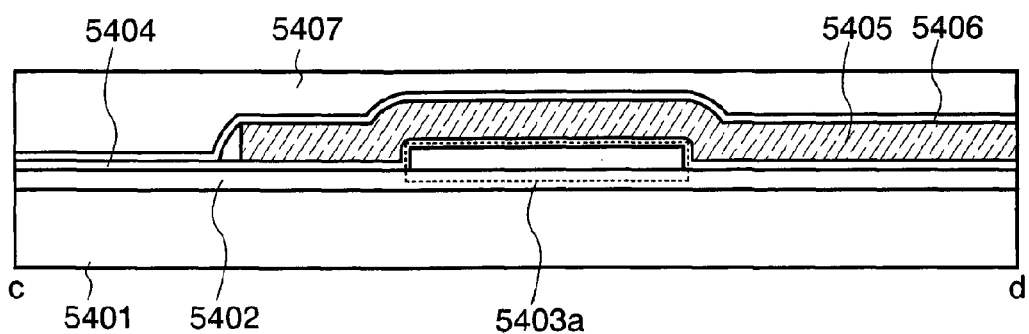

FIGS. 54A to 54C show diagrams showing a structure example of a semiconductor device including a transistor. FIG. 54B corresponds to a cross-sectional view taken along a line a-b in FIGS. 54A, and 54C corresponds to a cross-sectional view taken along a line c-d in FIG. 54A.

A semiconductor device shown in FIGS. 54A to 54C includes: semiconductor films 5403a and 5403b which are formed over a substrate 5401 with an insulating film 5402 interposed therebetween; gate electrodes 5405 which is formed over the semiconductor films 5403a and 5403b with a gate insulating film 5404 interposed therebetween; insulating films 5406 and 5407 which are formed to cover the gate electrode; and a conductive film 5408 which is connected to source regions or drain regions of the semiconductor films 5403a and 5403b and formed over the insulating film 5407. Note that FIGS. 54A to 54C show a case where an n-channel transistor 5410a which uses a part of the semiconductor film 5403a as a channel region and a p-channel transistor 5410b which uses a part of the semiconductor film 5403b as a channel region are provided; however, the structure is not limited thereto. For example, in FIGS. 54A to 54C, although an LDD region 5411 is provided in the n-channel transistor 5410a and no LDD region is provided in the p-channel transistor 5410b, a structure where LDD regions are provided in both transistors or a structure where an LDD region is provided in neither of the transistors can be applied.

Note that in this embodiment mode, at least one of the substrate 5401, the insulating film 5402, the semiconductor films 5403a and 5403b, the gate insulating film 5404, the insulating film 5406 and the insulating film 5407 is oxidized or nitrided by plasma treatment to oxidize or nitride the semiconductor film or the insulating film, so that the semiconductor device shown in FIGS. 54A to 54C is manufactured. By oxidizing or nitriding the semiconductor film or the insulating film by plasma treatment in such a manner, a surface of the semiconductor film or the insulating film is modified, and the insulating film can be formed to be denser than an insulating film formed by a CVD method or a sputtering method. Thus, a defect such as a pinhole can be suppressed, and characteristics and the like of the semiconductor device can be improved.

In this embodiment mode, a method is described with reference to drawings, in which a semiconductor device is manufactured by performing plasma treatment on the semiconductor films 5403a and 5403b or the gate insulating film 5404 in FIGS. 54A to 54C to oxidize or nitride the semiconductor films 5403a and 5403b or the gate insulating film 5404.

First, a case is shown in which an island-shaped semiconductor film of which end portion is formed at an angle of about 90 degrees is provided over a substrate.

First, the island-shaped semiconductor films 5403a and 5403b are formed over the substrate 5401 (FIG. 55A). An amorphous semiconductor film is formed over the insulating film 5402, which is formed in advance over the substrate 5401, using a material containing silicon (Si) (such as $Si_xGe_{1-x}$) as its main component or the like, by using a known method (such as a sputtering method, an LPCVD method, or a plasma CVD method); the amorphous semiconductor film is crystallized; and the semiconductor film is selectively etched; thus, the island-shaped semiconductor films 5403a and 5403b can be provided. Note that crystallization of the amorphous semiconductor film can be performed by a crystallization method such as a laser crystallization method, a thermal crystallization method using RTA or an annealing furnace, a thermal crystallization method using a metal element which promotes crystallization, or a combination thereof. Note that in FIGS. 55A to 55D, end portions of the island-shaped semiconductor films 5403a and 5403b are provided to have an angle of about 90 degrees (θ=85 to 100 degrees).

Next, the semiconductor films 5403a and 5403b are oxidized or nitrided by plasma treatment, so that semiconductor oxide films or semiconductor nitride films 5421a and 5421b (hereinafter also referred to as the insulating film 5421a and the insulating film 5421b) are formed on surfaces of the semiconductor films 5403a and 5403b, respectively (FIG. 55B). For example, when Si is used for the semiconductor films 5403a and 5403b, silicon oxide ($SiO_x$) or silicon nitride ($SiN_x$) is formed as the insulating film 5421a and the insulating film 5421b. Alternatively, the semiconductor films 5403a and 5403b may be oxidized by plasma treatment and then may be nitrided by performing plasma treatment again. In this case, silicon oxide ($SiO_x$) is formed in contact with the semiconductor films 5403a and 5403b, and silicon nitride oxide ($SiN_xO_y$) (x>y) is formed on the surface of the silicon oxide. Note that when the semiconductor film is oxidized by plasma treatment, the plasma treatment is performed in an oxygen atmosphere (e.g., in an atmosphere of oxygen ($O_2$) and a rare gas (including at least one of He, Ne, Ar, Kr, and Xe), in an atmosphere of oxygen, hydrogen ($H_2$), and a rare gas, or in an atmosphere of dinitrogen monoxide and a rare gas). On the other hand, when the semiconductor film is nitrided by plasma treatment, the plasma treatment is performed in a nitrogen atmosphere (e.g., in an atmosphere of nitrogen ($N_2$) and a rare gas (including at least one of He, Ne, Ar, Kr, and Xe), in an atmosphere of nitrogen, hydrogen, and a rare gas, or in an atmosphere of $NH_3$ and a rare gas). As a rare gas, Ar may be used, for example. Further, a gas mixture of Ar and Kr may be used as well. Therefore, the insulating films 5421a and 5421b contain a rare gas (including as least one of He, Ne, Ar, Kr, and Xe) used for plasma treatment. When Ar is used, the insulating films 5421a and 5421b contain Ar.

In addition, the plasma treatment is performed in the atmosphere containing the aforementioned gas, with conditions of an electron density ranging from $1\times10^{11}$ to $1\times10^{13}$ $cm^{-3}$ and a plasma electron temperature ranging from 0.5 to 1.5 eV. Since the plasma electron density is high and the electron temperature in the vicinity of an object to be treated (here, the semiconductor films 5403a and 5403b) formed over the substrate 5401 is low, damage by plasma to the object to be treated can be prevented. Further, since the plasma electron density is as high as $1\times10^{11}$ $cm^{-3}$ or more, an oxide film or a nitride film formed by oxidizing or nitriding the object to be treated by plasma treatment is superior in its uniformity of thickness and the like as well as being dense, as compared with a film formed by a CVD method, a sputtering method, or the like. Further, since the plasma electron temperature is as low as 1 eV or less, oxidation or nitridation can be performed at a lower temperature as compared with a conventional plasma treatment or thermal oxidation. For example, oxidation or nitridation can be performed sufficiently even when plasma treatment is performed at a temperature lower than a strain point of a glass substrate by 100 degrees or more. Note that for frequency for generating plasma, high frequency waves such as microwaves (2.45 GHz) can be used. Note that hereinafter, the plasma treatment is performed using the aforementioned conditions unless otherwise specified.

Next, the gate insulating film 5404 is formed to cover the insulating films 5421a and 5421b (FIG. 55C). The gate insulating film 5404 can be formed by a known method (such as a sputtering method, an LPCVD method, or a plasma CVD method) to have a single-layer structure or a stacked-layer structure of an insulating film containing oxygen or nitrogen, such as silicon oxide ($SiO_x$), silicon nitride ($SiN_x$), silicon oxynitride ($SiO_xN_y$) (x>y), or silicon nitride oxide ($SiN_xO_y$) (x>y). For example, when Si is used for the semiconductor films 5403a and 5403b and the Si is oxidized by plasma treatment to form silicon oxide as the insulating films 5421a and 5421b on the surfaces of the semiconductor films 5403a and 5403b, silicon oxide ($SiO_x$) is formed as the gate insulating film over the insulating films 5421a and 5421b. Alternatively, in FIG. 55B, when the insulating films 5421a and 5421b which are formed by oxidizing or nitriding the semiconductor films 5403a and 5403b by plasma treatment are sufficiently thick, the insulating films 5421a and 5421b can be used as gate insulating films.

Next, the gate electrodes 5405 and the like are formed over the gate insulating film 5404, so that a semiconductor device including the n-channel transistor 5410a and the p-channel transistor 5410b which use the island-shaped semiconductor films 5403a and 5403b as channel regions can be manufactured (FIG. 55D).

In this manner, the surfaces of the semiconductor films 5403a and 5403b are oxidized or nitrided by plasma treatment before the gate insulating film 5404 is provided over the semiconductor films 5403a and 5403b; thus, short circuits between the gate electrode and the semiconductor films, which may be caused by a coverage defect of the gate insulating film 5404 at end portions 5451a and 5451b of the channel regions, or the like can be prevented. That is, in the case where the end portions of the island-shaped semiconductor films have an angle of about 90 degrees ($\theta$=85 to 100 degrees), the end portions of the semiconductor films might not be properly covered with a gate insulating film when the gate insulating film is formed to cover the semiconductor film by a CVD method, a sputtering method, or the like. However, such a coverage defect and the like of the gate insulating film at the end portions of the semiconductor films can be prevented by oxidizing or nitriding the surfaces of the semiconductor films by plasma treatment in advance.

Alternatively, in FIGS. 55A to 55D, plasma treatment may be performed after the gate insulating film 5404 is formed, whereby the gate insulating film 5404 is oxidized or nitrided. In this case, plasma treatment is performed on the gate insulating film 5404 (FIG. 56A), which is formed to cover the semiconductor films 5403a and 5403b, and the gate insulating film 5404 is oxidized or nitrided, whereby an oxide film or an nitride film (hereinafter also referred to as an insulating film 5423) is formed on the surface of the gate insulating film 5404 (FIG. 56B). The plasma treatment can be performed under similar conditions to those in FIG. 55B. In addition, the insulating film 5423 contains a rare gas which is used for the plasma treatment. For example, includes Ar when Ar is used for the plasma treatment.

Alternatively, in FIG. 56B, after the gate insulating film 5404 is oxidized by performing plasma treatment in an oxygen atmosphere once, plasma treatment may be performed again in a nitrogen atmosphere to nitride the gate insulating film 5404. In this case, silicon oxide ($SiO_x$) or silicon oxynitride ($SiO_xN_y$) (x>y) is formed on the side on which semiconductor films 5403a and 5403b are, and silicon nitride oxide ($SiN_xO_y$) (x>y) is formed to be in contact with the gate electrodes 5405. Then, the gate electrodes 5405 and the like are formed over the gate insulating film 5423, whereby a semiconductor device including the n-channel transistor 5410a and the p-channel transistor 5410b which have the island-shaped semiconductor films 5403a and 5403b used as channel regions can be manufactured (FIG. 56C). In this manner, when plasma treatment is performed on the gate insulating film, the surface of the gate insulating film can be modified to form a dense film by oxidizing or nitriding the surface of the gate insulating film. The insulating film obtained by plasma treatment is denser and has fewer defects such as a pinhole, as compared with an insulating film formed by a CVD method or a sputtering method. Thus, characteristics of the transistors can be improved.

Note that FIGS. 56A to 56C show the case where the surfaces of the semiconductor films 5403a and 5403b are oxidized or nitrided by performing plasma treatment on the semiconductor films 5403a and 5403b in advance; however, a method may also be applied in which plasma treatment is not performed in advance on the semiconductor films 5403a and 5403b but performed after the gate insulating film 5404 is formed. In this manner, by performing plasma treatment before formation of the gate electrode, an exposed portion of the semiconductor film due to a coverage defect can be oxidized or nitrided even if a coverage defect such as breaking of a gate insulating film is caused at end portions of the semiconductor film; thus, short circuits between the gate electrode and the semiconductor film, which may be caused by a coverage defect of the gate insulating film at the end portion of the semiconductor film, or the like can be prevented.

In this manner, even when the island-shaped semiconductor films are formed to have end portions at an angle of about 90 degrees, short circuits between the gate electrodes and the semiconductor films, which are caused by a coverage defect of the gate insulating film at the end portions of the semiconductor films, or the like can be prevented by oxidizing or nitriding the semiconductor films or the gate insulating film by plasma treatment.

Next, a case is shown in which the island-shaped semiconductor film provided over the substrate has an end portion with a tapered shape ($\theta$=30 to 85 degrees).

Figure 57A:
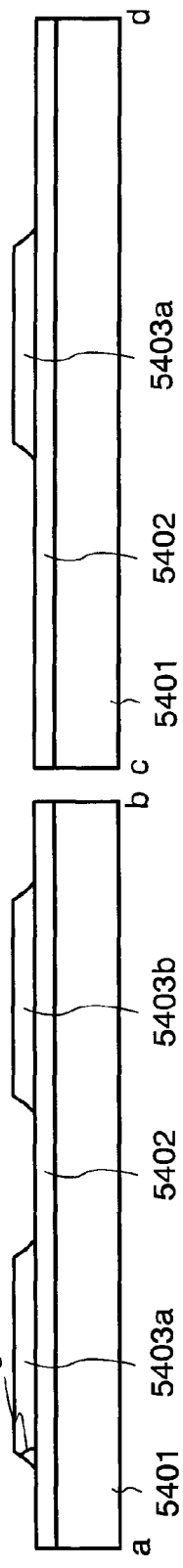
FIGS. 57A to 57D are cross-sectional views showing a manufacturing method of a transistor used for a display device of the present invention.

First, the island-shaped semiconductor films 5403a and 5403b are formed over the substrate 5401 (FIG. 57A). An amorphous semiconductor film is formed using a material containing silicon (Si) (such as $Si_xGe_{1-x}$) as its main component or the like, using a known method (such as a sputtering method, an LPCVD method, or a plasma CVD method) over the insulating film 5402, which is formed in advance over the substrate 5401; the amorphous semiconductor film is crystallized by a known crystallization method such as a laser crystallization method, a thermal crystallization method using RTA or an annealing furnace, or a thermal crystallization method using a metal element which promotes crystallization; and the semiconductor film is selectively etched and removed; thus, the island-shaped semiconductor films 5403a and 5403b can be provided. Note that in FIGS. 57A to 57D, the end portions of the island-shaped semiconductor films 5403a and 5403b are provided to have a tapered shape ($\theta$=30 to 85 degrees).

Figure 57B:
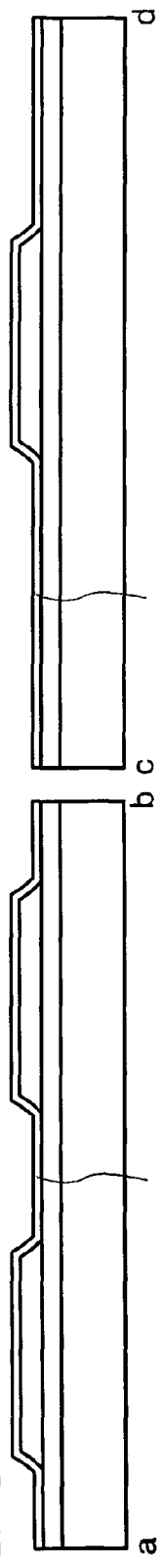

Next, the gate insulating film 5404 is formed to cover the semiconductor films 5403a and 5403b (FIG. 57B). The gate insulating film 5404 can be provided to have a single-layer structure or a stacked-layer structure of an insulating film containing oxygen or nitrogen, such as silicon oxide ($SiO_x$), silicon nitride ($SiN_x$), silicon oxynitride ($SiO_xN_y$) (x>y), or silicon nitride oxide ($SiN_xO_y$) (x>y), by a known method (such as a sputtering method, an LPCVD method, or a plasma CVD method).

Figure 57C:
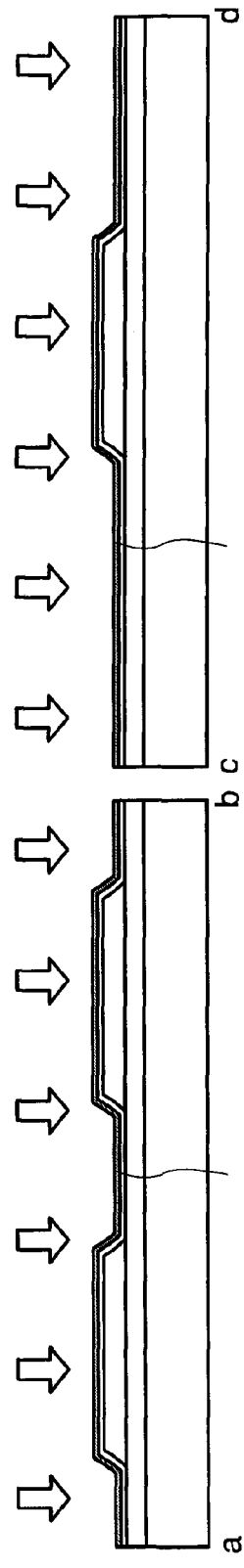

Next, the gate insulating film 5404 is oxidized or nitrided by plasma treatment, so that an oxide film or a nitride film (hereinafter also referred to as an insulating film 5424) is formed on the surface of the gate insulating film 5404 (FIG. 57C). The plasma treatment can be performed under similar conditions to the aforementioned description. For example, when silicon oxide ($SiO_x$) or silicon oxynitride ($SiO_xN_y$)

(x>y) is used as the gate insulating film 5404, the gate insulating film 5404 is oxidized by performing plasma treatment in an oxygen atmosphere, whereby a dense insulating film with few defects, such as a pinhole, can be formed on the surface of the gate insulating film as compared with a gate insulating film formed by a CVD method, a sputtering method, or the like. On the other hand, when the gate insulating film 5404 is nitrided by plasma treatment in a nitrogen atmosphere, silicon nitride oxide ($SiN_xO_y$) (x>y) can be provided as the insulating film 5424 on the surface of the gate insulating film 5404. Alternatively, after the gate insulating film 5404 is oxidized by performing plasma treatment in an oxygen atmosphere once, plasma treatment may be performed again in a nitrogen atmosphere to nitride the gate insulating film 5404. Further, the insulating film 5424 contains a rare gas used for the plasma treatment, and for example, contains Ar when Ar is used.

Figure 57D:
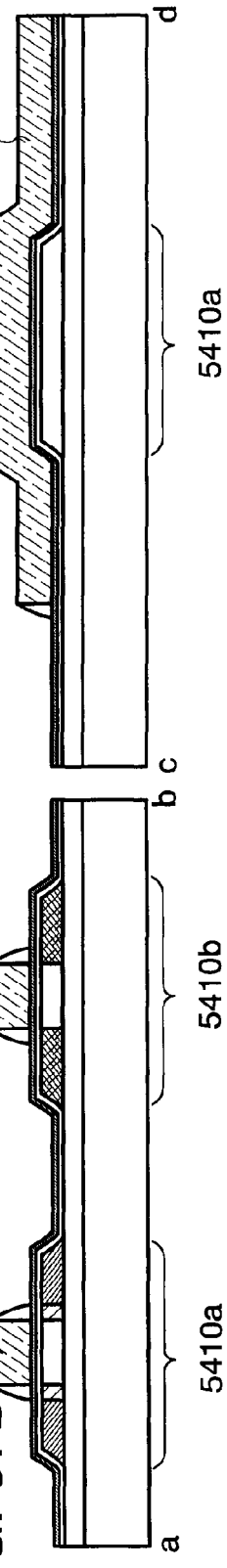

Next, the gate electrodes 5405 and the like are formed over the gate insulating film 5404, whereby a semiconductor device including the n-channel transistor 5410a and the p-channel transistor 5410b which have the island-shaped semiconductor films 5403a and 5403b used as channel regions can be manufactured (FIG. 57D).

In this manner, by performing plasma treatment on the gate insulating film, the insulating film formed of an oxide film or a nitride film can be provided on the surface of the gate insulating film, and the surface of the gate insulating film can be modified. The insulating film obtained by oxidation or nitridation with plasma treatment is denser and has fewer defects, such as a pinhole, as compared with a gate insulating film formed by a CVD method or a sputtering method; therefore, the characteristics of the transistors can be improved. In addition, although short circuits between the gate electrodes and the semiconductor films, which are caused by a coverage defect of the gate insulating film at the end portions of the semiconductor films, or the like can be suppressed by forming the semiconductor films to have a tapered shape, by performing plasma treatment after the gate insulating film is formed, short circuits or the like between the gate electrodes and the semiconductor films can be prevented more effectively.

Next, a manufacturing method of a semiconductor device which is different from that in FIGS. 57A to 57D is described with reference to drawings. Specifically, a case is shown where plasma treatment is selectively performed on an end portion of a semiconductor film having a tapered shape.

First, the island-shaped semiconductor films 5403a and 5403b are formed over the substrate 5401 (FIG. 58A). An amorphous semiconductor film is formed using a material containing silicon (Si) (such as $Si_xGe_{1-x}$) as its main component or the like, using a known method (such as a sputtering method, an LPCVD method, or a plasma CVD method), over the insulating film 5402, which is formed in advance over the substrate 5401; the amorphous semiconductor film is crystallized; and the semiconductor film is selectively etched using resists 5425a and 5425b as masks; thus, the island-shaped semiconductor films 5403a and 5403b can be provided. Note that crystallization of the amorphous semiconductor film can be performed by a known method such as a laser crystallization method, a thermal crystallization method using RTA or an annealing furnace, a thermal crystallization method using metal elements which promote crystallization, or a combination thereof.

Next, the end portions of the island-shaped semiconductor films 5403a and 5403b are selectively oxidized or nitrided by plasma treatment before the resists 5425a and 5425b which are used for etching the semiconductor films are removed, whereby an oxide film or a nitride film (hereinafter also referred to as an insulating film 5426) is formed in each end portion of the semiconductor films 5403a and 5403b (FIG. 58B). The plasma treatment is performed under the aforementioned conditions. In addition, the insulating film 5426 contains a rare gas used for the plasma treatment.

Next, the gate insulating film 5404 is formed to cover the semiconductor films 5403a and 5403b (FIG. 58C). The gate insulating film 5404 can be formed in a similar manner to the above description.

Next, the gate electrodes 5405 and the like are formed over the gate insulating film 5404, whereby a semiconductor device including the n-channel transistor 5410a and the p-channel transistor 5410b which have the island-shaped semiconductor films 5403a and 5403b used as channel regions can be manufactured (FIG. 58D).

When the end portions of the semiconductor films 5403a and 5403b have tapered shapes, end portions 5452a and 5452b of the channel regions, which are formed in a part of the semiconductor films 5403a and 5403b, are also tapered, and the thickness of the semiconductor films and the gate insulating film in end portions are different from that in a central portion, which may adversely affect the characteristics of the transistors. Here, by plasma treatment the end portions of the channel regions are selectively oxidized or nitrided, and insulating films are provided for the semiconductor films that become the end portions of the channel regions. Therefore, influence on the transistors due to the end portions of the channel regions can be suppressed.

Although FIGS. 58A to 58D show an example where only the end portions of the semiconductor films 5403a and 5403b are oxidized or nitrided by plasma treatment, the gate insulating film 5404 can also be oxidized or nitrided by plasma treatment as shown in FIGS. 57A to 57D (FIG. 60A).

Next, a manufacturing method of a semiconductor device which is different from the aforementioned manufacturing method is described with reference to drawings. Specifically, the case is shown where plasma treatment is performed on semiconductor films with tapered shapes.

First, the island-shaped semiconductor films 5403a and 5403b are formed over the substrate 5401 in a similar manner to the above description (FIG. 59A).

Next, the semiconductor films 5403a and 5403b are oxidized or nitrided by plasma treatment, whereby oxide films or nitride films 5427a and 5427b (hereinafter also referred to as insulating films 5427a and 5427b) are formed on the surfaces of the semiconductor films 5403a and 5403b, respectively (FIG. 59B). The plasma treatment can be performed in a manner similar to that performed under the aforementioned conditions. For example, when Si is used for the semiconductor films 5403a and 5403b, silicon oxide ($SiO_x$) or silicon nitride ($SiN_x$) is formed as the insulating films 5427a and 5427b. In addition, after the semiconductor films 5403a and 5403b are oxidized by plasma treatment, plasma treatment may be performed again on the semiconductor films 5403a and 5403b to nitride the semiconductor films 5403a and 5403b. In this case, silicon oxide ($SiO_x$) or silicon oxynitride ($SiO_xN_y$) (x>y) is formed in contact with the semiconductor films 5403a and 5403b, and silicon nitride oxide ($SiN_xO_y$) (x>y) is formed on the surface of the silicon oxide. Therefore, the insulating films 5427a and 5427b contain a rare gas used for the plasma treatment. Note that the end portions of the semiconductor films 5403a and 5403b are simultaneously oxidized or nitrided by performing plasma treatment.

Next, the gate insulating film 5404 is formed to cover the insulating films 5427a and 427b (FIG. 59C). The gate insulating film 5404 can be formed with a single-layer structure or a stacked-layer structure of an insulating film containing oxygen or nitrogen, such as silicon oxide (SiO$_x$), silicon nitride (SiN$_x$), silicon oxynitride (SiO$_x$N$_y$) (x>y), or silicon nitride oxide (SiN$_x$O$_y$) (x>y), by a known method (such as a sputtering method, an LPCVD method, or a plasma CVD method). For example, when Si is used for the semiconductor films 5403a and 5403b and the surfaces of the semiconductor films 5403a and 5403b are oxidized by plasma treatment to form silicon oxide as the insulating films 5427a and 5427b, silicon oxide (SiO$_x$) is formed as a gate insulating film over the insulating films 5427a and 5427b.

Next, the gate electrodes 5405 and the like are formed over the gate insulating film 5404, whereby a semiconductor device including the n-channel transistor 5410a and the p-channel transistor 5410b which have the island-shaped semiconductor films 5403a and 5403b used as channel regions can be manufactured (FIG. 59D).

When the end portions of the semiconductor films have tapered shape, end portions 5453a and 5453b of the channel regions, which are formed in a part of the semiconductor films, are also tapered, which may adversely affect characteristics of semiconductor elements. When semiconductor films are oxidized or nitrided by plasma treatment, the end portions of the channel regions are also oxidized or nitrided; thus, such influence on the semiconductor elements can be reduced.

Although FIGS. 59A to 59D show an example where only the semiconductor films 5403a and 5403b are oxidized or nitrided by plasma treatment, the gate insulating film 5404 can also be oxidized or nitrided by plasma treatment as shown in FIGS. 57A to 57D (FIG. 60B). In this case, after the gate insulating film 5404 is oxidized by plasma treatment in an oxygen atmosphere once, plasma treatment may be performed again in a nitrogen atmosphere to nitride the gate insulating film 5404. In this case, silicon oxide (SiO$_x$) or silicon oxynitride (SiO$_x$N$_y$) (x>y) is formed on the side on which the semiconductor films 5403a and 5403b are, and silicon nitride oxide (SiN$_x$O$_y$) (x>y) is formed to be in contact with the gate electrodes 5405.

As described above, the surface of the semiconductor film or the gate insulating film is modified by oxidizing or nitriding the semiconductor film or the gate insulating film by plasma treatment, so that a dense insulating film with good film quality can be formed. As a result, even when the insulating film is formed to be thin, a defect such as a pinhole can be prevented, and miniaturization and higher performance of a semiconductor element such as a transistor can be realized.

This embodiment mode shows an example where plasma treatment is performed to oxide or nitride the semiconductor films 5403a and 5403b or the gate insulating film 5404 shown in FIGS. 54A to 54C; however, a layer to be oxidized or nitrided by plasma treatment is not limited thereto. For example, plasma treatment may be performed on the substrate 5401 or the insulating film 5402, or on the insulating film 5406 or the insulating film 5407.

Note that this embodiment mode shows an example of an embodied case of the contents (or a part thereof) described in other embodiment modes, an example of slight transformation thereof, an example of partial modification thereof, an example of improvement thereof, an example of detailed description thereof, an application example thereof, an example of related part thereof, or the like. Therefore, the contents described in other embodiment modes can be freely applied to, combined with, or replaced with this embodiment mode.

Although this embodiment mode is described with reference to various drawings, the contents (or a part thereof) described in each drawing can be freely applied to, combined with, or replaced with the contents (or a part thereof) described in another drawing. Further, even more drawings can be formed by combining each part with another part in the above-described drawings.

Similarly, the contents (or a part thereof) shown in each drawing of this embodiment mode can be freely applied to, combined with, or replaced with the contents (or a part thereof) described in a drawing in another embodiment mode. Further, even more drawings can be formed by combining each part with part of another embodiment mode in the drawings of this embodiment mode.

[Embodiment Mode 9]

In this embodiment mode, hardware controlling the driving method shown in Embodiment Modes 1 to 6 is described.

Figure 61:
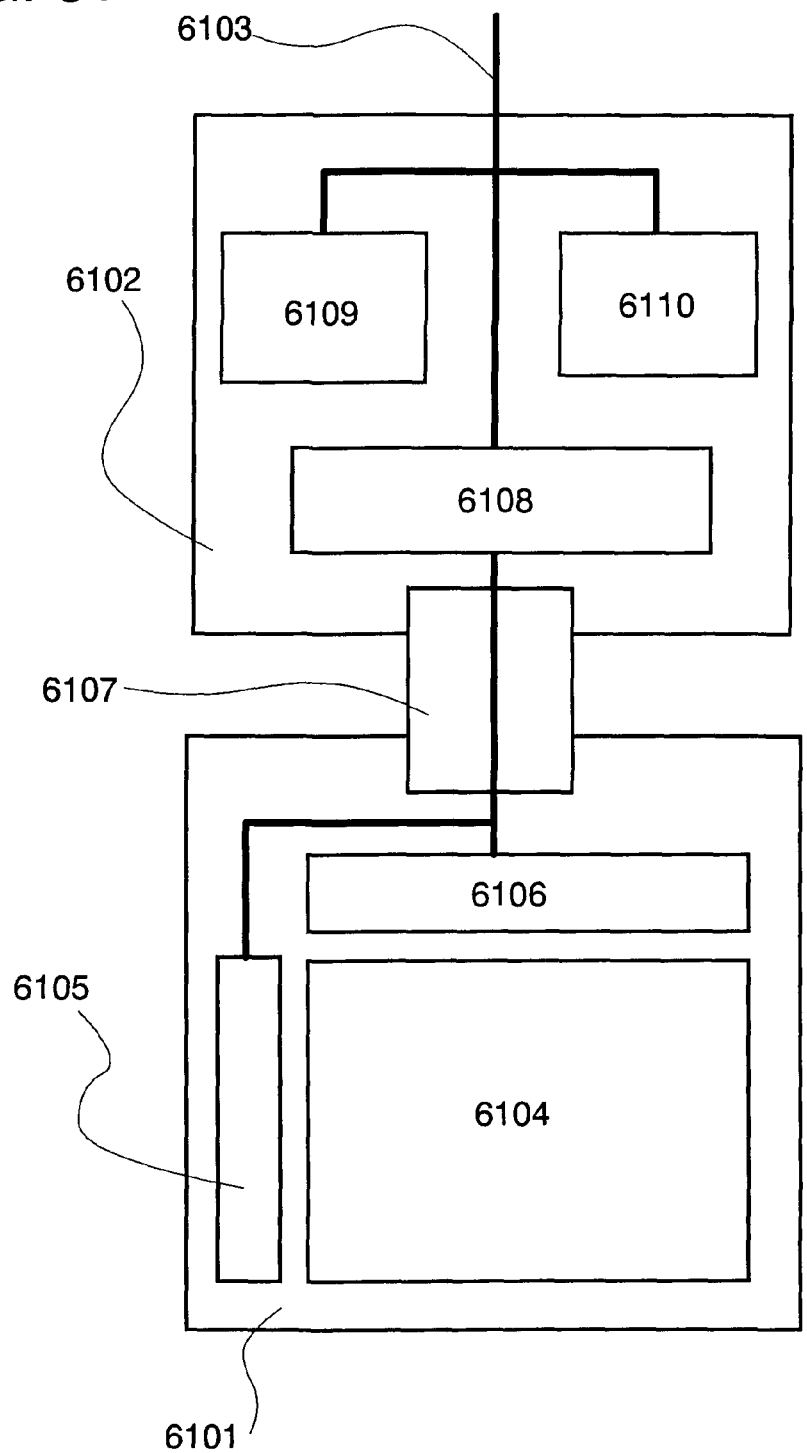
FIG. 61 is a diagram showing an example of hardware which controls a display device of the present invention.

FIG. 61 shows a general block diagram. A pixel portion 6104, a signal line driver circuit 6106, and a scan line driver circuit 6105 are provided over a substrate 6101. Further, a power supply circuit, a precharge circuit, a timing generating circuit, and/or the like may also be provided. Note that the signal line driver circuit 6106 and the scan line driver circuit 6105 need not be provided. In this case, an element which is not provided over the substrate 6101 may be formed into an IC. The IC may be provided over the substrate 6101 by COG (Chip On Glass). Alternatively, the IC may be provided over a connection substrate 6107 which connects a peripheral circuit substrate 6102 and the substrate 6101.

A signal 6103 is input to the peripheral circuit substrate 6102. Then, by control of a controller 6108, the signal is stored in memories 6109 and 6110, and the like. When the signal 6103 is an analog signal, the signal is often stored in the memories 6109 and 6110 and the like after it is converted from analog to digital. Then, the controller 6108 outputs a signal to the substrate 6101 by using the signal stored in the memories 6109 and 6110 and the like.

In order to realize the driving method shown in Embodiment Modes 1 to 6, the controller 6108 controls the order of appearance of subframes and the like to output the signal to the substrate 6101.

Note that this embodiment mode shows an example of an embodied case of the contents (or a part thereof) described in other embodiment modes, an example of slight transformation thereof, an example of partial modification thereof, an example of improvement thereof, an example of detailed description thereof, an application example thereof, an example of related part thereof, or the like. Therefore, the contents described in other embodiment modes can be freely applied to, combined with, or replaced with this embodiment mode.

Although this embodiment mode is described with reference to various drawings, the contents (or a part thereof) described in each drawing can be freely applied to, combined with, or replaced with the contents (or a part thereof) described in another drawing. Further, even more drawings can be formed by combining each part with another part in the above-described drawings.

Similarly, the contents (or a part thereof) shown in each drawing of this embodiment mode can be freely applied to, combined with, or replaced with the contents (or a part thereof) described in a drawing in another embodiment mode. Further, even more drawings can be formed by combining each

[Embodiment Mode 10]

In this embodiment mode, structural examples of an EL module and an EL television receiver using a display device of the invention are described.

Figure 62:
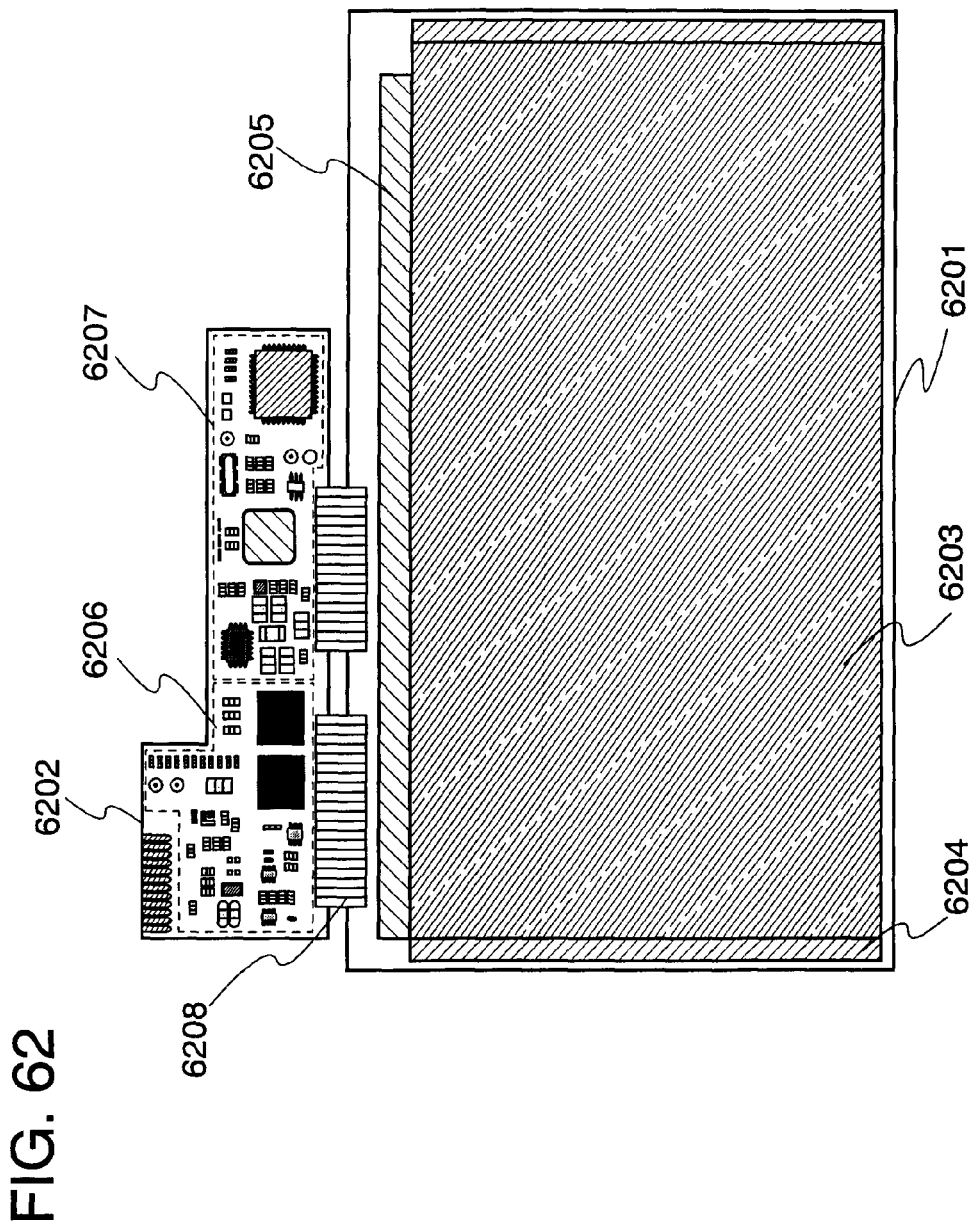
FIG. 62 is a view showing an example of an EL module for which a display device of the present invention is used.

FIG. 62 shows an EL module in which a display panel 6201 and a circuit board 6202 are combined. The display panel 6201 includes a pixel portion 6203, a scan line driver circuit

6204, and a signal line driver circuit 6205. For example, a control circuit 6206, a signal dividing circuit 6207, and the like are provided for the circuit board 6202. The display panel 6201 and the circuit board 6202 are connected to each other by a connection wiring 6208. As the connection wiring, an FPC or the like can be used.

The control circuit 6206 corresponds to the controller 6108, the memory 6109, the memory 6110, or the like in Embodiment Mode 9. The order of appearance of subframes and the like is controlled mainly by the control circuit 6206.

In the display panel 6201, the pixel portion and a part of peripheral driver circuits (a driver circuit having a low operation frequency among a plurality of driver circuits) may be formed over a substrate by using transistors in an integrated manner, and another part of the peripheral driver circuits (a driver circuit having a high operation frequency among the plurality of driver circuits) may be formed over an IC chip. The IC chip may be mounted on the display panel 6201 by COG (Chip On Glass) or the like. Alternatively, the IC chip may be mounted on the display panel 6201 by using TAB (Tape Automated Bonding) or a printed wiring board.

In addition, by impedance conversion of a signal input to a scan line or a signal line by a buffer circuit, a writing period for pixels of each row can be shortened. Thus, a high-definition display device can be provided.

Moreover, in order to further reduce power consumption, a pixel portion may be formed over a glass substrate by using transistors, and all signal line driver circuits may be formed over an IC chip, which may be mounted on a display panel by COG (Chip On Glass) or the like.

Figure 63:
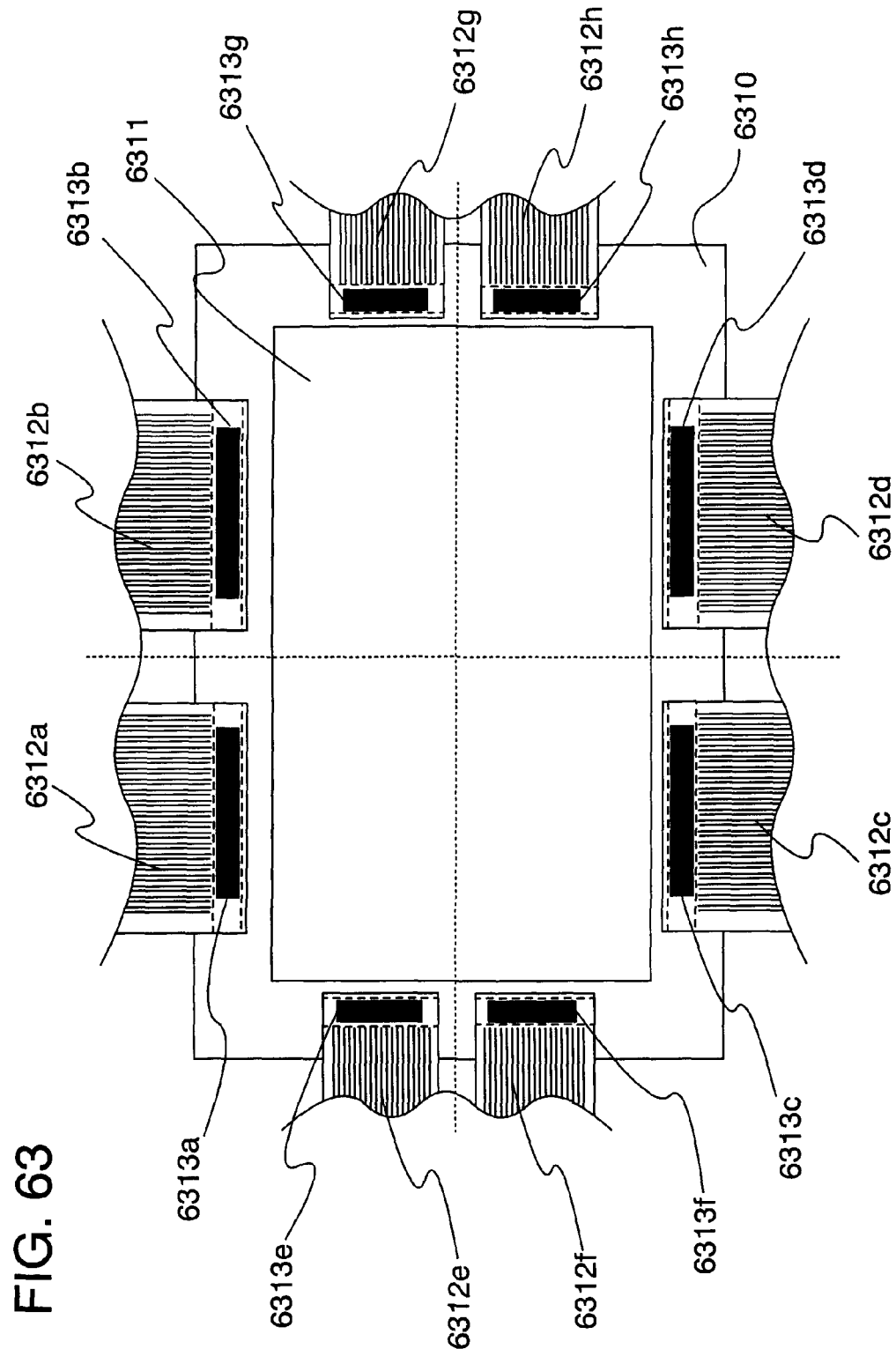
FIG. 63 is a view showing a structural example of a display panel for which a display device of the present invention is used.

For example, the entire screen of the display panel may be divided into several regions, and an IC chip in which a part or all of the peripheral driver circuits (the signal line driver circuit, the scan line driver circuit, and the like) are formed may be arranged in each region to be mounted on the display panel by COG (Chip On Glass) or the like. FIG. 63 shows a structure of the display panel in this case.

FIG. 63 shows an example where driving is performed by dividing the entire screen into four regions and using eight IC chips. A display panel includes a substrate 6310, a pixel portion 6311, FPCs 6312*a* to 6312*h*, and IC chips 6313*a* to 6313*h*. Among the eight IC chips, a signal line driver circuit is formed in the IC chips 6313*a* to 6313*d*, and a scan line driver circuit is formed in the IC chips 6313*e* to 6313*h*. It becomes possible to drive only an arbitrary screen region of the four screen regions by driving arbitrary IC chips. For example, when only the IC chips 6313*a* and 6313*e* are driven, only the upper left region of the four screen regions can be driven. Thus, power consumption can be reduced.

Figure 64:
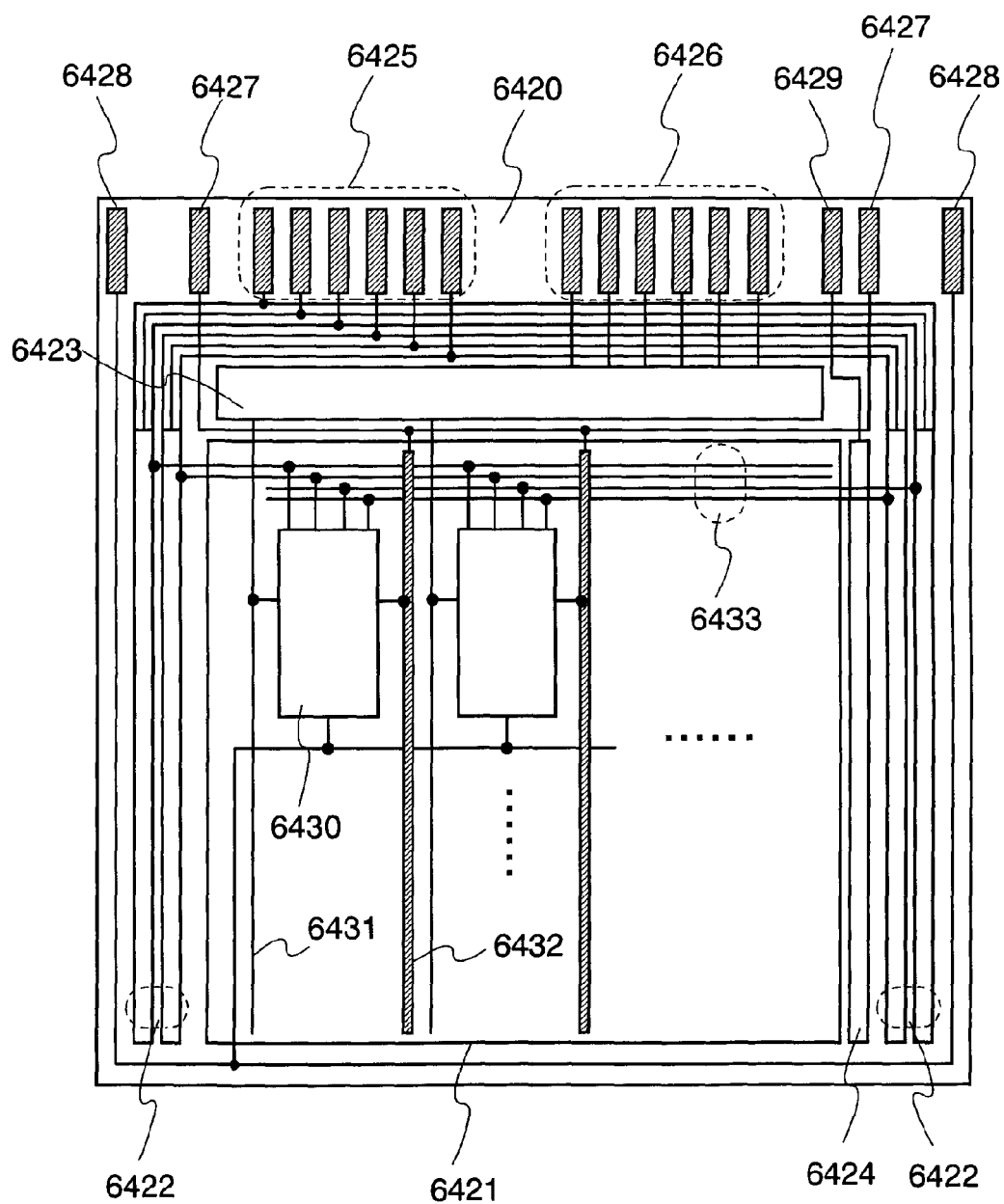
FIG. 64 is a view showing a structural example of a display panel for which a display device of the present invention is used.

FIG. 64 shows an example of a display device having a different structure. A display panel of FIG. 64 includes a pixel portion 6421 in which a plurality of pixels 6430 is arranged, a scan line driver circuit 6422 to control a signal of a scan line 6433, and a signal line driver circuit 6423 to control a signal of a signal line 6431, over a substrate 6420. In addition, a monitor circuit 6424 to correct changes in the luminance of a light emitting element included in the pixel 6430 may also be provided. The light emitting element included in the pixel 6430 and a light emitting element included in the monitor circuit 6424 have the same structure. The light emitting elements have a structure where a layer including a material which exhibits electroluminescence is interposed between a pair of electrodes.

The peripheral portion of the substrate 6420 includes an input terminal 6425 which inputs a signal from an external circuit to the scan line driver circuit 6422, an input terminal 6426 which inputs a signal from an external circuit to the signal line driver circuit 6423, and an input terminal 6429 which inputs a signal to the monitor circuit 6424.

In order to make the light emitting element included in the pixel 6430 emit light, power is necessary to be supplied from an external circuit. A power supply line 6432 provided in the pixel portion 6421 is connected to an external circuit through an input terminal 6427. Resistance loss occurs in the power supply line 6432 due to the length of a lead wiring; thus, a plurality of input terminals 6427 is preferably provided in the peripheral portion of the substrate 6420. The input terminals 6427 are provided on opposite sides of the substrate 6420 and arranged so that luminance unevenness is inconspicuous at the surface of the pixel portion 6421. In other words, display in which one side of the screen lights up while the opposite side remains dark is prevented. In addition, an electrode, which is one of a pair of electrodes included in the light emitting element, on the opposite side of the electrode connected to the power supply line 6432 is formed as a common electrode which is shared among the plurality of pixels 6430. Further, a plurality of terminals 6428 is provided to reduce resistance loss in the electrode.

In such a display panel, a power supply line is formed using a low resistance material such as Cu, which is especially effective for large screen. For example, when a screen size is a 13-inch class, the length of a diagonal line is 340 mm, while in the case of a 60-inch class is 1500 mm or more. In such a case, since wiring resistance cannot be ignored, it is preferable to use a low resistance material such as Cu for a wiring. In addition, in consideration of wiring delay, a signal line or a scan line may be formed in a similar manner.

Figure 65:
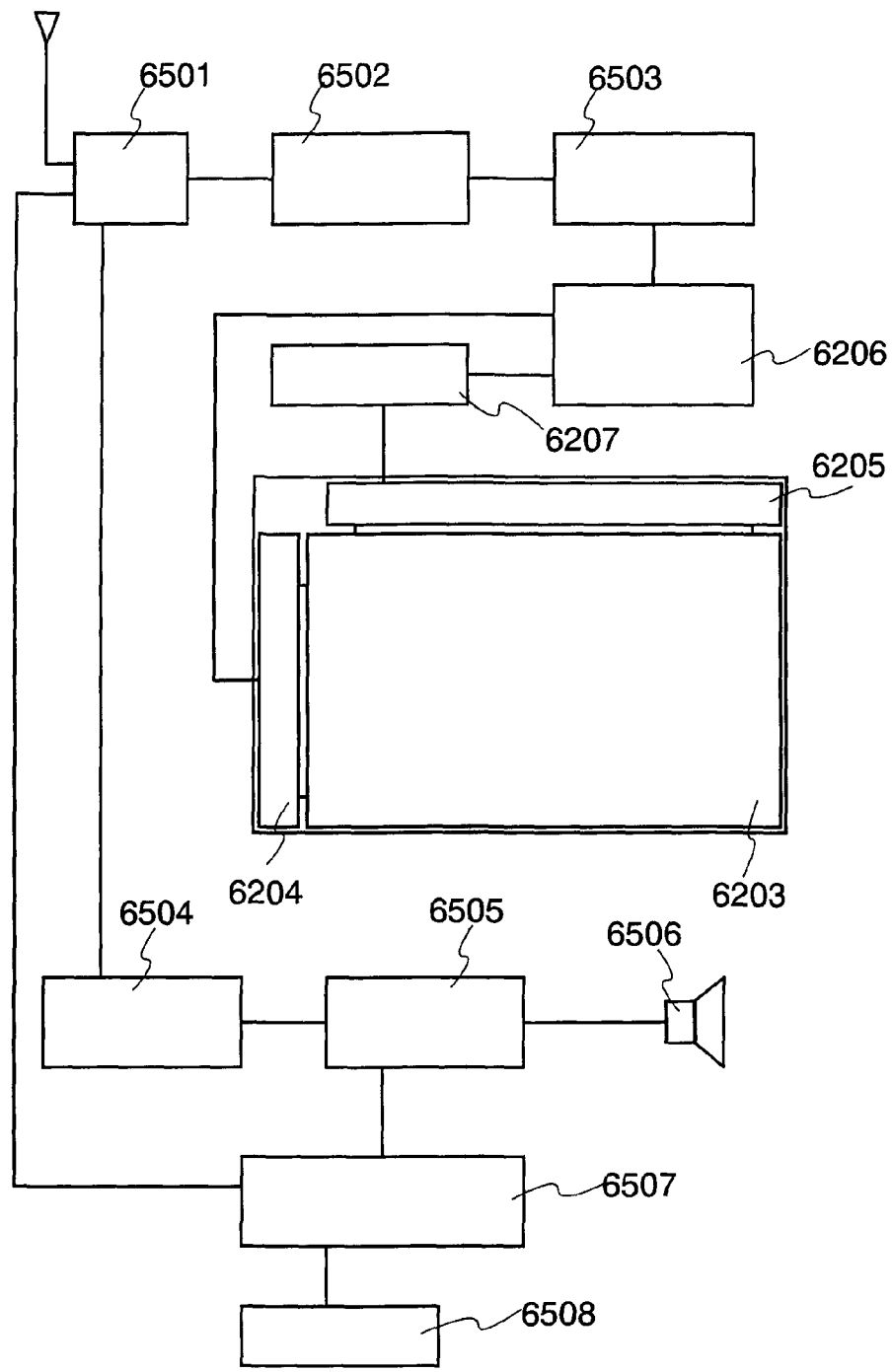
FIG. 65 is a diagram showing an example of an EL television receiver for which a display device of the present invention is used.

With such an EL module provided with the panel structure as described above, an EL television receiver can be completed. FIG. 65 is a block diagram showing the main structure of an EL television receiver. A tuner 6501 receives video signals and audio signals. The video signals are processed by a video signal amplifier circuit 6502; a video signal processing circuit 6503 for converting a signal output from the video signal amplifier circuit 6502 into a color signal corresponding to each color of red, green, and blue; and the control circuit 6206 for converting the video signal to be input to a driver circuit. The control circuit 6206 outputs signals to each of the scan line and the signal line. When digital drive is performed, the signal dividing circuit 6207 may be provided on the signal line side to divide an input digital signal into M signals to supply.

Among the signals received by the tuner 6501, the audio signals are transmitted to an audio signal amplifier circuit 6504, and an output thereof is supplied to a speaker 6506 through an audio signal processing circuit 6505. A control circuit 6507 receives control data on a receiving station (reception frequency) or sound volume from an input portion 6508 and transmits signals to the tuner 6501 and the audio signal processing circuit 6505.

By incorporating the EL module into a housing, a television receiver can be completed. A display portion is formed using such an EL module. In addition, a speaker, a video input terminal, and the like are provided as appropriate.

It is needless to say that the invention is not limited to the television receiver and can be applied to various uses, especially as a large display medium such as a monitor of a personal computer, an information display board at a train station, airport, or the like, or an advertisement display board on the street.

By using a display device and a driving method thereof according to the invention, a clear image can be displayed with reduced variations in luminance.

Note that this embodiment mode shows an example of an embodied case of the contents (or a part thereof) described in other embodiment modes, an example of slight transformation thereof, an example of partial modification thereof, an example of improvement thereof, an example of detailed description thereof, an application example thereof, an example of related part thereof, or the like. Therefore, the contents described in other embodiment modes can be freely applied to, combined with, or replaced with this embodiment mode.

Although this embodiment mode is described with reference to various drawings, the contents (or a part thereof) described in each drawing can be freely applied to, combined with, or replaced with the contents (or a part thereof) described in another drawing. Further, even more drawings can be formed by combining each part with another part in the above-described drawings.

Similarly, the contents (or a part thereof) shown in each drawing of this embodiment mode can be freely applied to, combined with, or replaced with the contents (or a part thereof) described in a drawing in another embodiment mode. Further, even more drawings can be formed by combining each part with part of another embodiment mode in the drawings of this embodiment mode.

[Embodiment Mode 11]

Electronic device using the display device of the invention include cameras such as a video camera and a digital camera, a goggle-type display (head mounted display), a navigation system, an audio reproducing device (such as a car audio and an audio component), a notebook computer, a game machine, a portable information terminal (such as a mobile computer, a cellular phone, a mobile game machine, and an electronic book), an image reproducing device provided with a recording medium (specifically, a device for reproducing a content of a recording medium such as a digital versatile disc (DVD) and having a display for displaying the reproduced image) and the like. FIGS. 66A to 66H show specific examples of these electronic device.

Figure 66A:
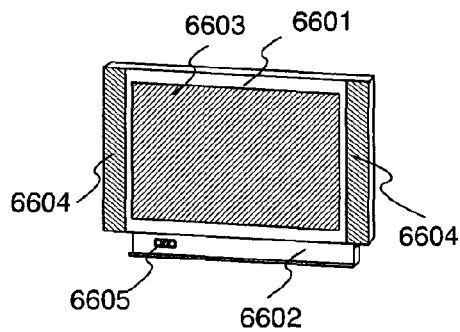
FIGS. 66A to 66H are views each showing an example of an electronic device to which a display device of the present invention is applied.

FIG. 66A shows a self-light emitting display, which includes a housing 6601, a supporting base 6602, a display portion 6603, speaker portions 6604, a video input terminal 6605, and the like. The invention can be used for a display device forming the display portion 6603. According to the invention, a clear image can be displayed with reduced variations in luminance. A backlight is not necessary since the display is a self-light emitting type, and the display portion can be made to be thinner than that of a liquid crystal display. Note that such display includes all display devices for information display, such as display devices for a personal computer, for TV broadcast reception, and for displays of advertisements.

Figure 66B:
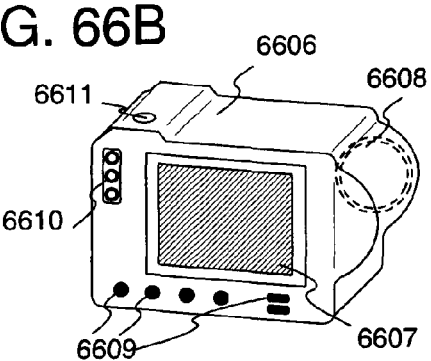

FIG. 66B shows a digital still camera, which includes a main body 6606, a display portion 6607, an image receiving portion 6608, operation keys 6609, an external connection port 6610, a shutter button 6611, and the like. The invention can be used for a display device forming the display portion 6607. According to the invention, a clear image can be displayed with reduced variations in luminance.

Figure 66C:
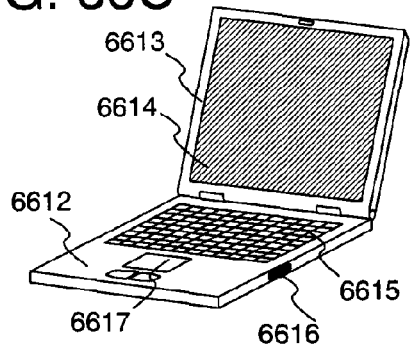

FIG. 66C shows a notebook computer, which includes a main body 6612, a housing 6613, a display portion 6614, a keyboard 6615, an external connection port 6616, a pointing device 6617, and the like. The invention can be used for a display device forming the display portion 6614. According to the invention, a clear image can be displayed with reduced variations in luminance.

Figure 66D:
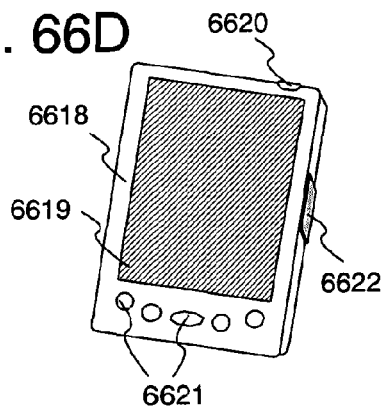

FIG. 66D shows a mobile computer, which includes a main body 6618, a display portion 6619, a switch 6620, operation keys 6621, an infrared port 6622, and the like. The invention can be used for a display device forming the display portion 6619. According to the invention, a clear image can be displayed with reduced variations in luminance.

Figure 66E:
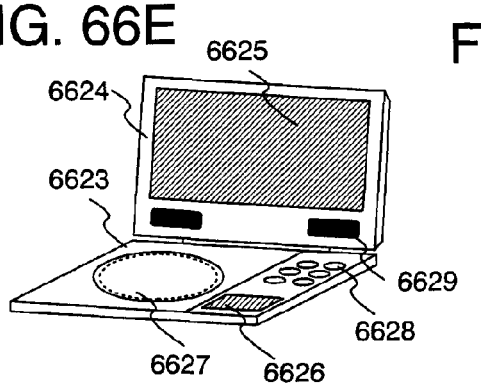

FIG. 66E shows an image reproducing device provided with a recording medium reading portion (specifically, a DVD player, for example), which includes a main body 6623, a housing 6624, a display portion A 6625, a display portion B 6626, a recording medium (such as DVD) reading portion 6627, an operation key 6628, a speaker portion 6629, and the like. The display portion A 6625 mainly displays image information, and the display portion B 6626 mainly displays text information. The invention can be used for a display device forming the display portion A 6625 and the display portion B 6626. According to the invention, a clear image can be displayed with reduced variations in luminance. Note that the image reproducing device provided with a recording medium includes a home game console or the like.

Figure 66F:
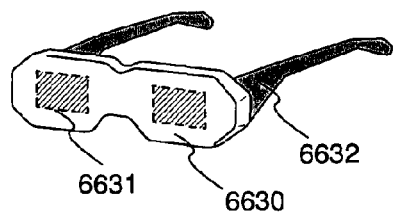

FIG. 66F shows a goggle-type display (head mounted display), which includes a main body 6630, a display portion 6631, an arm portion 6632, and the like. The invention can be used for a display device forming the display portion 6631. According to the invention, a clear image can be displayed with reduced variations in luminance.

Figure 66G:
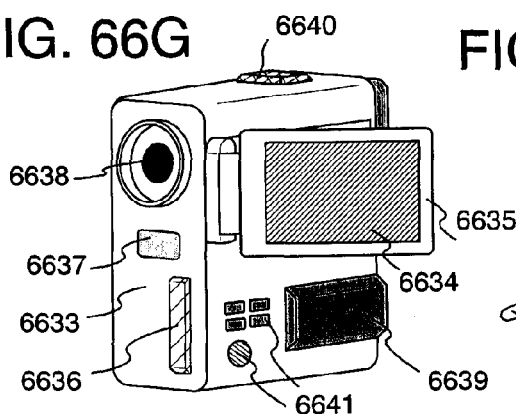

FIG. 66G shows a video camera, which includes a main body 6633, a display portion 6634, a housing 6635, an external connection port 6636, a remote control receiving portion 6637, an image receiving portion 6638, a battery 6639, an audio input portion 6640, operation keys 6641, and the like. The invention can be used for a display device forming the display portion 6634. According to the invention, a clear image can be displayed with reduced variations in luminance.

Figure 66H:
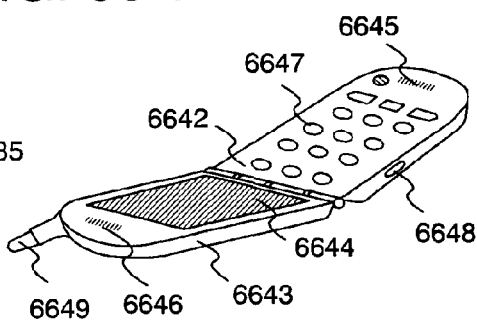
Figure 67:
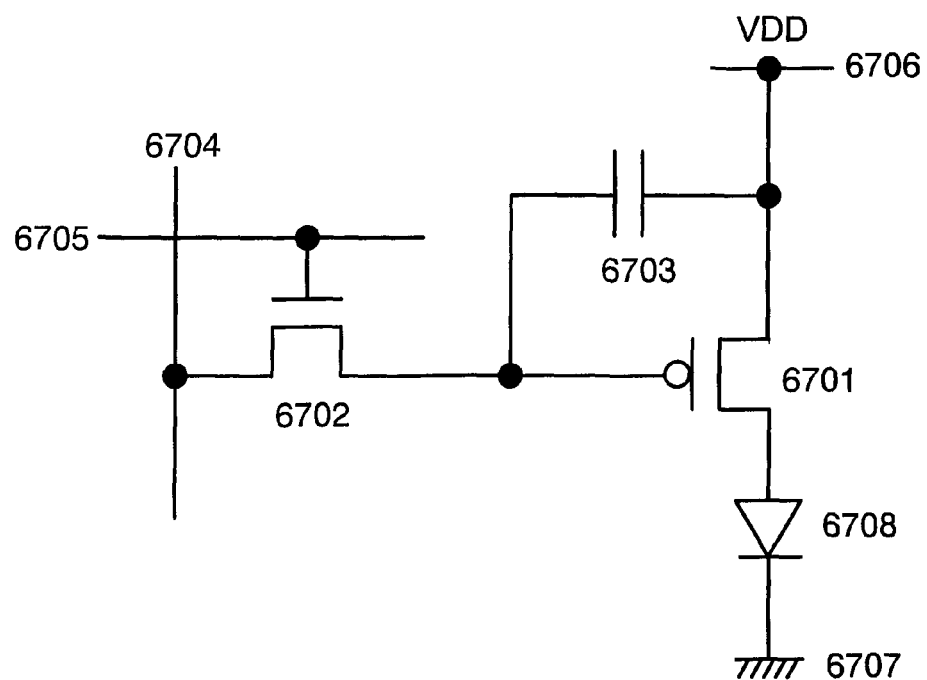
FIG. 67 is a diagram showing a conventional pixel structure.

FIG. 66H shows a cellular phone, which includes a main body 6642, a housing 6643, a display portion 6644, an audio input portion 6645, an audio output portion 6646, operation keys 6647, an external connection port 6648, an antenna 6649, and the like. The invention can be used for a display device forming the display portion 6644. Note that the display portion 6644 displays a white character in a black background so that current consumption of the cellular phone can be suppressed. According to the invention, a clear image can be displayed with reduced variations in luminance.

Note that when a light emitting material with high luminance is used, the invention can be applied to a front or rear projector which projects and magnifies light including output image information with a lens or the like.

Moreover, in recent years, the above electronic devices has often been used for displaying information distributed through electronic communication lines such as the Internet or CATV (Cable TV), and in particular, opportunity to display moving image information has been increased. Since a light emitting material has extremely high response speed, a light emitting device is suitable for displaying moving images.

Since a light emitting display device consumes power in its light emitting portion, it is preferable to display information so as to be as small a light emitting portion as possible. Accordingly, when a light emitting display device is used for a display portion of a portable information terminal which mainly displays text information, such as a cellular phone and an audio reproducing device in particular, it is preferable to drive the light emitting display device in such a manner that text information is displayed with a light emitting portion while using a non-light emitting portion as a background.

As described above, the application range of the invention is so wide that the invention can be applied to electronic devices of various fields. Further, the electronic device of this embodiment mode can use the display device having any structure shown in Embodiment Modes 1 to 10.

This application is based on Japanese Patent Application serial No. 2006-338989 filed with Japan Patent Office on Dec. 15, 2006, the entire contents of which are hereby incorporated by reference.

What is claimed is:

1. A semiconductor device comprising:
a signal line;
a capacitor line;
a power supply line;
a first scan line;
a second scan line; and
a first pixel and a second pixel, each of the first pixel and the second pixel comprising:
   a load;
   a first transistor;
   a second transistor; and
   a capacitor comprising a third transistor comprising:
      a semiconductor layer electrically connected to a first electrode of the capacitor,
      a gate electrode electrically connected to a second electrode of the capacitor, and
      a gate insulating film interposed between the semiconductor layer and the gate electrode,
wherein a first terminal of the first transistor of each of the first pixel and the second pixel is electrically connected to the signal line and the power supply line,
wherein a second terminal of the first transistor of each of the first pixel and the second pixel is electrically connected to the load of the corresponding one of the first pixel and the second pixel,
wherein a first terminal of the second transistor of each of the first pixel and the second pixel is electrically connected to a gate of the first transistor of the corresponding one of the first pixel and the second pixel,
wherein a second terminal of the second transistor of each of the first pixel and the second pixel is electrically connected to the second terminal of the first transistor of the corresponding one of the first pixel and the second pixel,
wherein a gate of the second transistor of the first pixel is electrically connected to the first scan line,
wherein a gate of the second transistor of the second pixel is electrically connected to the second scan line,
wherein the first electrode of the capacitor of each of the first pixel and the second pixel is electrically connected to the gate of the first transistor of the corresponding one of the first pixel and the second pixel,
wherein the second electrode of the capacitor of each of the first pixel and the second pixel is electrically connected to the capacitor line,
wherein each of the first transistor, the second transistor, and the third transistor of each of the first pixel and the second pixel is a p-channel transistor, and
wherein a potential of the first electrode of the capacitor of each of the first pixel and the second pixel is higher than a potential of the capacitor line.

2. The semiconductor device according to claim 1, wherein a voltage based on a video signal voltage and a threshold voltage of the first transistor of each of the first pixel and the second pixel is applied to the gate of the first transistor of the corresponding one of the first pixel and the second pixel so that a current is supplied to the load of the corresponding one of the first pixel and the second pixel.

3. The semiconductor device according to claim 1, wherein a ratio of a channel width W to a channel length L of the first transistor of each of the first pixel and the second pixel is larger than that of a channel width W to a channel length L of the second transistor of the corresponding one of the first pixel and the second pixel.

4. The semiconductor device according to claim 1, wherein the load of each of the first pixel and the second pixel is a light emitting element.

5. An electronic device having the semiconductor device according to claim 1, wherein the electronic device is one selected from the group consisting of a camera, a goggle-type display, a navigation system, an audio reproducing device, a notebook computer, a game machine, a portable information terminal, and an image reproducing device provided with a recording medium.

6. The semiconductor device according to claim 1, wherein at least one of the first transistor and the second transistor of each of the first pixel and the second pixel comprises an oxide semiconductor.

7. The semiconductor device according to claim 6, wherein the oxide semiconductor is such as ZnO, a-InGaZnO, IZO, ITO, or SnO.

8. The semiconductor device according to claim 1,
wherein the second electrode of the capacitor of the first pixel and the first terminal of the first transistor of the first pixel are electrically isolated from each other, and
wherein the second electrode of the capacitor of the second pixel and the first terminal of the first transistor of the second pixel are electrically isolated from each other.

9. A semiconductor device comprising:
a signal line;
a capacitor line;
a first power supply line;
a second power supply line;
a first scan line;
a second scan line; and
a first pixel and a second pixel, each of the first pixel and the second pixel comprising:
   a load;
   a first transistor;
   a second transistor;
   a third transistor;
   a fourth transistor;
   a fifth transistor; and
   a capacitor comprising a sixth transistor comprising:
      a semiconductor layer electrically connected to a first electrode of the capacitor,
      a gate electrode electrically connected to a second electrode of the capacitor, and
      a gate insulating film interposed between the semiconductor layer and the gate electrode,
wherein a first terminal of the first transistor of each of the first pixel and the second pixel is electrically connected to the signal line through the third transistor of the corresponding one of the first pixel and the second pixel, and to the first power supply line through the fourth transistor of the corresponding one of the first pixel and the second pixel,
wherein a second terminal of the first transistor of each of the first pixel and the second pixel is electrically connected to the load of the corresponding one of the first pixel and the second pixel through the fifth transistor of the corresponding one of the first pixel and the second pixel,
wherein a first terminal of the second transistor of each of the first pixel and the second pixel is electrically connected to a gate of the first transistor of the corresponding one of the first pixel and the second pixel, wherein a second terminal of the second transistor of each of the first pixel and the second pixel is electrically connected to the second terminal of the first transistor of the corresponding one of the first pixel and the second pixel, wherein a gate of the second transistor of the first pixel is electrically connected to the first scan line, wherein a gate of the second transistor of the second pixel is electrically connected to the second scan line, wherein the first electrode of the capacitor of each of the first pixel and the second pixel is electrically connected to the gate of the first transistor of the corresponding one of the first pixel and the second pixel, wherein the second electrode of the capacitor of each of the first pixel and the second pixel is electrically connected to the capacitor line, wherein each of the first transistor, the second transistor, the third transistor, the fourth transistor, the fifth transistor, and the sixth transistor of each of the first pixel and the second pixel is a p-channel transistor, and wherein a potential of the first electrode of the capacitor of each of the first pixel and the second pixel is higher than a potential of the capacitor line.

10. The semiconductor device according to claim 9, wherein a voltage based on a video signal voltage and a threshold voltage of the first transistor of each of the first pixel and the second pixel is applied to the gate of the first transistor of the corresponding one of the first pixel and the second pixel so that a current is supplied to the load of the corresponding one of the first pixel and the second pixel.

11. The semiconductor device according to claim 9, further comprising an initializing line,
wherein each of the first pixel and the second pixel comprises a seventh transistor, and
wherein the second terminal of the first transistor of each of the first pixel and the second pixel is electrically connected to the initializing line through the seventh transistor of each of the first pixel and the second pixel.

12. The semiconductor device according to claim 9, wherein a ratio of a channel width W to a channel length L of the first transistor of each of the first pixel and the second pixel is larger than that of a channel width W to a channel length L of the second transistor of the corresponding one of the first pixel and the second pixel, that of a channel width W to a channel length L of the third transistor of the corresponding one of the first pixel and the second pixel, that of a channel width W to a channel length L of the fourth transistor of the corresponding one of the first pixel and the second pixel, or that of a channel width W to a channel length L of the fifth transistor of the corresponding one of the first pixel and the second pixel.

13. The semiconductor device according to claim 9, wherein the second transistor of each of the first pixel and the second pixel and the third transistor of the corresponding one of the first pixel and the second pixel have a different conductivity from each other.

14. The semiconductor device according to claim 9, wherein each of the first pixel and the second pixel further comprises a scan line configured to be electrically connected to at least two gates of the second to fifth transistors of the corresponding one of the first pixel and the second pixel.

15. The semiconductor device according to claim 9, wherein the load of each of the first pixel and the second pixel is a light emitting element.

16. An electronic device having the semiconductor device according to claim 9, wherein the electronic device is one selected from the group consisting of a camera, a goggle-type display, a navigation system, an audio reproducing device, a notebook computer, a game machine, a portable information terminal, and an image reproducing device provided with a recording medium.

17. The semiconductor device according to claim 9, wherein at least one of the first transistor, the second transistor, the third transistor, the fourth transistor, and the fifth transistor of each of the first pixel and the second pixel comprises an oxide semiconductor.

18. The semiconductor device according to claim 17, wherein the oxide semiconductor is such as ZnO, a-InGaZnO, IZO, ITO, or SnO.

19. A driving method of a semiconductor device comprising:
a signal line;
a capacitor line;
a power supply line;
a first scan line;
a second scan line; and
a first pixel and a second pixel, each of the first pixel and the second pixel comprising:
a load;
a first transistor;
a second transistor; and
a capacitor comprising a third transistor comprising:
a semiconductor layer electrically connected to a first electrode of the capacitor,
a gate electrode electrically connected to a second electrode of the capacitor, and
a gate insulating film interposed between the semiconductor layer and the gate electrode,
wherein a first terminal of the first transistor of each of the first pixel and the second pixel is electrically connected to the signal line and the power supply line,
wherein a second terminal of the first transistor of each of the first pixel and the second pixel is electrically connected to the load of the corresponding one of the first pixel and the second pixel,
wherein a first terminal of the second transistor of each of the first pixel and the second pixel is electrically connected to a gate of the first transistor of the corresponding one of the first pixel and the second pixel,
wherein a second terminal of the second transistor of each of the first pixel and the second pixel is electrically connected to the second terminal of the first transistor of the corresponding one of the first pixel and the second pixel,
wherein a gate of the second transistor of the first pixel is electrically connected to the first scan line,
wherein a gate of the second transistor of the second pixel is electrically connected to the second scan line,
wherein the first electrode of the capacitor of each of the first pixel and the second pixel is electrically connected to the gate of the first transistor of the corresponding one of the first pixel and the second pixel, and
wherein the second electrode of the capacitor of each of the first pixel and the second pixel is electrically connected to the capacitor line,
the method comprising the steps of:
supplying an initial potential from an initializing line which is electrically connected to the first terminal of the first transistor of each of the first pixel and the second pixel via an initial transistor of the corresponding one of the first pixel and the second pixel;
applying a first voltage to the first scan line;
supplying current corresponding to a first video signal from the signal line to the capacitor of the first pixel via the first transistor of the first pixel and the second transistor of the first pixel to charge a voltage corresponding to the first video signal;

applying the first voltage to the second scan line; and supplying current corresponding to a second video signal from the signal line to the capacitor of the second pixel via the first transistor of the second pixel and the second transistor of the second pixel to charge a voltage corresponding to the second video signal.

20. The driving method of a semiconductor device according to claim 19, wherein the load of each of the first pixel and the second pixel is a light emitting element.

21. The semiconductor device according to claim 19, wherein at least one of the first transistor and the second transistor of each of the first pixel and the second pixel comprises an oxide semiconductor.

22. The semiconductor device according to claim 21, wherein the oxide semiconductor is such as ZnO, a-InGaZnO, IZO, ITO, or SnO.

23. A driving method of a semiconductor device comprising:
a signal line;
a capacitor line;
a first power supply line;
a second power supply line;
a first scan line;
a second scan line; and
a first pixel and a second pixel, each of the first pixel and the second pixel comprising:
a load;
a first transistor;
a second transistor;
a third transistor;
a fourth transistor;
a fifth transistor; and
a capacitor comprising a sixth transistor comprising:
a semiconductor layer electrically connected to a first electrode of the capacitor,
a gate electrode electrically connected to a second electrode of the capacitor, and
a gate insulating film interposed between the semiconductor layer and the gate electrode,
wherein a first terminal of the first transistor of each of the first pixel and the second pixel is electrically connected to the signal line through the third transistor of the corresponding one of the first pixel and the second pixel, and to the first power supply line through the fourth transistor of the corresponding one of the first pixel and the second pixel,
wherein a second terminal of the first transistor of each of the first pixel and the second pixel is electrically connected to the load of the corresponding one of the first pixel and the second pixel through the fifth transistor of the corresponding one of the first pixel and the second pixel,
wherein a first terminal of the second transistor of each of the first pixel and the second pixel is electrically connected to a gate of the first transistor of the corresponding one of the first pixel and the second pixel,
wherein a second terminal of the second transistor of each of the first pixel and the second pixel is electrically connected to the second terminal of the first transistor of the corresponding one of the first pixel and the second pixel,
wherein a gate of the second transistor of the first pixel is electrically connected to the first scan line,
wherein a gate of the second transistor of the second pixel is electrically connected to the second scan line,
wherein the first electrode of the capacitor of each of the first pixel and the second pixel is electrically connected to the gate of the first transistor of the corresponding one of the first pixel and the second pixel, and
wherein the second electrode of the capacitor of each of the first pixel and the second pixel is electrically connected to the capacitor line,
the method comprising the steps of:
supplying an initial potential from an initializing line which is electrically connected to the first terminal of the first transistor of each of the first pixel and the second pixel via an initial transistor of the corresponding one of the first pixel and the second pixel;
applying a first voltage to the first scan line;
supplying current corresponding to a first video signal from the signal line to the capacitor of the first pixel via the first transistor of the first pixel and the second transistor of the first pixel to charge a voltage corresponding to the first video signal;
applying the first voltage to the second scan line; and
supplying current corresponding to a second video signal from the signal line to the capacitor of the second pixel via the first transistor of the second pixel and the second transistor of the second pixel to charge a voltage corresponding to the second video signal.

24. The driving method of a semiconductor device according to claim 23, wherein the load of each of the first pixel and the second pixel is a light emitting element.

25. The semiconductor device according to claim 23, wherein at least one of the first transistor and the second transistor of each of the first pixel and the second pixel comprises an oxide semiconductor.

26. The semiconductor device according to claim 25, wherein the oxide semiconductor is such as ZnO, a-InGaZnO, IZO, ITO, or SnO.

* * * * *